US012201012B2

(12) United States Patent
Ma et al.

(10) Patent No.: US 12,201,012 B2
(45) Date of Patent: *Jan. 14, 2025

(54) ORGANIC ELECTROLUMINESCENT MATERIALS AND DEVICES

(71) Applicant: Universal Display Corporation, Ewing, NJ (US)

(72) Inventors: Bin Ma, Ewing, NJ (US); Chuanjun Xia, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 155 days.

This patent is subject to a terminal disclaimer.

(21) Appl. No.: 17/104,076

(22) Filed: Nov. 25, 2020

(65) Prior Publication Data

US 2021/0083206 A1 Mar. 18, 2021

Related U.S. Application Data

(63) Continuation of application No. 14/887,955, filed on Oct. 20, 2015, now Pat. No. 10,868,261.

(60) Provisional application No. 62/077,469, filed on Nov. 10, 2014.

(51) Int. Cl.

| | |
|---|---|
| ***H10K 85/30*** | (2023.01) |
| ***C07F 15/00*** | (2006.01) |
| ***C09K 11/02*** | (2006.01) |
| ***C09K 11/06*** | (2006.01) |
| ***H10K 50/11*** | (2023.01) |
| ***H10K 85/60*** | (2023.01) |
| ***H10K 101/10*** | (2023.01) |

(52) U.S. Cl.

CPC ....... *H10K 85/342* (2023.02); *C07F 15/0033* (2013.01); *C09K 11/025* (2013.01); *C09K 11/06* (2013.01); *H10K 85/622* (2023.02); *H10K 85/6576* (2023.02); *C09K 2211/1007* (2013.01); *C09K 2211/1029* (2013.01); *C09K 2211/1033* (2013.01); *C09K 2211/1088* (2013.01); *C09K 2211/185* (2013.01); *H10K 50/11* (2023.02); *H10K 2101/10* (2023.02)

(58) Field of Classification Search

CPC .......... C07F 15/0033; C07F 1/00; C07F 1/02; C07F 1/04; C07F 1/06; C07F 1/08; C07F 1/10; C07F 1/12; C07F 3/00; C07F 3/006; C07F 3/02; C07F 3/04; C07F 3/06; C07F 3/08; C07F 3/10; C07F 3/12; C07F 3/14; C07F 5/00; C07F 5/06; C07F 5/061; C07F 5/064; C07F 5/065; C07F 5/066; C07F 5/067; C07F 7/00; C07F 7/22; C07F 7/2204; C07F 7/2224; C07F 7/226; C07F 7/2284; C07F 7/24; C07F 7/28; C07F 7/30; C07F 9/00; C07F 9/66; C07F 9/74; C07F 9/78; C07F 9/80; C07F 9/82; C07F 9/84; C07F 9/86; C07F 9/90; C07F 9/92; C07F 9/94; C07F 11/00; C07F 12/00; C07F 15/00; C07F 15/0006; C07F 15/002; C07F 15/0046; C07F 15/006; C07F 15/0073; C07F 15/0086; C07F 15/02; C07F 15/04; C07F 15/06; C07F 19/00; C09K 11/025; C09K 2211/1007; C09K 2211/1029; C09K 2211/1033; C09K 2211/1088; C09K 2211/185; C09K 11/06; H01L 51/0085; H01L 51/0054; H01L 51/0074; H01L 51/5012; H01L 51/5016; H10K 85/342; H10K 85/622; H10K 85/6576; H10K 50/11; H10K 2101/10; H10K 85/30; H10K 85/321; H10K 85/322; H10K 85/324; H10K 85/326; H10K 85/331; H10K 85/341; H10K 85/344; H10K 85/346; H10K 85/348; H10K 85/351; H10K 85/361; H10K 85/371; H10K 85/381

USPC .............. 546/4; 428/690, 691, 917, 411.433; 427/58, 66; 313/500–512; 257/40, 257/88–104, 51.001, 51.052; 252/301.16–301.35

See application file for complete search history.

(56) References Cited

U.S. PATENT DOCUMENTS

| | | | |
|---|---|---|---|
| 4,769,292 | A | 9/1988 | Tang |
| 5,061,569 | A | 10/1991 | Vanslyke |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |

(Continued)

FOREIGN PATENT DOCUMENTS

| | | |
|---|---|---|
| EP | 0650955 | 5/1995 |
| EP | 1238981 | 9/2002 |

(Continued)

OTHER PUBLICATIONS

Xie et al., "Spiro-functionalized Ligand with Supramolecular Steric Hindrance to Control π-π Interaction in the Iridium Complex for High-Performance Electrophosphorescent Devices", The Journal of Physical Chemistry Letters (2010) vol. 1, pp. 272-276. (Year: 2010).*

(Continued)

*Primary Examiner* — Dylan C Kershner
(74) *Attorney, Agent, or Firm* — Riverside Law LLP

(57) ABSTRACT

This invention discloses iridium complexes containing phenylpyridine ligand wherein there is an aryl or heterocyclic ring fused into phenyl ring. The iridium complexes showed desired device performance.

20 Claims, 2 Drawing Sheets

(56) References Cited

U.S. PATENT DOCUMENTS

| | | | | |
|---|---|---|---|---|
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,528,187 | B1 | 3/2003 | Okada | |
| 6,687,266 | B1 | 2/2004 | Ma | |
| 6,835,469 | B2 | 12/2004 | Kwong | |
| 6,921,915 | B2 | 7/2005 | Takiguchi | |
| 7,087,321 | B2 | 8/2006 | Kwong | |
| 7,090,928 | B2 | 8/2006 | Thompson | |
| 7,154,114 | B2 | 12/2006 | Brooks | |
| 7,250,226 | B2 | 7/2007 | Tokito | |
| 7,279,704 | B2 | 10/2007 | Walters | |
| 7,332,232 | B2 | 2/2008 | Ma | |
| 7,338,722 | B2 | 3/2008 | Thompson | |
| 7,393,599 | B2 | 7/2008 | Thompson | |
| 7,396,598 | B2 | 7/2008 | Takeuchi | |
| 7,431,968 | B1 | 10/2008 | Shtein | |
| 7,445,855 | B2 | 11/2008 | Mackenzie | |
| 7,534,505 | B2 | 5/2009 | Lin | |
| 7,968,146 | B2 | 6/2011 | Wagner | |
| 8,946,697 | B1 | 2/2015 | Ma | |
| 10,868,261 | B2 * | 12/2020 | Ma | H01L 51/0085 |
| 2002/0034656 | A1 | 3/2002 | Thompson | |
| 2002/0134984 | A1 | 9/2002 | Igarashi | |
| 2002/0158242 | A1 | 10/2002 | Son | |
| 2003/0138657 | A1 | 7/2003 | Li | |
| 2003/0152802 | A1 | 8/2003 | Tsuboyama | |
| 2003/0162053 | A1 | 8/2003 | Marks | |
| 2003/0175553 | A1 | 9/2003 | Thompson | |
| 2003/0230980 | A1 | 12/2003 | Forrest | |
| 2004/0036077 | A1 | 2/2004 | Ise | |
| 2004/0137267 | A1 | 7/2004 | Igarashi | |
| 2004/0137268 | A1 | 7/2004 | Igarashi | |
| 2004/0174116 | A1 | 9/2004 | Lu | |
| 2005/0025993 | A1 | 2/2005 | Thompson | |
| 2005/0112407 | A1 | 5/2005 | Ogasawara | |
| 2005/0238919 | A1 | 10/2005 | Ogasawara | |
| 2005/0244673 | A1 | 11/2005 | Satoh | |
| 2005/0260441 | A1 | 11/2005 | Thompson | |
| 2005/0260449 | A1 | 11/2005 | Walters | |
| 2006/0008670 | A1 | 1/2006 | Lin | |
| 2006/0202194 | A1 | 9/2006 | Jeong | |
| 2006/0240279 | A1 | 10/2006 | Adamovich | |
| 2006/0251923 | A1 | 11/2006 | Lin | |
| 2006/0263635 | A1 | 11/2006 | Ise | |
| 2006/0280965 | A1 | 12/2006 | Kwong | |
| 2007/0128466 | A1 | 6/2007 | Nomura | |
| 2007/0190359 | A1 | 8/2007 | Knowles | |
| 2007/0278938 | A1 | 12/2007 | Yabunouchi | |
| 2008/0015355 | A1 | 1/2008 | Schafer | |
| 2008/0018221 | A1 | 1/2008 | Egen | |
| 2008/0106190 | A1 | 5/2008 | Yabunouchi | |
| 2008/0124572 | A1 | 5/2008 | Mizuki | |
| 2008/0220265 | A1 | 9/2008 | Xia | |
| 2008/0297033 | A1 | 12/2008 | Knowles | |
| 2009/0008605 | A1 | 1/2009 | Kawamura | |
| 2009/0009065 | A1 | 1/2009 | Nishimura | |
| 2009/0017330 | A1 | 1/2009 | Iwakuma | |
| 2009/0030202 | A1 | 1/2009 | Iwakuma | |
| 2009/0039776 | A1 | 2/2009 | Yamada | |
| 2009/0045730 | A1 | 2/2009 | Nishimura | |
| 2009/0045731 | A1 | 2/2009 | Nishimura | |
| 2009/0101870 | A1 | 4/2009 | Prakash | |
| 2009/0108737 | A1 * | 4/2009 | Kwong | H01L 51/0085 313/504 |
| 2009/0115316 | A1 | 5/2009 | Zheng | |
| 2009/0165846 | A1 | 7/2009 | Johannes | |
| 2009/0167162 | A1 | 7/2009 | Lin | |
| 2009/0179554 | A1 | 7/2009 | Kuma | |
| 2010/0244004 | A1 * | 9/2010 | Xia | C07F 15/0033 257/40 |
| 2010/0270916 | A1 | 10/2010 | Xia | |
| 2013/0026452 | A1 | 1/2013 | Kottas | |
| 2013/0119354 | A1 | 5/2013 | Ma | |
| 2014/0131663 | A1 | 5/2014 | Beers | |
| 2014/0131676 | A1 | 5/2014 | Beers | |

FOREIGN PATENT DOCUMENTS

| | | | |
|---|---|---|---|
| EP | 1725079 | 11/2006 | |
| EP | 2034538 | 3/2009 | |
| JP | 200511610 | 1/2005 | |
| JP | 2007123392 | 5/2007 | |
| JP | 2007254297 | 10/2007 | |
| JP | 2008074939 A | 4/2008 | |
| JP | 2010135467 | 6/2010 | |
| JP | 2012074444 A | 4/2012 | |
| WO | 0139234 | 5/2001 | |
| WO | 0202714 | 1/2002 | |
| WO | 0215645 | 2/2002 | |
| WO | 03040257 | 5/2003 | |
| WO | 03060956 | 7/2003 | |
| WO | 2004093207 | 10/2004 | |
| WO | 2004107822 | 12/2004 | |
| WO | 2004111066 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008044723 | 4/2008 | |
| WO | 2008056746 | 5/2008 | |
| WO | 2008057394 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | WO-2009021126 A2 * | 2/2009 | C07D 307/91 |
| WO | 2009050290 | 4/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | 2010011390 | 1/2010 | |
| WO | 2010111175 | 9/2010 | |

OTHER PUBLICATIONS

Sekine et al., machine translation of JP 2012-074444 (2012) pp. 1-39. (Year: 2012).*

Adachi, Chihaya et al., "High-Efficiency Red Electrophosphorescence Devices," Appl. Phys. Lett., 78(11):1622-1624 (2001).

Adachi, Chihaya et al., "Organic Electroluminescent Device Having a Hole Conductor as an Emitting Layer," Appl. Phys. Lett., 55(15):1489-1491 (1989).

Adachi, Chihaya et al., "Nearly 100% Internal Phosphorescence Efficiency in an Organic Light Emitting Device," J. Appl. Phys., 90(10):5048-5051 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

(56) References Cited

OTHER PUBLICATIONS

Baldo et al., "Highly Efficient Phosphorescent Emission from Organic Electroluminescent Devices," Nature, vol. 395,151-154, (1998).
Baldo et al., "Very high-efficiency green organic light-emitting devices based on electrophosphorescence," Appl. Phys. Lett., vol. 75, No. 3, 4-6 (1999).
Gao, Zhiqiang et al., "Bright-Blue Electroluminescence From a Silyl-Substituted ter-(phenylene-vinylene) derivative," Appl. Phys. Lett., 74(6):865-867 (1999).
Guo, Tzung-Fang et al., "Highly Efficient Electrophosphorescent Polymer Light-Emitting Devices," Organic Electronics, 1:15-20 (2000).
Hamada, Yuji et al., "High Luminance in Organic Electroluminescent Devices with Bis(10-hydroxybenzo[h]quinolinato)beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185: Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al.,"1,2,4-Triazole Derivative as an Electron Transport Layer in Organic Electroluminescent Devices," Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1):162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21):5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode: an Isoindole Derivative," Chem. Mater., 15(16):3148-3151 (2003).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,6-Bis(dinnesitylboryl)-2,2'-bithiophene and 5,5"-Bis(dimesitylbory1)-2,2':5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S, et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Ostergard et al., "Langmuir-Blodgett Light-Emitting Diodes Of Poly(3-Hexylthiophene): Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8):1059-1064 (2005).
Van Slyke, S. A. et al., "Organic Electroluminescent Devices with Improved Stability," Appl. Phys. Lett, 69(15 ):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., "A Novel Class of Phosphorescent Gold(III) Alkynyl-Based Organic Light-Emitting Devices with Tunable Colour," Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Xie et al. "Spiro-functionalized Ligand with Supramolecular Steric Hindrance to Control tt-tt Interaction in the Iridium Complex for High-Performance Electrophosphorescent Devices" The Journal of Physical Chemistry Letters (2010) vol. 1 pp. 272-276. (Year: 2010).

* cited by examiner

ORGANIC ELECTROLUMINESCENT MATERIALS AND DEVICES

CROSS-REFERENCE TO RELATED APPLICATIONS

The present application is a continuation of U.S. patent application Ser. No. 14/887,955, filed Oct. 20, 2015, now allowed, which claims the benefit of U.S. Provisional Patent Application Ser. No. 62/077,469, filed Nov. 10, 2014, all of which applications are incorporated herein by reference in their entireties.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to compounds for use as emitters and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

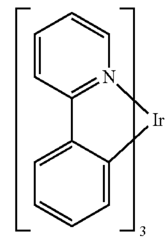

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

When the aryl or heteroaryl ring in the ligands of metal complexes is not fused with a five-membered saturated carbon ring, the molecule may be less rigid, thereby reducing molecular stability, decreasing complex device lifetime and diminishing color purity. There is a need in the art for novel compounds with improved stability and enhanced properties. The present invention addresses this unmet need.

SUMMARY OF THE INVENTION

According to an embodiment, a compound is provided comprising a ligand $L_A$ of Formula I:

Formula I

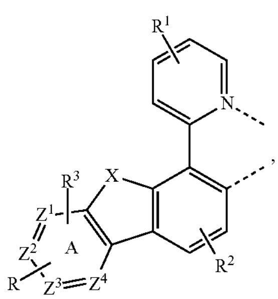

wherein R has the following structure and is fused to ring A:

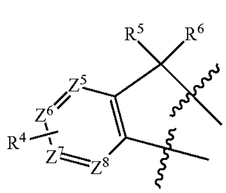

wherein each $Z^1$ to $Z^8$ is nitrogen or carbon;

wherein the wave lines indicate the bonds to two of the adjacent $Z^1$ to $Z^4$ of ring A;

wherein when two of the adjacent $Z^1$ to $Z^4$ are used to fuse to R, those two of the adjacent $Z^1$ to $Z^4$ are carbon;

wherein $R^1$ and $R^4$ each independently represent mono, di, tri, or tetra substitutions, or no substitution;

wherein $R^2$ and $R^3$ each independently represent mono, or di substitutions, or no substitution;

wherein X is O or S;

wherein $R^1$, $R^2$, $R^3$, $R^4$, $R^5$, and $R^6$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substituents are optionally joined to form a ring, which can be further substituted;

wherein the ligand $L_A$ is coordinated to a metal M; and wherein the ligand $L_A$ is optionally linked with other ligands to comprise a tridentate, tetradentate, pentadentate or hexadentate ligand.

In one embodiment, M is selected from the group consisting of Ir, Rh, Re, Ru, Os, Pt, Au, and Cu.

In one embodiment, M is Ir.

In one embodiment, the ligand $L_A$ is selected from the group consisting of:

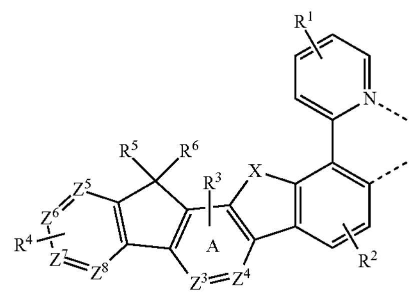

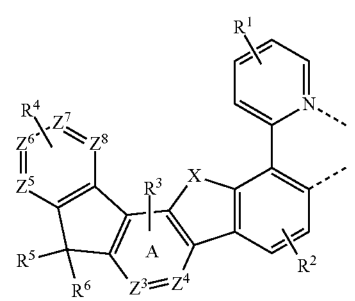

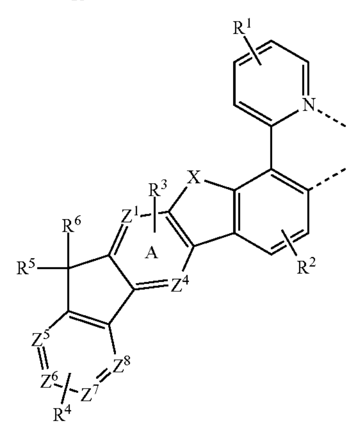

-continued

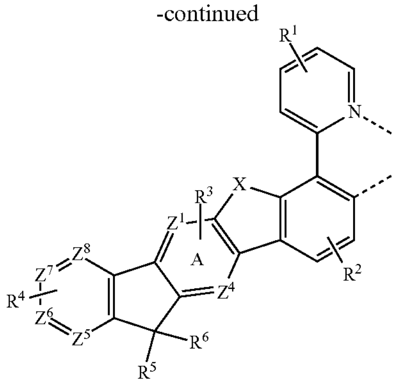

,

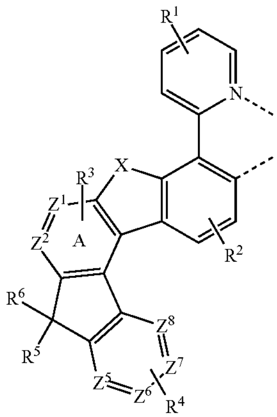

, and

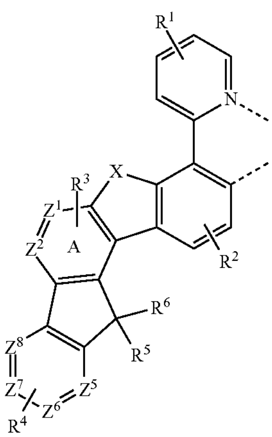

.

In one embodiment each of $Z^1$ to $Z^4$ is carbon. In another embodiment each of $Z^5$ to $Z^8$ is carbon. In another embodiment each of $Z^1$ to $Z^8$ is carbon. In yet another embodiment, at least one of $Z^5$ to $Z^8$ is nitrogen.

In one embodiment X is O.

In one embodiment $R^5$ and $R^6$ are each independently selected from the group consisting of hydrogen, deuterium, alkyl, cycloalkyl, aryl, heteroaryl, and combinations thereof. In another embodiment, $R^5$ and $R^6$ are joined to form a ring.

In one embodiment, the ligand $L_A$ is selected from the group consisting of compounds $L_{A1}$ to $L_{A508}$.

In another embodiment, the compound has the formula $(L_A)Ir(L_B)_2$ of Formula II, having the structure:

Formula II

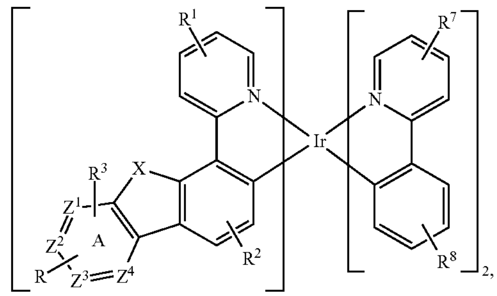

wherein $R^7$ and $R^8$ each independently represent mono, di, tri, or tetra substitutions, or no substitution;

wherein $R^7$ and $R^8$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two adjacent $R^7$ and $R^8$ are optionally joined to form a ring, which can be further substituted.

In one embodiment $L_B$ is selected from the group consisting of $L_{B1}$ to $L_{B225}$.

In one embodiment, the compound is selected from the group consisting of compound 1 through Compound 114,300; where each compound x has the formula $Ir(L_{Ai})(L_{Bj})_2$; wherein x=508j+i−508, i is an integer from 1 to 508, and j is an integer from 1 to 225; wherein $L_{Ai}$ is one of $L_{A1}$ to $L_{A508}$ and $L_{Bj}$ is one of $L_{B1}$ to $L_{B225}$.

According to another embodiment, an organic light emitting device (OLED) is provided. The OLED comprises an anode; a cathode; and an organic layer, disposed between the anode and the cathode, comprising a compound comprising a ligand $L_A$ of Formula I.

In one aspect, the OLED is incorporated into a device selected from the group consisting of a consumer product, an electronic component module, and a lighting panel.

In one embodiment, the organic layer comprises a host; wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, $C_nH_{2n}$—$Ar_1$, or no substitution;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In another embodiment, the organic layer further comprises a host, wherein the host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In yet another embodiment, the organic layer further comprises a host and the host is selected from the group consisting of:

-continued
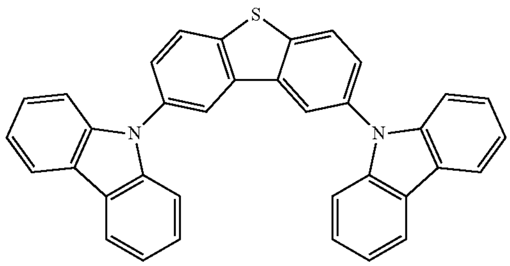
,
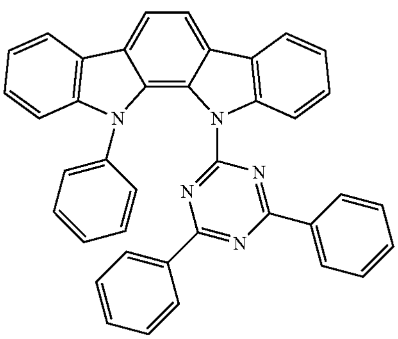
,
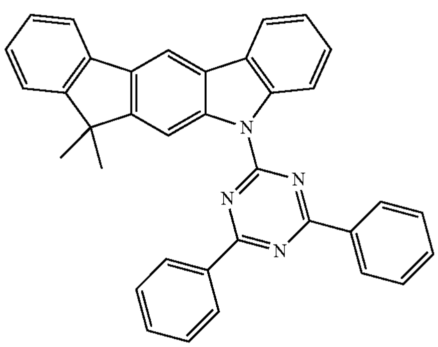
,
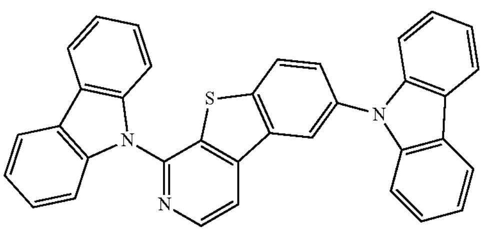
,
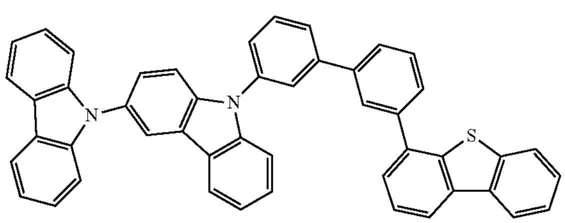
,
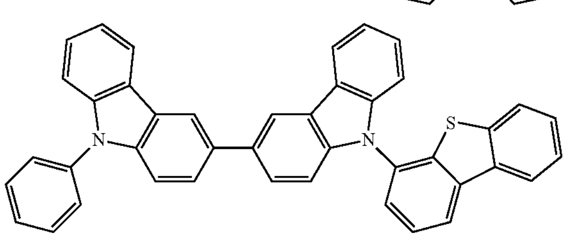
,
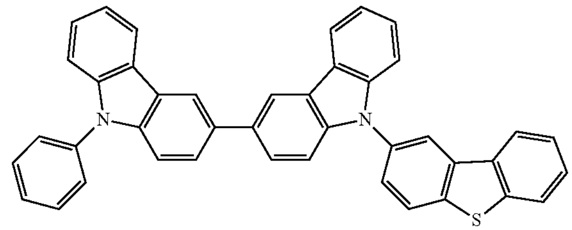
,
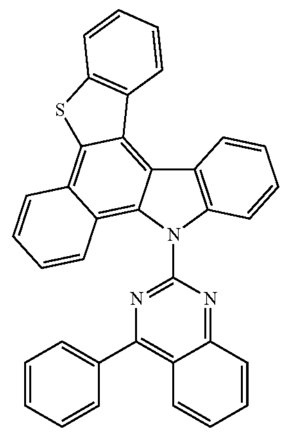
,
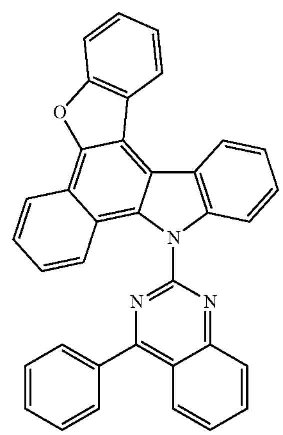
,
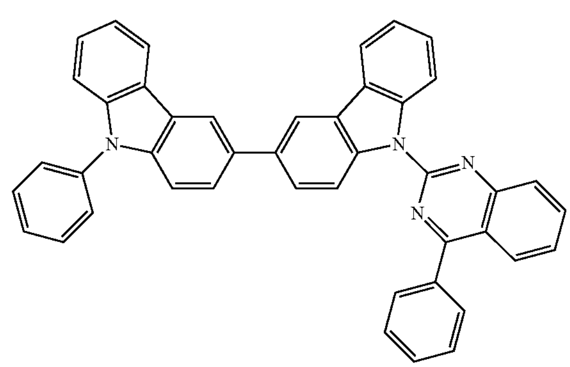
, -continued
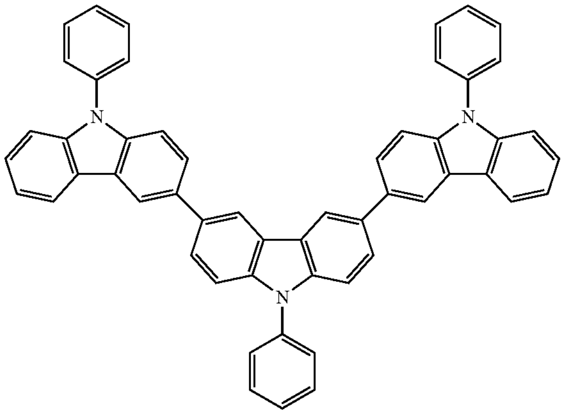
,
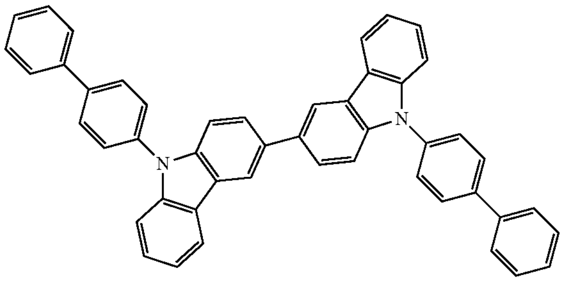
,
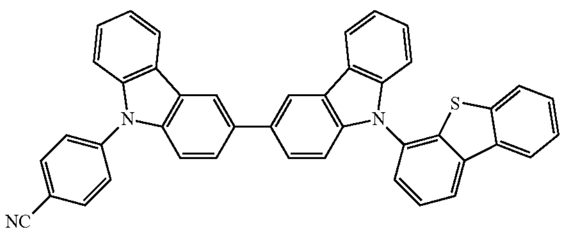
,
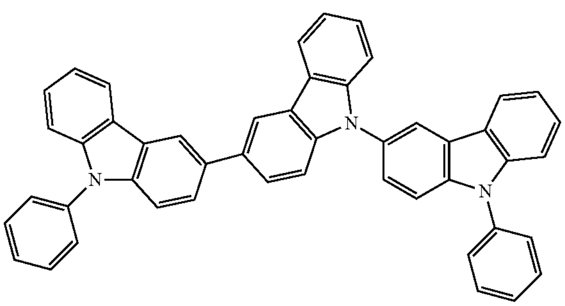
,
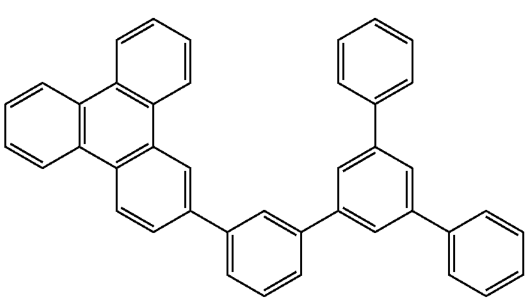
,
-continued
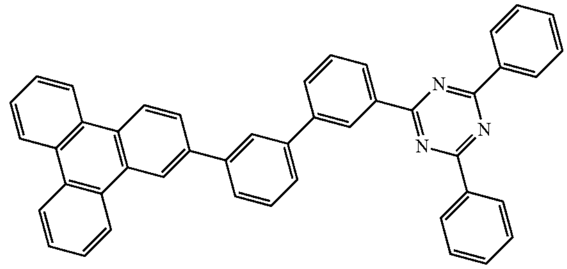
,
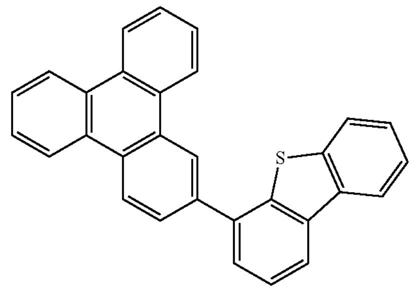
,
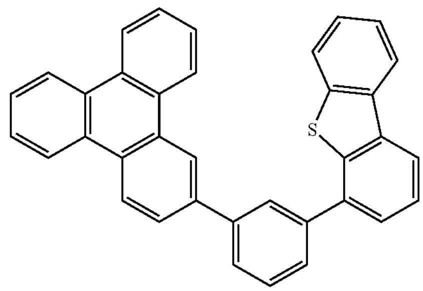
,
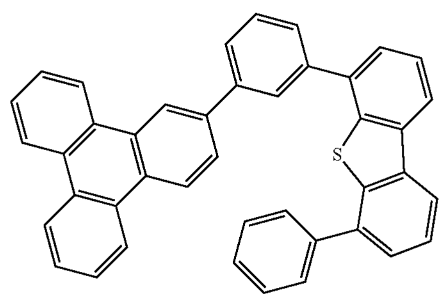
,
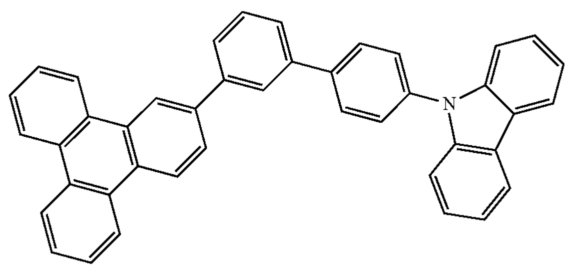
,
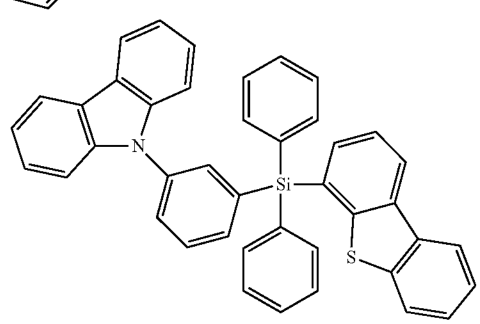
, -continued

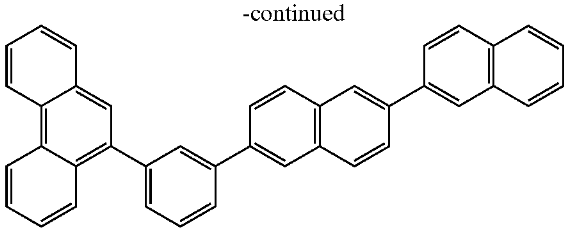

, and combinations thereof.

In one embodiment, the organic layer further comprises a host and the host comprises a metal complex.

According to another embodiment, the invention provides a formulation comprising a compound comprising a ligand $L_A$ of Formula I:

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 which is incorporated by reference in its entirety.

Figure 1:
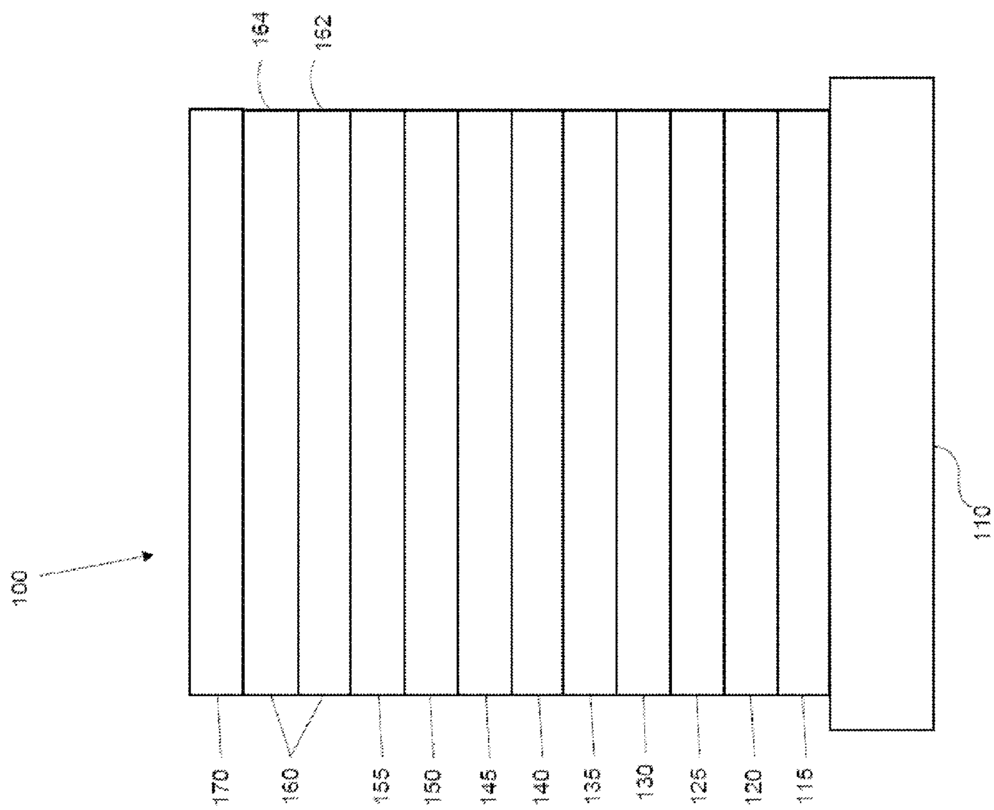
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 which is incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
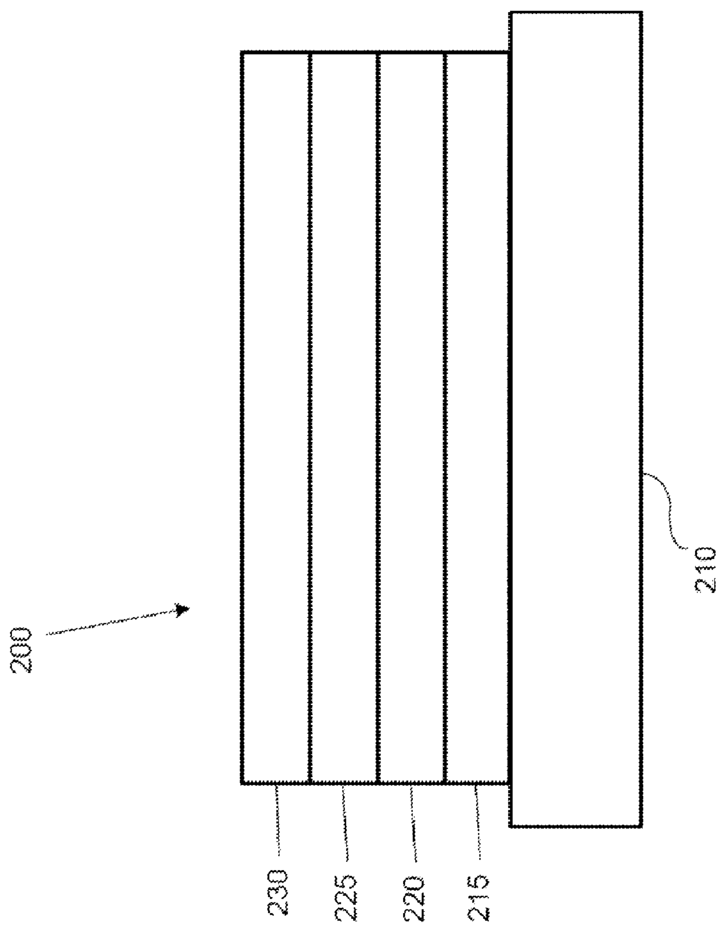
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where R is mono-substituted, then one $R^1$ must be other than H. Similarly, where $R^1$ is di-substituted, then two of $R^1$ must be other than H. Similarly, where R is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[fh]quinoxaline and dibenzo[fh]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

When an aryl or heteroaryl ring in the ligands of metal complexes is fused with a five-membered saturated carbon group the complex device lifetime can be enhanced and color purity potentially can be improved compared with devices that include the previously synthesized similar complexes in which the aryl or heteroaryl ring is not fused. Although not wishing to be bound by any particular theory, this effect is believed to be due to the ring fusion making the molecule more rigid and therefore potentially increasing the molecule's stability in general. In addition, molecular rigidification can make photoluminescent spectrum narrower and better color CIE which are desired properties of OLED. Therefore, the present invention is based, in part, on the discovery that fusing the ligands of metal complexes with five-membered saturated carbon groups provides a device with enhanced lifetime and improved color purity.

Compounds of the Invention:

The compounds of the present invention may be synthesized using techniques well-known in the art of organic synthesis. The starting materials and intermediates required for the synthesis may be obtained from commercial sources or synthesized according to methods known to those skilled in the art.

In one aspect, the compound of the invention is a compound comprising a ligand $L_A$ of Formula I:

Formula I

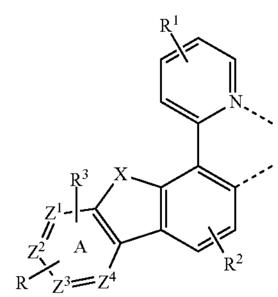

wherein R has the following structure and is fused to ring A:

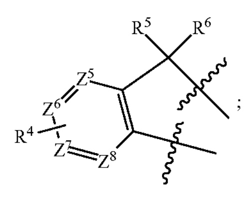

wherein each $Z^1$ to $Z^8$ is nitrogen or carbon;

wherein the wave lines indicate the bonds to two of the adjacent $Z^1$ to $Z^4$ of ring A;

wherein when two of the adjacent $Z^1$ to $Z^4$ are used to fuse to R, those two of the adjacent $Z^1$ to $Z^4$ are carbon;

wherein $R^1$ and $R^4$ each independently represent mono, di, tri, or tetra substitutions, or no substitution;

wherein $R^2$ and $R^3$ each independently represent mono, or di substitutions, or no substitution;

wherein X is O or S;

wherein $R^1$, $R^2$, $R^3$, $R^4$, $R^5$, and $R^6$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substituents are optionally joined to form a ring, which can be further substituted;

wherein the ligand $L_A$ is coordinated to a metal M; and wherein the ligand $L_A$ is optionally linked with other ligands to comprise a tridentate, tetradentate, pentadentate or hexadentate ligand.

The metal M is not particularly limited. Examples of metals useful in the compounds of the present invention include, but are not limited to, transition metals such as Ir, Pt, Au, Re, Ru, W, Rh, Ru, Os, Pd, Ag, Cu, Co, Zn, Ni, Pb, Al, and Ga. In one embodiment, M is selected from the group consisting of Ir, Rh, Re, Ru, Os, Pt, Au, and Cu. In one embodiment, M is Ir.

In one embodiment, the ligand $L_A$ is selected from the group consisting of

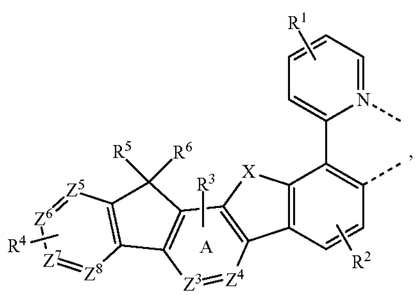

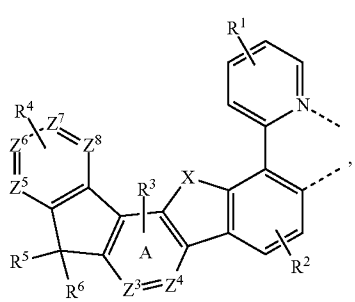

-continued

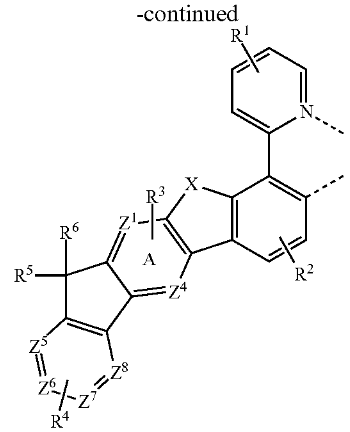

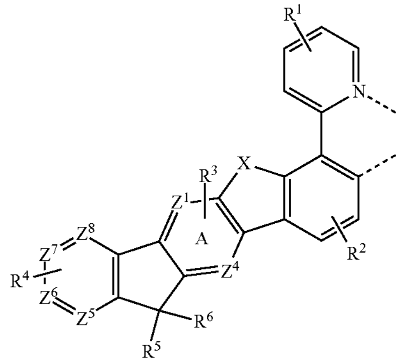

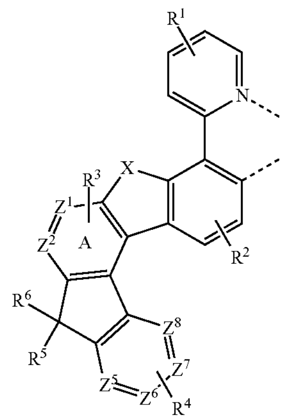

and

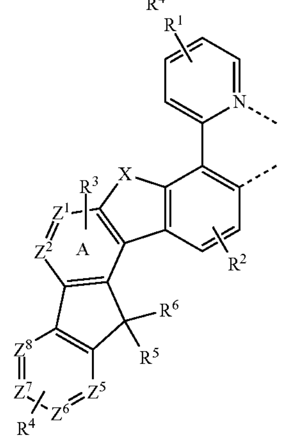

In one embodiment each of $Z^1$ to $Z^4$ is carbon. In another embodiment each of $Z^5$ to $Z^8$ is carbon. In another embodiment each of $Z^1$ to $Z^8$ is carbon. In yet another embodiment, at least one of $Z^5$ to $Z^8$ is nitrogen.

In one embodiment X is O. In another embodiment, X is S.

In one embodiment $R^5$ and $R^6$ are each independently selected from the group consisting of hydrogen, deuterium, alkyl, cycloalkyl, aryl, heteroaryl, and combinations thereof. In another embodiment, $R^5$ and $R^6$ are joined to form a ring.

In one embodiment, the ligand $L_A$ is selected from the group consisting of compounds $L_{A1}$ to $L_{A508}$:

$L_{A1}$

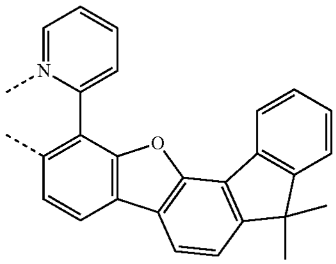

$L_{A2}$

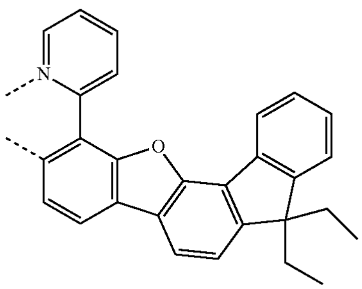

$L_{A3}$

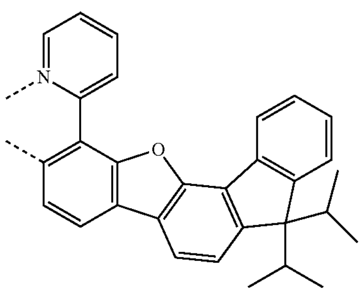

$L_{A4}$

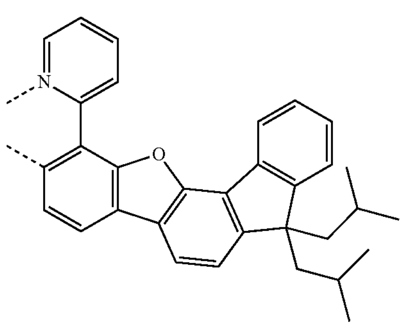

-continued $L_{A5}$

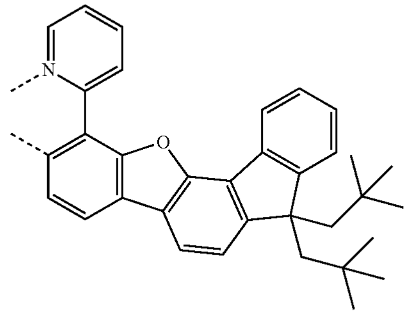

$L_{A6}$

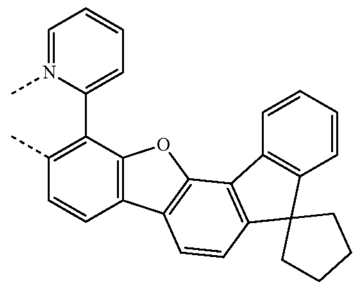

$L_{A7}$

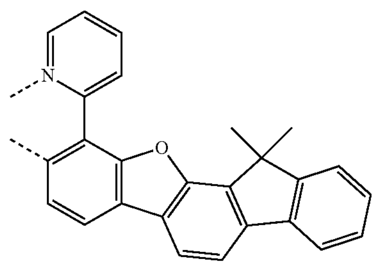

$L_{A8}$

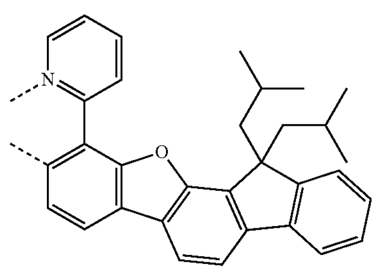

$L_{A9}$

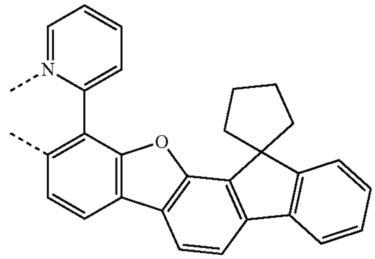

-continued
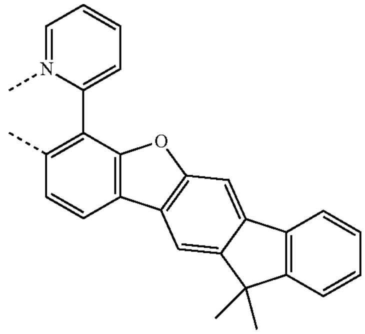
$L_{A10}$
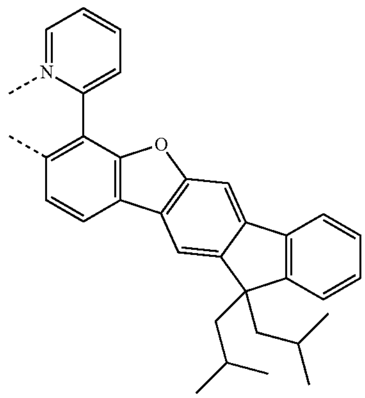
$L_{A11}$
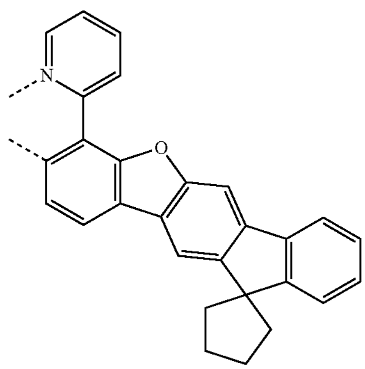
$L_{A12}$
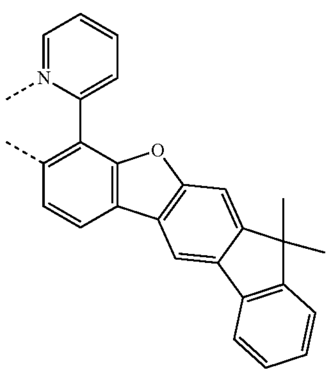
$L_{A13}$
-continued
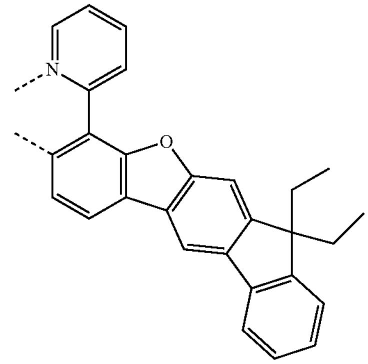
$L_{A14}$
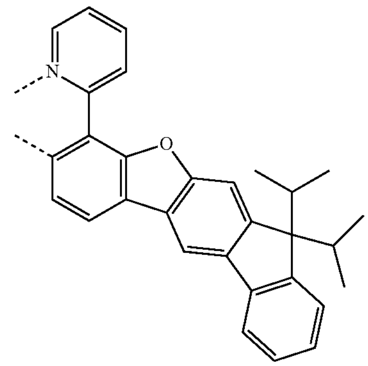
$L_{A15}$
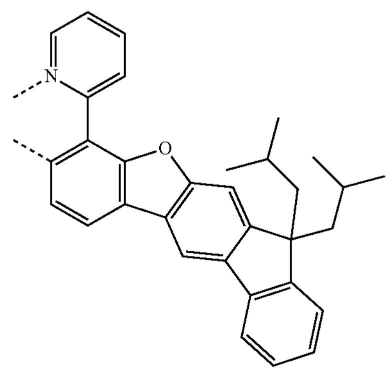
$L_{A16}$
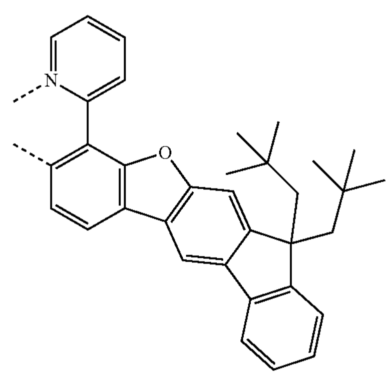
$L_{A17}$ -continued
$L_{A18}$
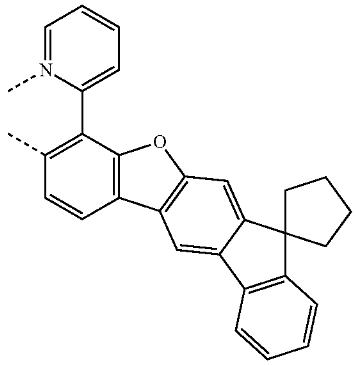
$L_{A19}$
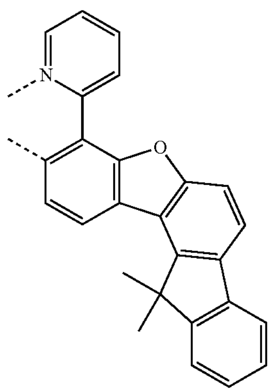
$L_{A20}$
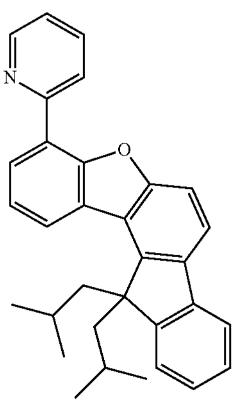
$L_{A21}$
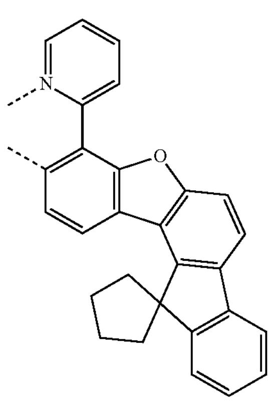
-continued
$L_{A22}$
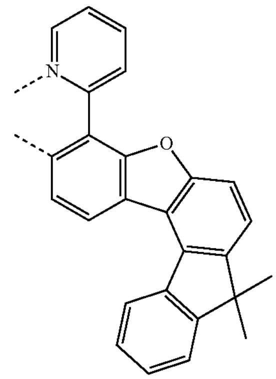
$L_{A23}$
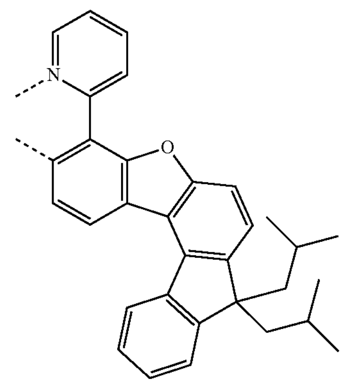
$L_{A24}$
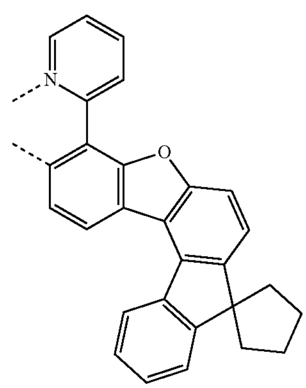
$L_{A25}$
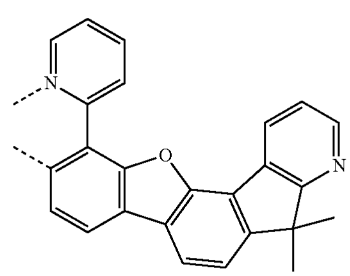

L$_{A26}$
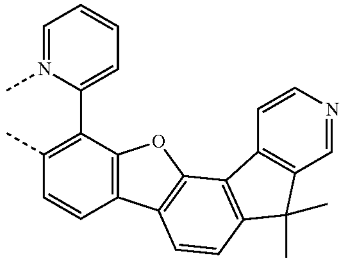
L$_{A27}$
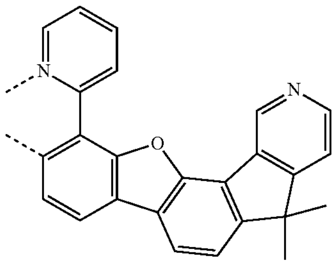
L$_{A28}$
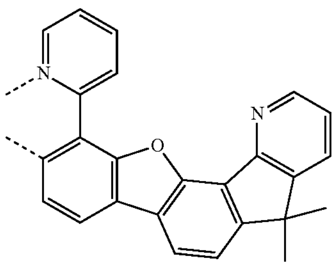
L$_{A29}$
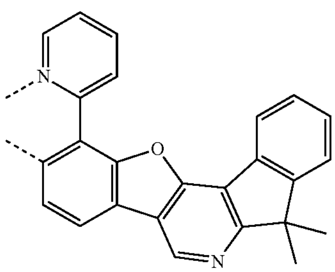
L$_{A30}$
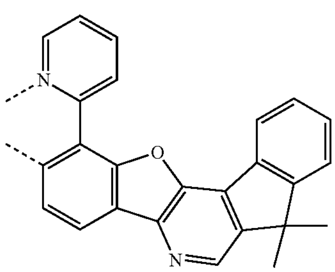
L$_{A31}$
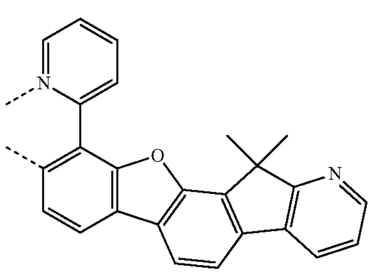
L$_{A32}$
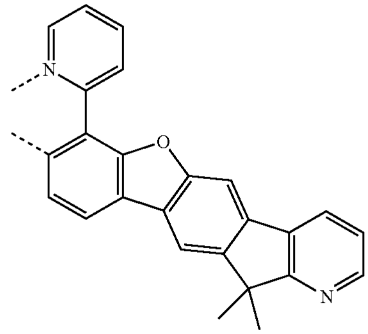
L$_{A33}$
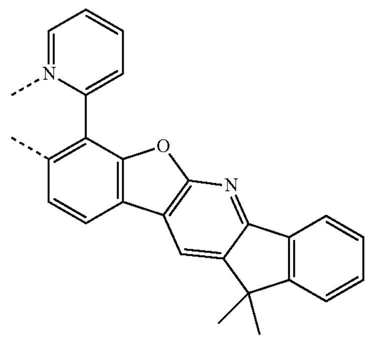
L$_{A34}$
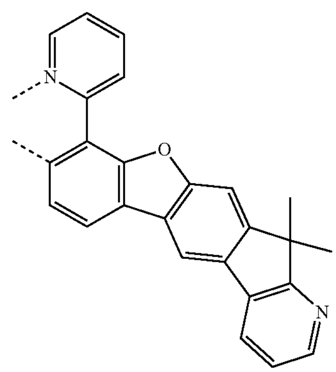
L$_{A35}$
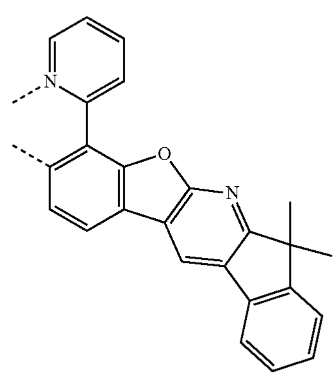

$L_{A36}$
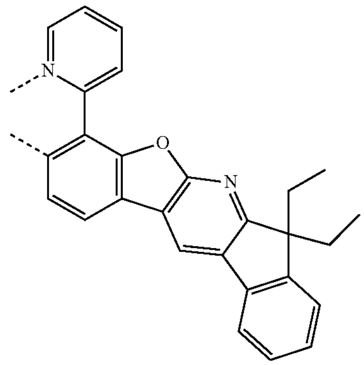
$L_{A37}$
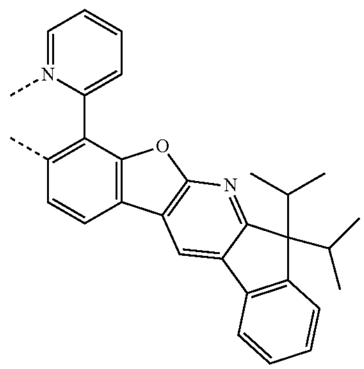
$L_{A38}$
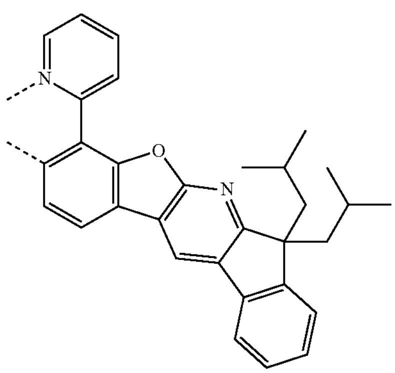
$L_{A39}$
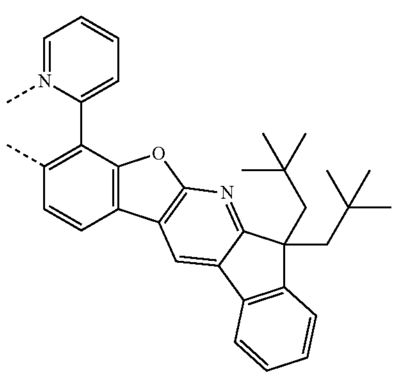
$L_{A40}$
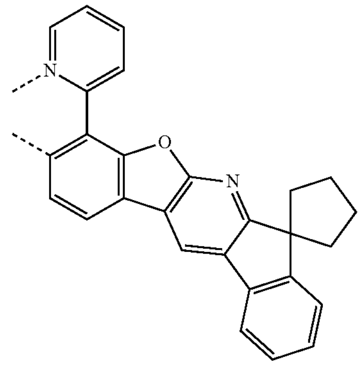
$L_{A41}$
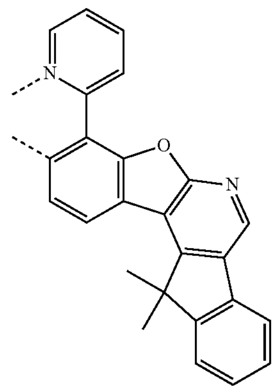
$L_{A42}$
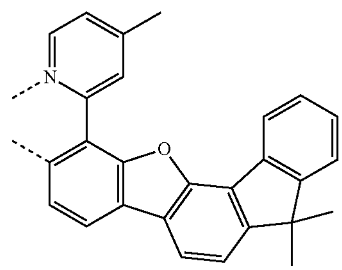
$L_{A43}$
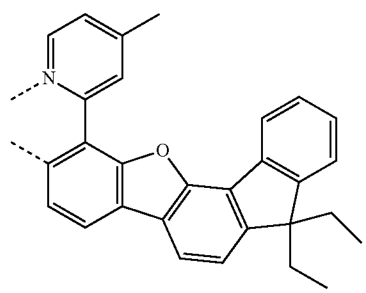
$L_{A44}$
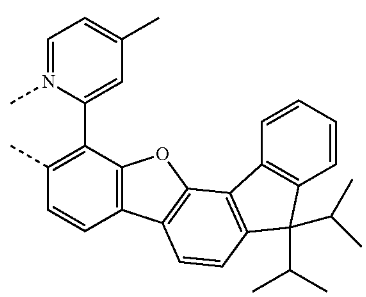

-continued
L$_{A45}$
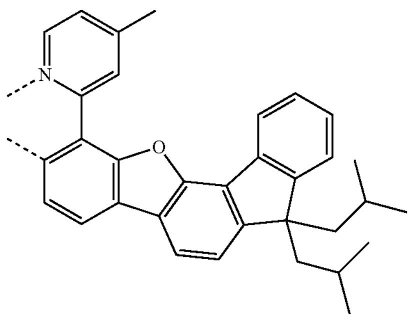
L$_{A46}$
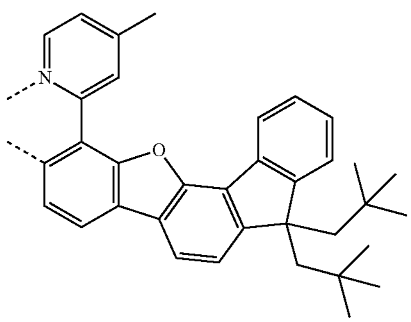
L$_{A47}$
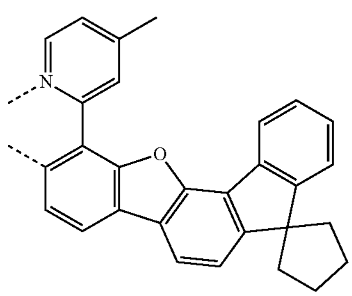
L$_{A48}$
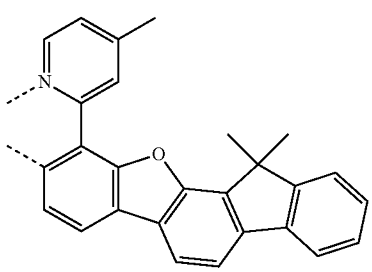
L$_{A49}$
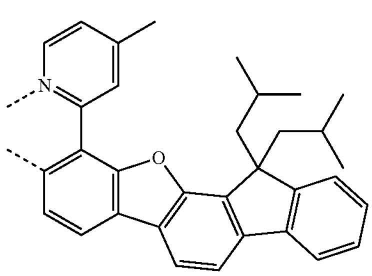
-continued
L$_{A50}$
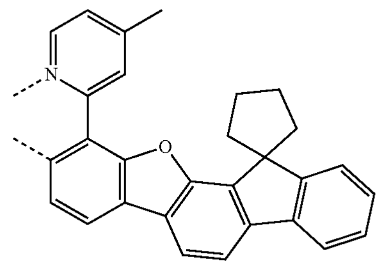
L$_{A51}$
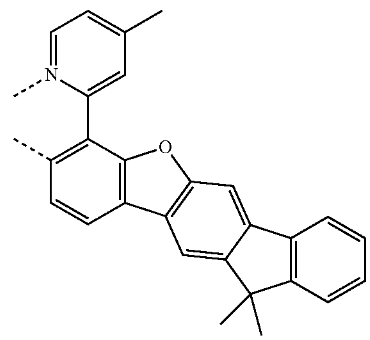
L$_{A52}$
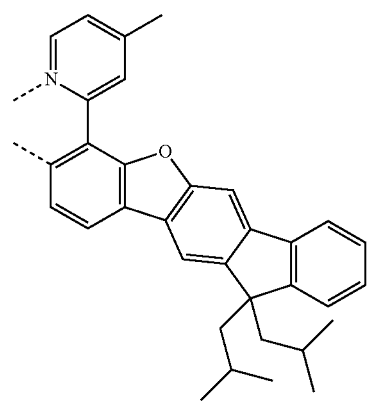
L$_{A53}$
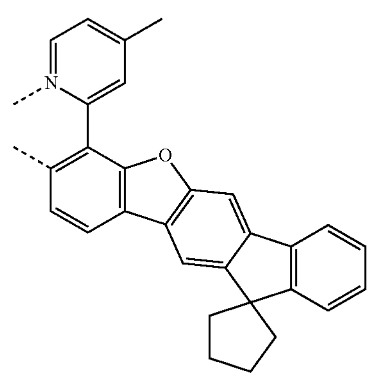

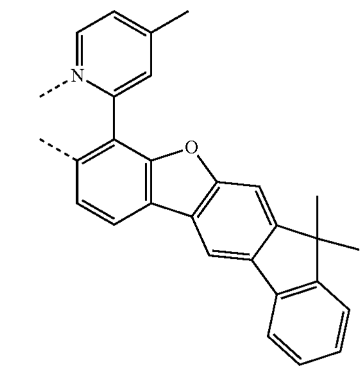
$L_{A54}$
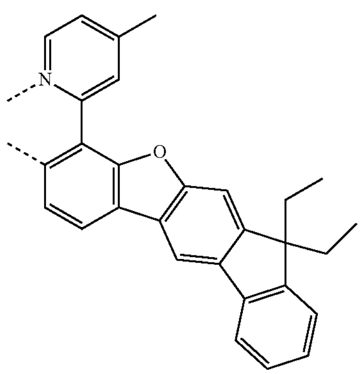
$L_{A55}$
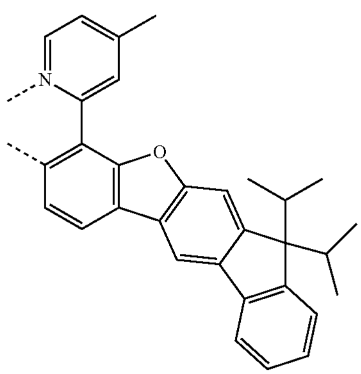
$L_{A56}$
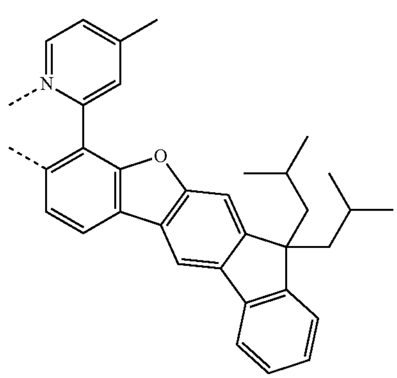
$L_{A57}$
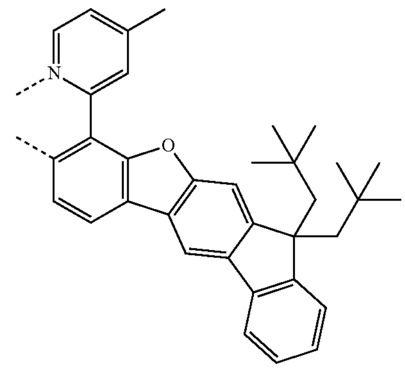
$L_{A58}$
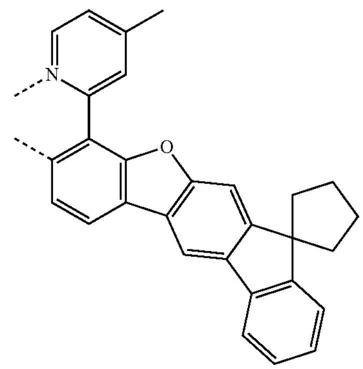
$L_{A59}$
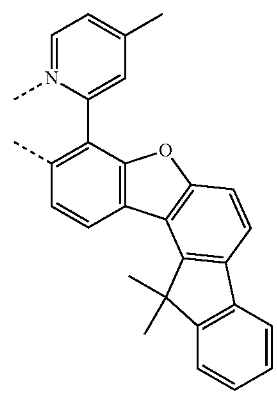
$L_{A60}$
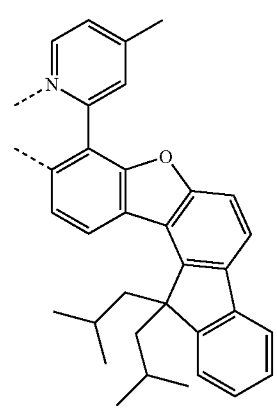
$L_{A61}$ -continued
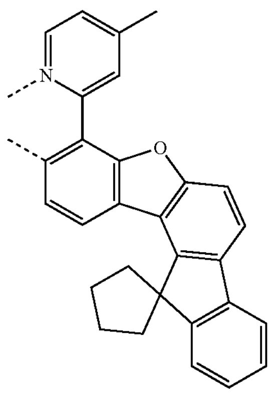
$L_{A62}$
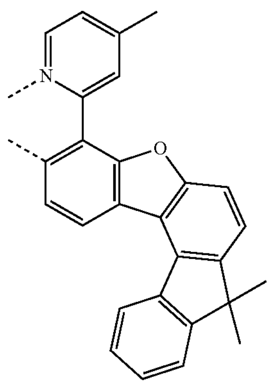
$L_{A63}$
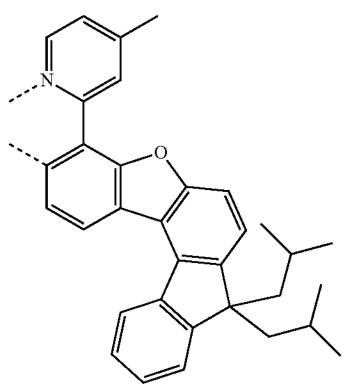
$L_{A64}$
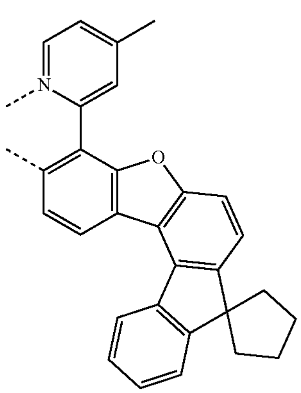
$L_{A65}$
-continued
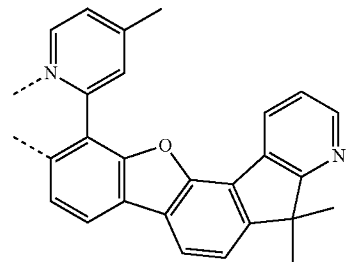
$L_{A66}$
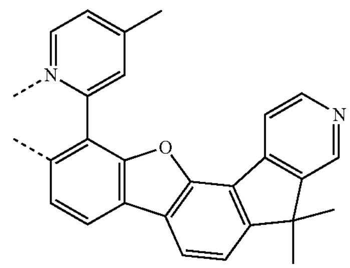
$L_{A67}$
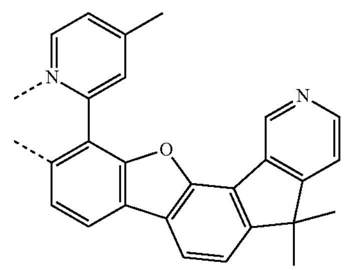
$L_{A68}$
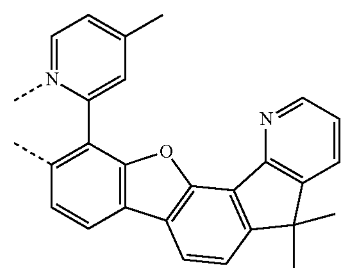
$L_{A69}$
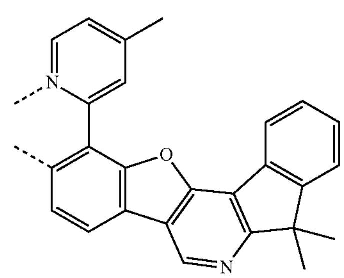
$L_{A70}$
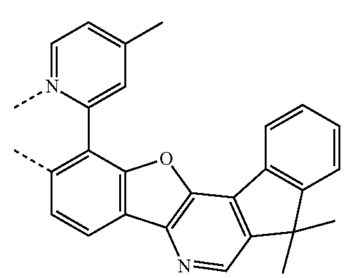
$L_{A71}$ -continued
$L_{A72}$
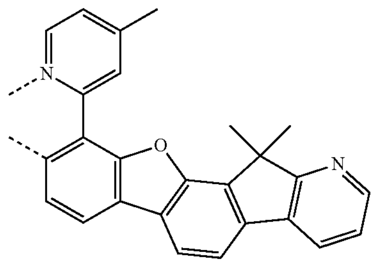
$L_{A73}$
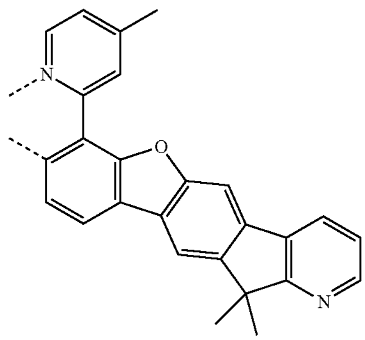
$L_{A74}$
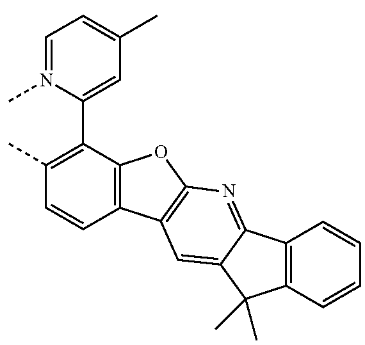
$L_{A75}$
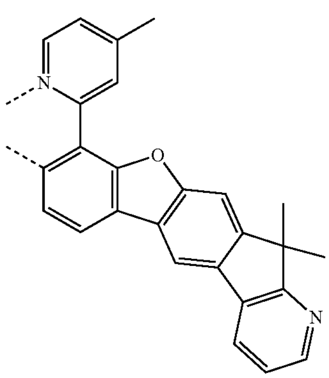
-continued
$L_{A76}$
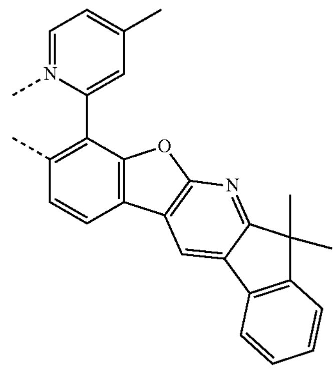
$L_{A77}$
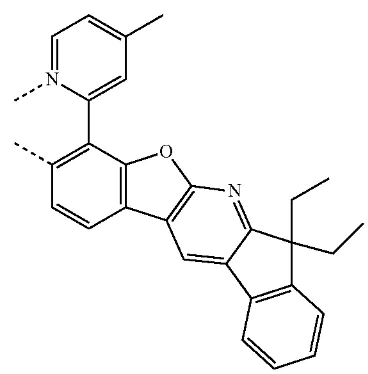
$L_{A78}$
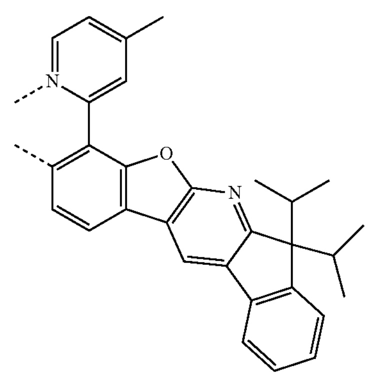
$L_{A79}$
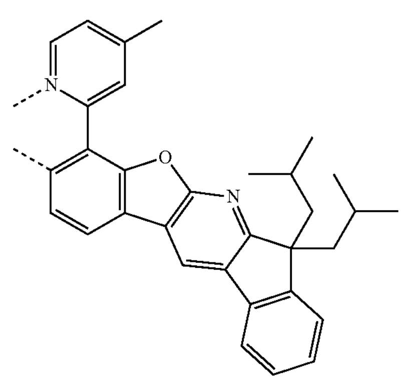

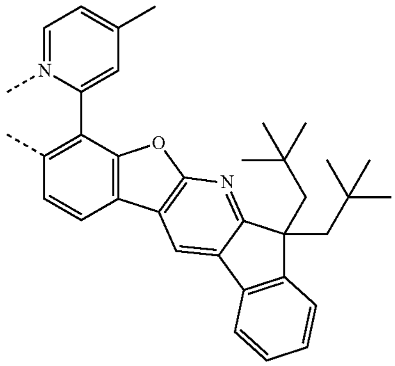
$L_{A80}$
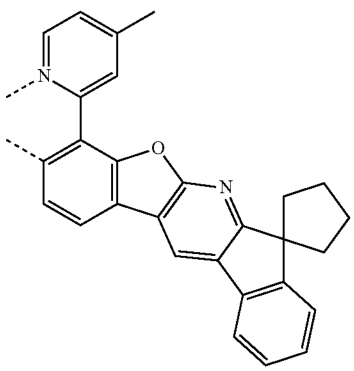
$L_{A81}$
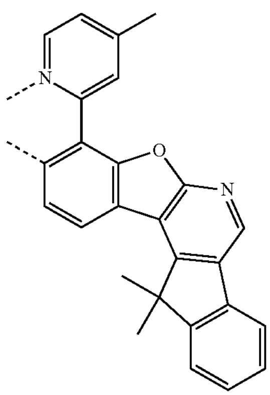
$L_{A82}$
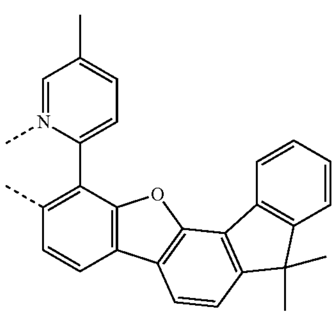
$L_{A83}$
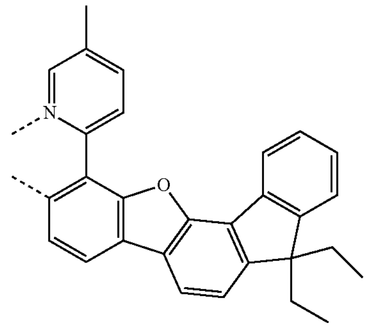
$L_{A84}$
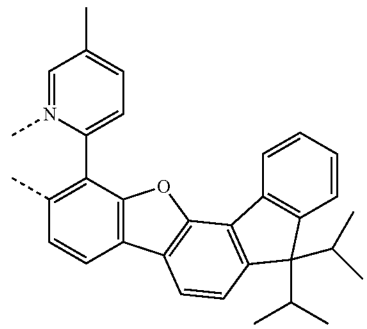
$L_{A85}$
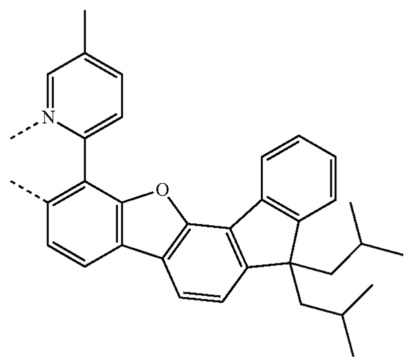
$L_{A86}$
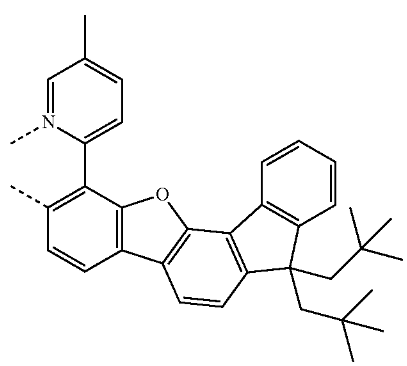
$L_{A87}$ -continued
$L_{A88}$
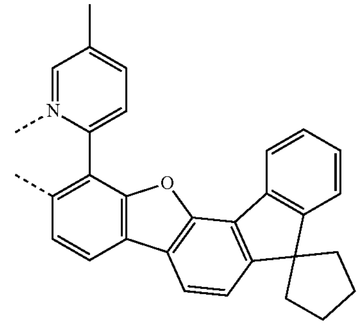
$L_{A89}$
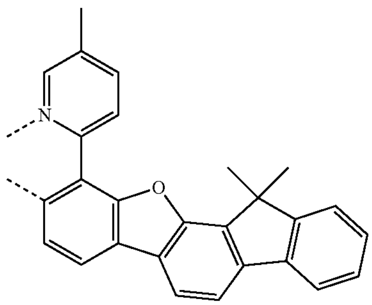
$L_{A90}$
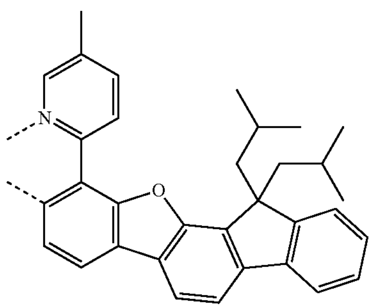
$L_{A91}$
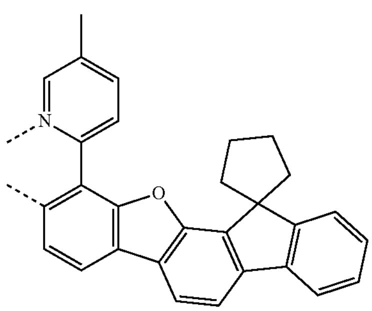
$L_{A92}$
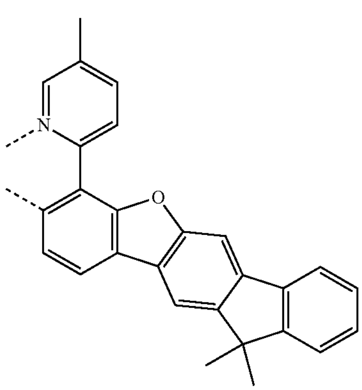
-continued
$L_{A93}$
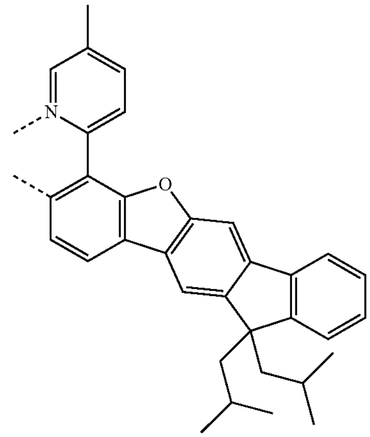
$L_{A94}$
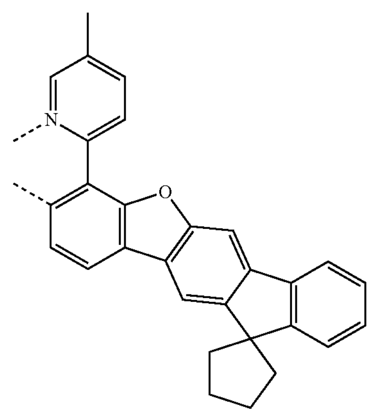
$L_{A95}$
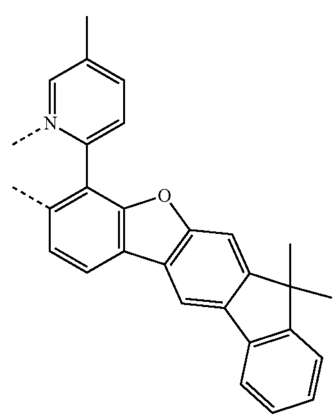

-continued
$L_{A96}$
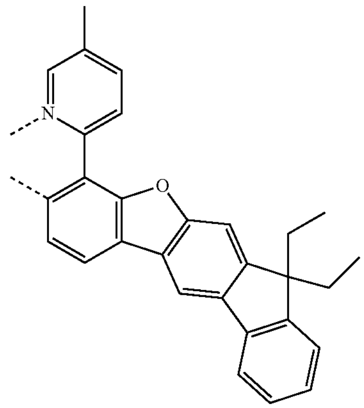
$L_{A97}$
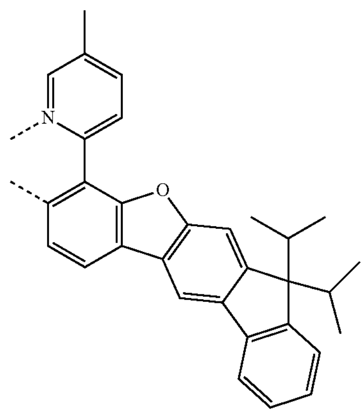
$L_{A98}$
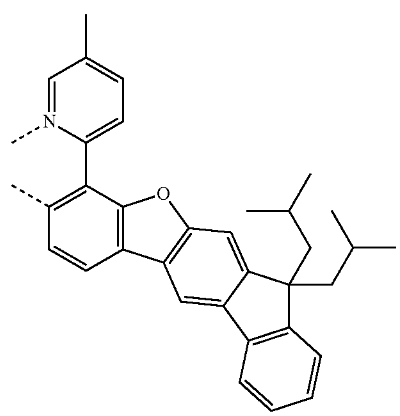
$L_{A99}$
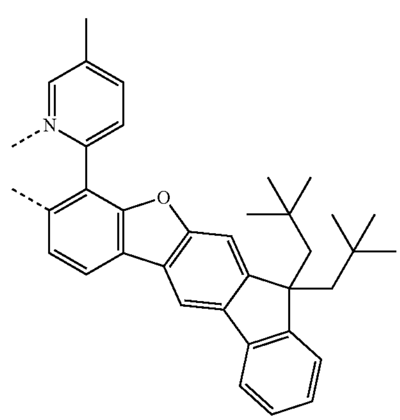
-continued
$L_{A100}$
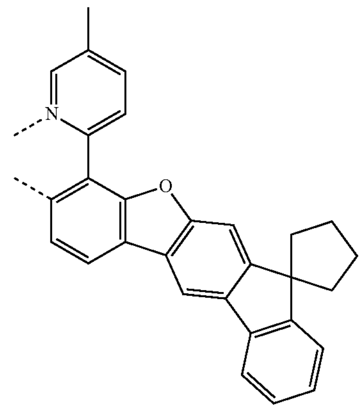
$L_{A101}$
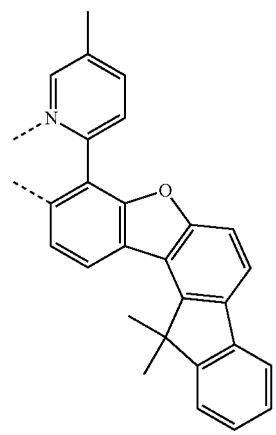
$L_{A102}$
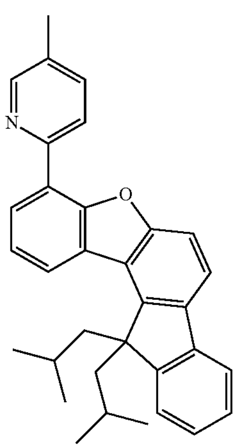

-continued
L$_{A103}$
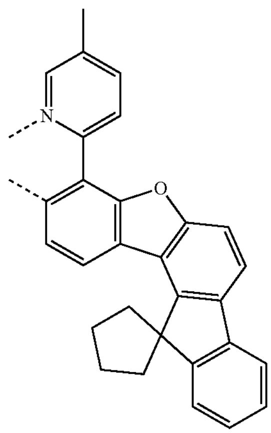
L$_{A104}$
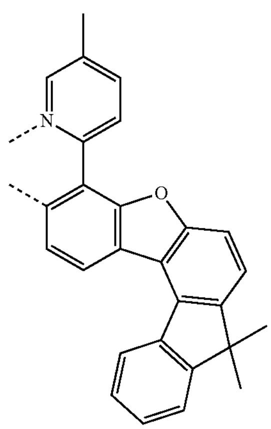
L$_{A105}$
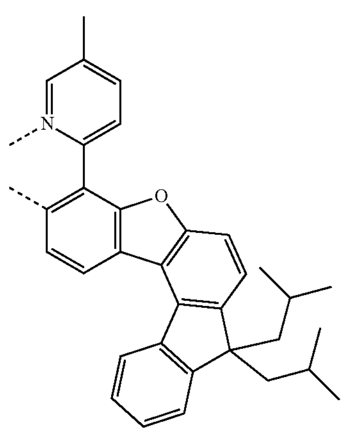
-continued
L$_{A106}$
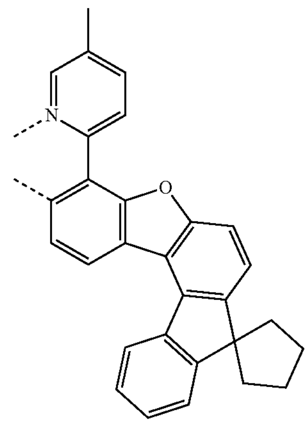
L$_{A107}$
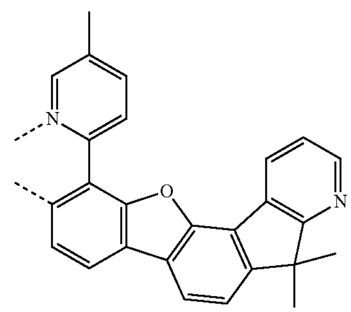
L$_{A108}$
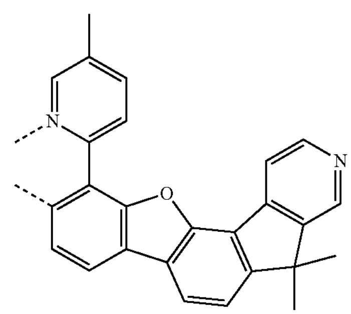
L$_{A109}$
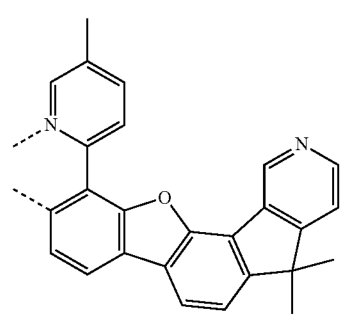

-continued
$L_{A110}$
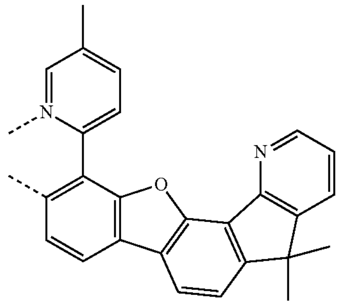
$L_{A111}$
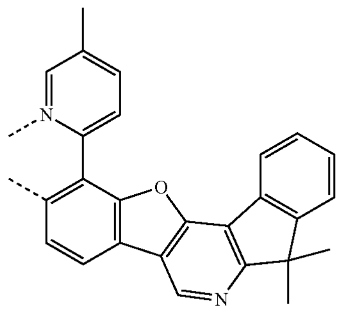
$L_{A112}$
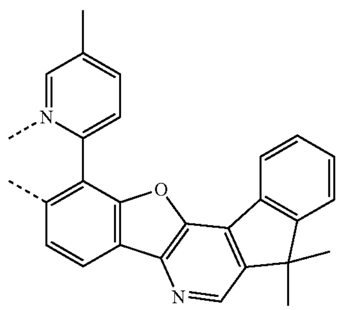
$L_{A113}$
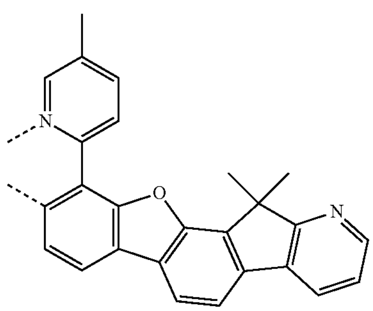
$L_{A114}$
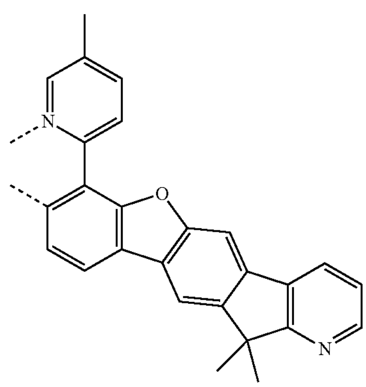
-continued
$L_{A115}$
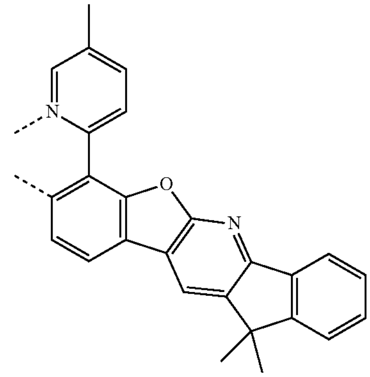
$L_{A116}$
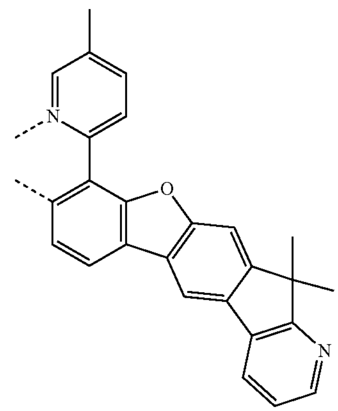
$L_{A117}$
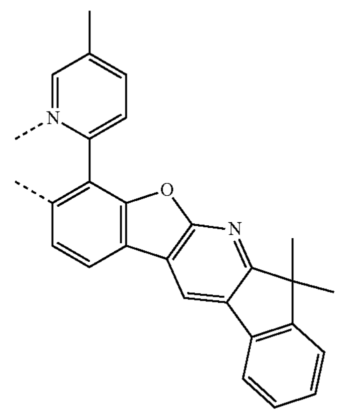
$L_{A118}$
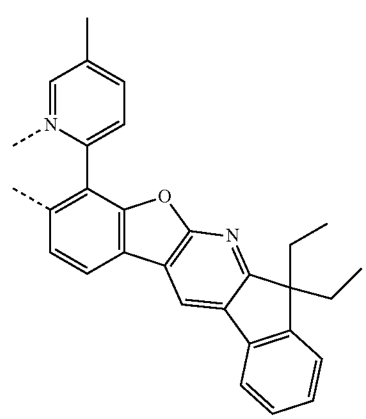

$L_{A119}$
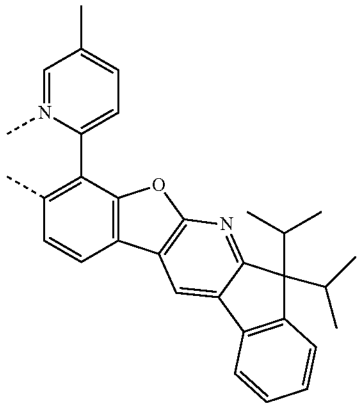
$L_{A120}$
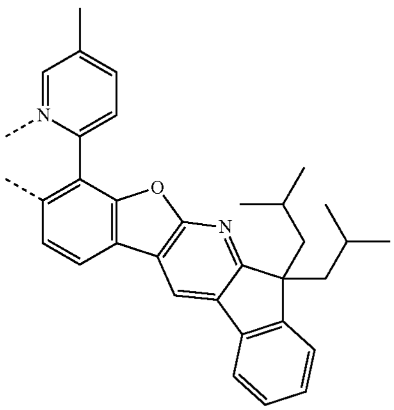
$L_{A121}$
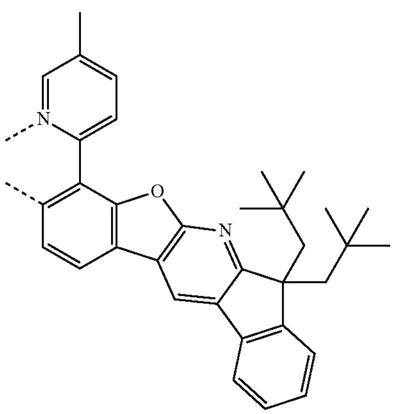
$L_{A122}$
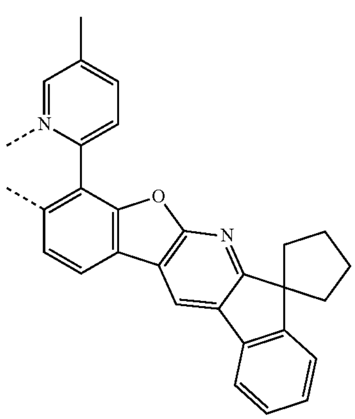
$L_{A123}$
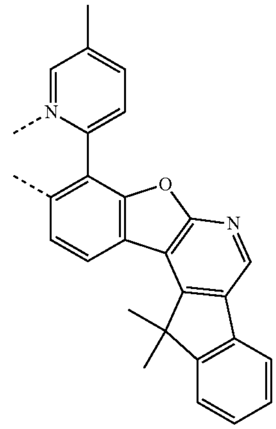
$L_{A124}$
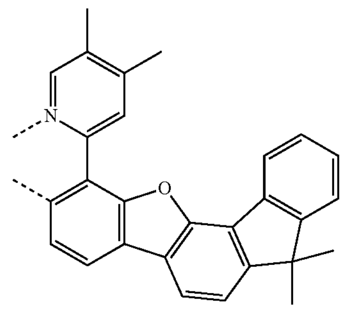
$L_{A125}$
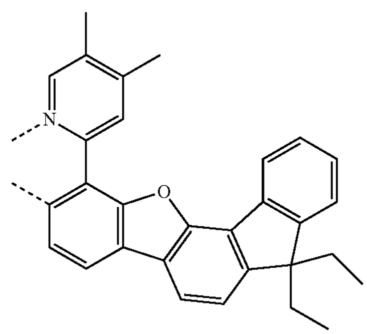
$L_{A126}$
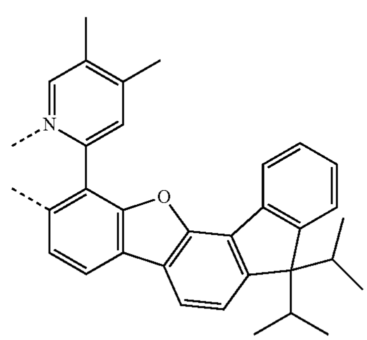

-continued
$L_{A127}$
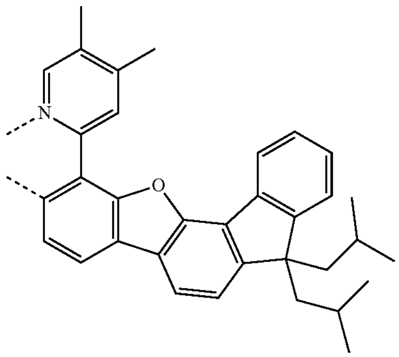
$L_{A128}$
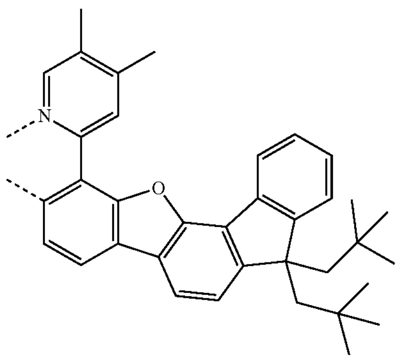
$L_{A129}$
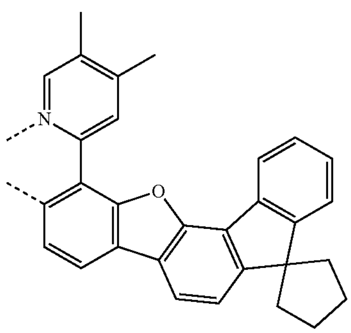
$L_{A130}$
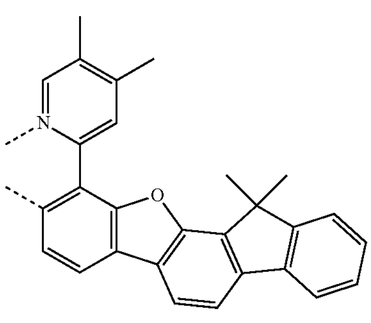
-continued
$L_{A131}$
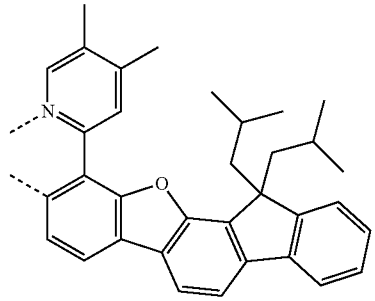
$L_{A132}$
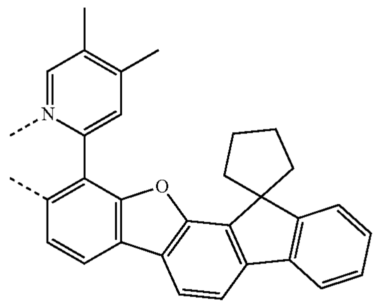
$L_{A133}$
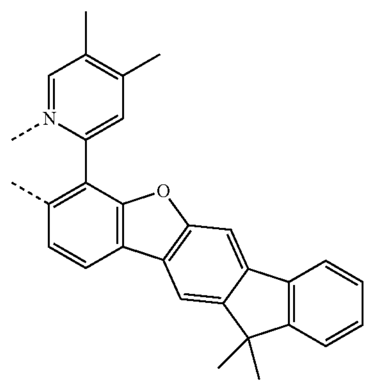
$L_{A134}$
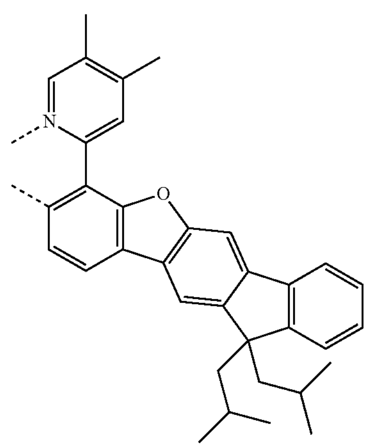

-continued
$L_{A135}$
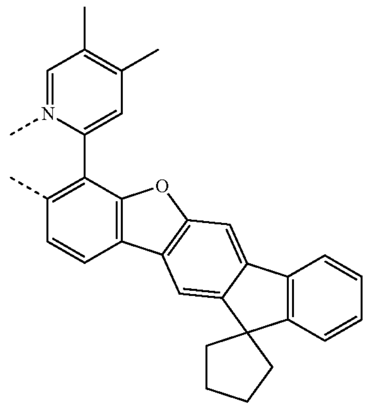
$L_{A136}$
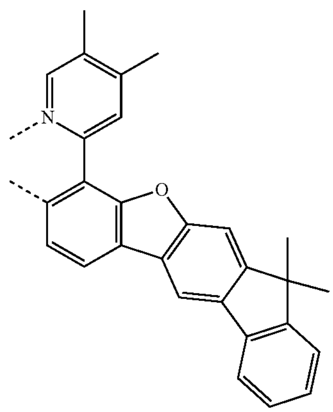
$L_{A137}$
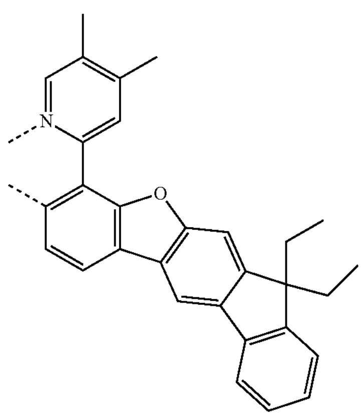
$L_{A138}$
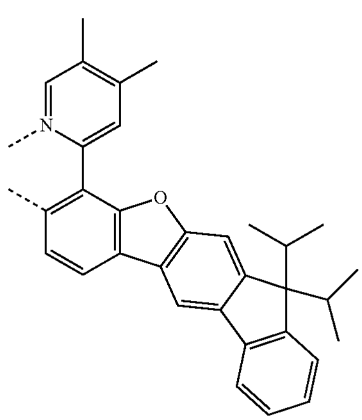
-continued
$L_{A139}$
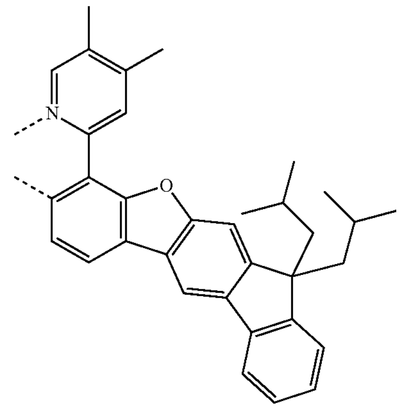
$L_{A140}$
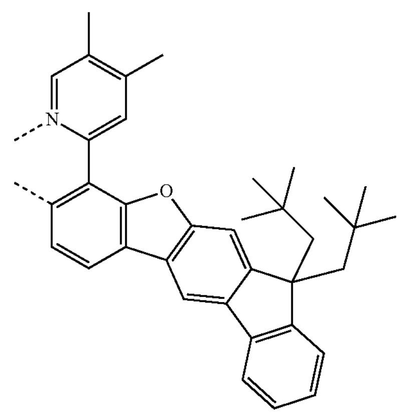
$L_{A141}$
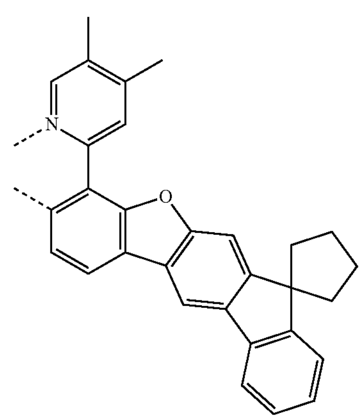

-continued
$L_{A142}$
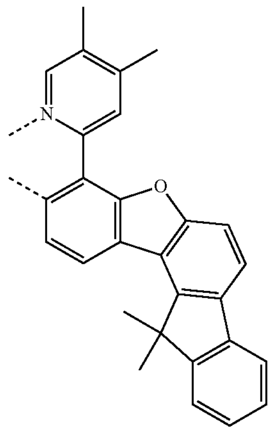
$L_{A143}$
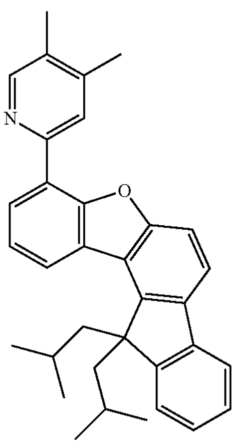
$L_{A144}$
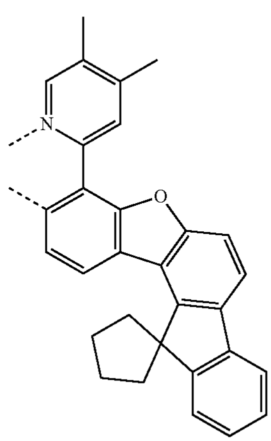
-continued
$L_{A145}$
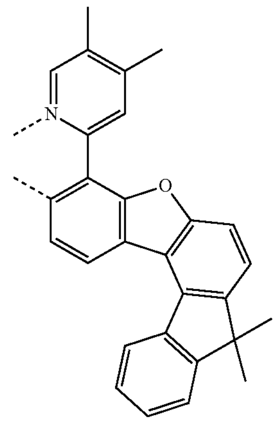
$L_{A146}$
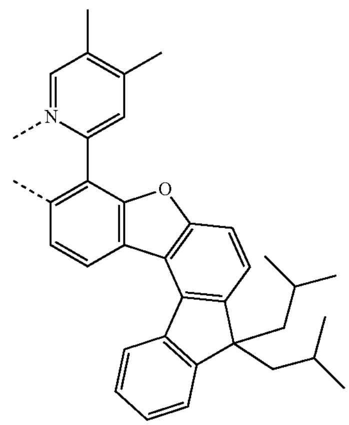
$L_{A147}$
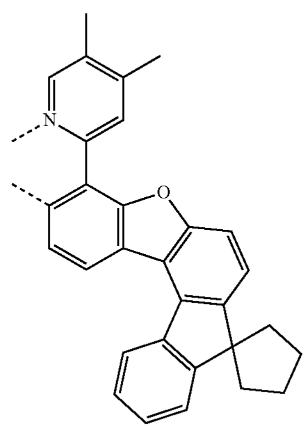
$L_{A148}$
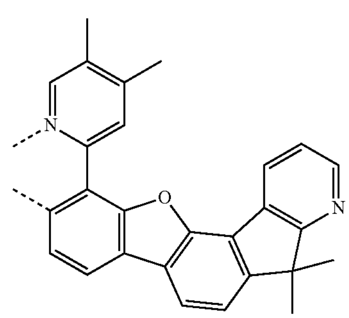

-continued
$L_{A149}$
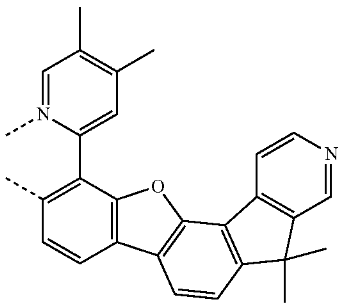
$L_{A150}$
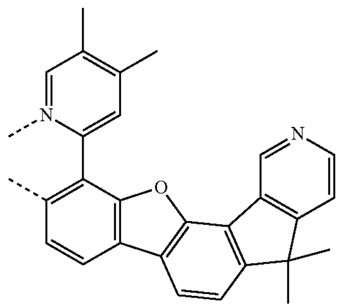
$L_{A151}$
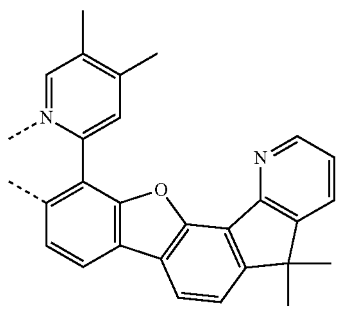
$L_{A152}$
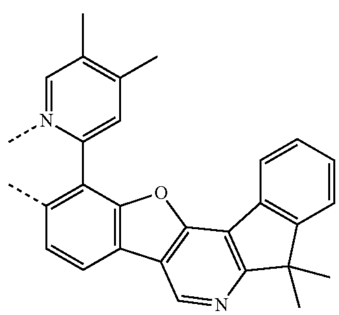
$L_{A153}$
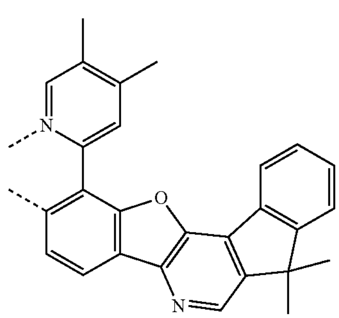
-continued
$L_{A154}$
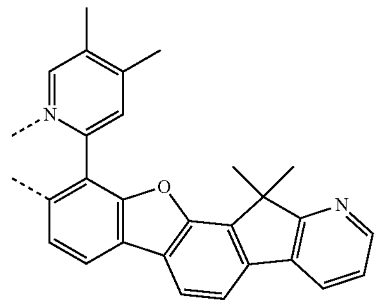
$L_{A155}$
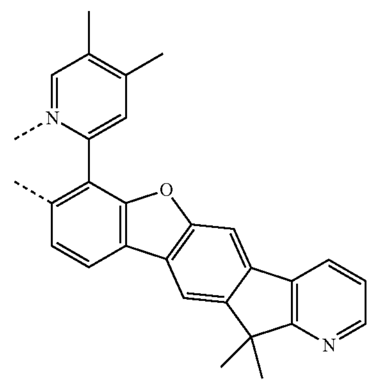
$L_{A156}$
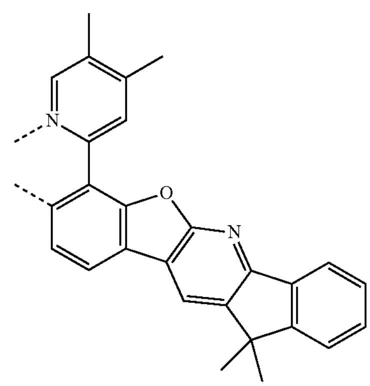
$L_{A157}$
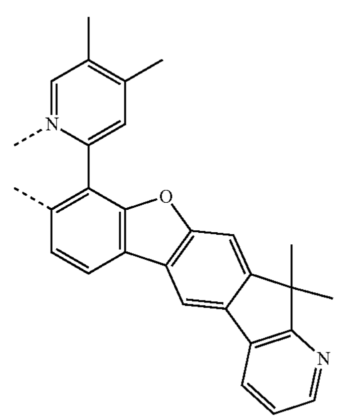

-continued
$L_{A158}$
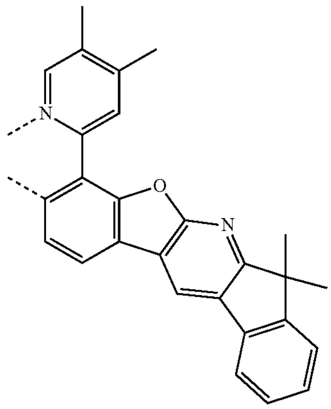
$L_{A159}$
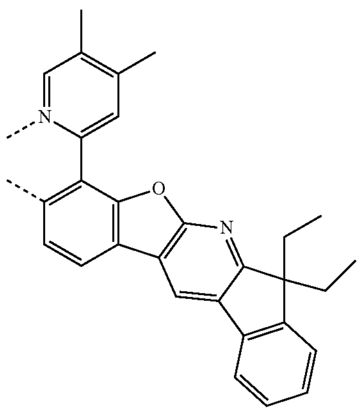
$L_{A160}$
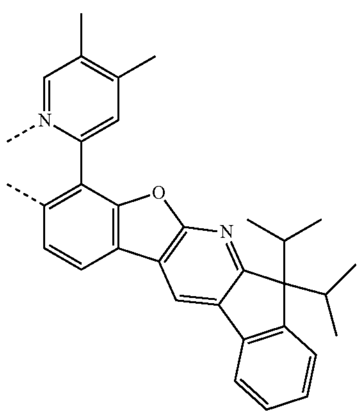
$L_{A161}$
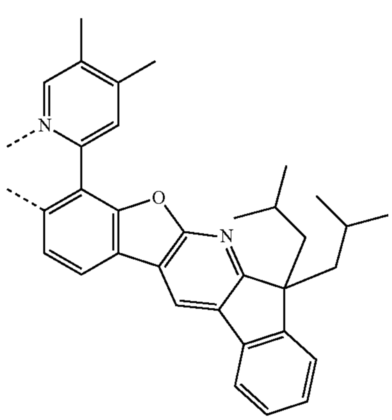
-continued
$L_{A162}$
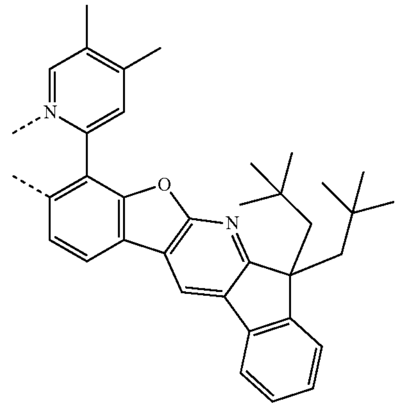
$L_{A163}$
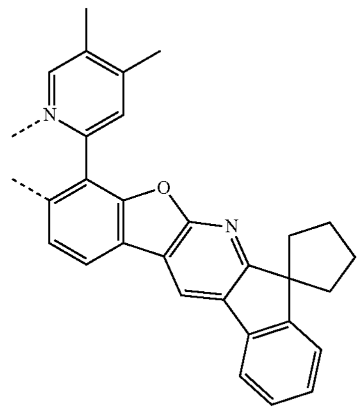
$L_{A164}$
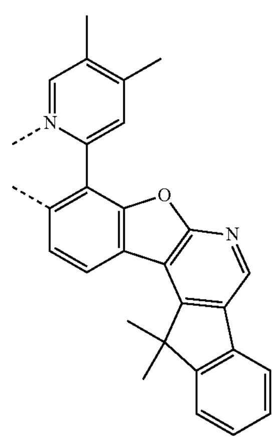
$L_{A165}$
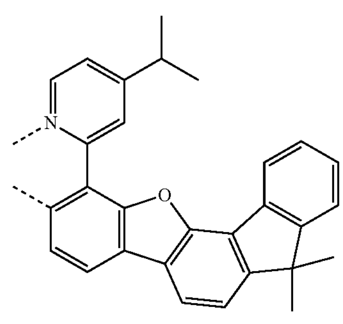

-continued
$L_{A166}$
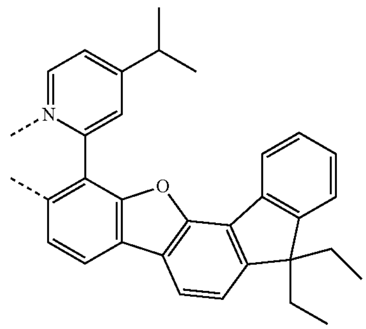
$L_{A167}$
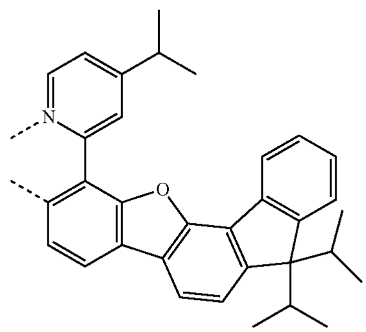
$L_{A168}$
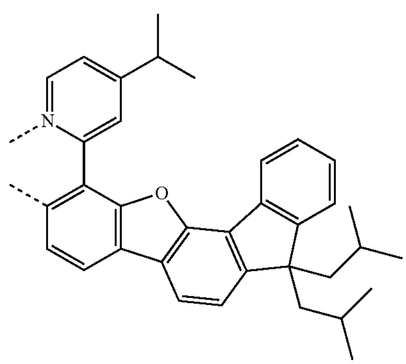
$L_{A169}$
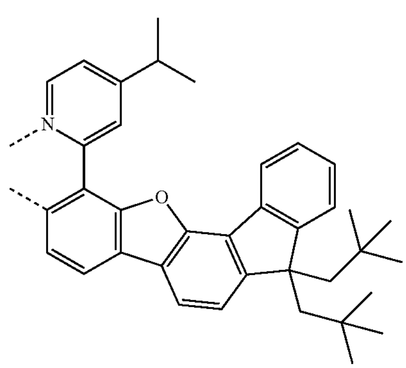
-continued
$L_{A170}$
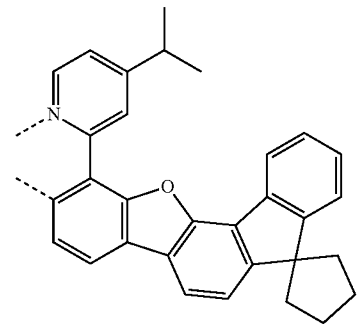
$L_{A171}$
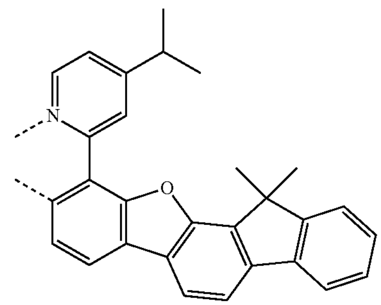
$L_{A172}$
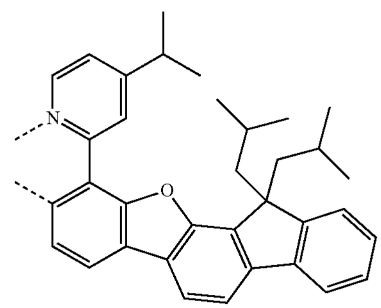
$L_{A173}$
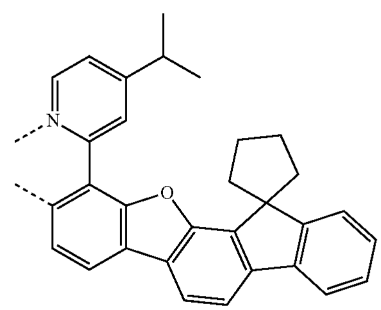
$L_{A174}$
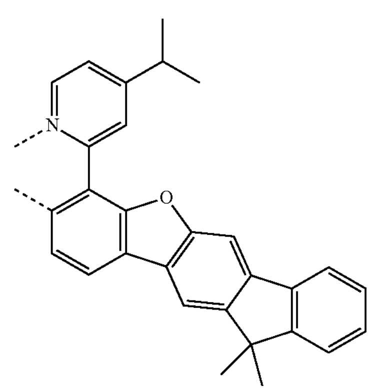

$L_{A175}$
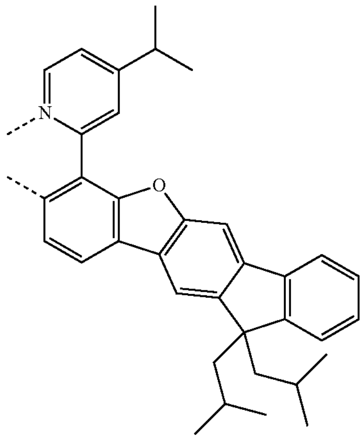
$L_{A176}$
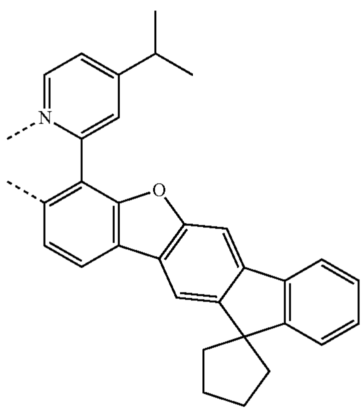
$L_{A177}$
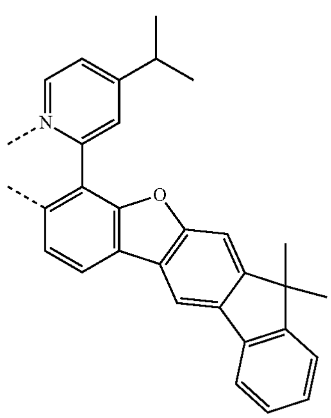
$L_{A178}$
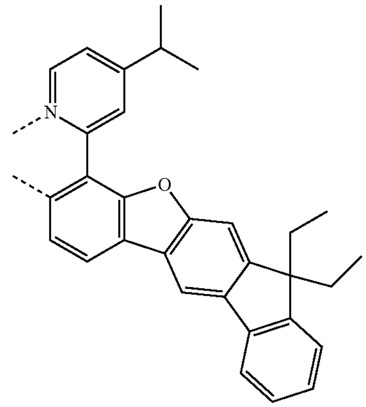
$L_{A179}$
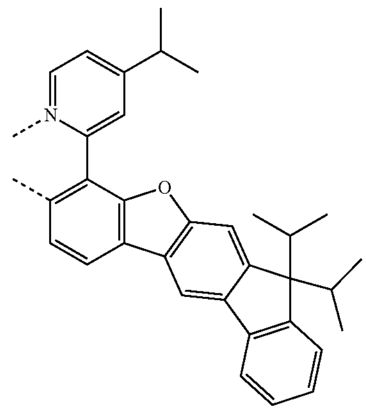
$L_{A180}$
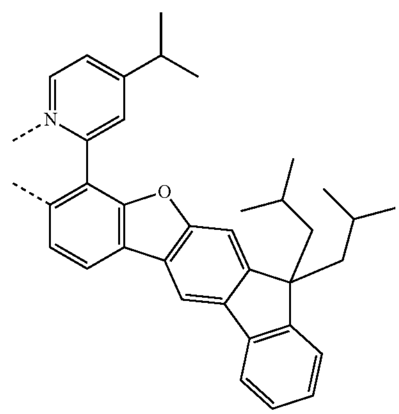
$L_{A181}$
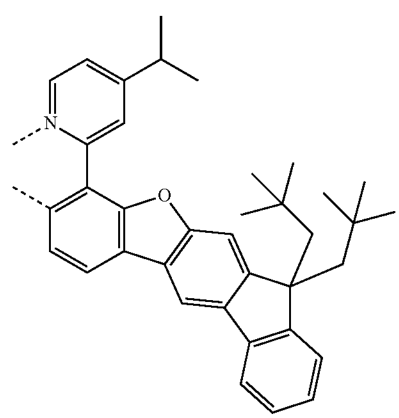

$L_{A182}$
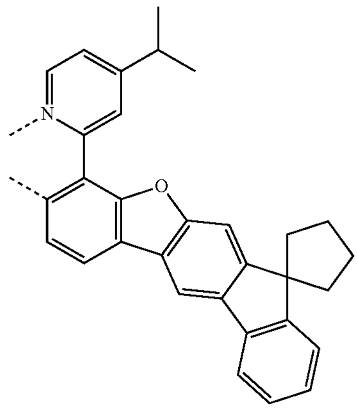
$L_{A183}$
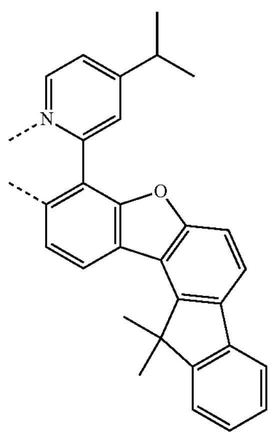
$L_{A184}$
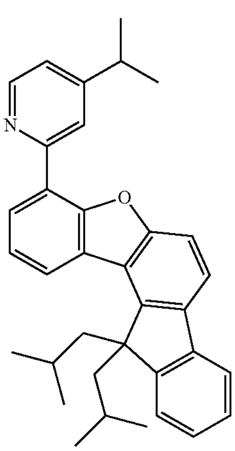
$L_{A185}$
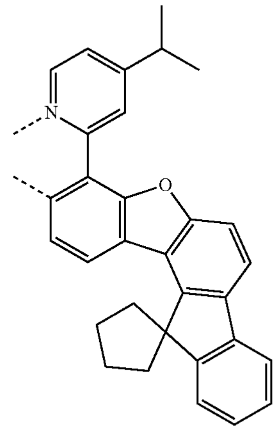
$L_{A186}$
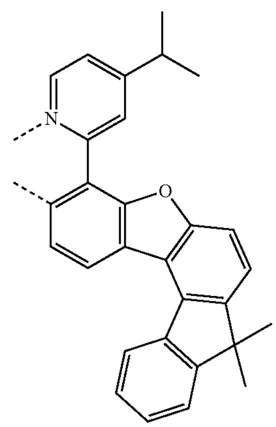
$L_{A187}$
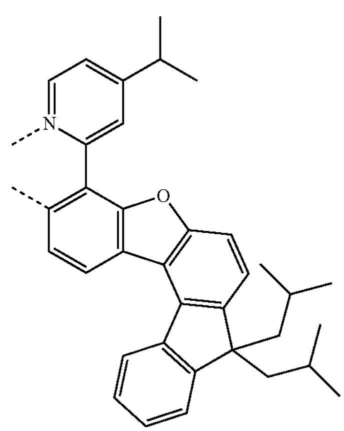

-continued
$L_{A188}$
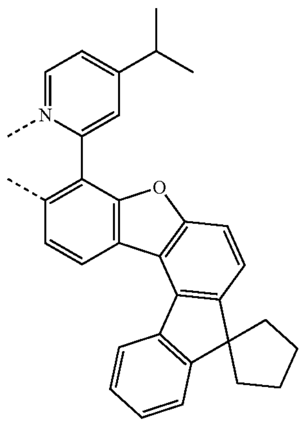
$L_{A189}$
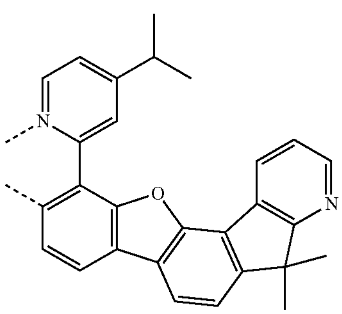
$L_{A190}$
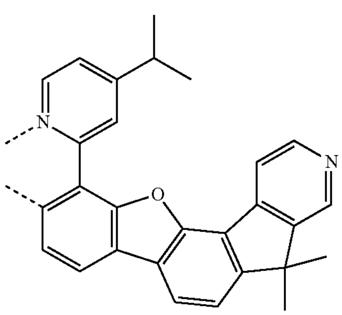
$L_{A191}$
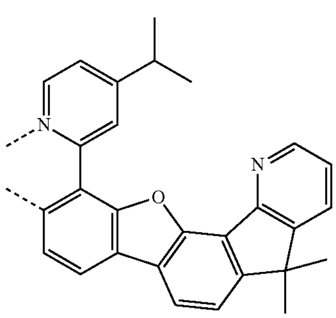
-continued
$L_{A192}$
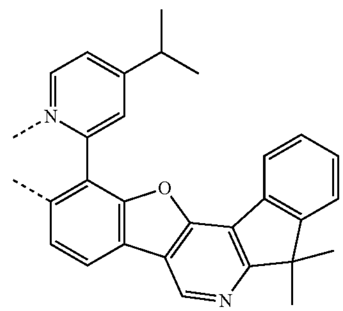
$L_{A193}$
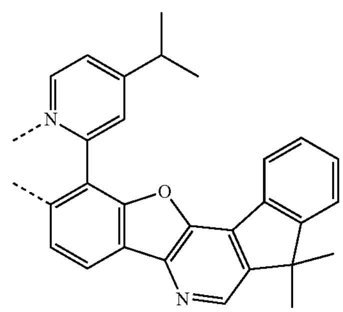
$L_{A194}$
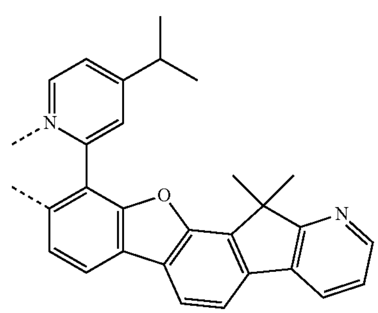
$L_{A195}$
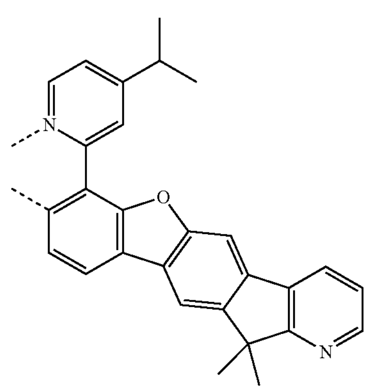

$L_{A196}$
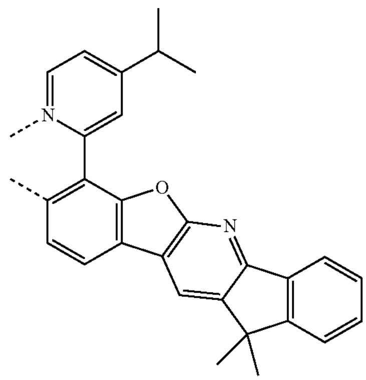
$L_{A197}$
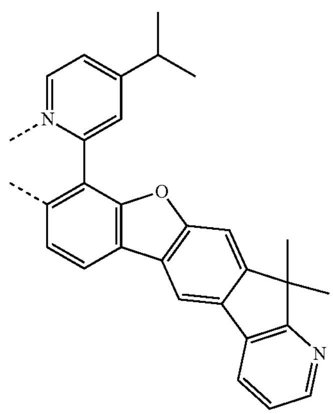
$L_{A198}$
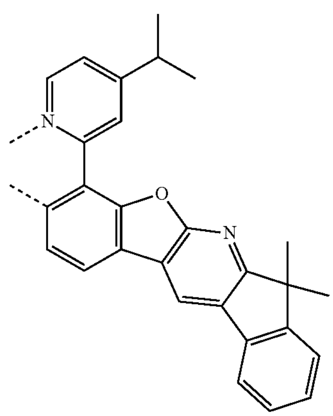
$L_{A199}$
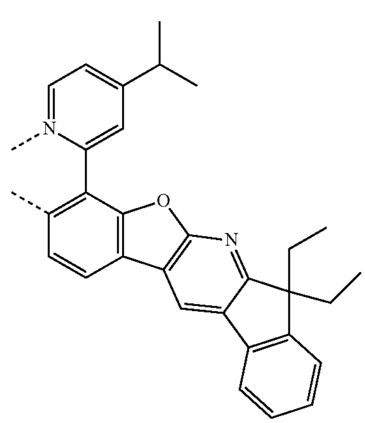
$L_{A200}$
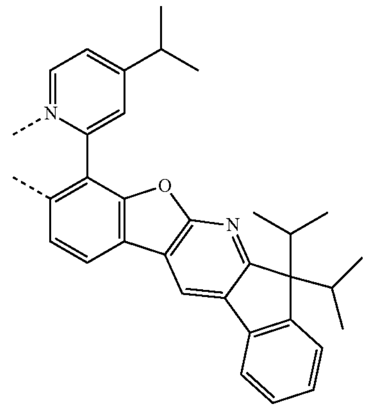
$L_{A201}$
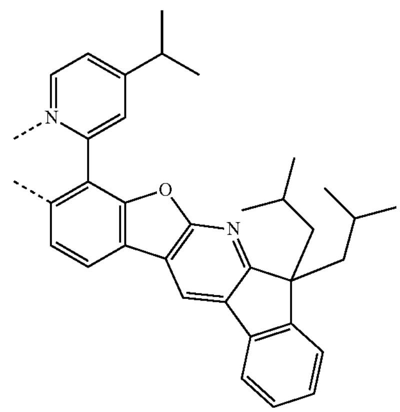
$L_{A202}$
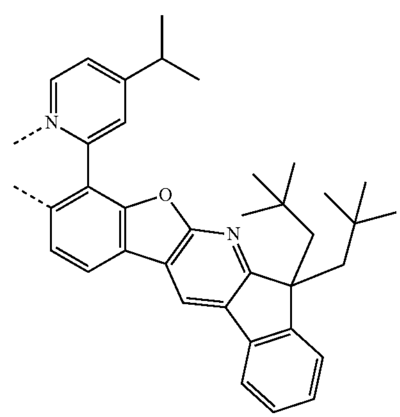
$L_{A203}$
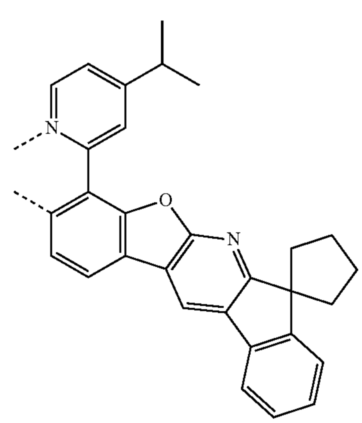

-continued
$L_{A204}$
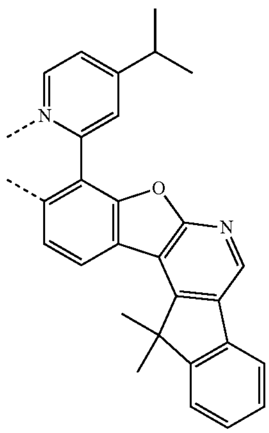
$L_{A205}$
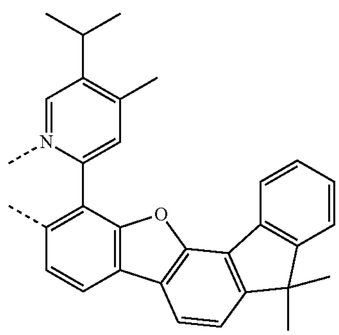
$L_{A206}$
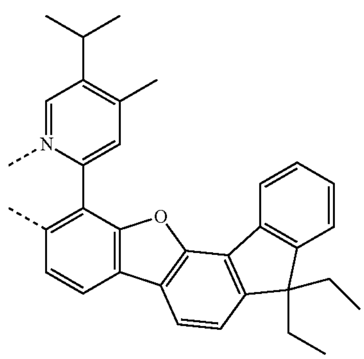
$L_{A207}$
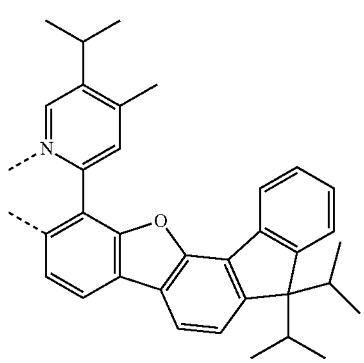
-continued
$L_{A208}$
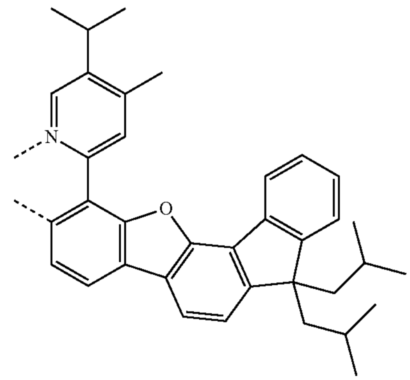
$L_{A209}$
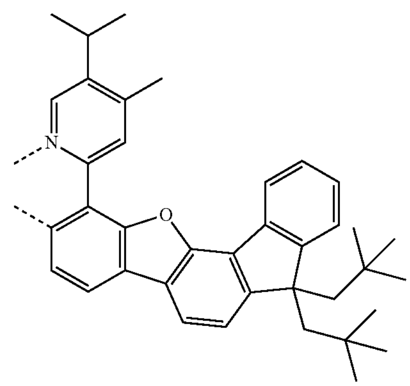
$L_{A210}$
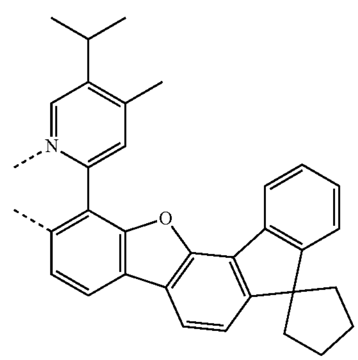
$L_{A211}$
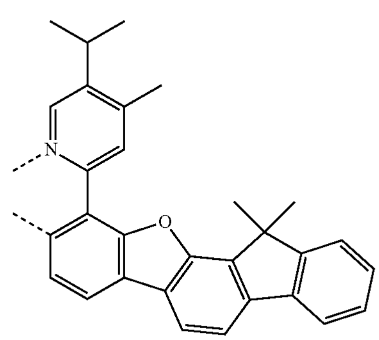

-continued
$L_{A212}$
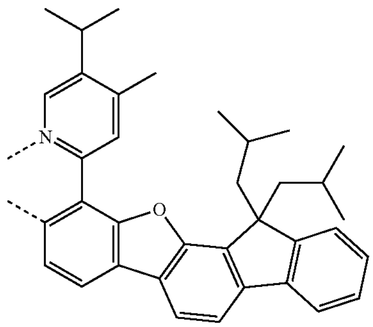
$L_{A213}$
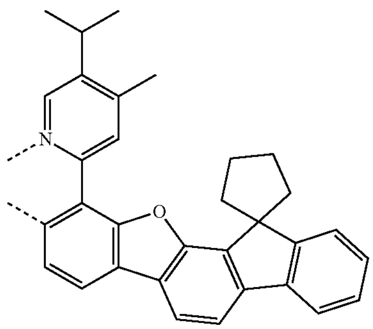
$L_{A214}$
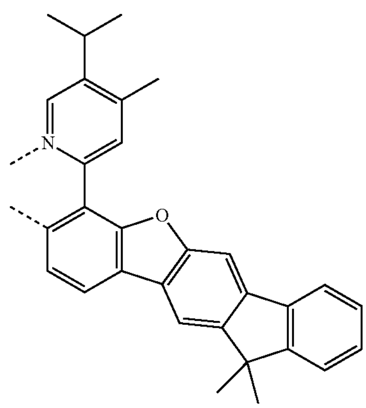
$L_{A215}$
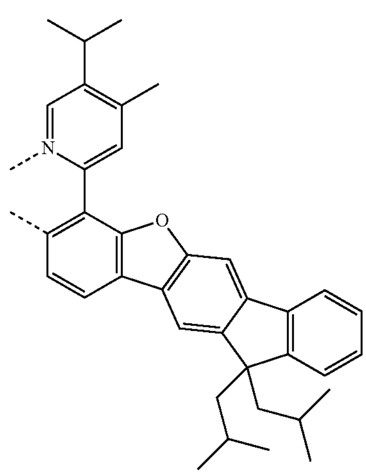
-continued
$L_{A216}$
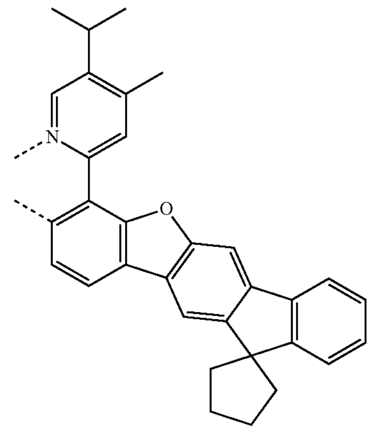
$L_{A217}$
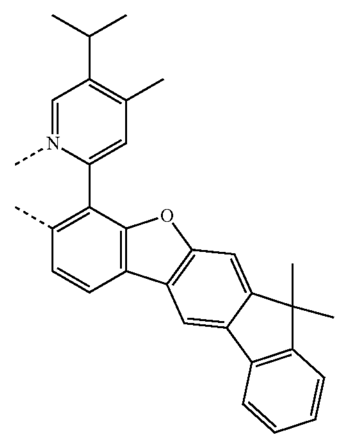
$L_{A218}$
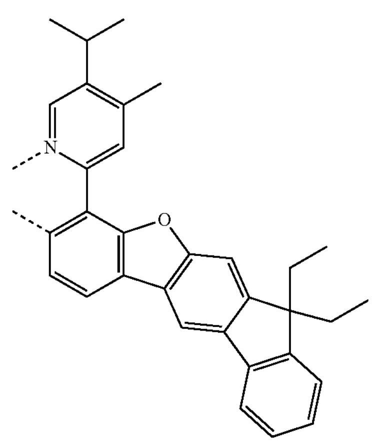

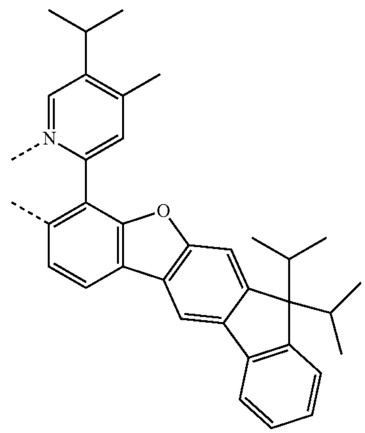
$L_{A219}$
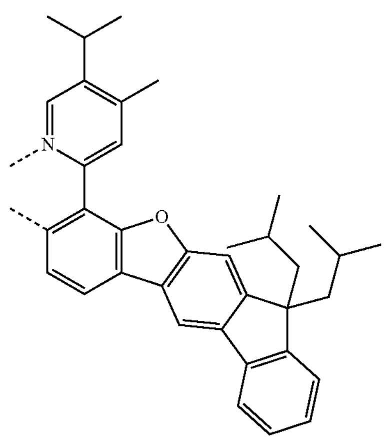
$L_{A220}$
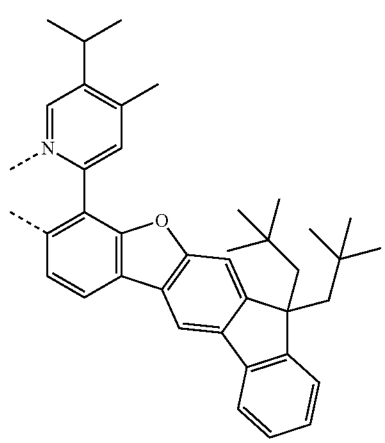
$L_{A221}$
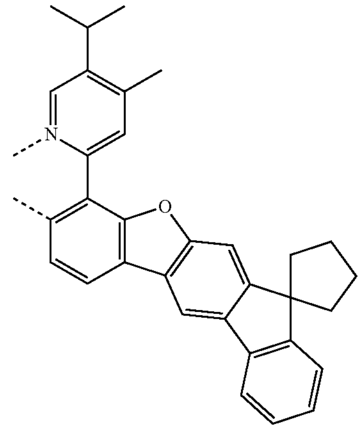
$L_{A222}$
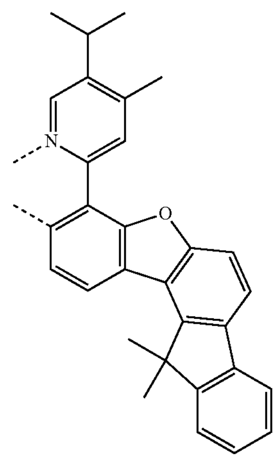
$L_{A223}$
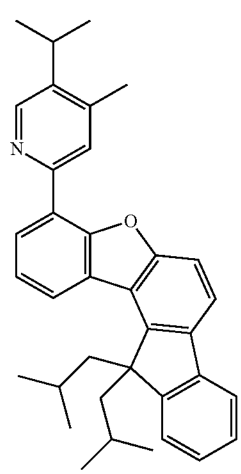
$L_{A224}$ -continued
$L_{A225}$
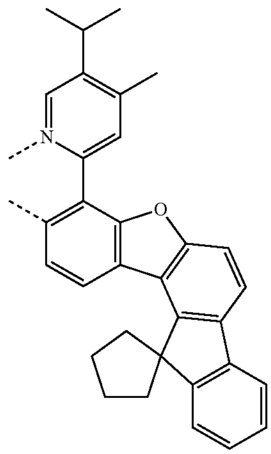
$L_{A226}$
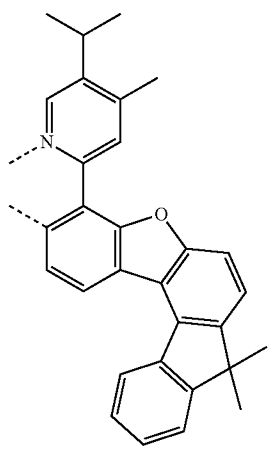
$L_{A227}$
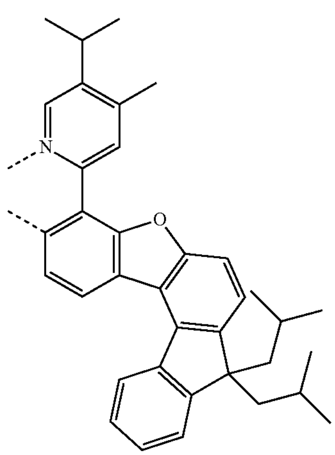
-continued
$L_{A228}$
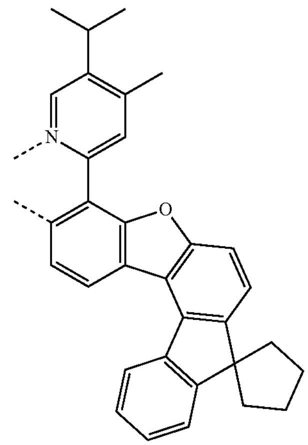
$L_{A229}$
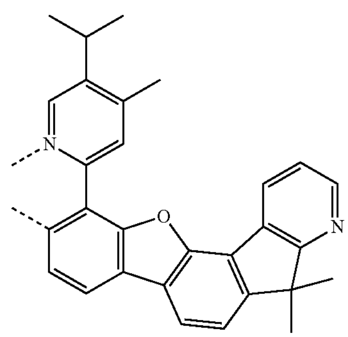
$L_{A230}$
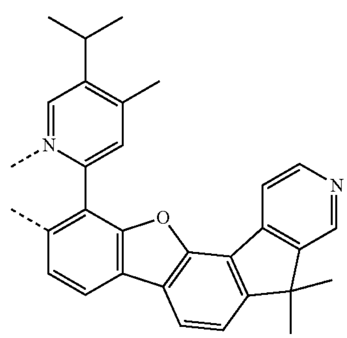
$L_{A231}$
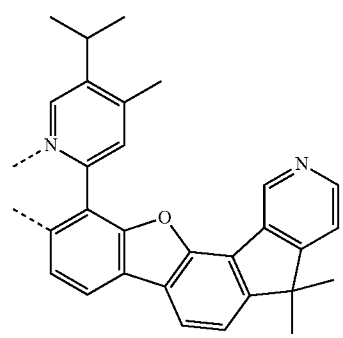

$L_{A232}$
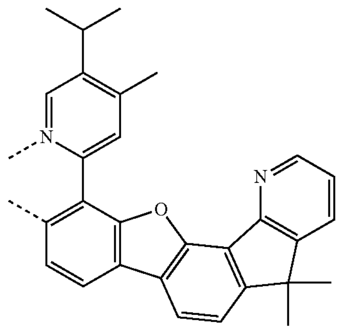
$L_{A233}$
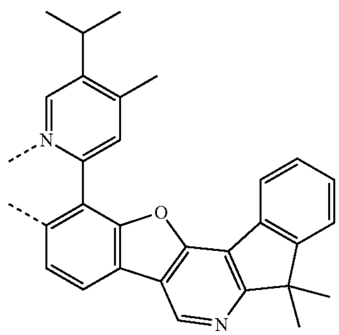
$L_{A234}$
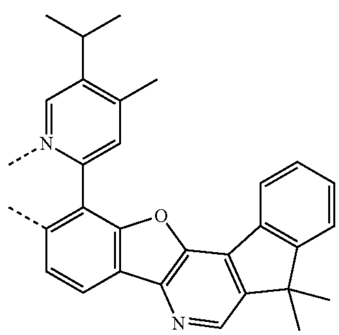
$L_{A235}$
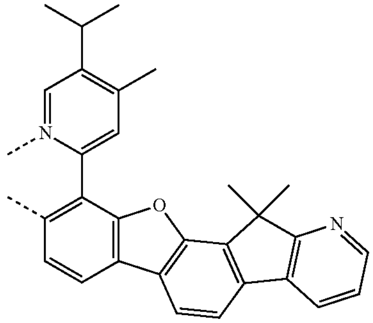
$L_{A236}$
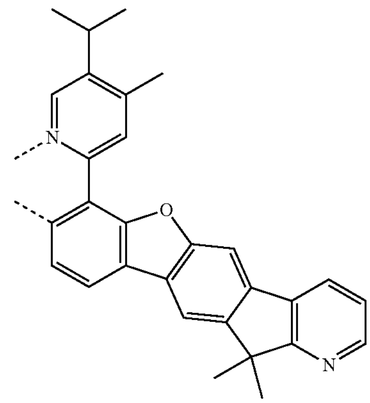
$L_{A237}$
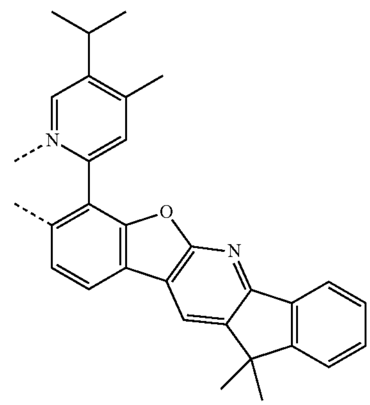
$L_{A238}$
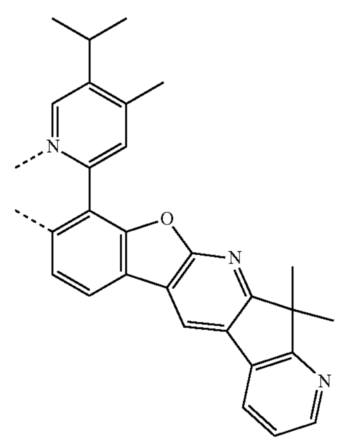

$L_{A239}$
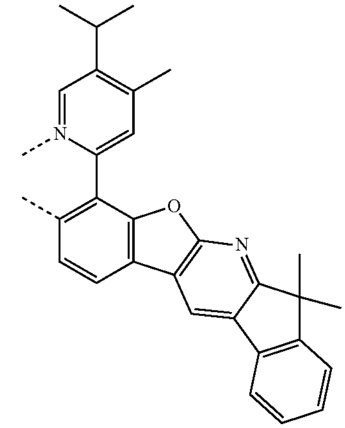
$L_{A240}$
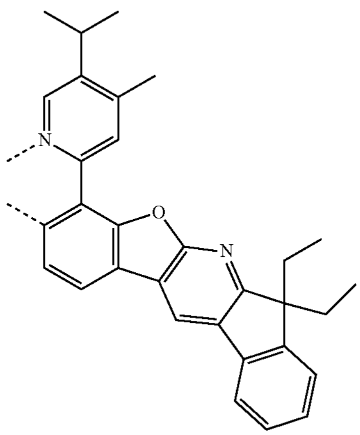
$L_{A241}$
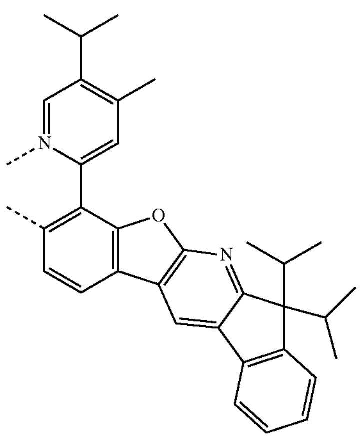
$L_{A242}$
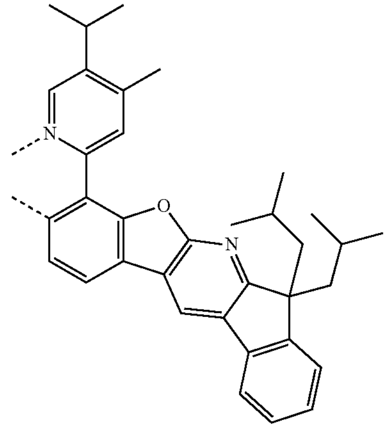
$L_{A243}$
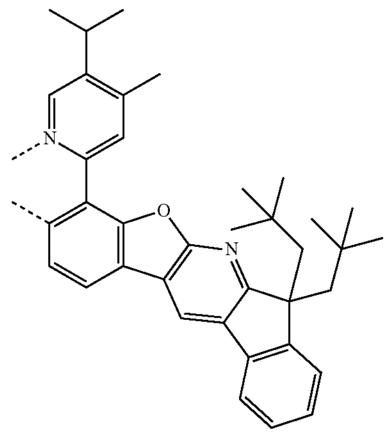
$L_{A244}$
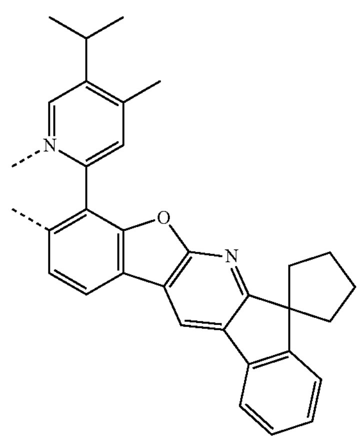

-continued
$L_{A245}$
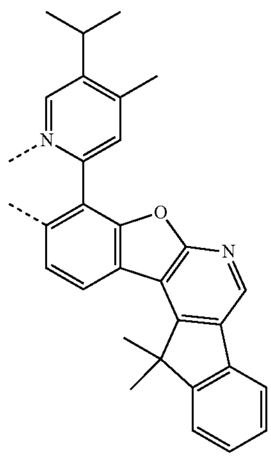
$L_{A246}$
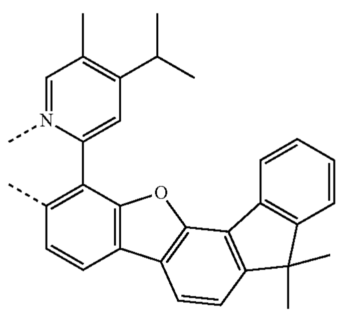
$L_{A247}$
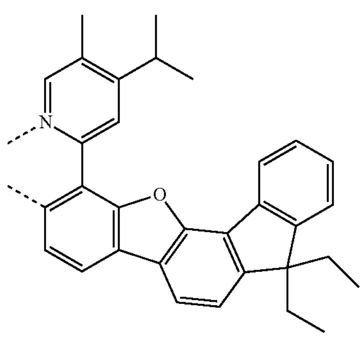
$L_{A248}$
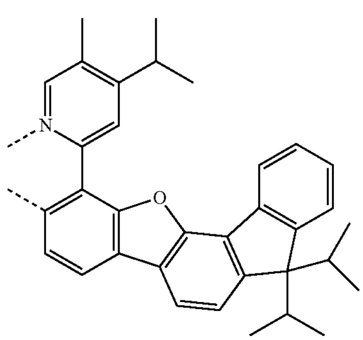
-continued
$L_{A249}$
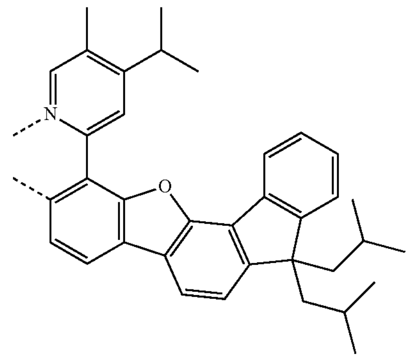
$L_{A250}$
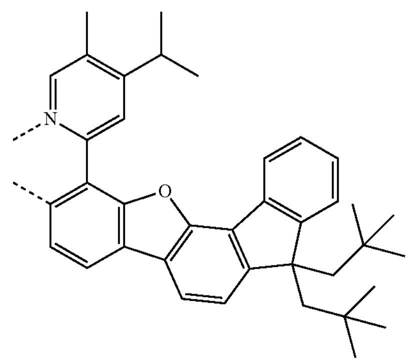
$L_{A251}$
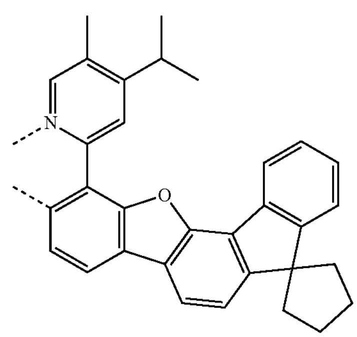
$L_{A252}$
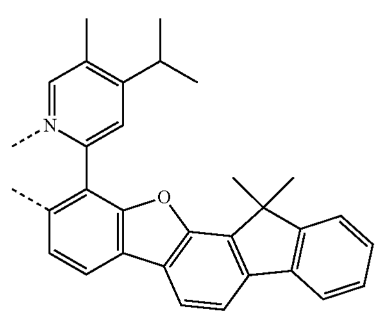

-continued
$L_{A253}$
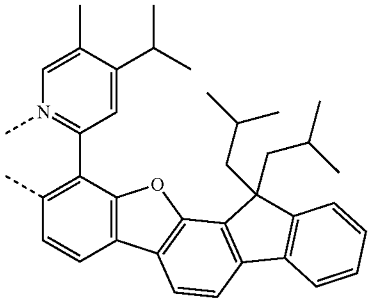
$L_{A254}$
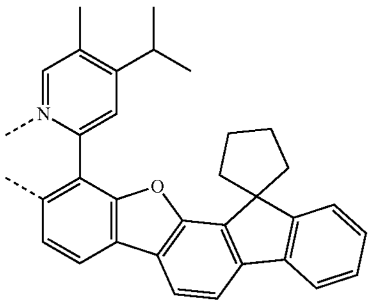
$L_{A255}$
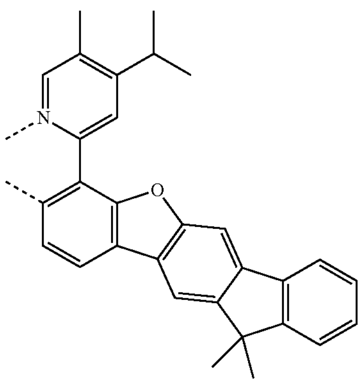
$L_{A256}$
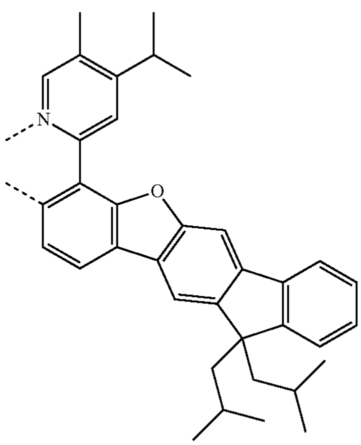
-continued
$L_{A257}$
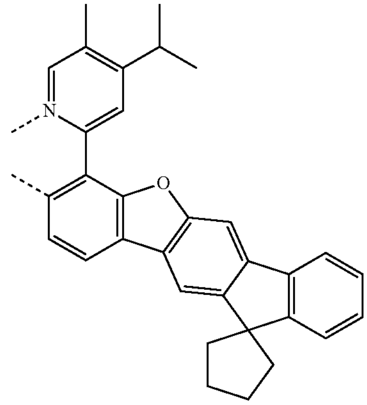
$L_{A258}$
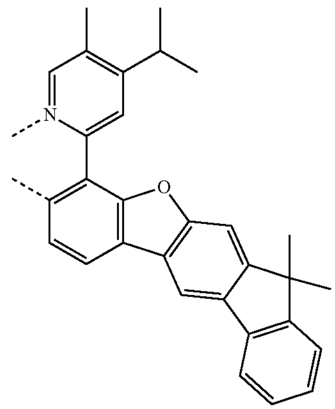
$L_{A259}$
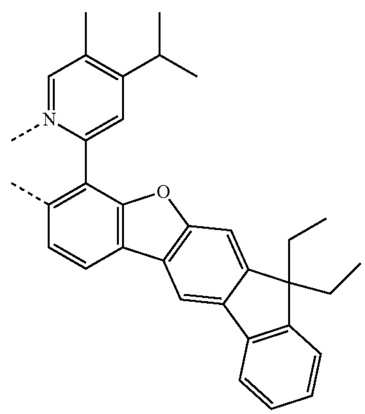
$L_{A260}$
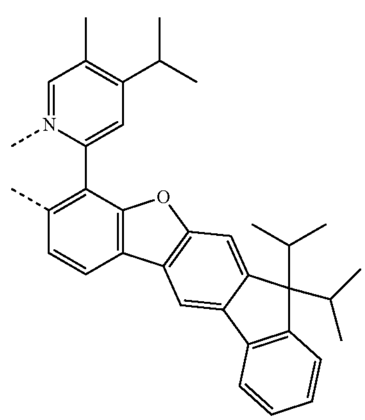

-continued
$L_{A261}$
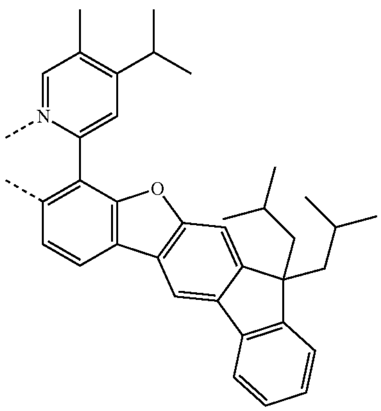
$L_{A262}$
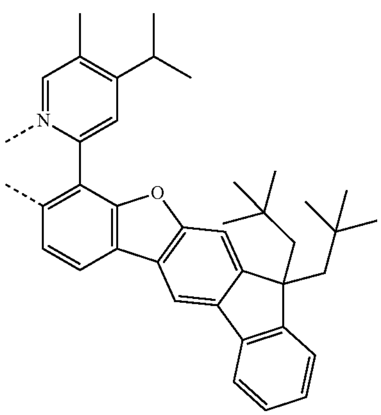
$L_{A263}$
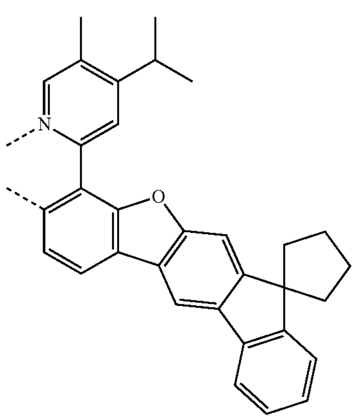
-continued
$L_{A264}$
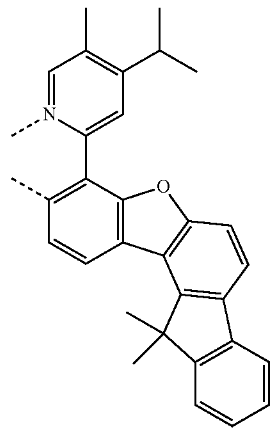
$L_{A265}$
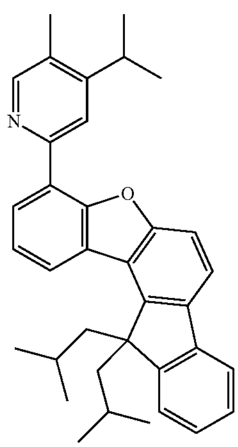
$L_{A266}$
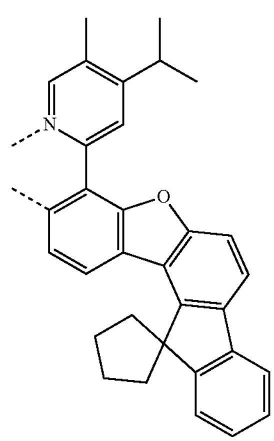

-continued
$L_{A267}$
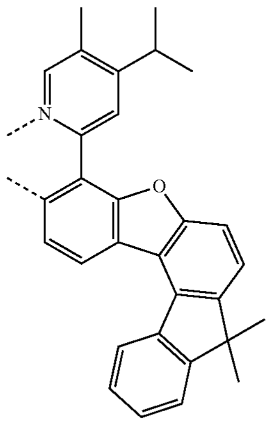
$L_{A268}$
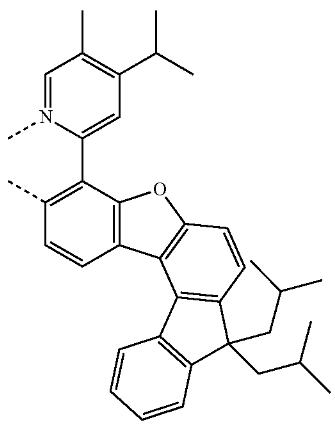
$L_{A269}$
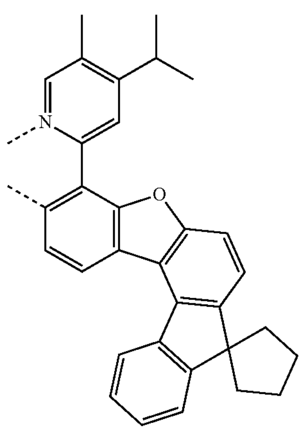
$L_{A270}$
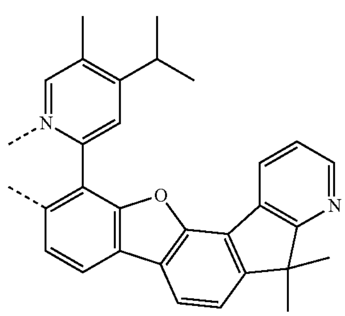
-continued
$L_{A271}$
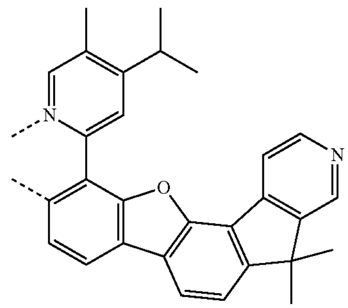
$L_{A272}$
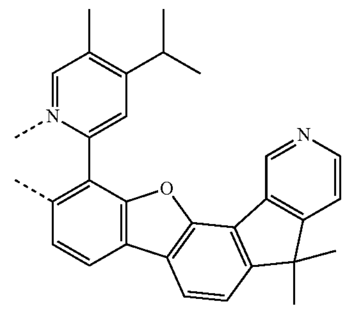
$L_{A273}$
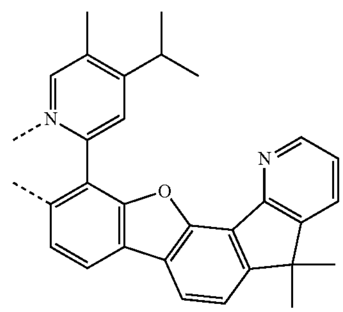
$L_{A274}$
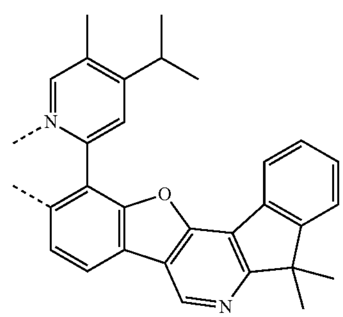
$L_{A275}$
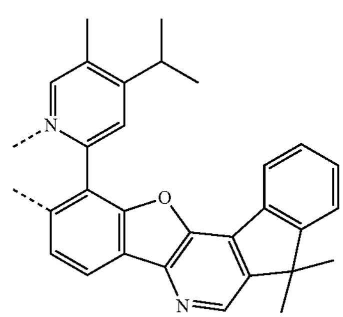

L$_{A276}$
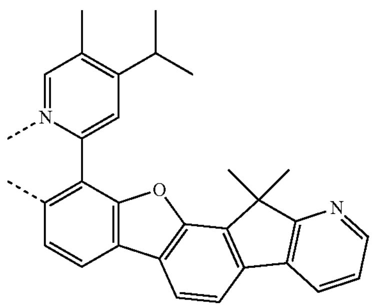
L$_{A277}$
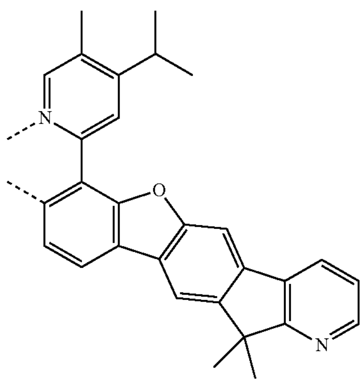
L$_{A278}$
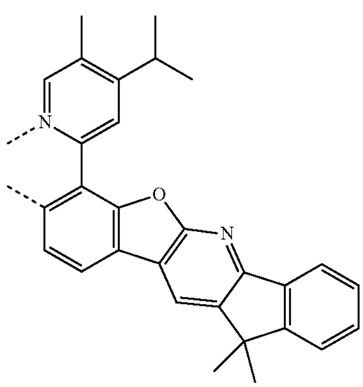
L$_{A279}$
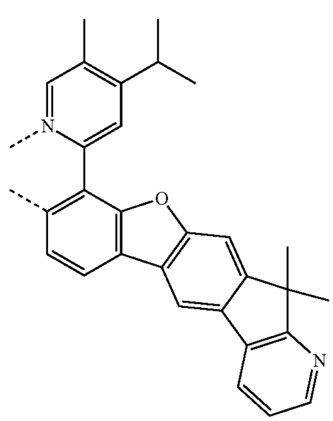
L$_{A280}$
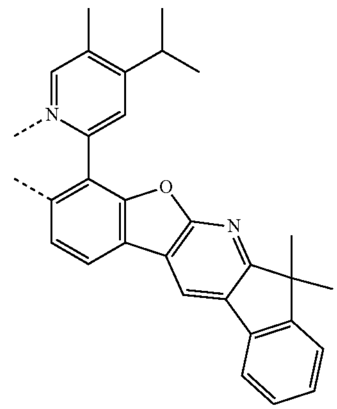
L$_{A281}$
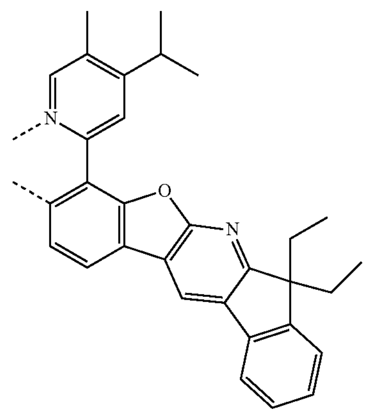
L$_{A282}$
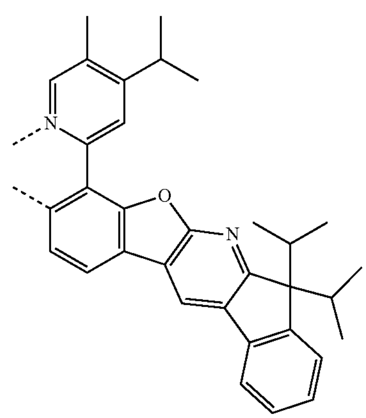
L$_{A283}$
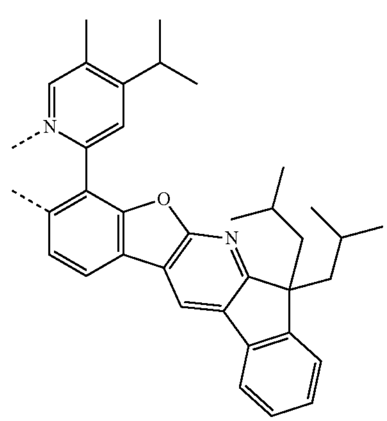

-continued
L$_{A284}$
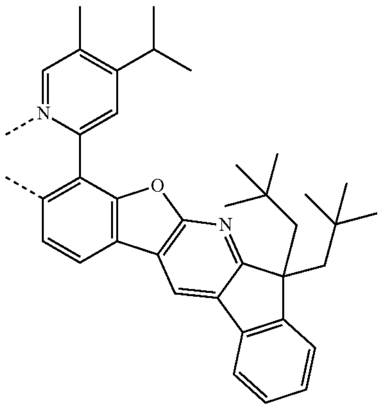
L$_{A285}$
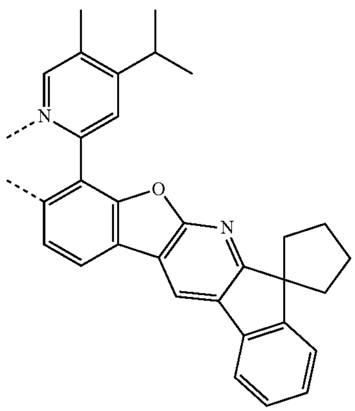
L$_{A286}$
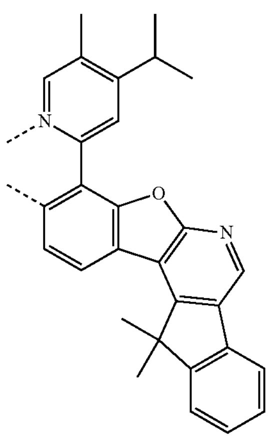
L$_{A287}$
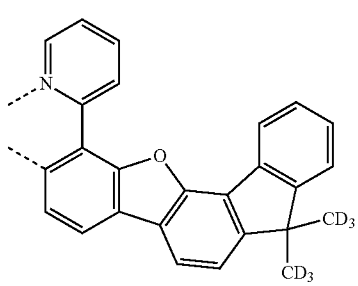
-continued
L$_{A288}$
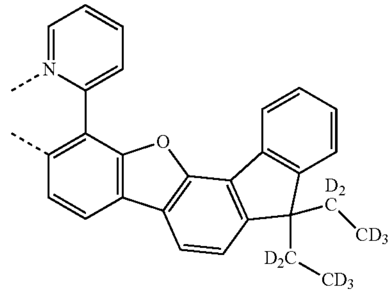
L$_{A289}$
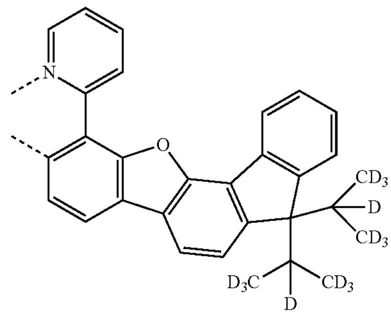
L$_{A290}$
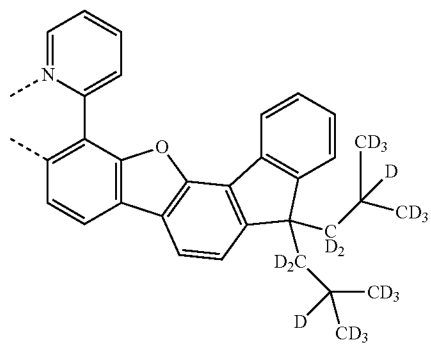
L$_{A291}$
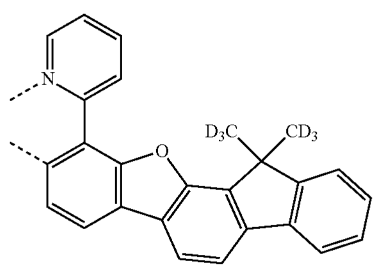
L$_{A292}$
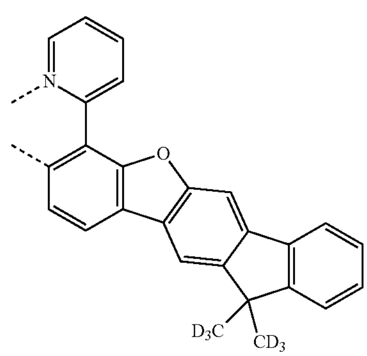

-continued
$L_{A293}$
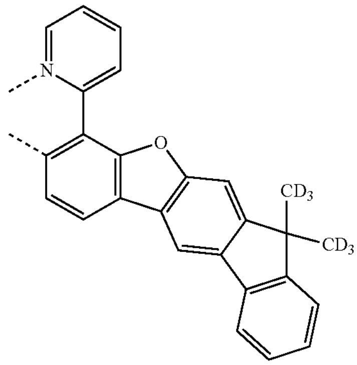
$L_{A294}$
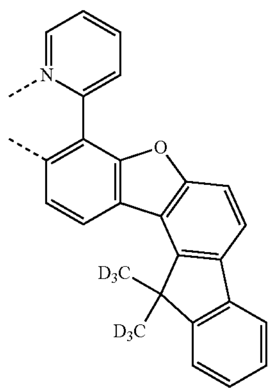
$L_{A295}$
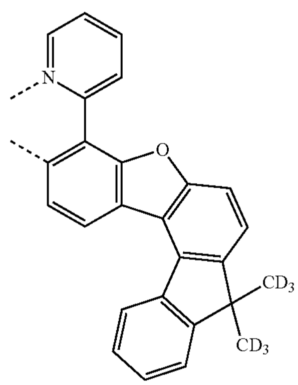
$L_{A296}$
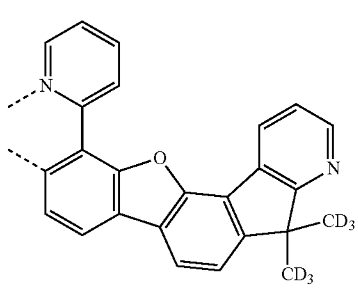
-continued
$L_{A297}$
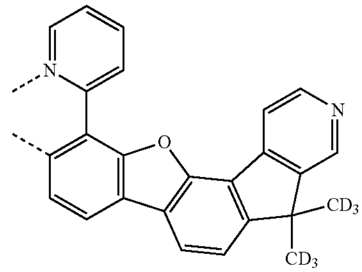
$L_{A298}$
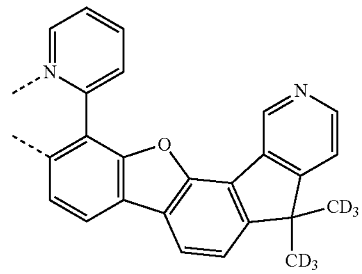
$L_{A299}$
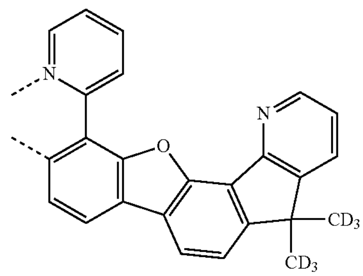
$L_{A300}$
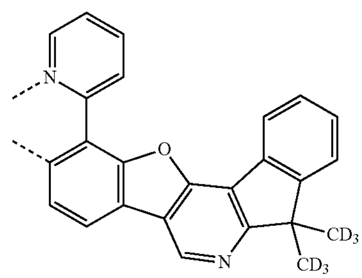
$L_{A301}$
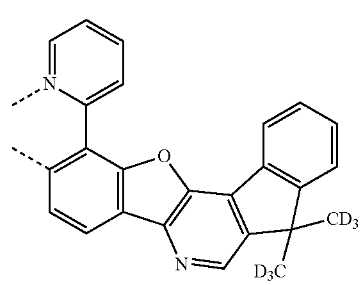

-continued
L_{A302}
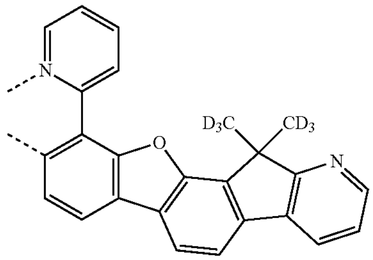
L_{A303}
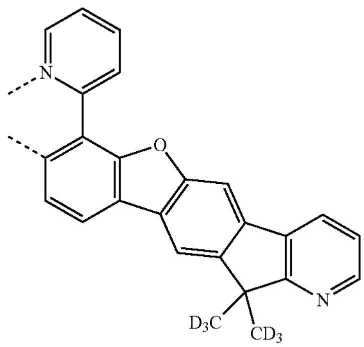
L_{A304}
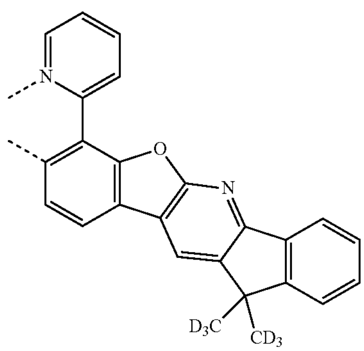
L_{A305}
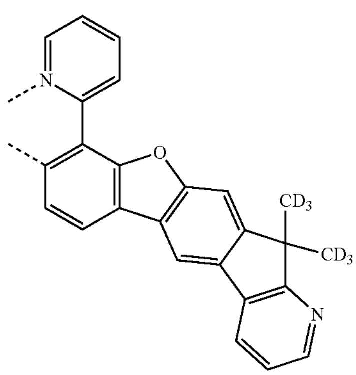
-continued
L_{A306}
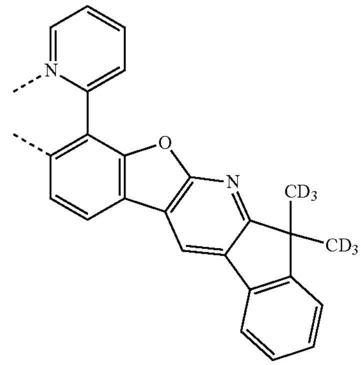
L_{A307}
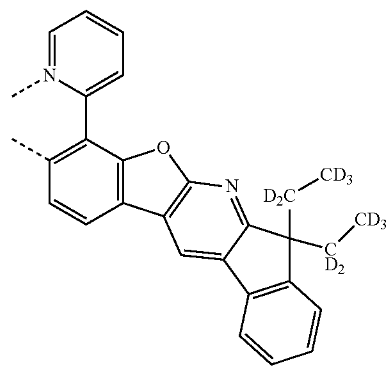
L_{A308}
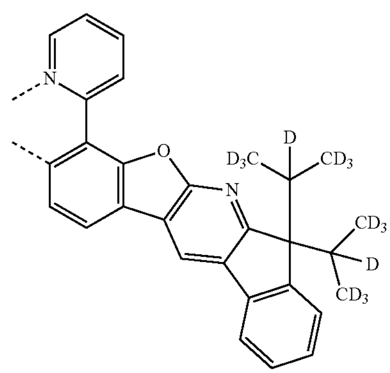
L_{A309}
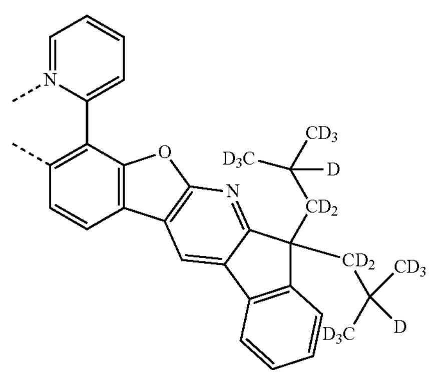

-continued
$L_{A310}$
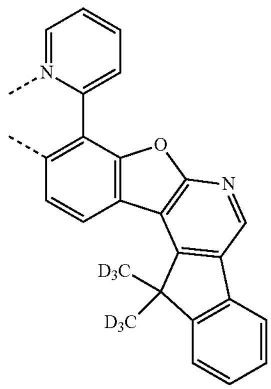
$L_{A311}$
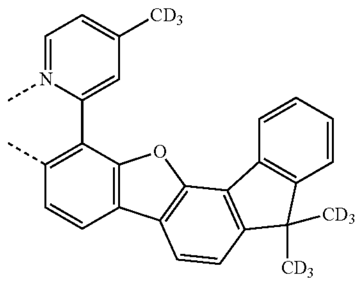
$L_{A312}$
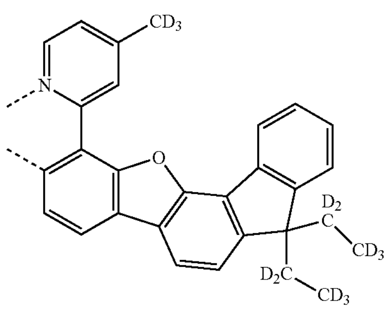
$L_{A313}$
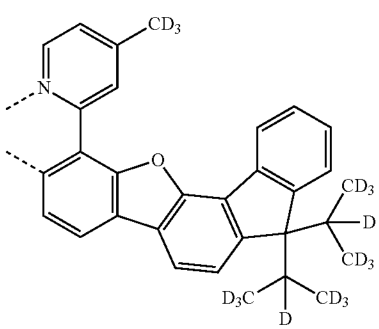
-continued
$L_{A314}$
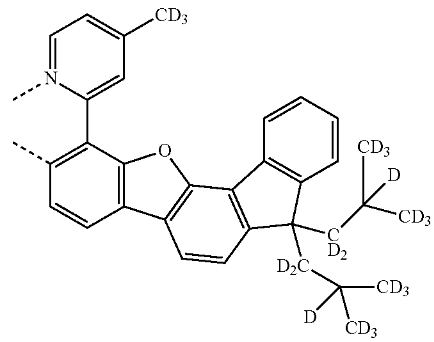
$L_{A315}$
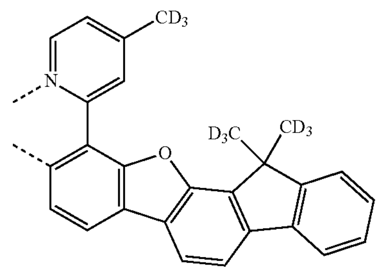
$L_{A316}$
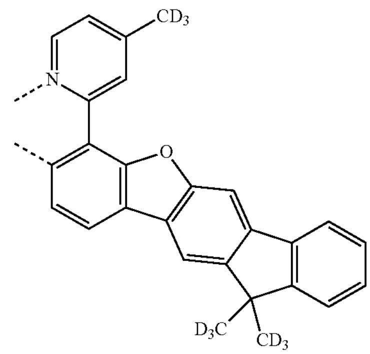
$L_{A317}$
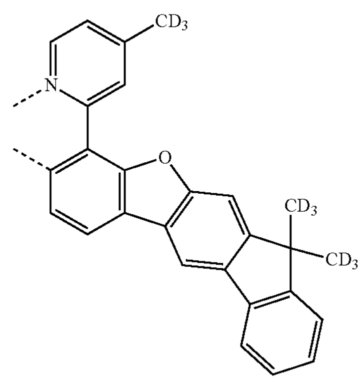

-continued
$L_{A318}$
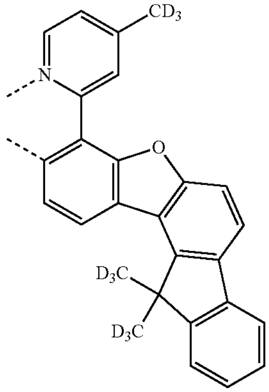
$L_{A319}$
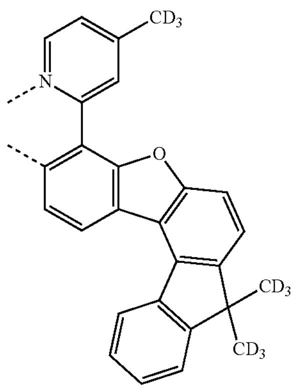
$L_{A320}$
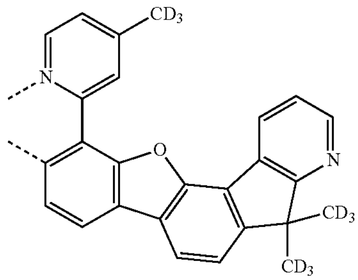
$L_{A321}$
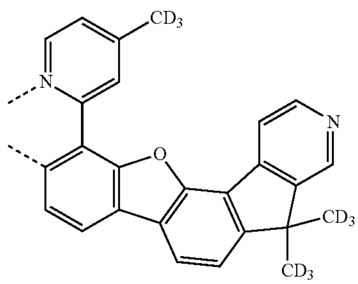
$L_{A322}$
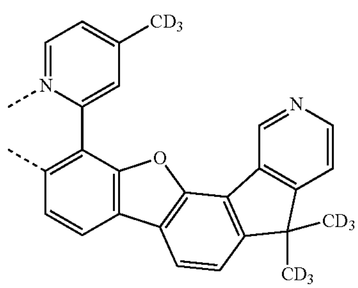
-continued
$L_{A323}$
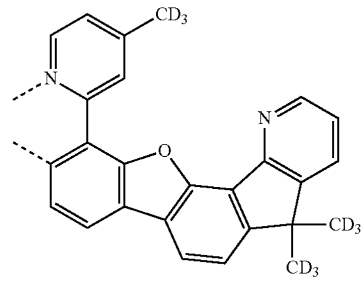
$L_{A324}$
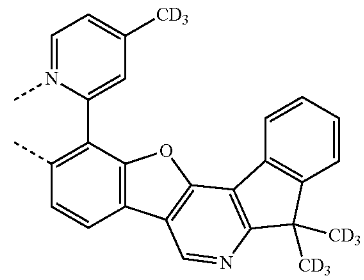
$L_{A325}$
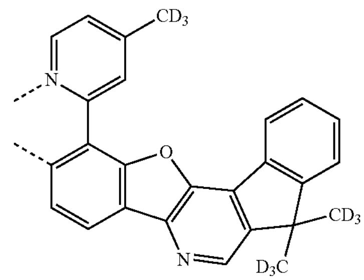
$L_{A326}$
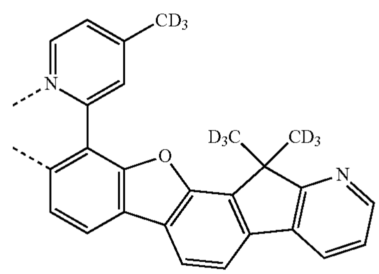
$L_{A327}$
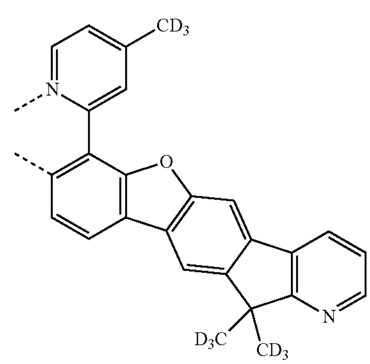

L$_{A328}$
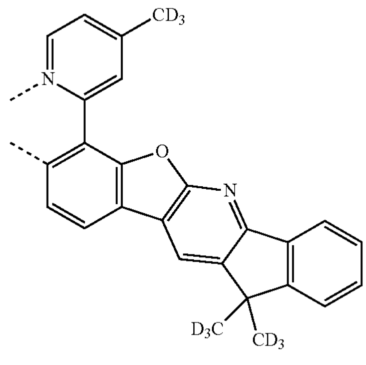
L$_{A329}$
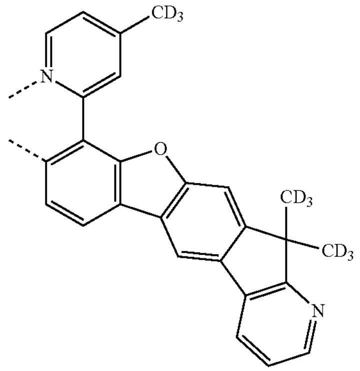
L$_{A330}$
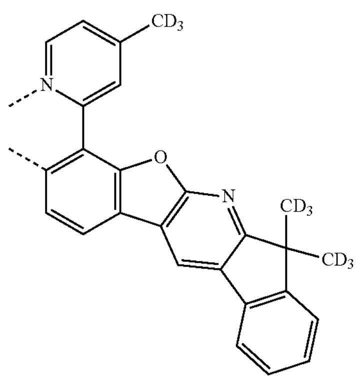
L$_{A331}$
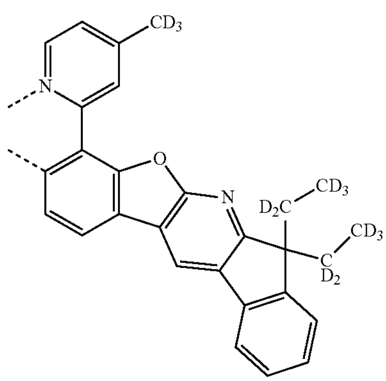
L$_{A332}$
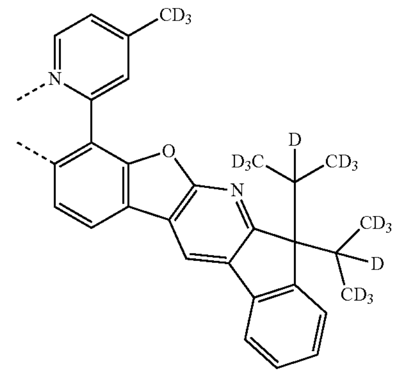
L$_{A333}$
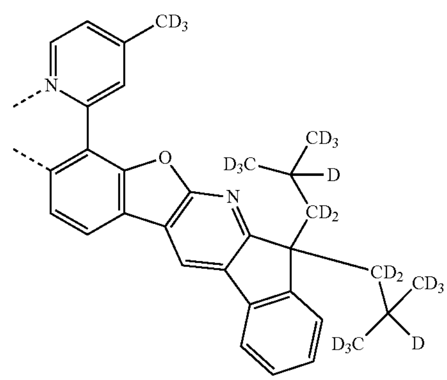
L$_{A334}$
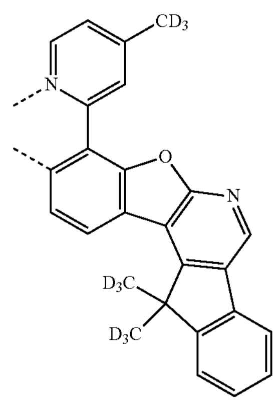
L$_{A335}$
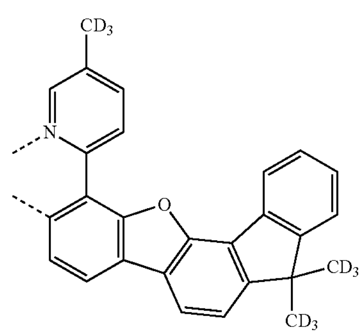

-continued
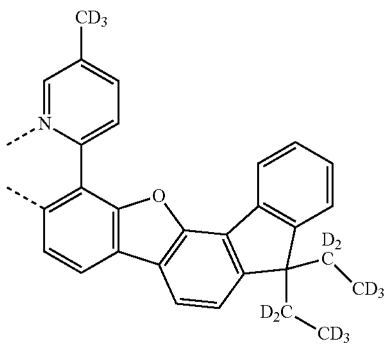
$L_{A336}$
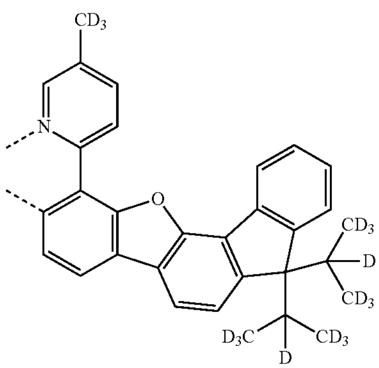
$L_{A337}$
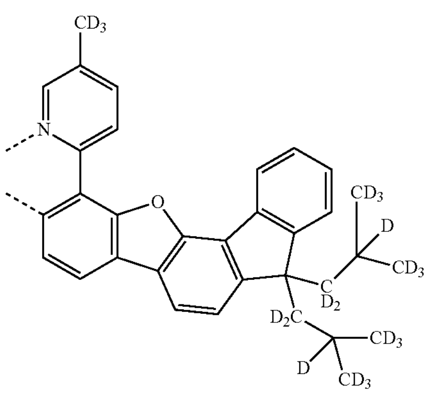
$L_{A338}$
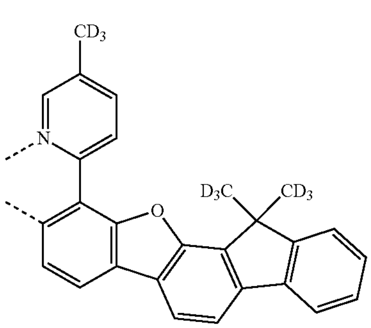
$L_{A339}$
-continued
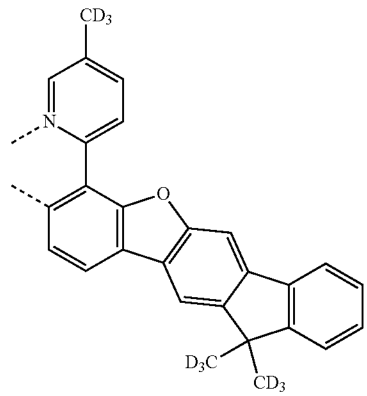
$L_{A340}$
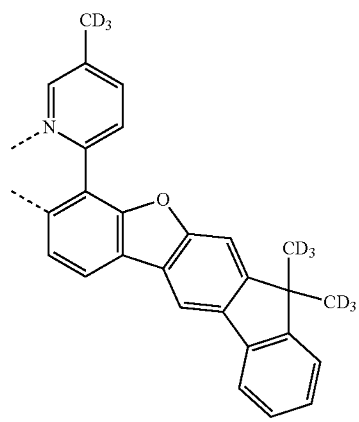
$L_{A341}$
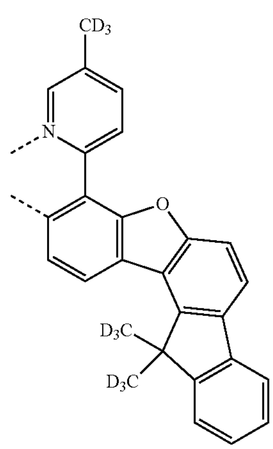
$L_{A342}$ -continued
$L_{A343}$
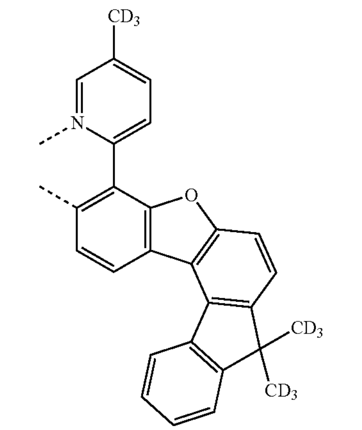
$L_{A344}$
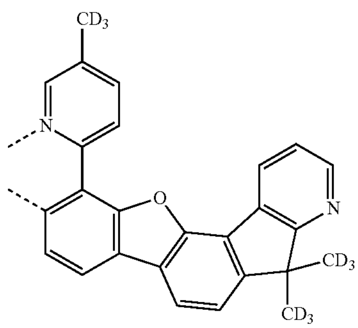
$L_{A345}$
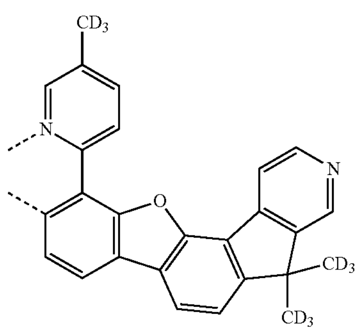
$L_{A346}$
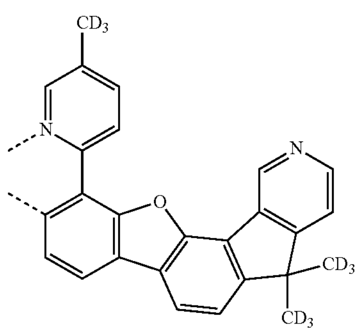
-continued
$L_{A347}$
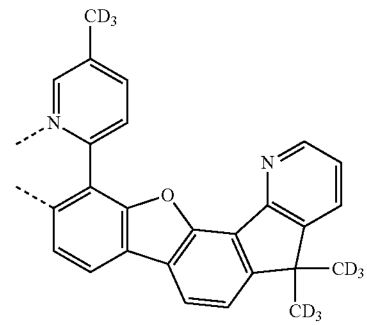
$L_{A348}$
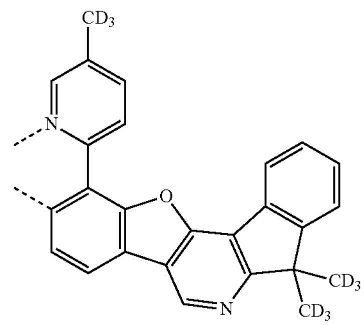
$L_{A349}$
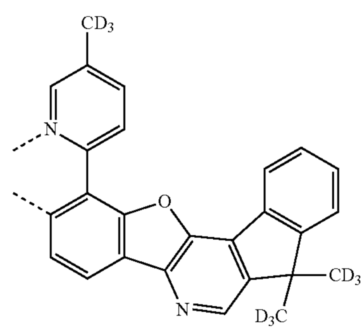
$L_{A350}$
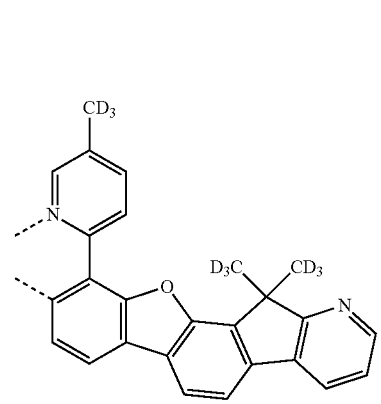

-continued
$L_{A351}$
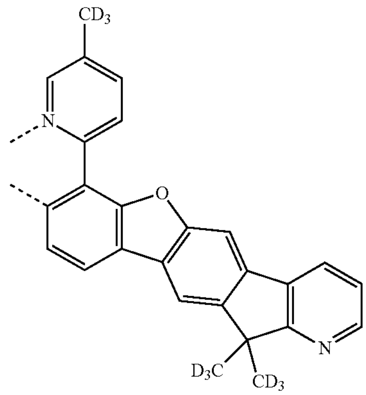
$L_{A352}$
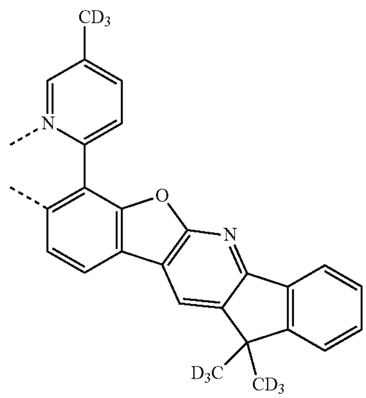
$L_{A353}$
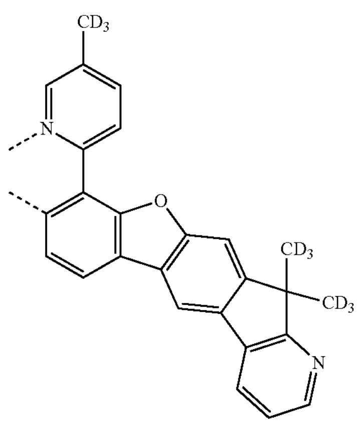
$L_{A354}$
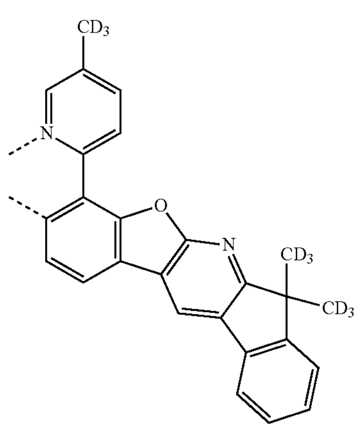
-continued
$L_{A355}$
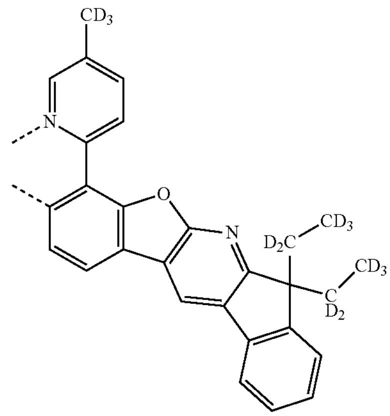
$L_{A356}$
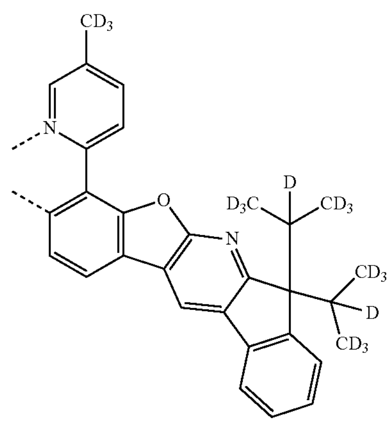
$L_{A357}$
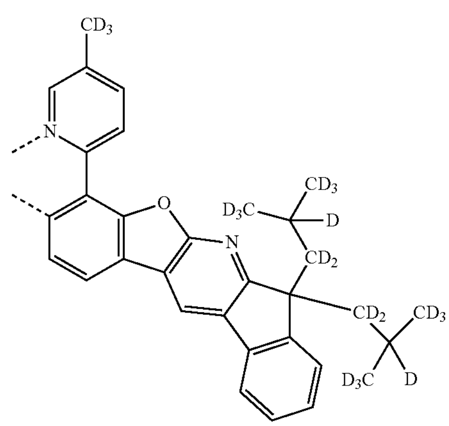

-continued
L$_{A358}$
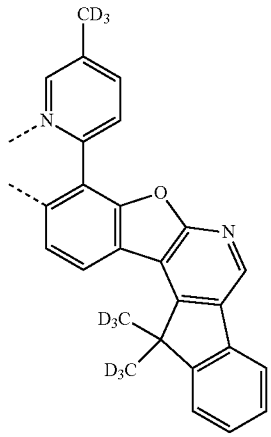
L$_{A359}$
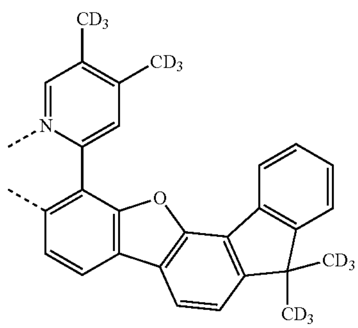
L$_{A360}$
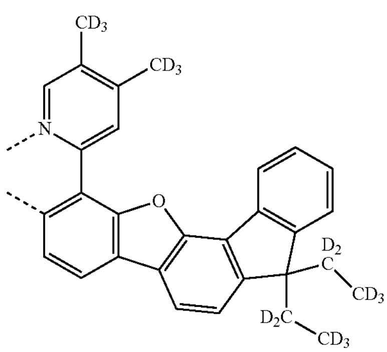
L$_{A361}$
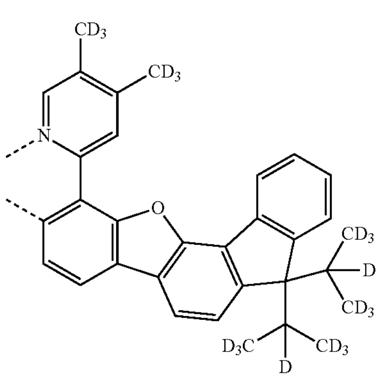
-continued
L$_{A362}$
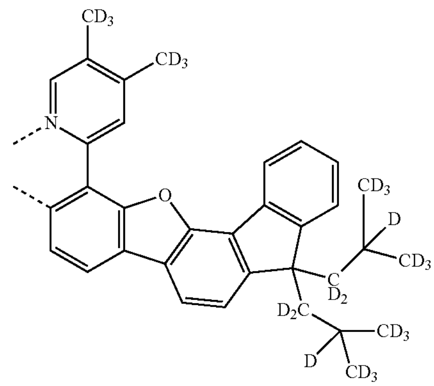
L$_{A363}$
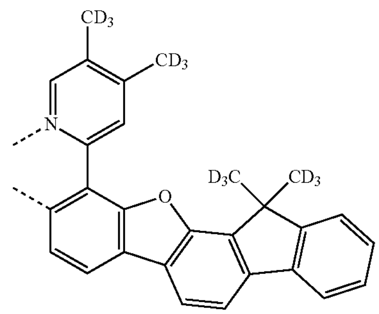
L$_{A364}$
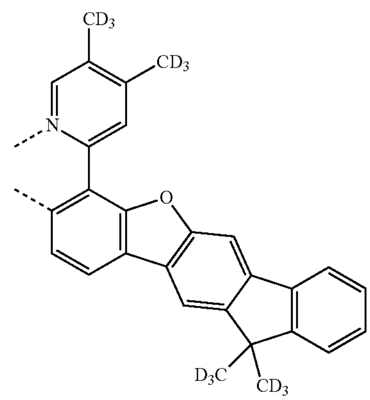
L$_{A365}$
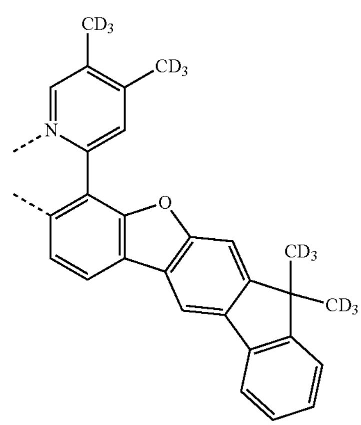

-continued
$L_{A366}$
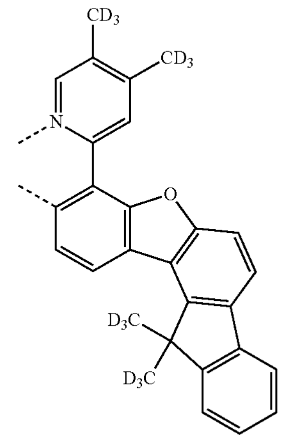
$L_{A367}$
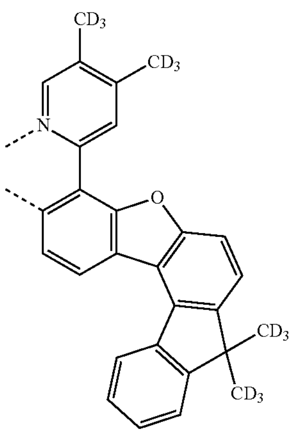
$L_{A368}$
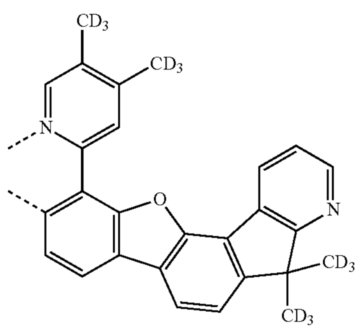
$L_{A369}$
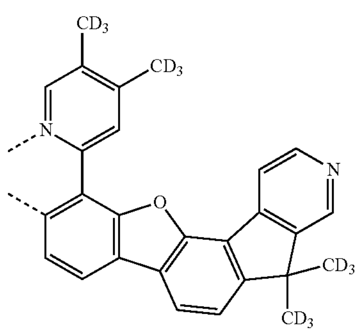
-continued
$L_{A370}$
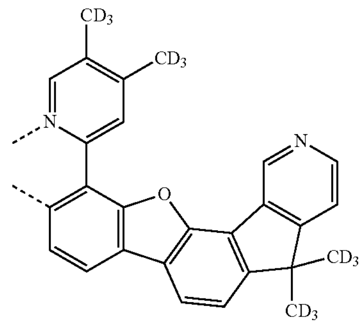
$L_{A371}$
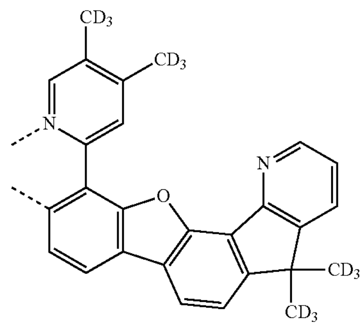
$L_{A372}$
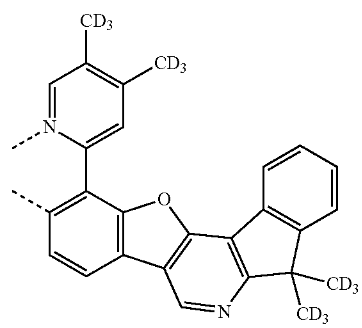
$L_{A373}$
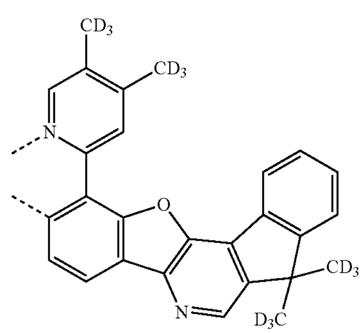

$L_{A374}$
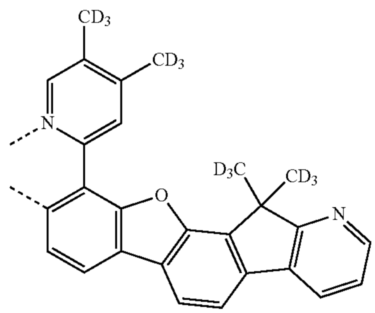
$L_{A375}$
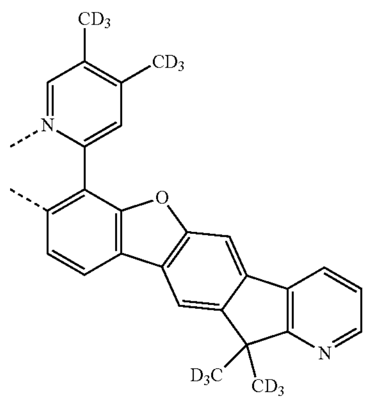
$L_{A376}$
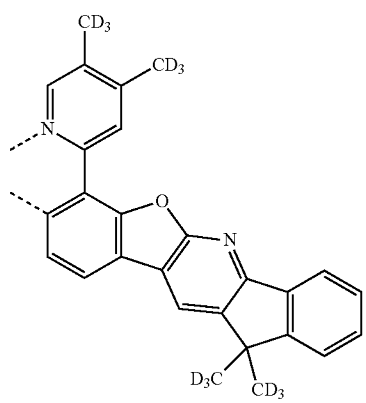
$L_{A377}$
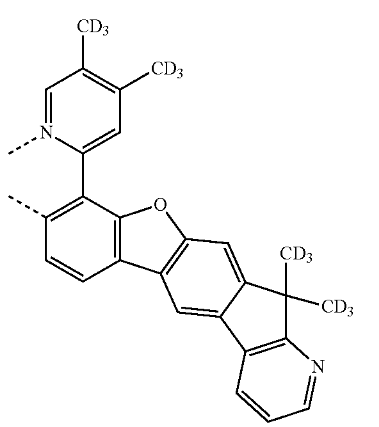
$L_{A378}$
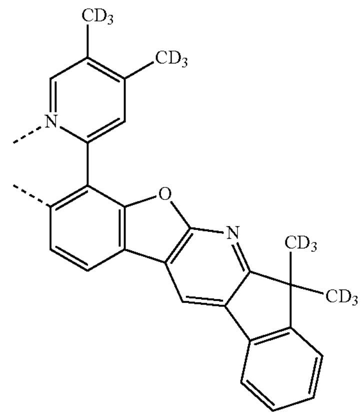
$L_{A379}$
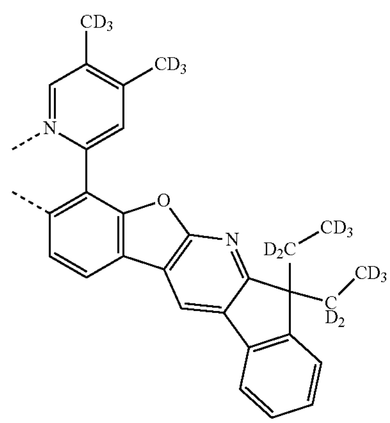
$L_{A380}$
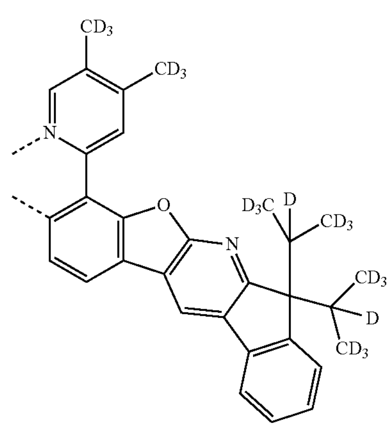

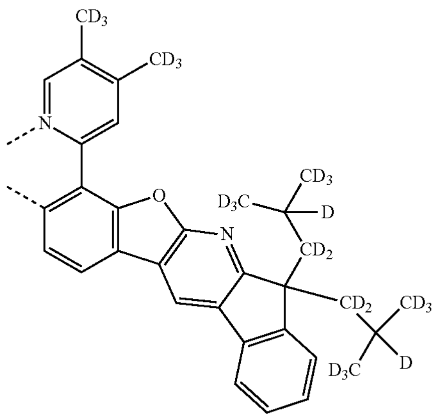
$L_{A381}$
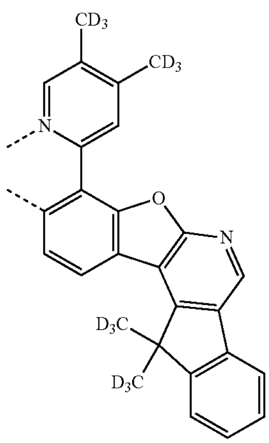
$L_{A382}$
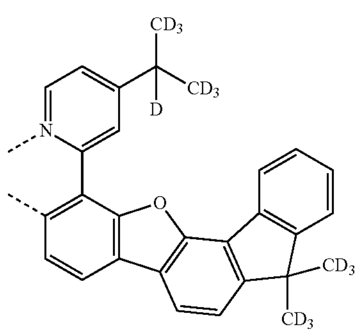
$L_{A383}$
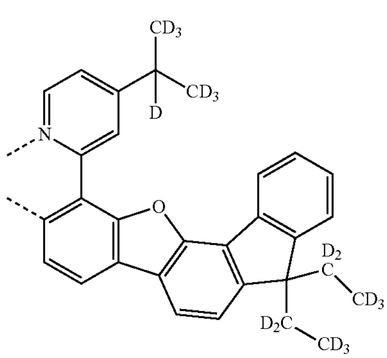
$L_{A384}$
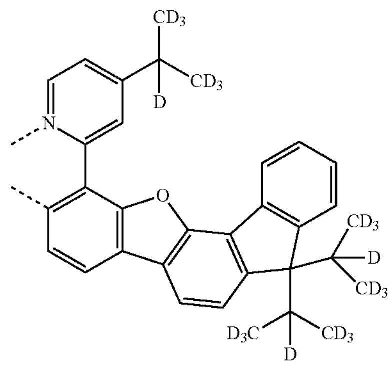
$L_{A385}$
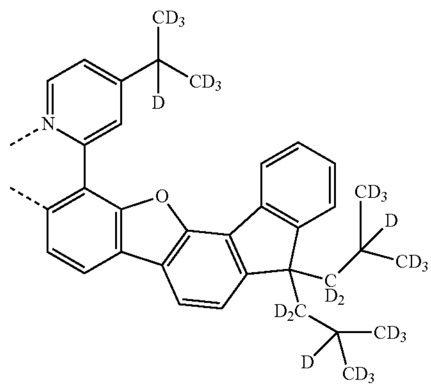
$L_{A386}$
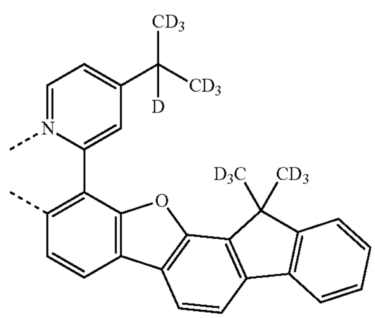
$L_{A387}$
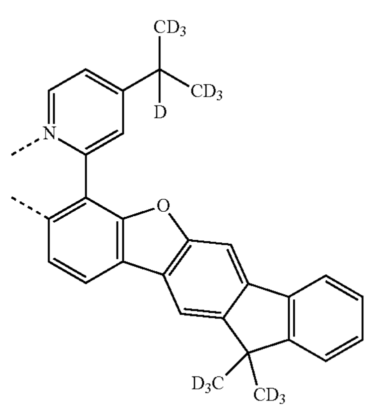
$L_{A388}$ -continued
$L_{A389}$
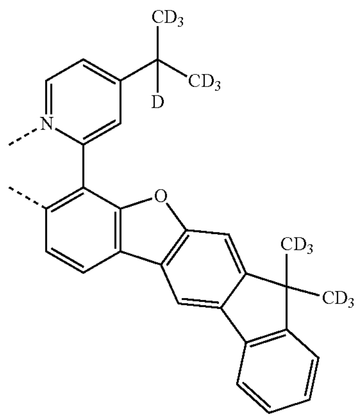
$L_{A390}$
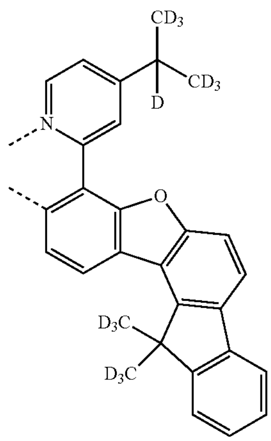
$L_{A391}$
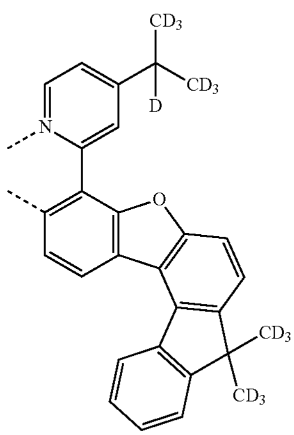
$L_{A392}$
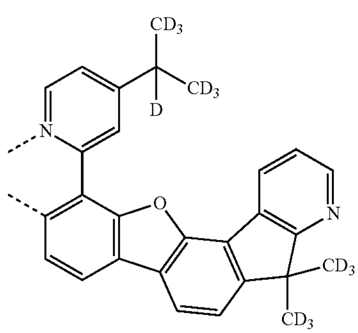
-continued
$L_{A393}$
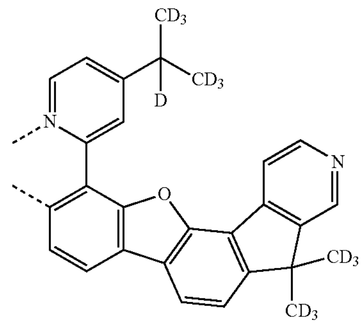
$L_{A394}$
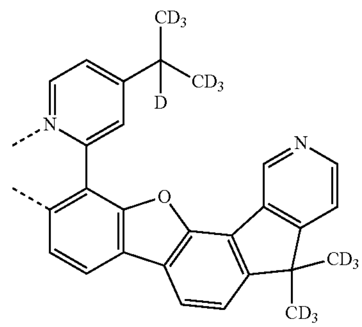
$L_{A395}$
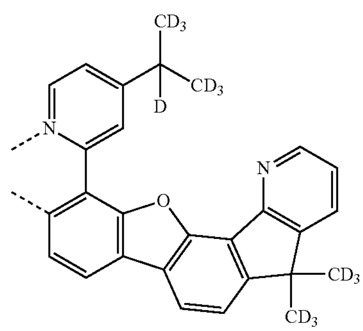
$L_{A396}$
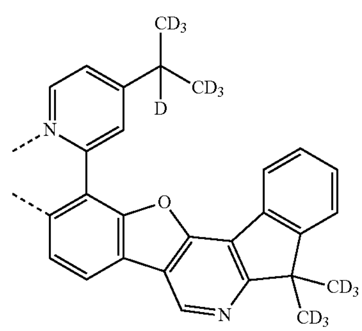
$L_{A397}$
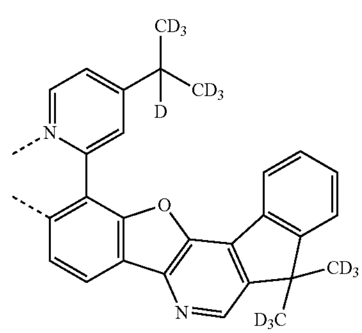

-continued
$L_{A398}$
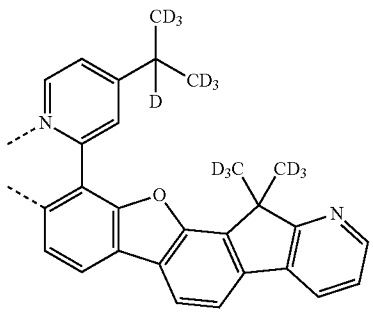
$L_{A399}$
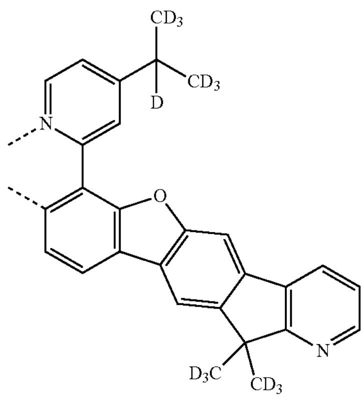
$L_{A400}$
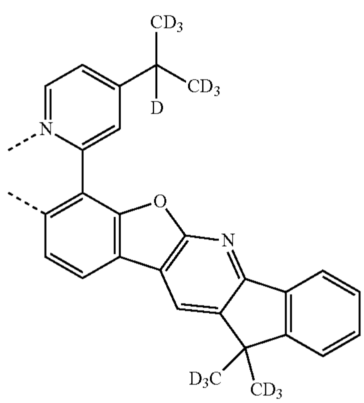
$L_{A401}$
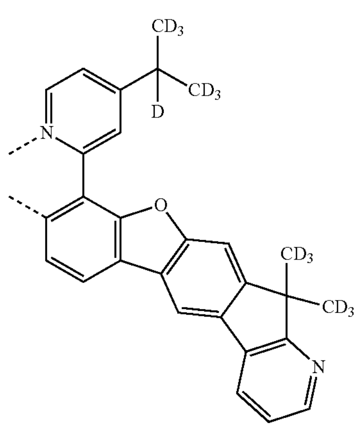
-continued
$L_{A402}$
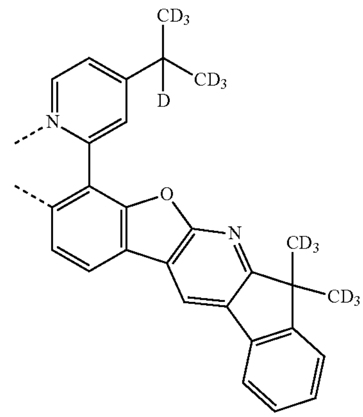
$L_{A403}$
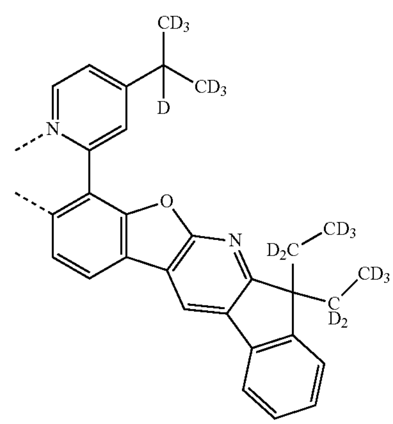
$L_{A404}$
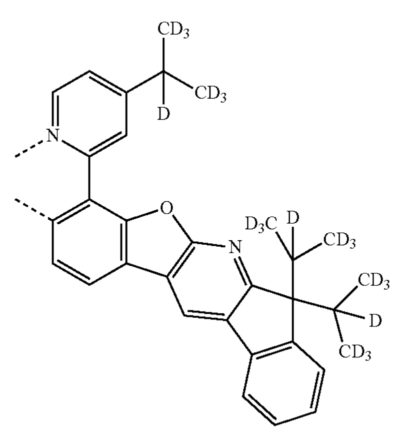

L$_{A405}$
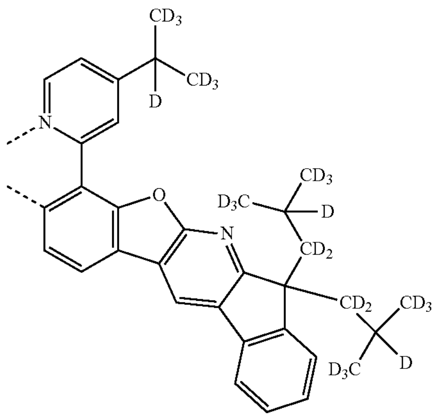
L$_{A406}$
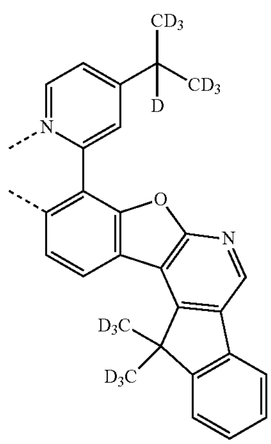
L$_{A407}$
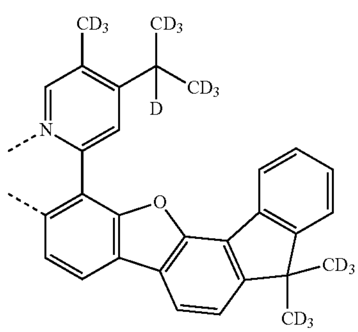
L$_{A408}$
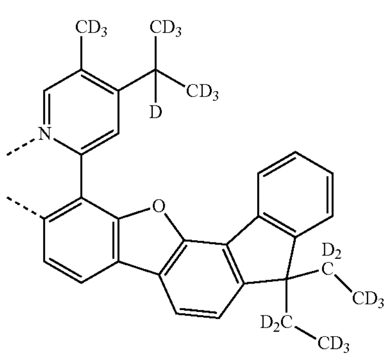
L$_{A409}$
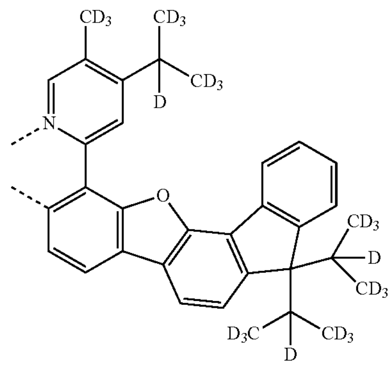
L$_{A410}$
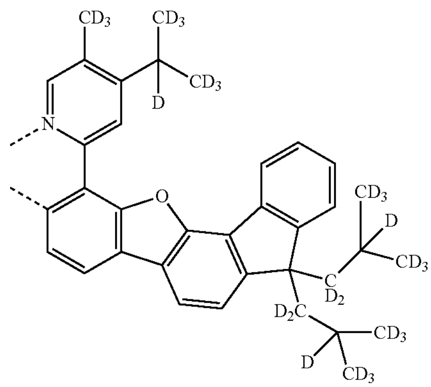
L$_{A411}$
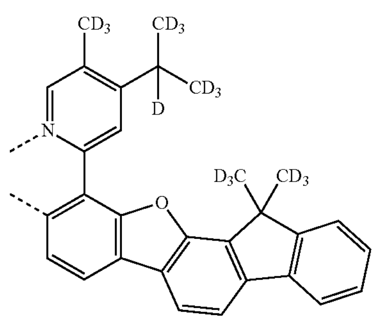
L$_{A412}$
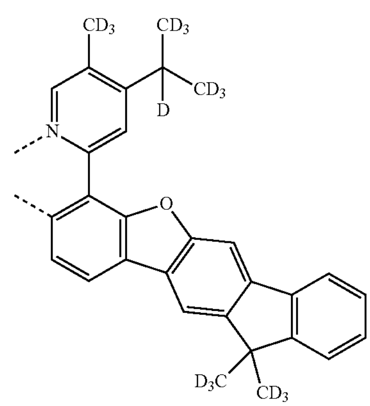

L$_{A413}$
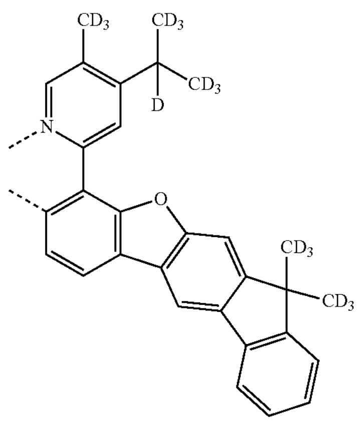
L$_{A414}$
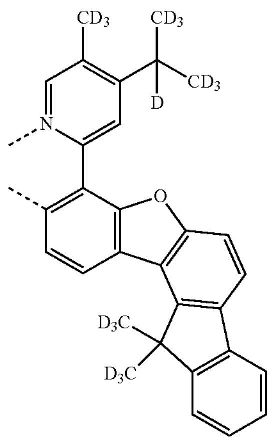
L$_{A415}$
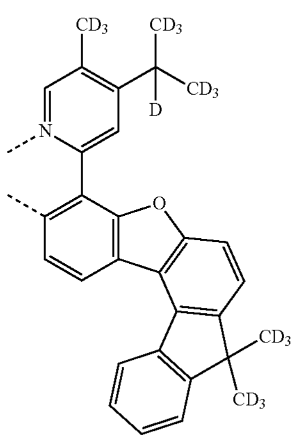
L$_{A416}$
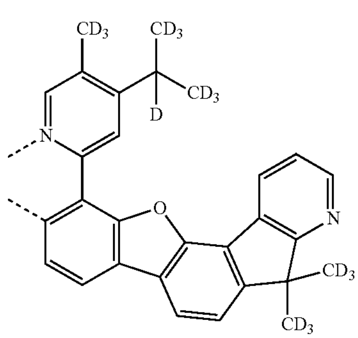
L$_{A417}$
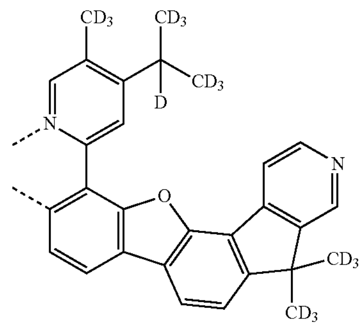
L$_{A418}$
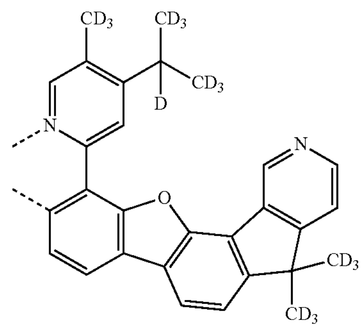
L$_{A419}$
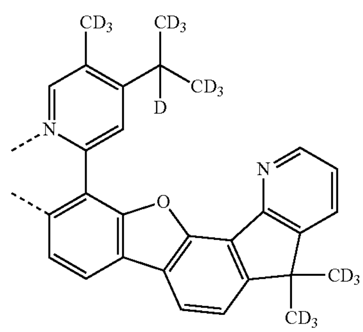
L$_{A420}$
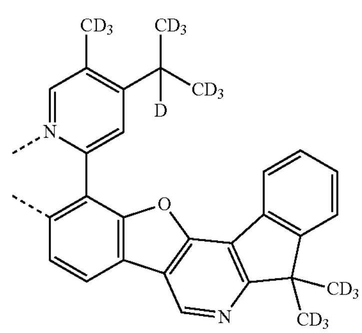
L$_{A421}$
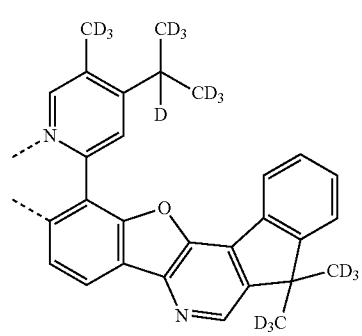

-continued
$L_{A422}$
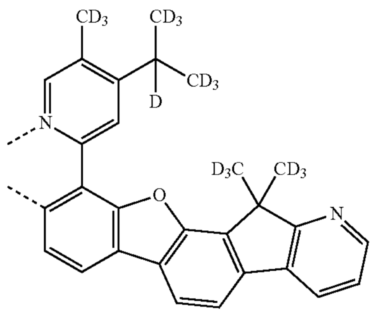
$L_{A423}$
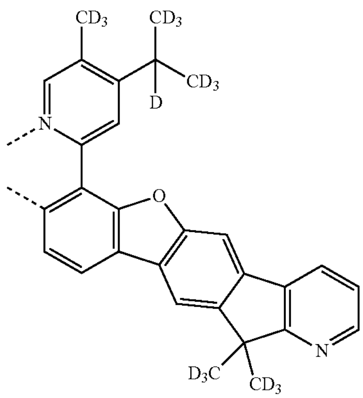
$L_{A424}$
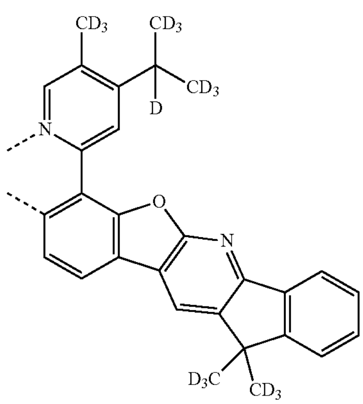
$L_{A425}$
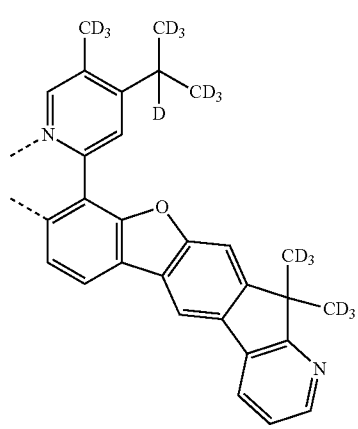
-continued
$L_{A426}$
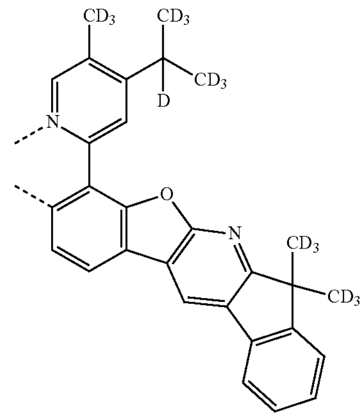
$L_{A427}$
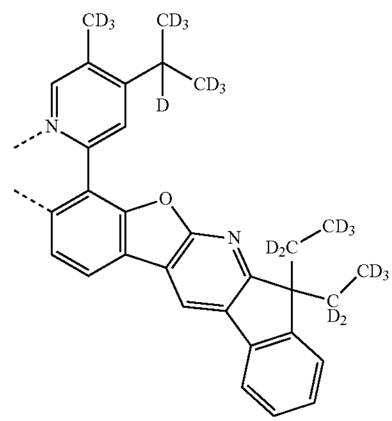
$L_{A428}$
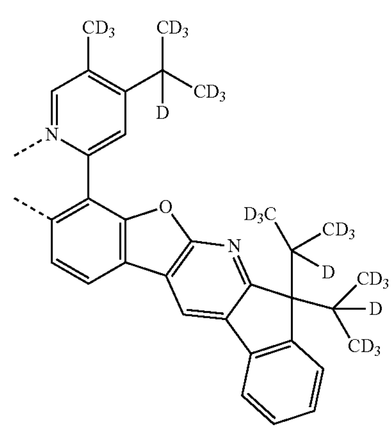

-continued
$L_{A429}$
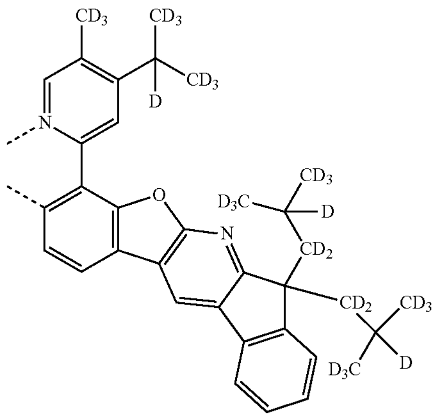
$L_{A430}$
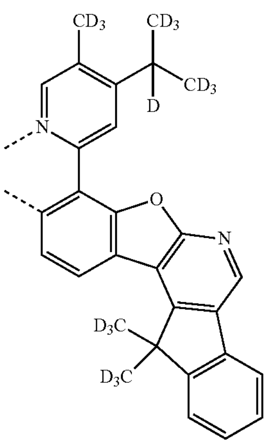
$L_{A431}$
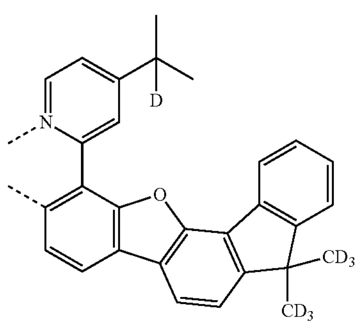
$L_{A432}$
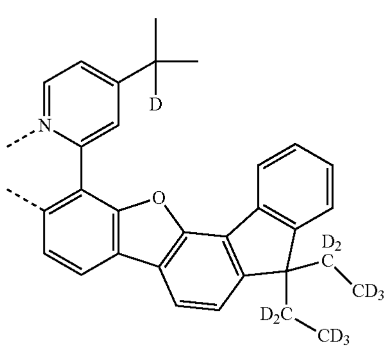
-continued
$L_{A433}$
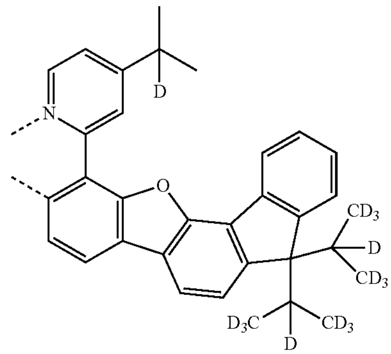
$L_{A434}$
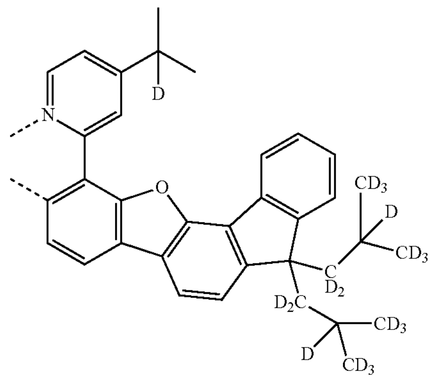
$L_{A435}$
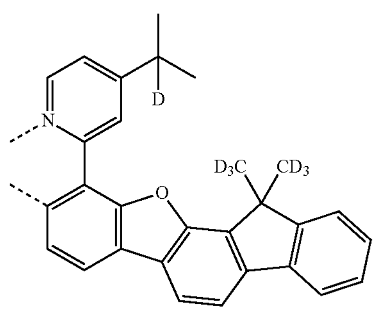
$L_{A436}$
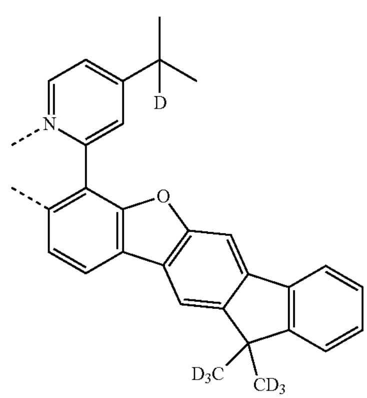

-continued
$L_{A437}$
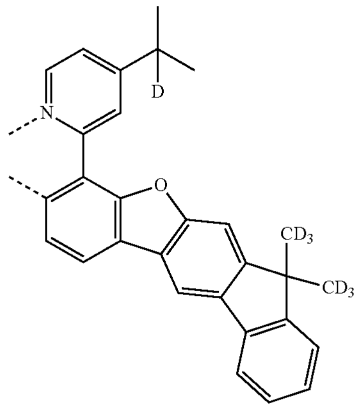
$L_{A438}$
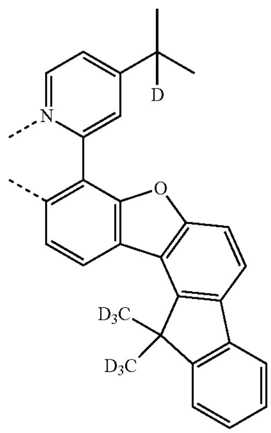
$L_{A439}$
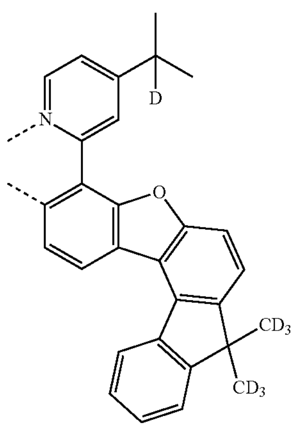
$L_{A440}$
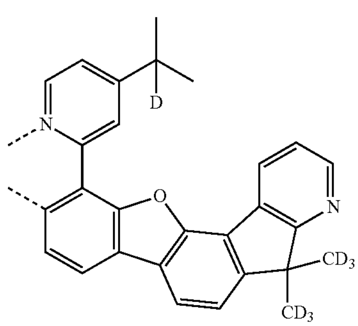
-continued
$L_{A441}$
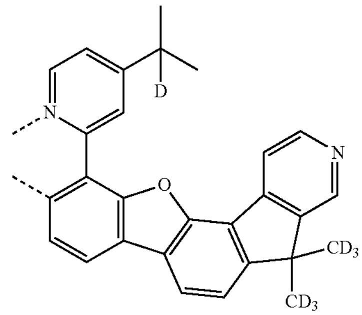
$L_{A442}$
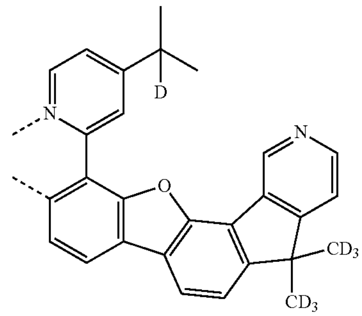
$L_{A443}$
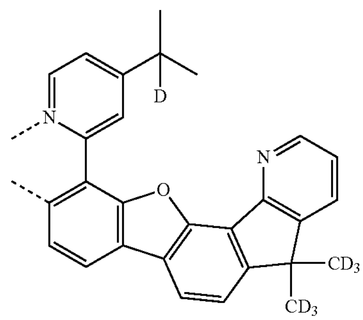
$L_{A444}$
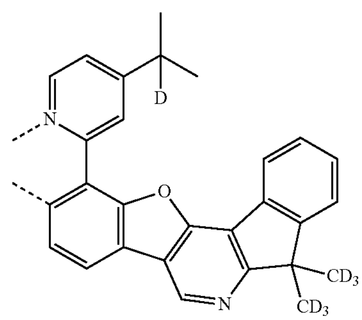
$L_{A445}$
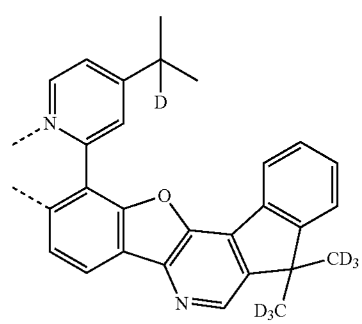

$L_{A446}$
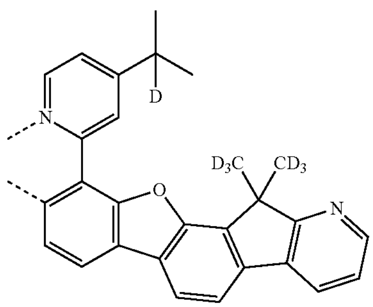
$L_{A447}$
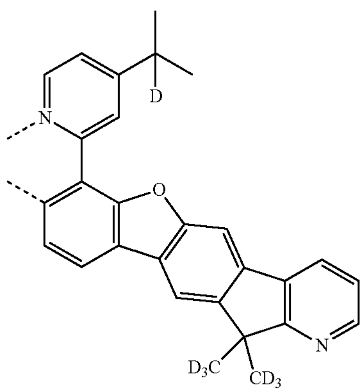
$L_{A448}$
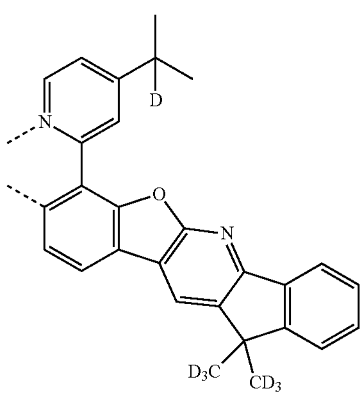
$L_{A449}$
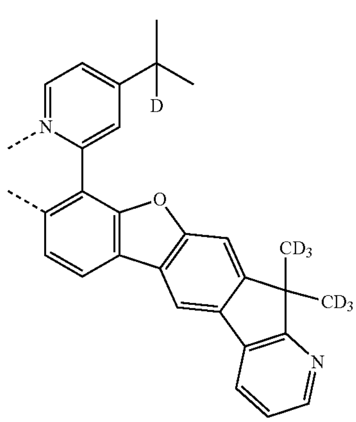
$L_{A450}$
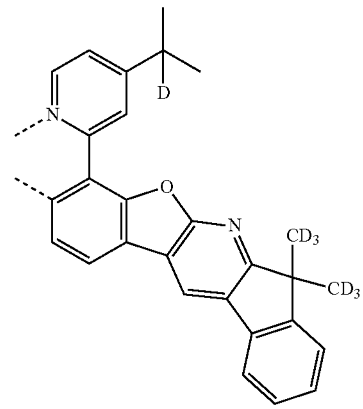
$L_{A451}$
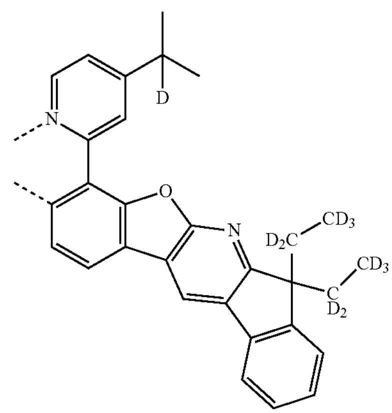
$L_{A452}$
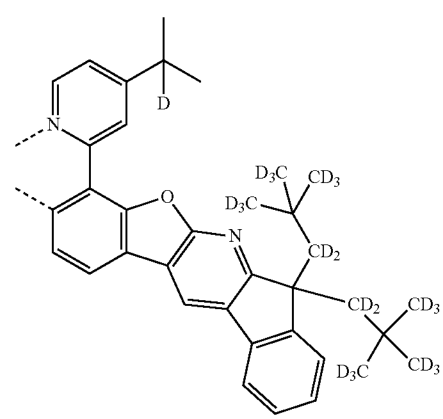
$L_{A453}$
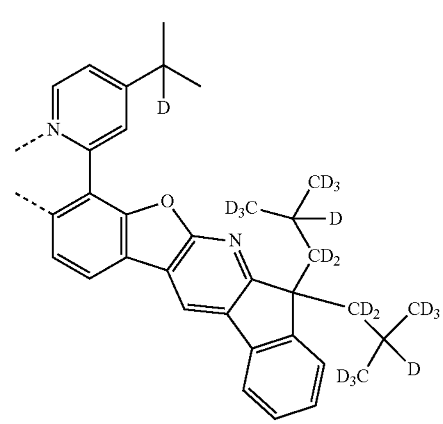

$L_{A454}$
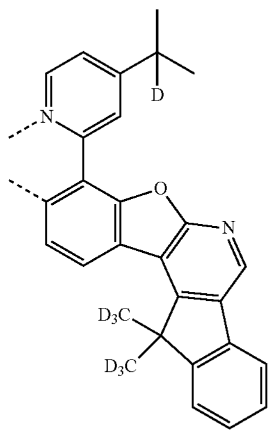
$L_{A455}$
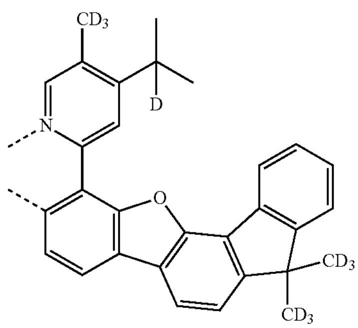
$L_{A456}$
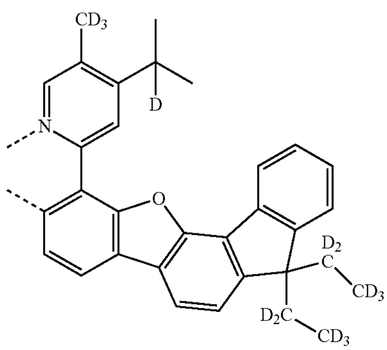
$L_{A457}$
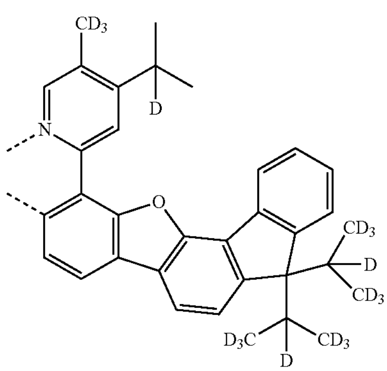
$L_{A458}$
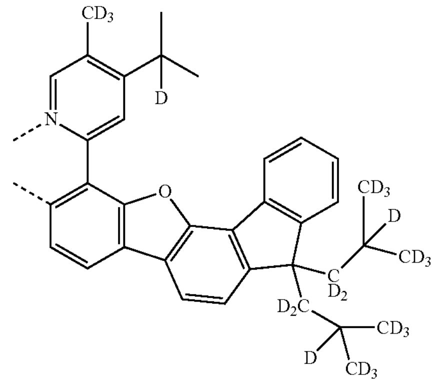
$L_{A459}$
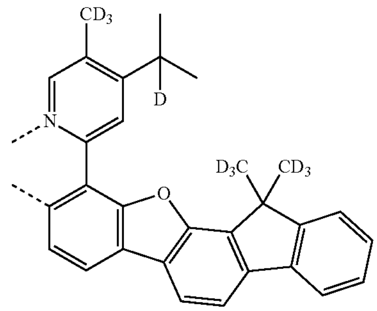
$L_{A460}$
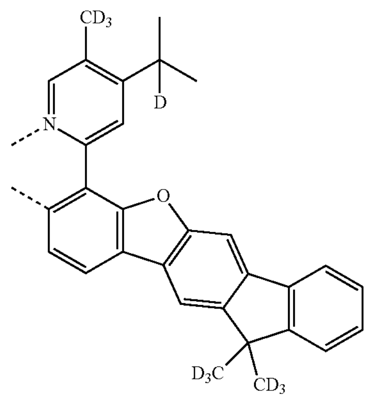
$L_{A461}$
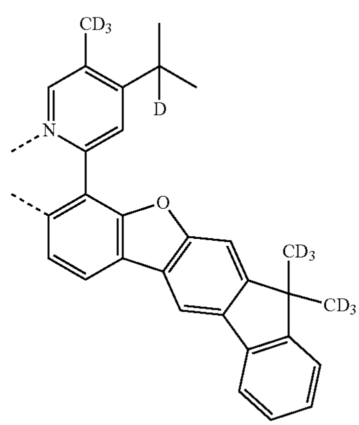

-continued
L$_{A462}$
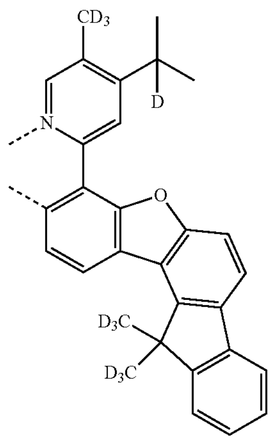
L$_{A463}$
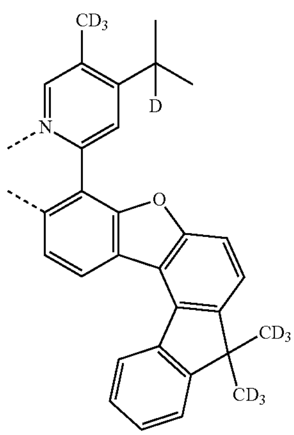
L$_{A464}$
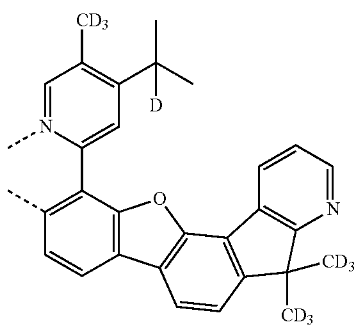
L$_{A465}$
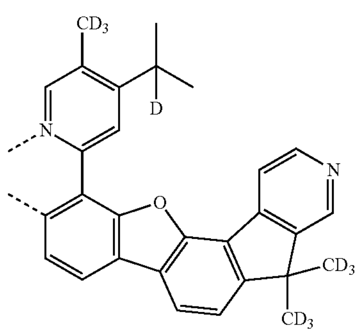
-continued
L$_{A466}$
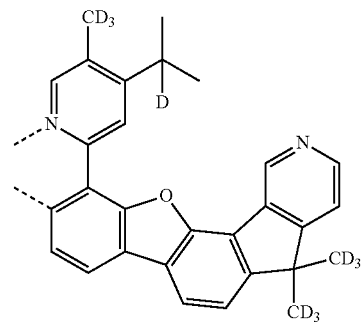
L$_{A467}$
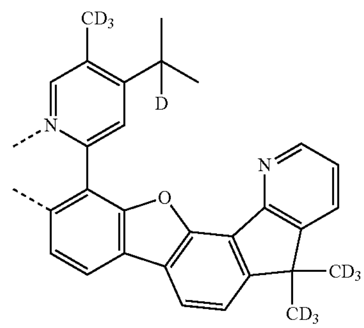
L$_{A468}$
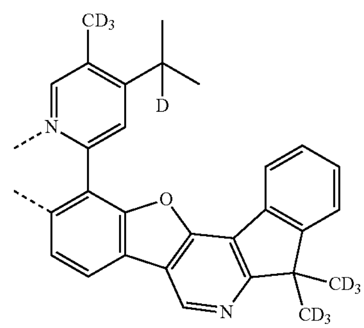
L$_{A469}$
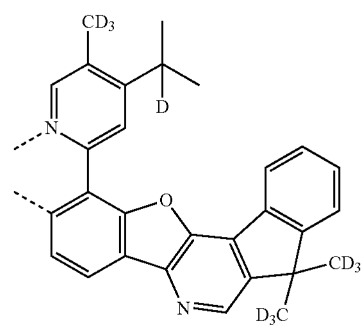
L$_{A470}$
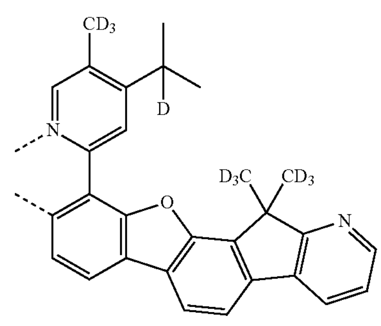

-continued
$L_{A471}$
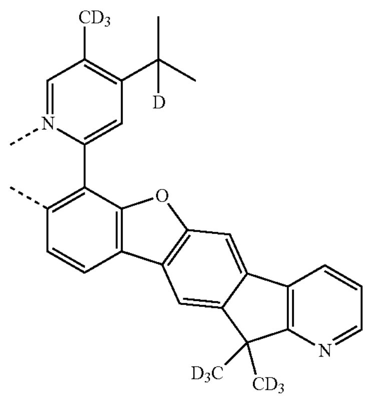
$L_{A472}$
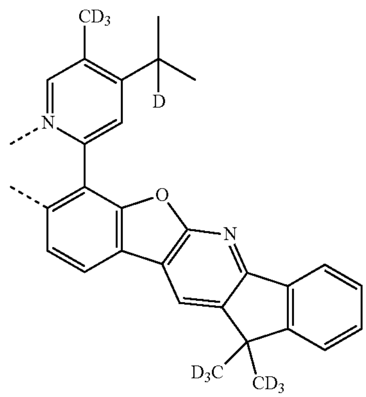
$L_{A473}$
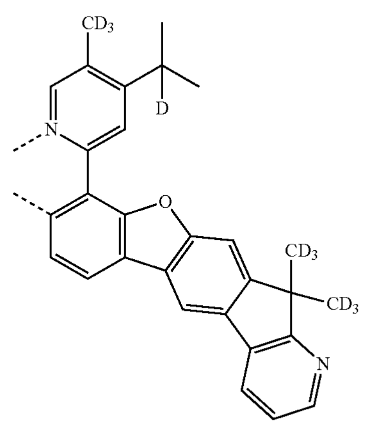
$L_{A474}$
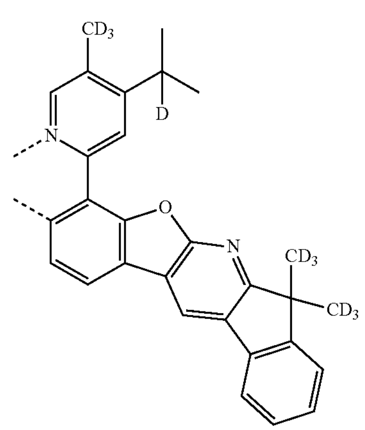
-continued
$L_{A475}$
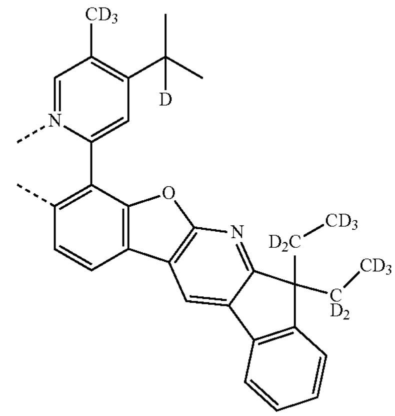
$L_{A476}$
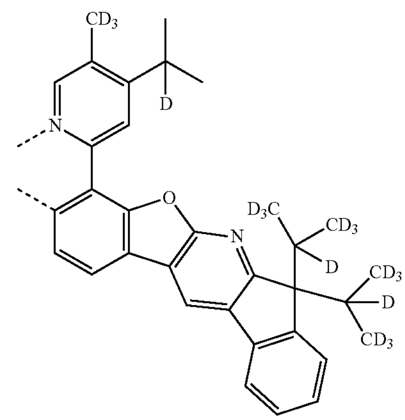
$L_{A477}$
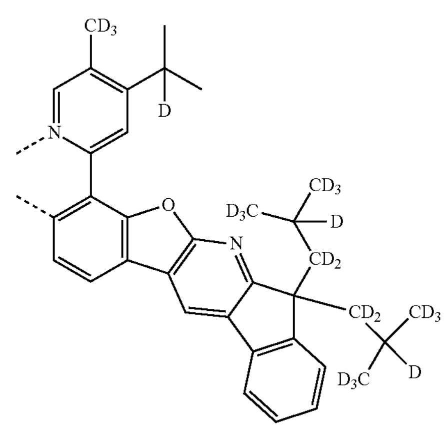

-continued
$L_{A478}$
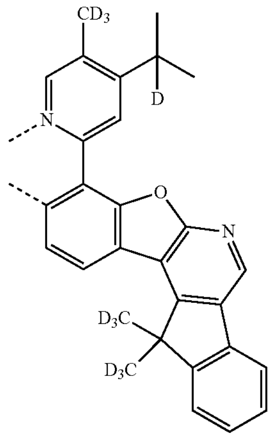
$L_{A479}$
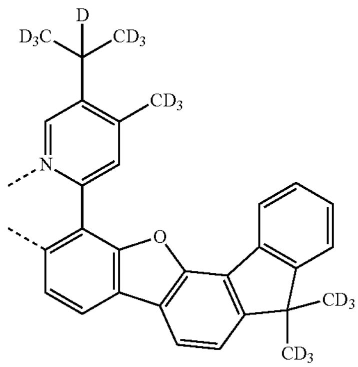
$L_{A480}$
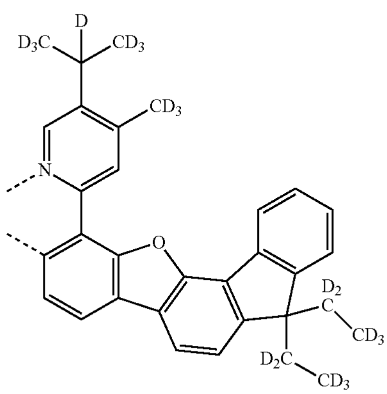
$L_{A481}$
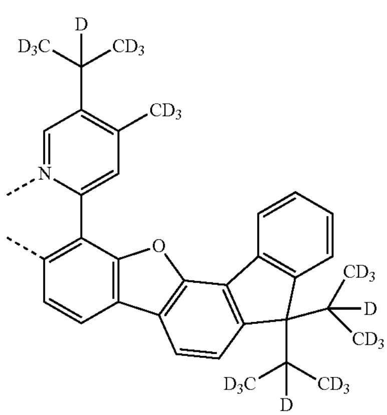
-continued
$L_{A482}$
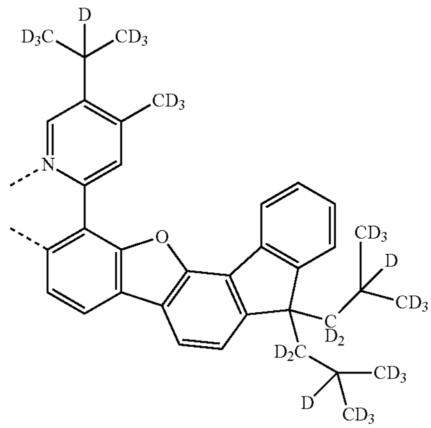
$L_{A483}$
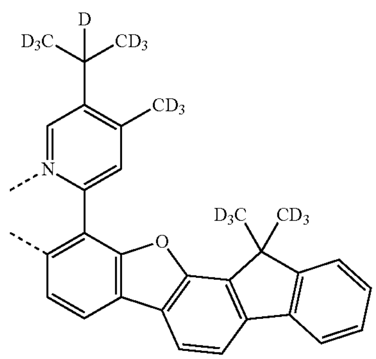
$L_{A484}$
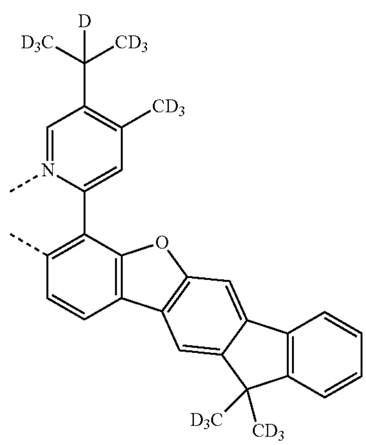

-continued
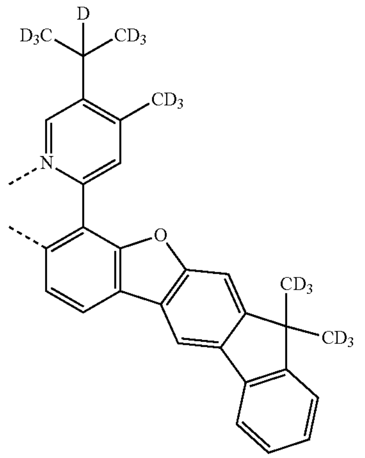
$L_{A485}$
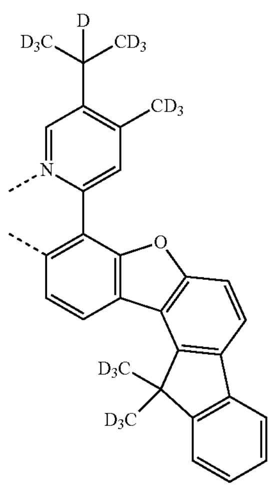
$L_{A486}$
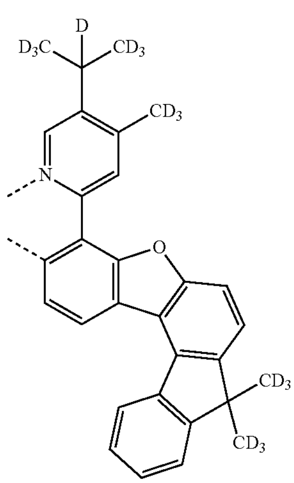
$L_{A487}$
-continued
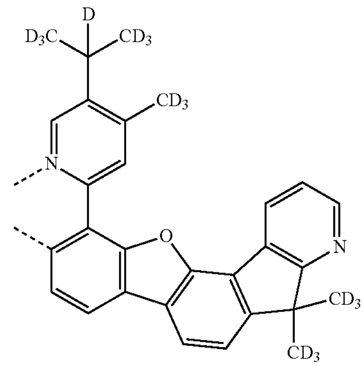
$L_{A488}$
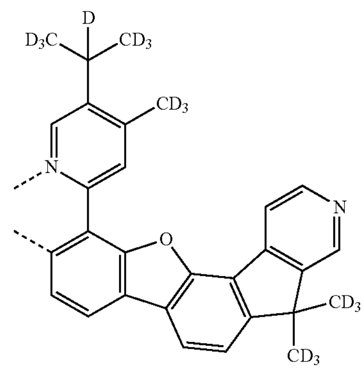
$L_{A489}$
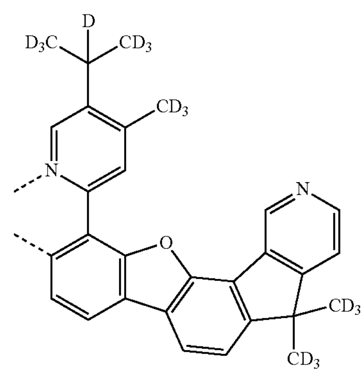
$L_{A490}$
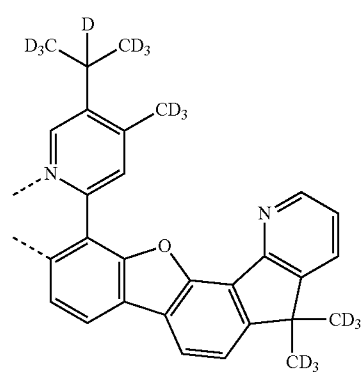
$L_{A491}$ $L_{A492}$
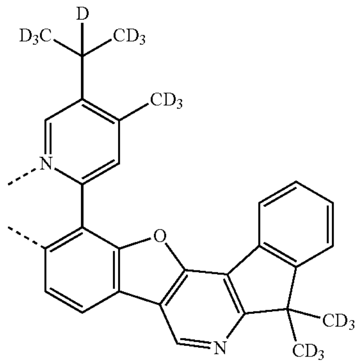
$L_{A493}$
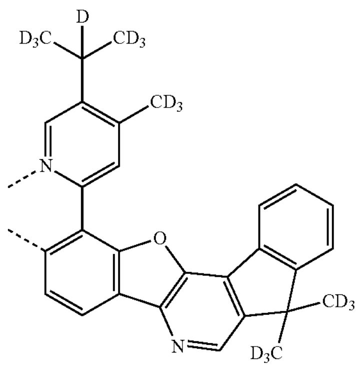
$L_{A494}$
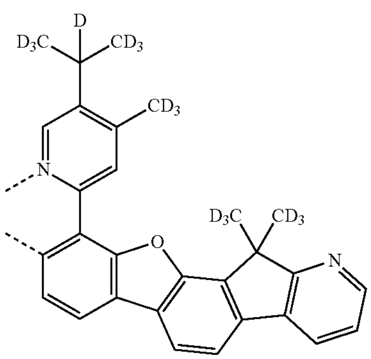
$L_{A495}$
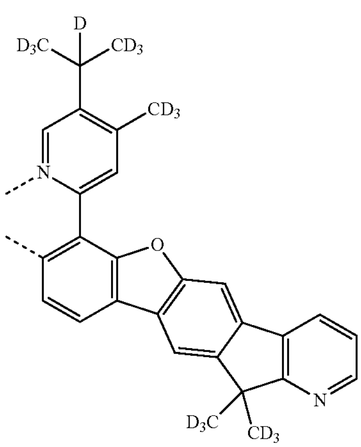
$L_{A496}$
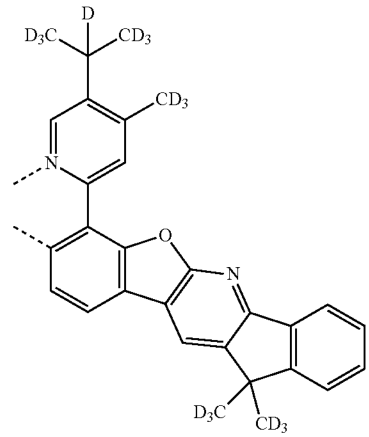
$L_{A497}$
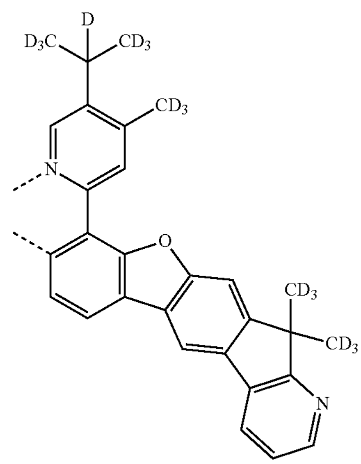
$L_{A498}$
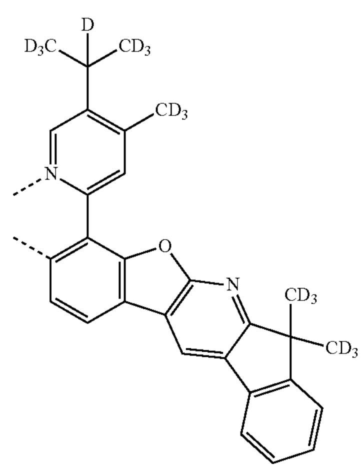

$L_{A499}$
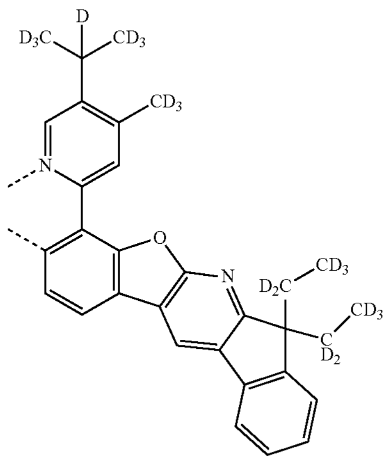
$L_{A500}$
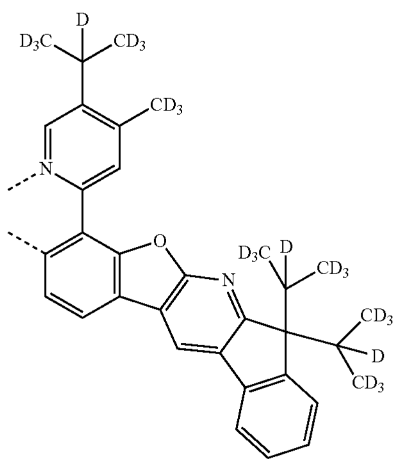
$L_{A501}$
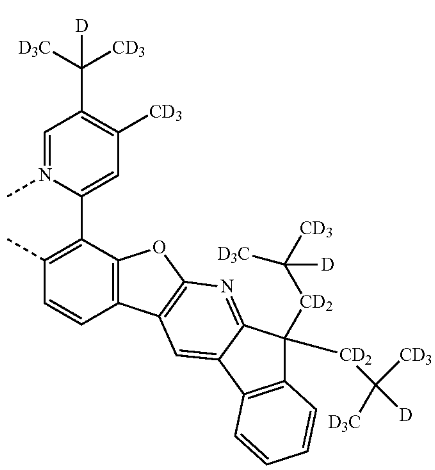
$L_{A502}$
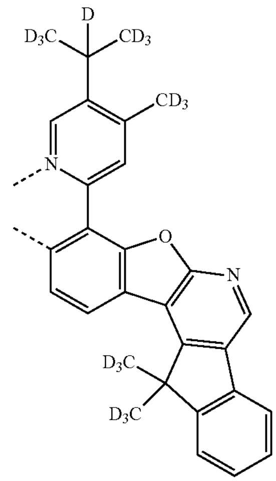
$L_{A503}$
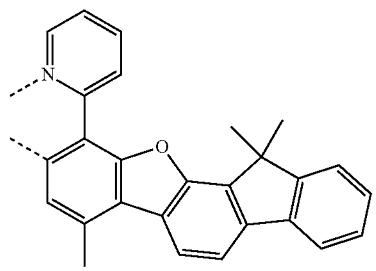
$L_{A504}$
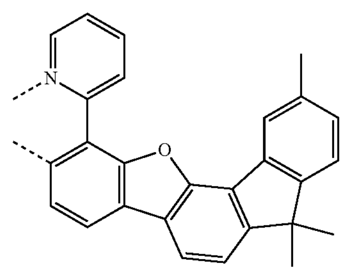
$L_{A505}$
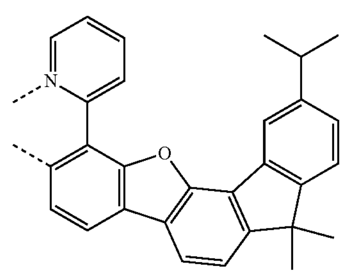
$L_{A506}$
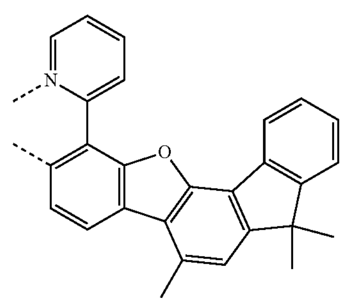

-continued $L_{A507}$

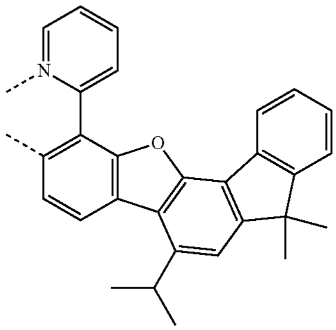

and $L_{A508}$

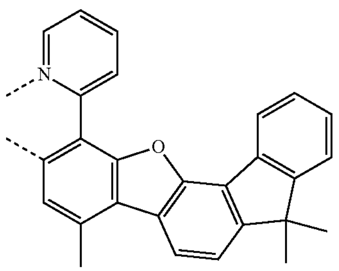

In one embodiment, the compound of the invention has the formula $(L_A)Ir(L_B)_2$ of Formula II, having the structure:

Formula II

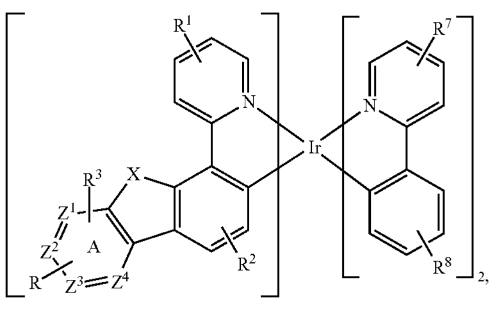

wherein $R^7$ and $R^8$ each independently represent mono, di, tri, or tetra substitutions, or no substitution;

wherein $R^7$ and $R^8$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two adjacent $R^7$ and $R^8$ are optionally joined to form a ring, which can be further substituted.

In one embodiment $L_B$ is selected from the group consisting of $L_{B1}$ to $L_{B225}$:

$L_{B1}$

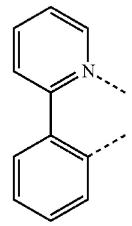

$L_{B2}$

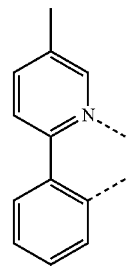

$L_{B3}$

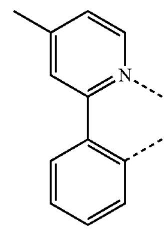

$L_{B4}$

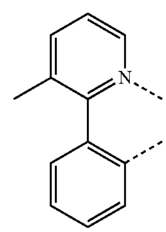

$L_{B5}$

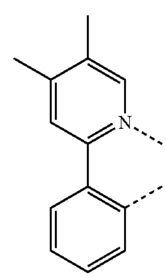

$L_{B6}$

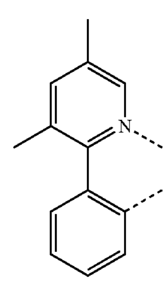

-continued
$L_{B7}$
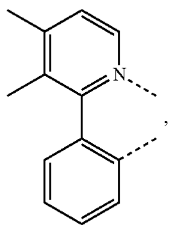
$L_{B8}$
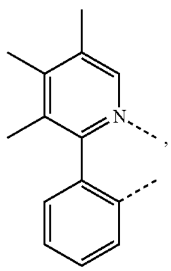
$L_{B9}$
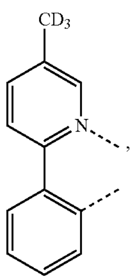
$L_{B10}$
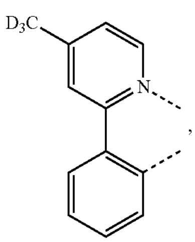
$L_{B11}$
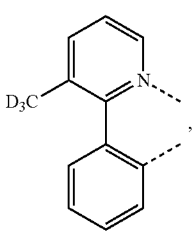
$L_{B12}$
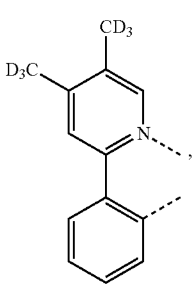
-continued
$L_{B13}$
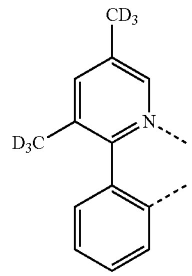
$L_{B14}$
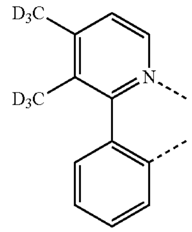
$L_{B15}$
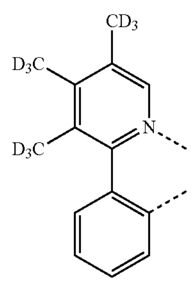
$L_{B16}$
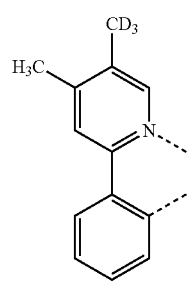
$L_{B17}$
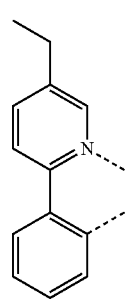

-continued
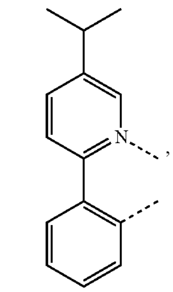
$L_{B18}$
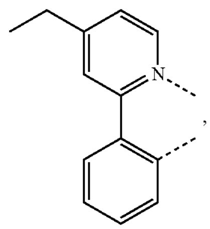
$L_{B19}$
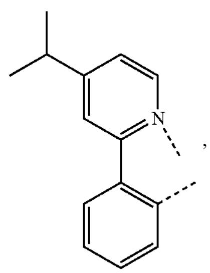
$L_{B20}$
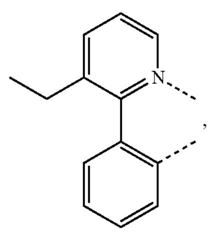
$L_{B21}$
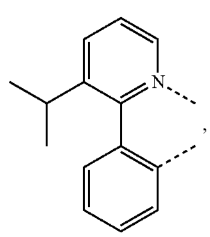
$L_{B22}$
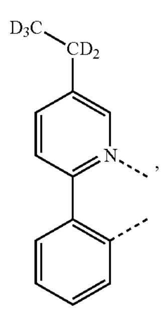
$L_{B23}$
-continued
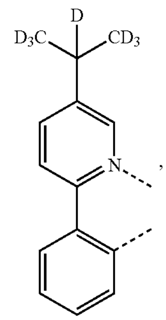
$L_{B24}$
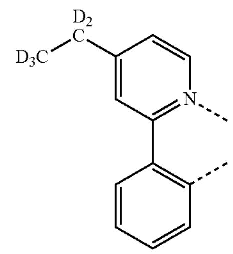
$L_{B25}$
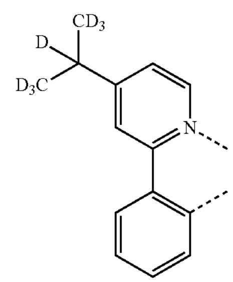
$L_{B26}$
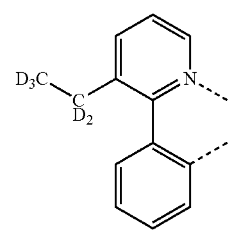
$L_{B27}$
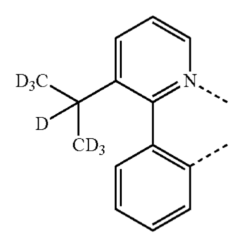
$L_{B28}$
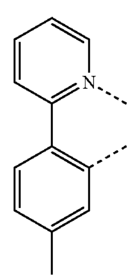
$L_{B29}$ -continued
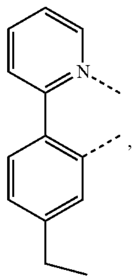
$L_{B30}$
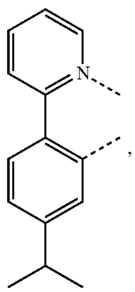
$L_{B31}$
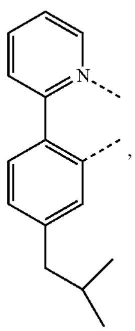
$L_{B32}$
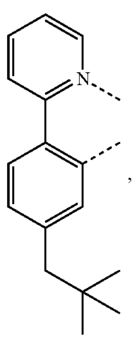
$L_{B33}$
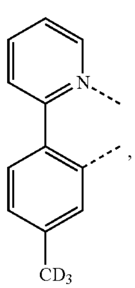
$L_{B34}$
-continued
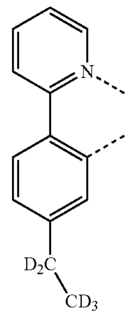
$L_{B35}$
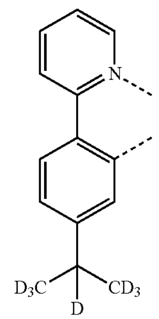
$L_{B36}$
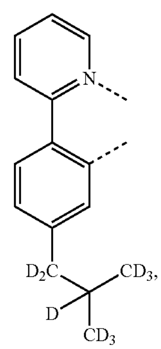
$L_{B37}$
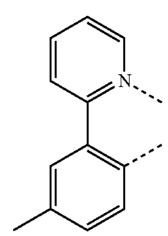
$L_{B38}$
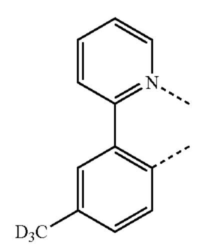
$L_{B39}$ -continued
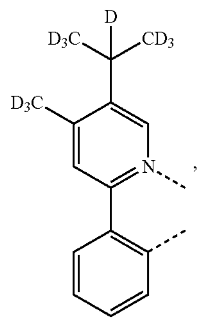
$L_{B40}$
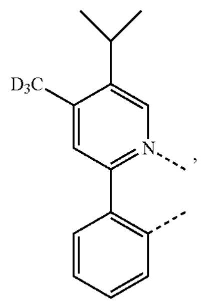
$L_{B41}$
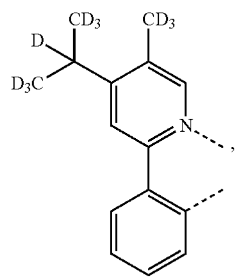
$L_{B42}$
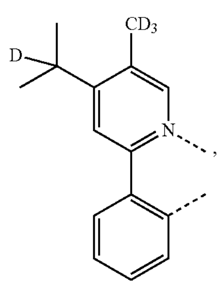
$L_{B43}$
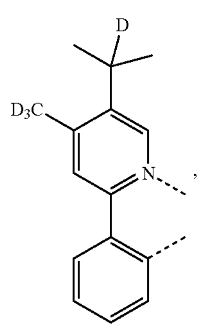
$L_{B44}$
-continued
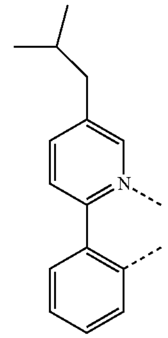
$L_{B45}$
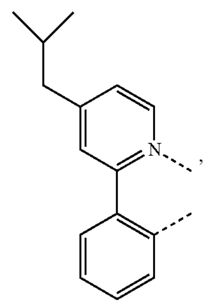
$L_{B46}$
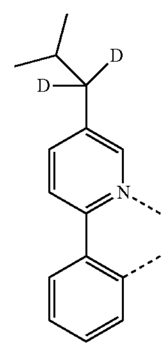
$L_{B47}$
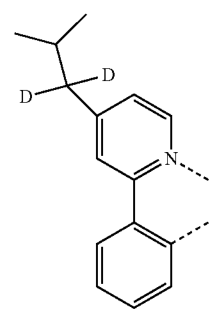
$L_{B48}$
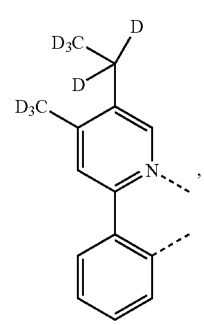
$L_{B49}$ -continued
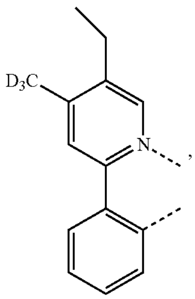
$L_{B50}$
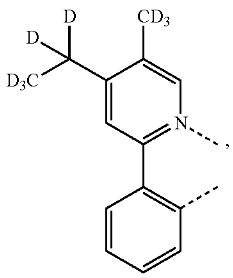
$L_{B51}$
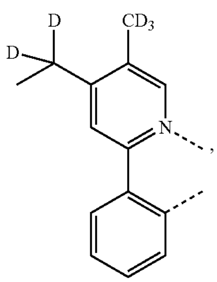
$L_{B52}$
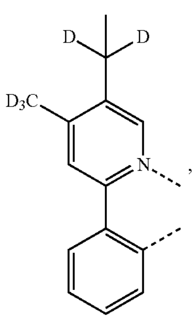
$L_{B53}$
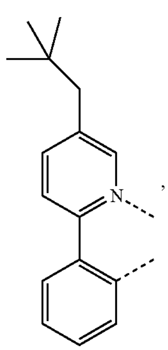
$L_{B54}$
-continued
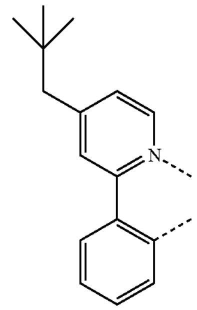
$L_{B55}$
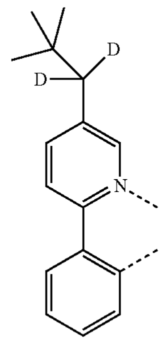
$L_{B56}$
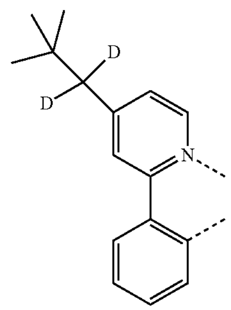
$L_{B57}$
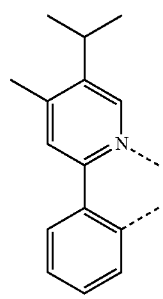
$L_{B58}$
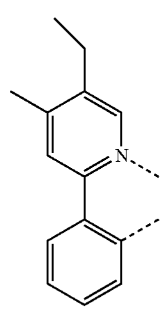
$L_{B59}$ -continued
$L_{B60}$
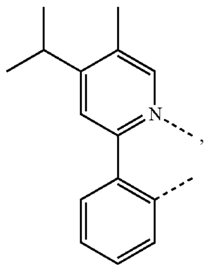
$L_{B61}$
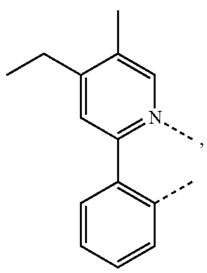
$L_{B62}$
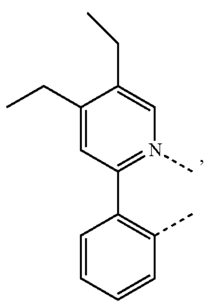
$L_{B63}$
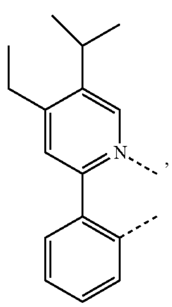
$L_{B64}$
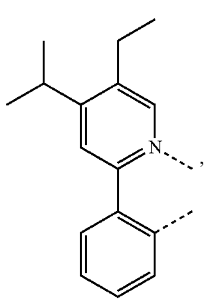
-continued
$L_{B65}$
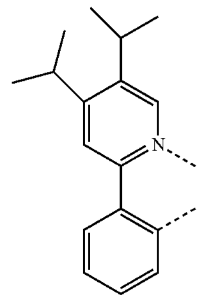
$L_{B66}$
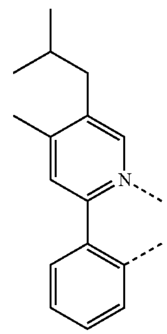
$L_{B67}$
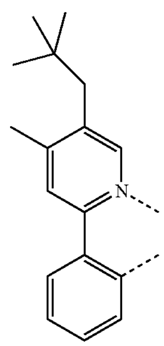
$L_{B68}$
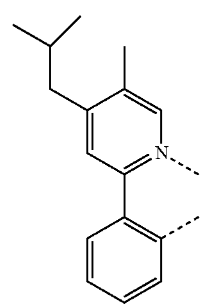
$L_{B69}$
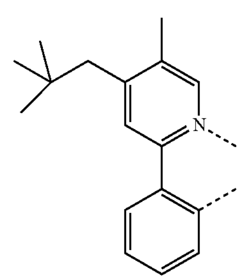

-continued
$L_{B70}$
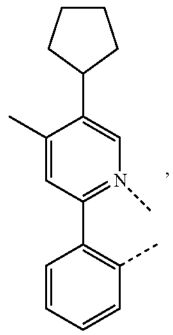
$L_{B71}$
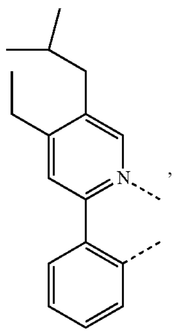
$L_{B72}$
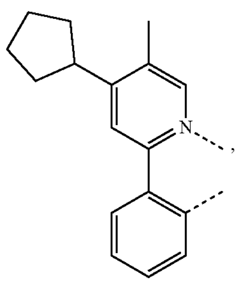
$L_{B73}$
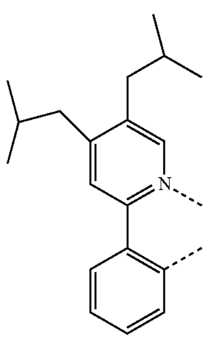
$L_{B74}$
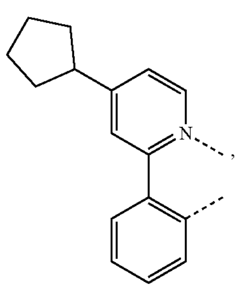
-continued
$L_{B75}$
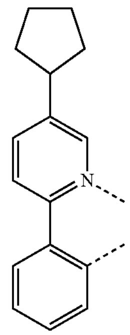
$L_{B76}$
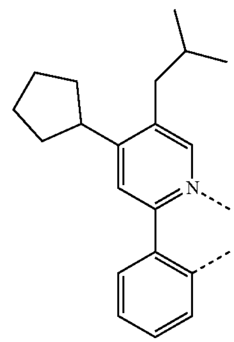
$L_{B77}$
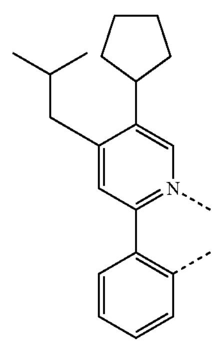
$L_{B78}$
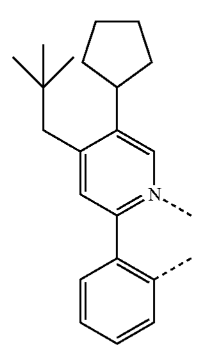

$L_{B79}$
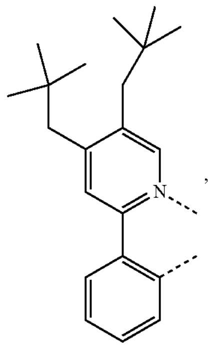
$L_{B80}$
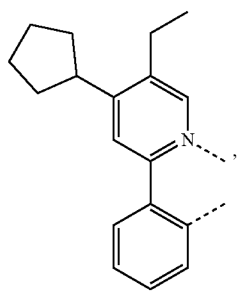
$L_{B81}$
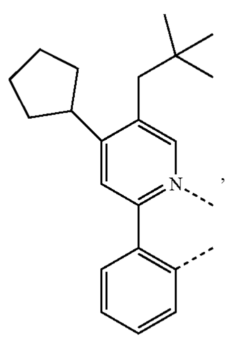
$L_{B82}$
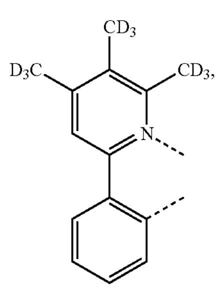
$L_{B83}$
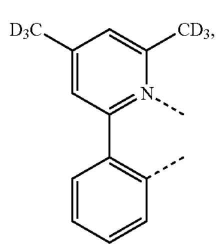
$L_{B84}$
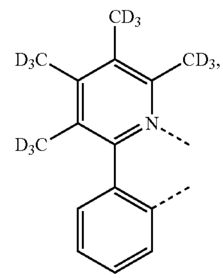
$L_{B85}$
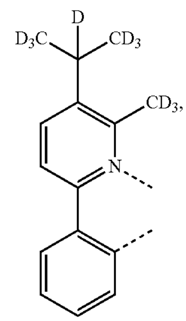
$L_{B86}$
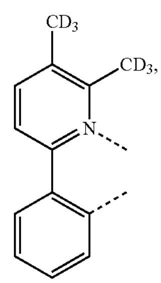
$L_{B87}$
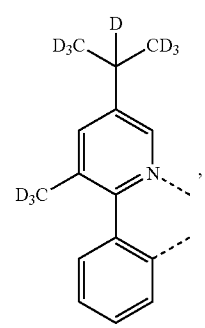
$L_{B88}$
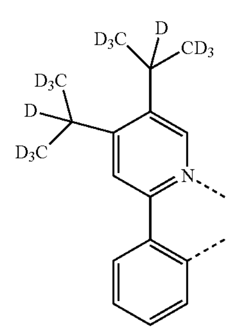

-continued
$L_{B89}$
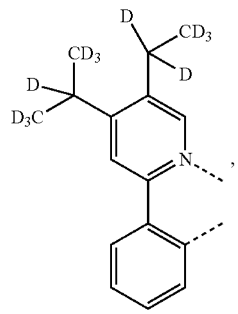
$L_{B90}$
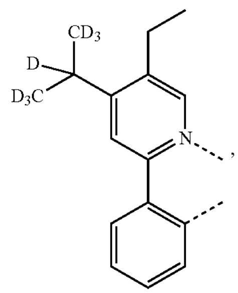
$L_{B91}$
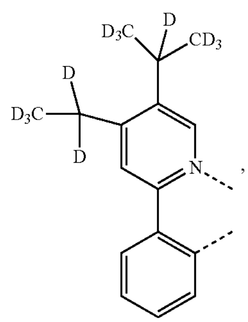
$L_{B92}$
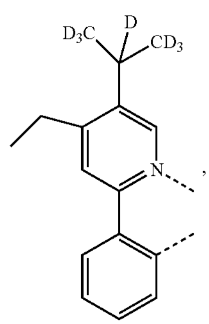
$L_{B93}$
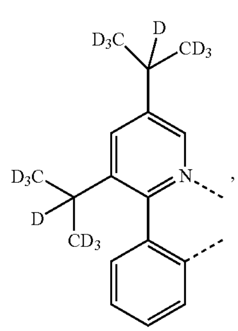
-continued
$L_{B94}$
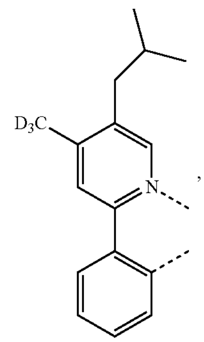
$L_{B95}$
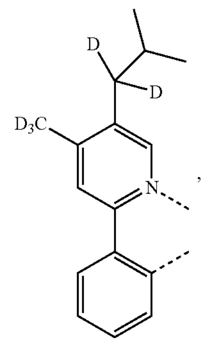
$L_{B96}$
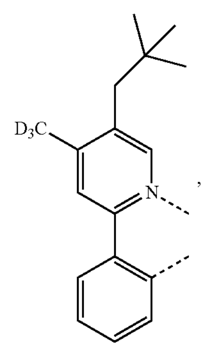
$L_{B97}$
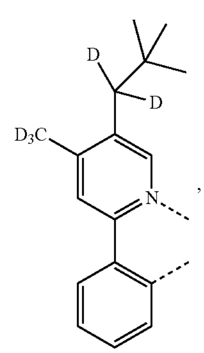

$L_{B98}$
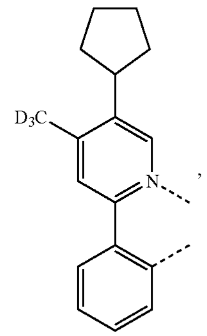
$L_{B99}$
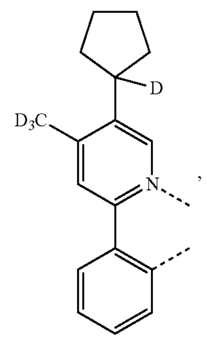
$L_{B100}$
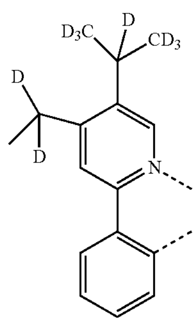
$L_{B101}$
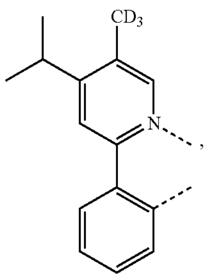
$L_{B102}$
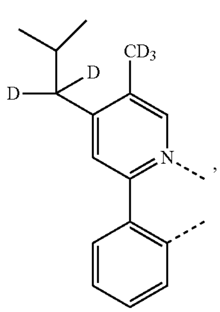
$L_{B103}$
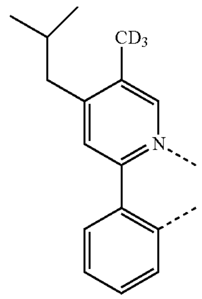
$L_{B104}$
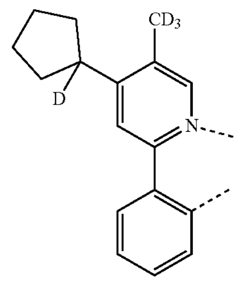
$L_{B105}$
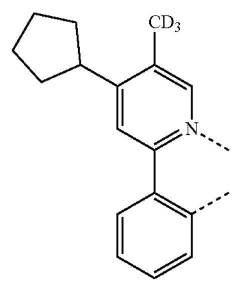
$L_{B106}$
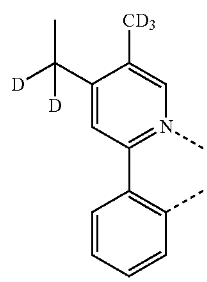
$L_{B107}$
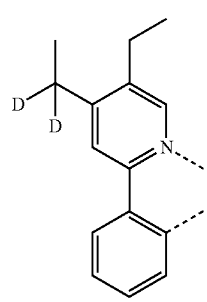

-continued
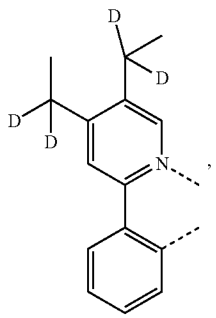
$L_{B108}$
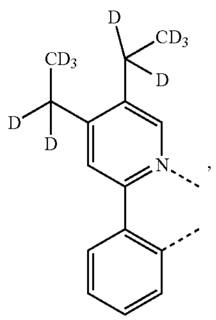
$L_{B109}$
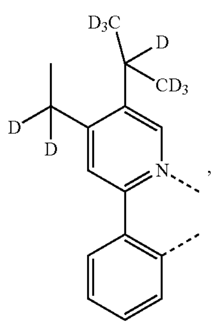
$L_{B110}$
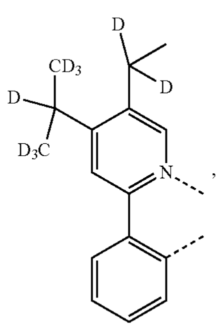
$L_{B111}$
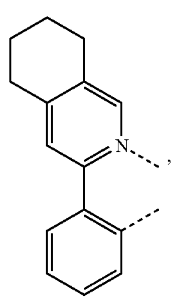
$L_{B112}$
-continued
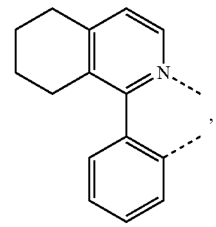
$L_{B113}$
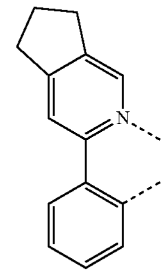
$L_{B114}$
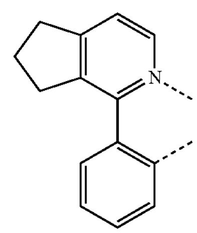
$L_{B115}$
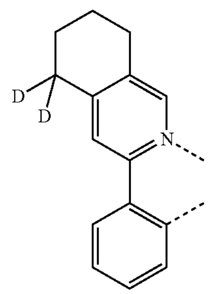
$L_{B116}$
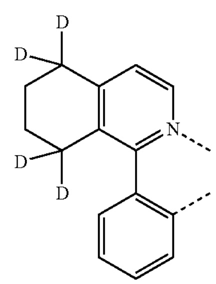
$L_{B117}$
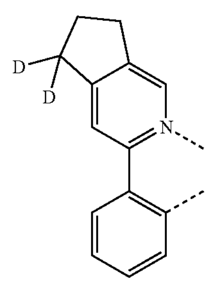
$L_{B118}$ -continued
$L_{B119}$
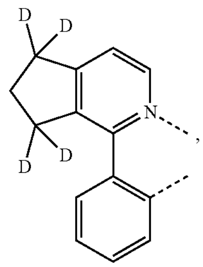
$L_{B120}$
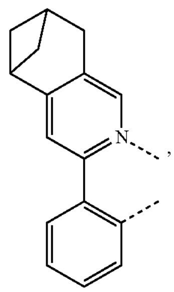
$L_{B121}$
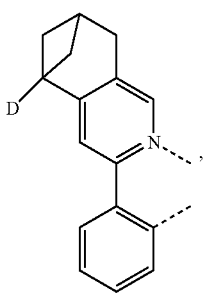
$L_{B122}$
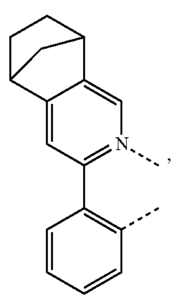
$L_{B123}$
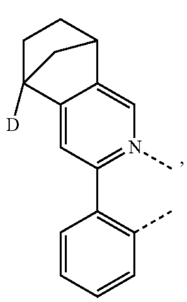
-continued
$L_{B124}$
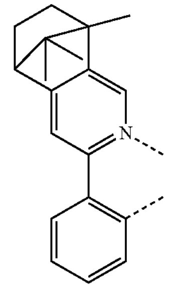
$L_{B125}$
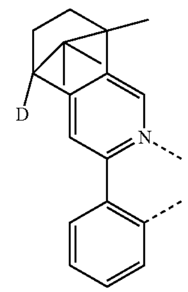
$L_{B126}$
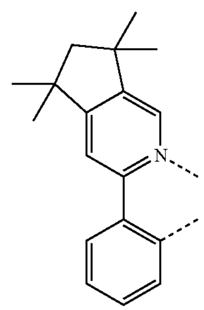
$L_{B127}$
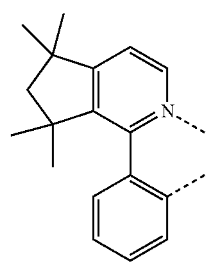
$L_{B128}$
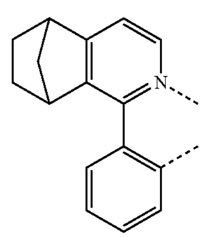

-continued
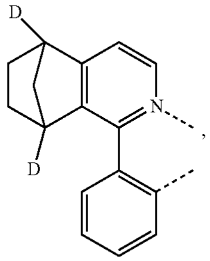
$L_{B129}$
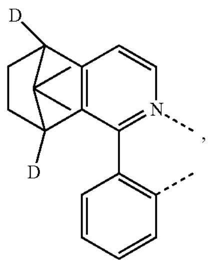
$L_{B130}$
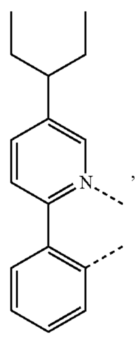
$L_{B131}$
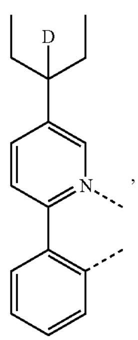
$L_{B132}$
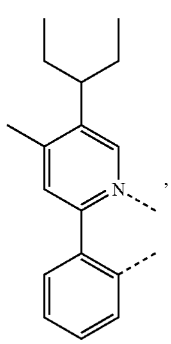
$L_{B133}$
-continued
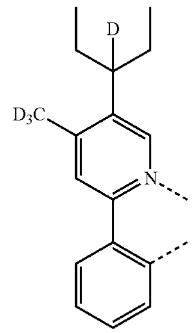
$L_{B134}$
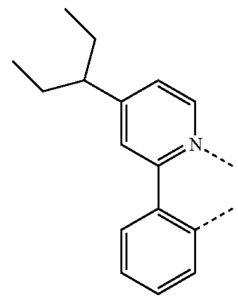
$L_{B135}$
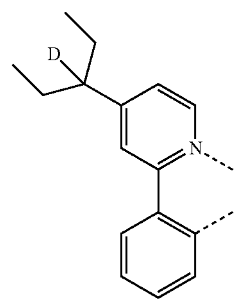
$L_{B136}$
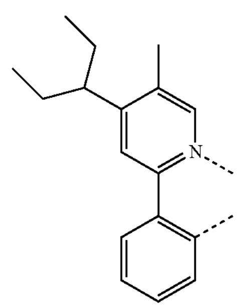
$L_{B137}$
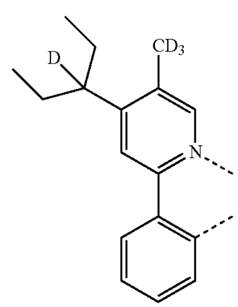
$L_{B138}$ -continued
L$_{B139}$
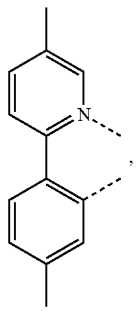
L$_{B140}$
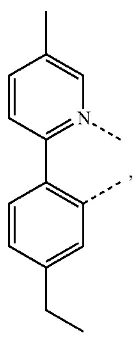
L$_{B141}$
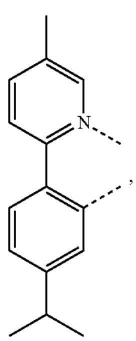
L$_{B142}$
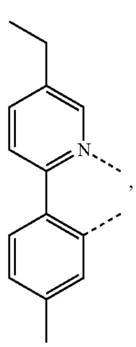
-continued
L$_{B143}$
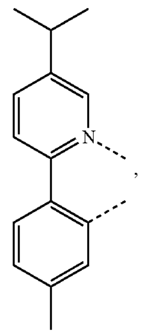
L$_{B144}$
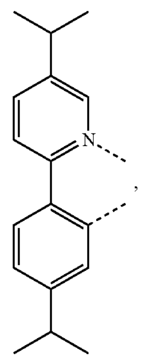
L$_{B145}$
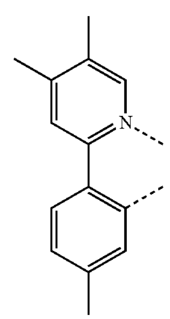
L$_{B146}$
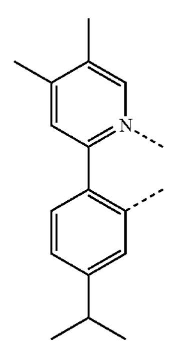

-continued
$L_{B147}$
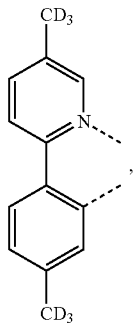
$L_{B148}$
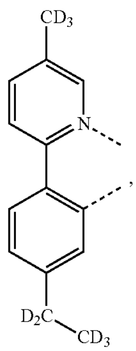
$L_{B149}$
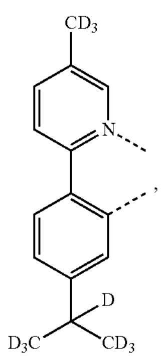
$L_{B150}$
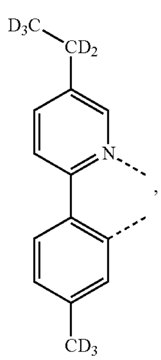
-continued
$L_{B151}$
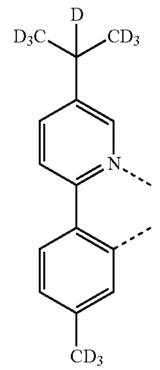
$L_{B152}$
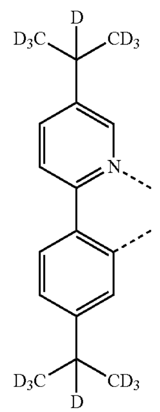
$L_{B153}$
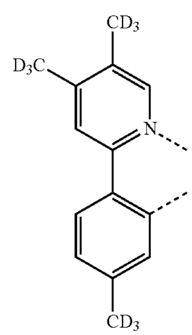
$L_{B154}$
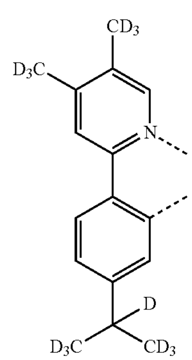

-continued
$L_{B155}$
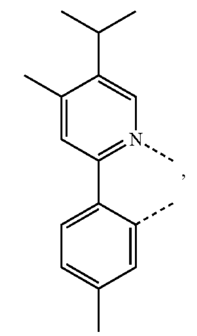
$L_{B156}$
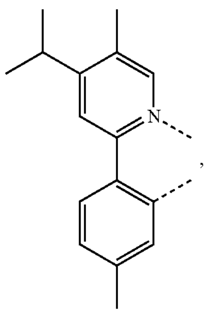
$L_{B157}$
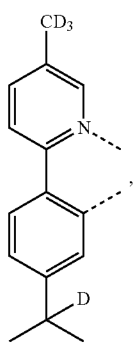
$L_{B158}$
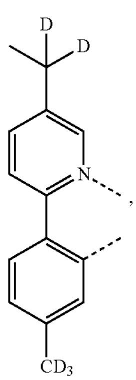
-continued
$L_{B159}$
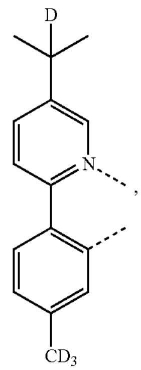
$L_{B160}$
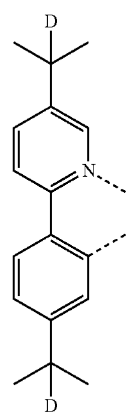
$L_{B161}$
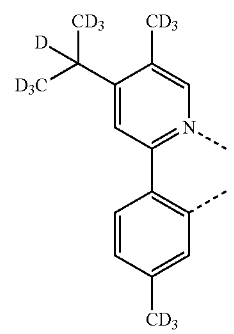
$L_{B162}$
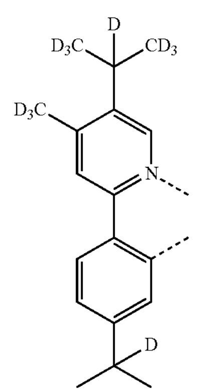

$L_{B163}$
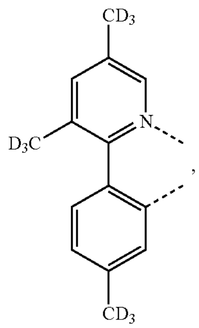
$L_{B164}$
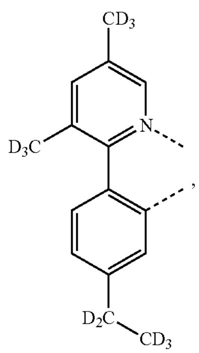
$L_{B165}$
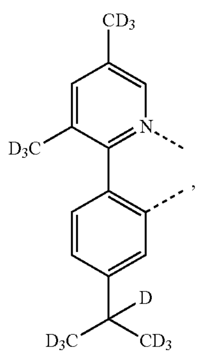
$L_{B166}$
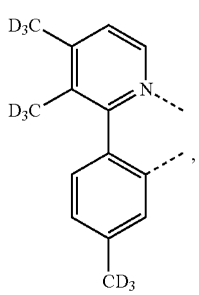
$L_{B167}$
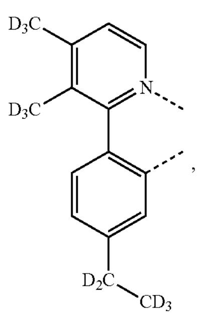
$L_{B168}$
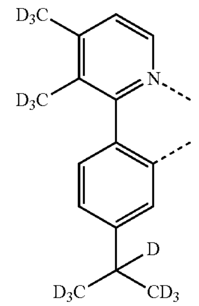
$L_{B169}$
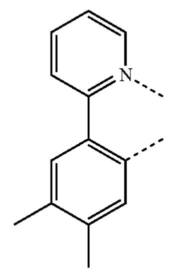
$L_{B170}$
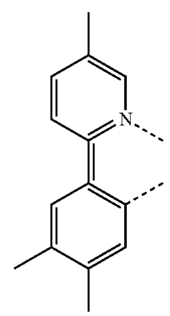
$L_{B171}$
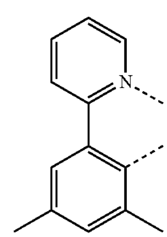
$L_{B172}$
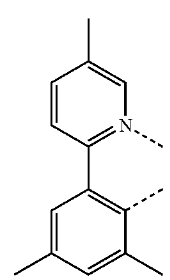

-continued
$L_{B173}$
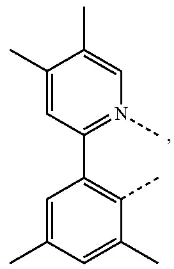
$L_{B174}$
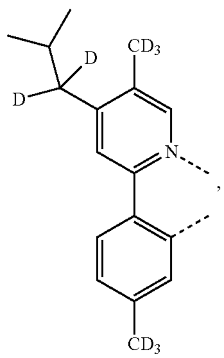
$L_{B175}$
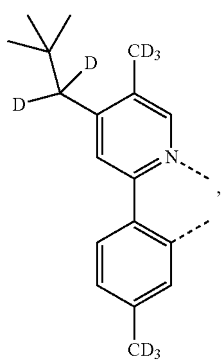
$L_{B176}$
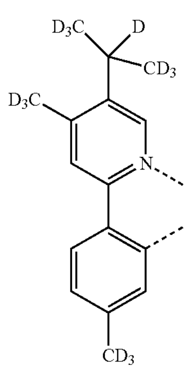
-continued
$L_{B177}$
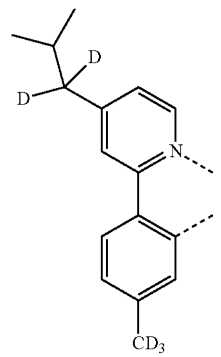
$L_{B178}$
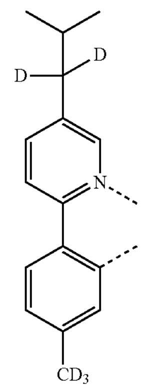
$L_{B179}$
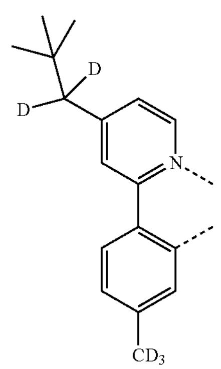
$L_{B180}$
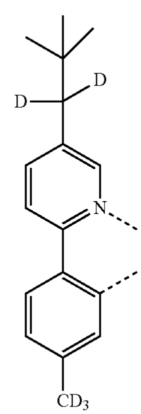

-continued
$L_{B181}$
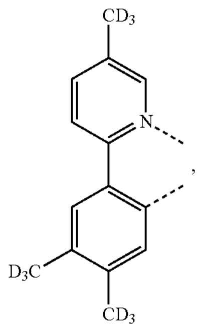
$L_{B182}$
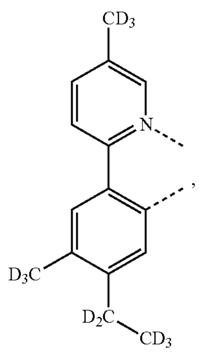
$L_{B183}$
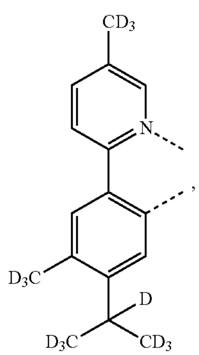
$L_{B184}$
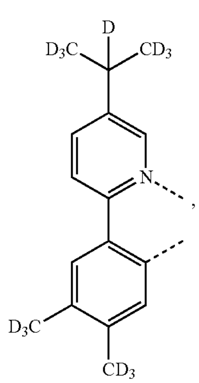
-continued
$L_{B185}$
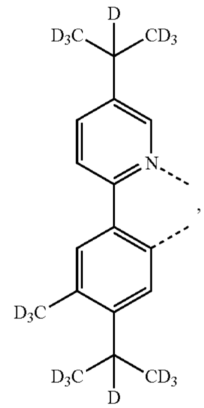
$L_{B186}$
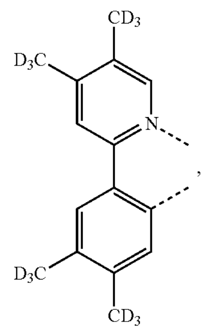
$L_{B187}$
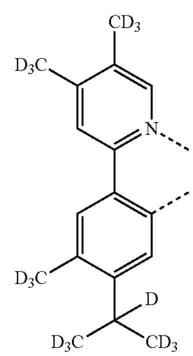
$L_{B188}$
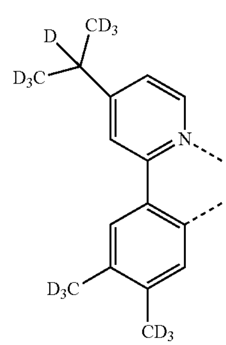

-continued
$L_{B189}$
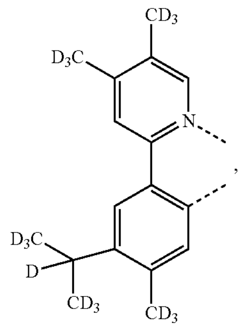
$L_{B190}$
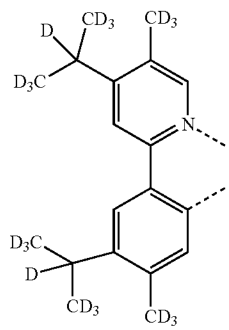
$L_{B191}$
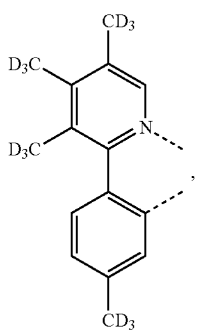
$L_{B192}$
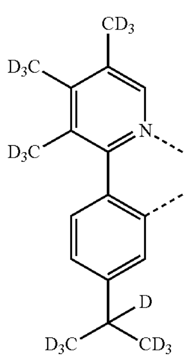
-continued
$L_{B193}$
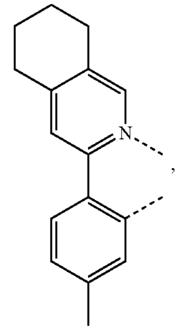
$L_{B194}$
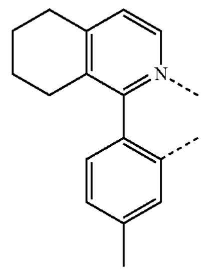
$L_{B195}$
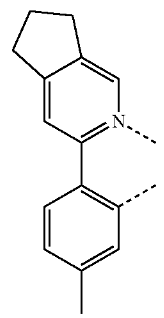
$L_{B196}$
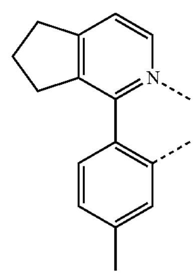
$L_{B197}$
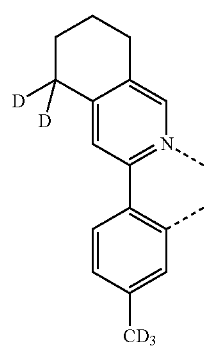

-continued
$L_{B198}$
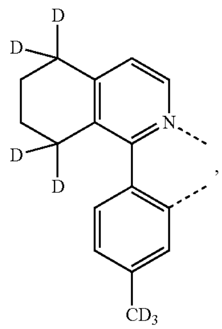
$L_{B199}$
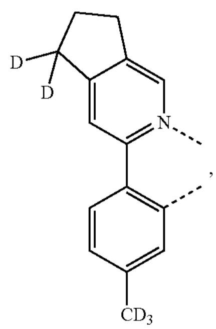
$L_{B200}$
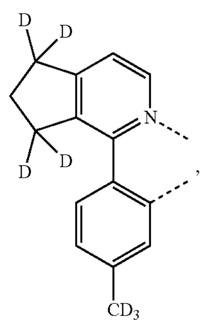
$L_{B201}$
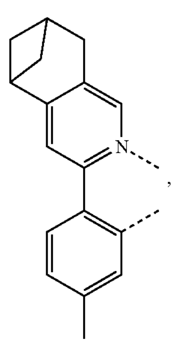
-continued
$L_{B202}$
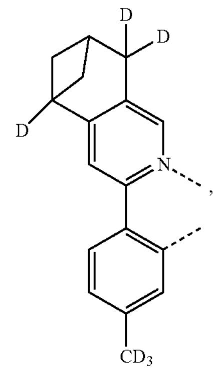
$L_{B203}$
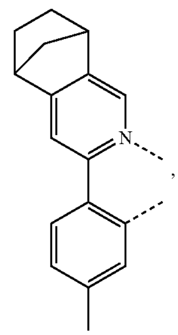
$L_{B204}$
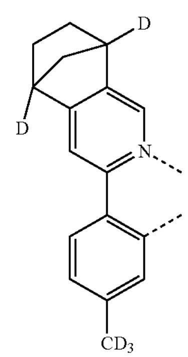
$L_{B205}$
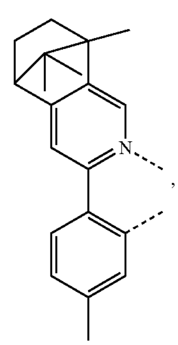

$L_{B206}$
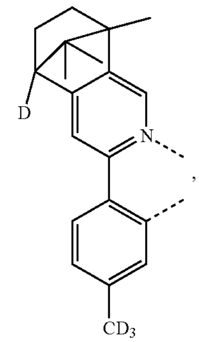
$L_{B207}$
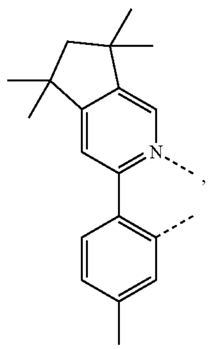
$L_{B208}$
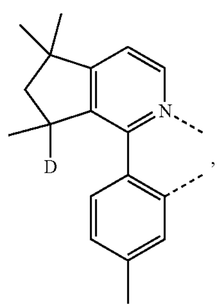
$L_{B209}$
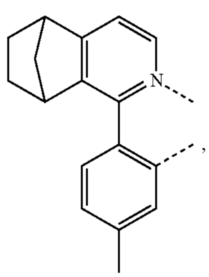
$L_{B210}$
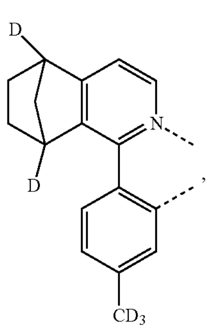
$L_{B211}$
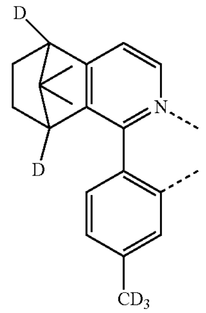
$L_{B212}$
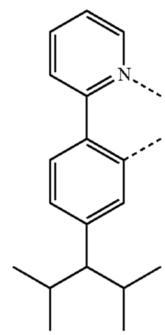
$L_{B213}$
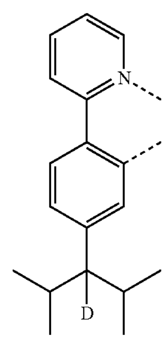
$L_{B214}$
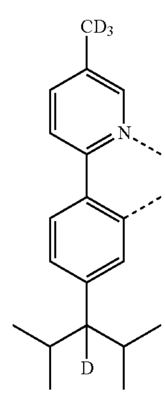

-continued
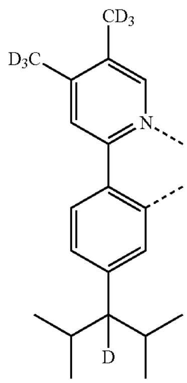
$L_{B215}$
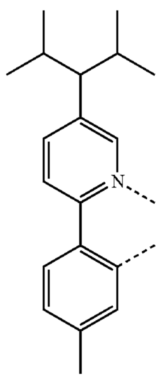
$L_{B216}$
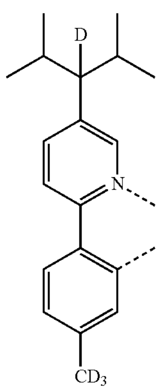
$L_{B217}$
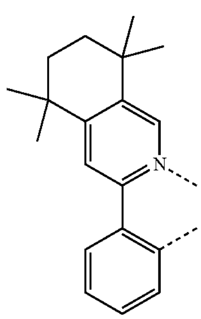
$L_{B218}$
-continued
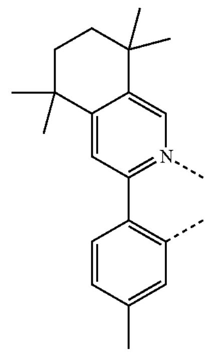
$L_{B219}$
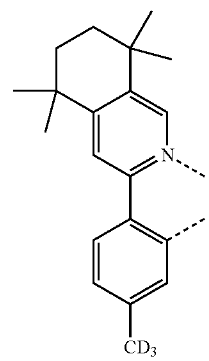
$L_{B220}$
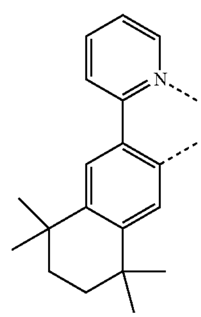
$L_{B221}$
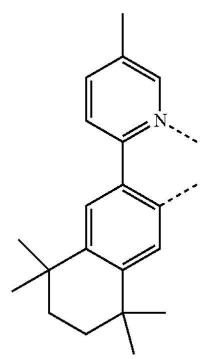
$L_{B222}$ -continued $L_{B223}$

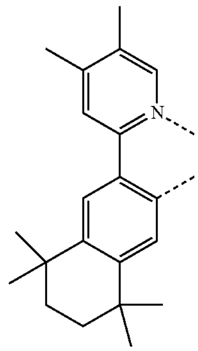

$L_{B224}$

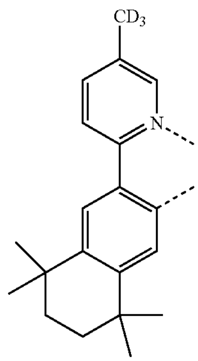

and $L_{B225}$

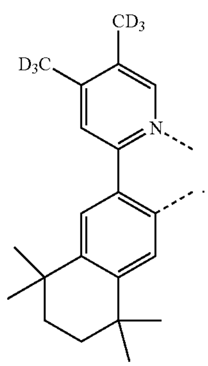

In one embodiment, the compound is selected from the group consisting of Compound 1 through Compound 114,300; where each compound x has the formula $Ir(L_{Ai})(L_{Bj})_2$; wherein x=508j+i−508, i is an integer from 1 to 508, and j is an integer from 1 to 225; wherein $L_{Ai}$ is one of $L_{A1}$ to $L_{A508}$ and $L_{Bj}$ is one of $L_{B1}$ to $L_{B225}$. For example, if the compound has formula $Ir(L_{A35})(L_{B15})_2$, the compound is Compound 7,147. In one embodiment, ligand $L_{Ai}$ is at least one ligand $L_A$. In one embodiment, ligand $L_{Bj}$ is at least one ligand $L_B$.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

Devices:

According to another aspect of the present disclosure, an organic light emitting device (OLED) is also provided. The OLED includes an anode, a cathode, and an organic layer disposed between the anode and the cathode. The organic layer may include a host and a phosphorescent dopant. The emissive layer can include a compound according to Formula I, and its variations as described herein.

The OLED can be one or more of a consumer product, an electronic component module, an organic light-emitting device and a lighting panel. The organic layer can be an emissive layer and the compound can be an emissive dopant in some embodiments, while the compound can be a non-emissive dopant in other embodiments. The organic layer can be a charge transporting layer and the compound can be a charge transporting material in the organic layer in some embodiments. The organic layer can be a blocking layer and the compound can be a blocking material in the organic layer in some embodiments.

In one embodiment, the OLED is incorporated into a device selected from the group consisting of a consumer product, an electronic component module, and a lighting panel.

The organic layer can also include a host. In some embodiments, the host can include a metal complex. In one embodiment, the organic layer comprises a host; wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, $C_nH_{2n}{-}Ar_1$, or no substitution;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In another embodiment, the organic layer further comprises a host, wherein the host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene. The host can include a metal complex.

In another embodiment, the organic layer further comprises a host and the host is selected from the group consisting of:

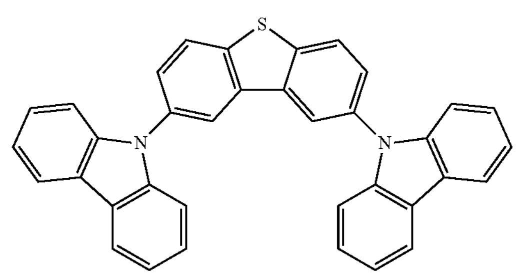

,

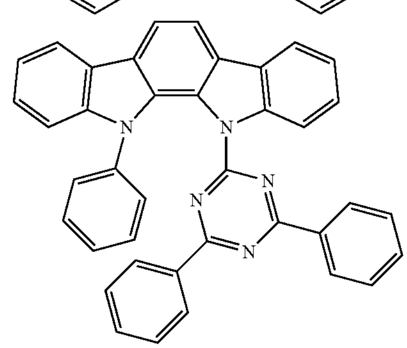

,

-continued
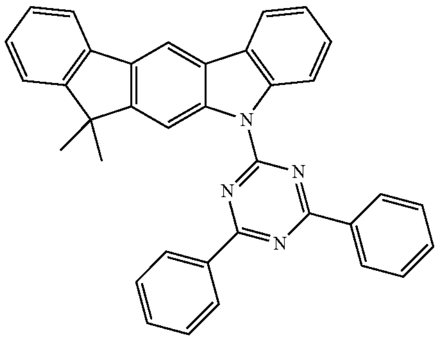
,
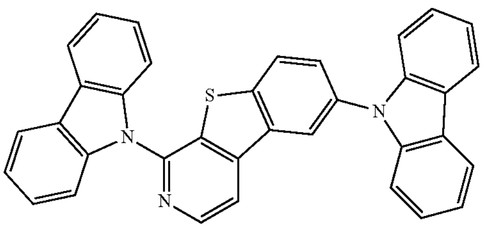
,
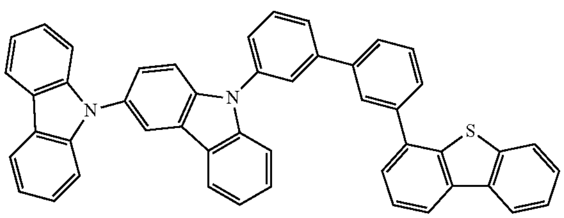
,
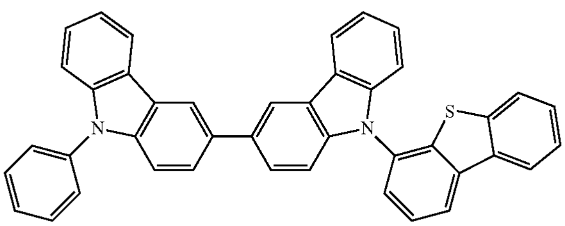
,
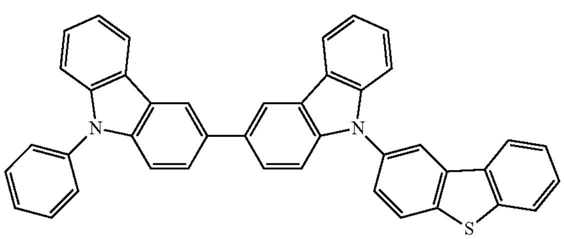
,
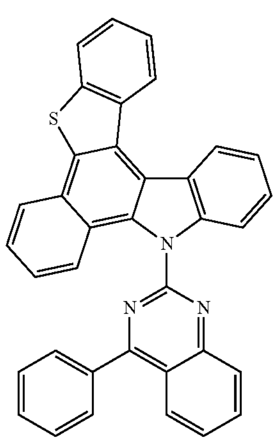
,
-continued
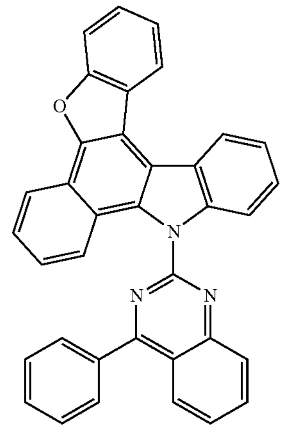
,
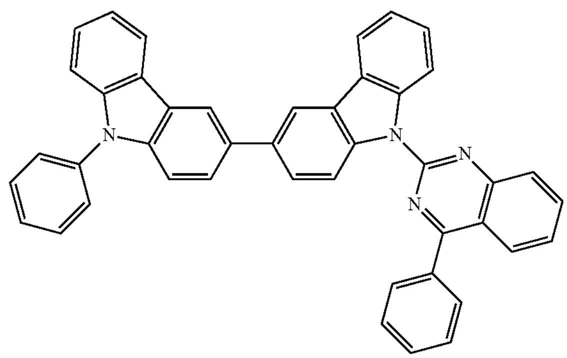
,
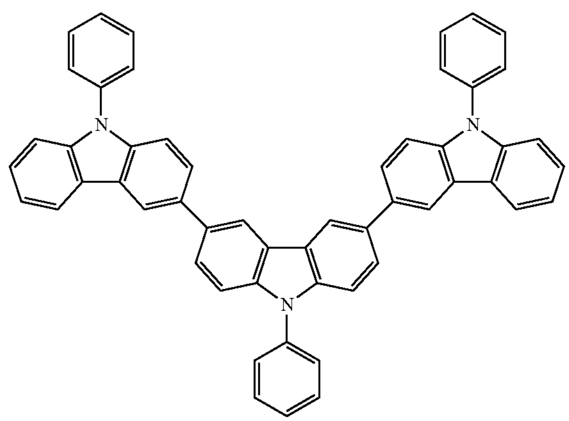
,
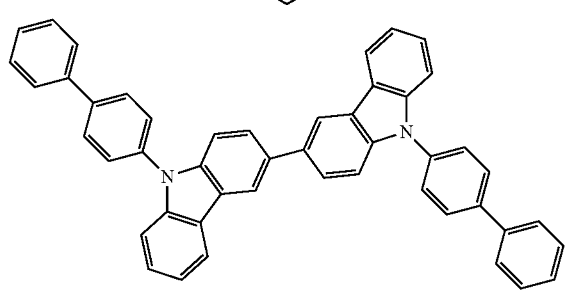
,
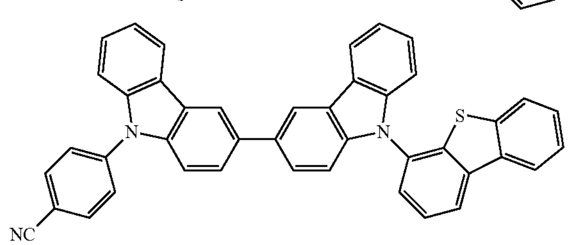
, -continued

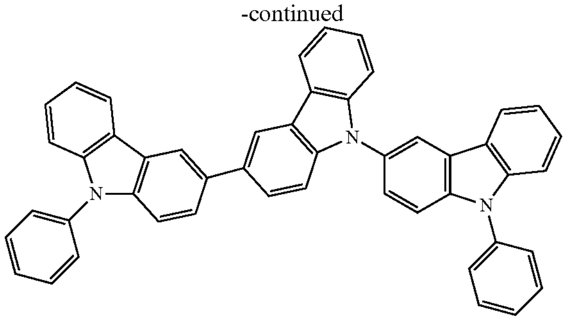
,

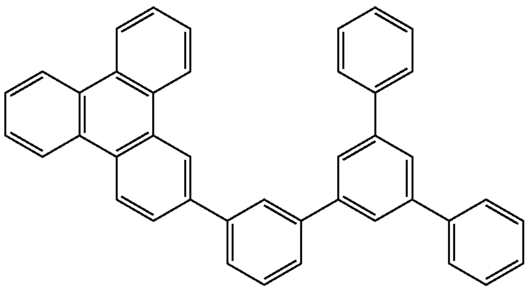
,

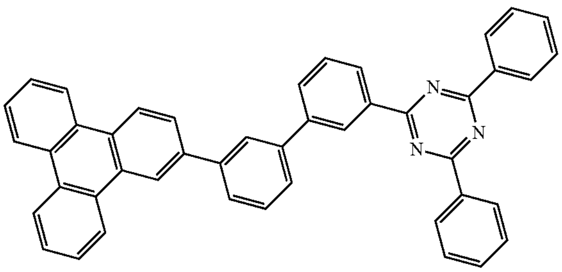
,

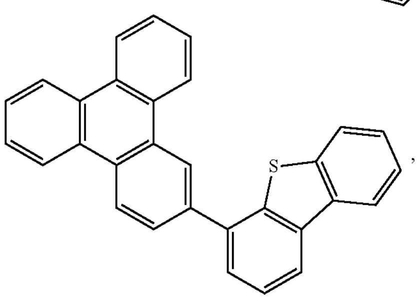
,

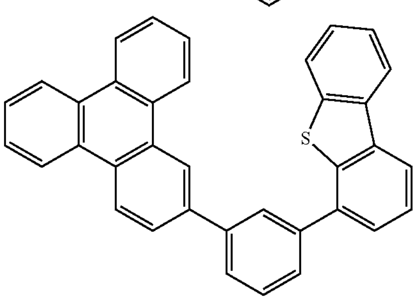
,

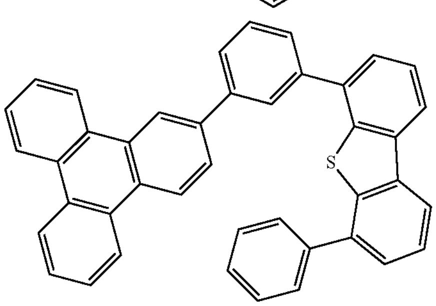
,

-continued

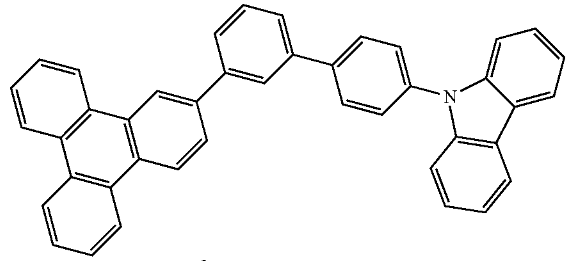
,

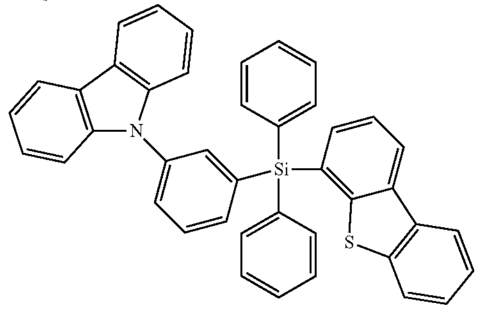
,

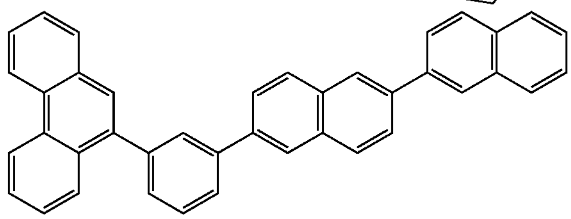
, and combinations thereof.

In one embodiment, the OLED organic layer further comprises a host and the host comprises a metal complex.

Formulations:

In yet another aspect of the present disclosure, a formulation that comprises a compound according to Formula I is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$;

a p-type semiconducting organic compound, such as 1,4,5,8,9,12-Hexaazatriphenylenehexacarbonitrile; a metal complex, and cross-linkable compounds.

Examples of aromatic amine derivatives used in HIL or HTL include, but are not limited to the following general structures:

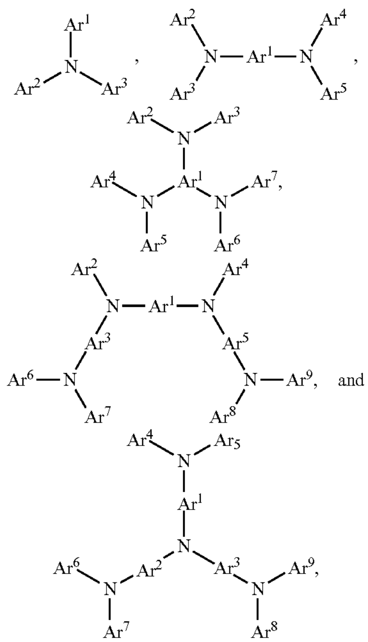

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

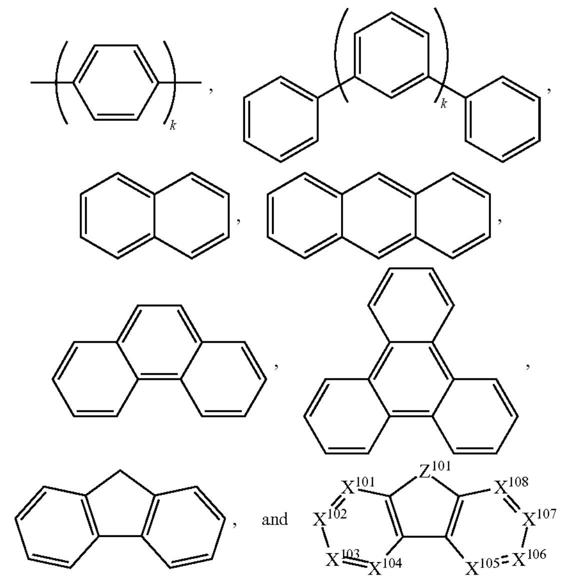

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

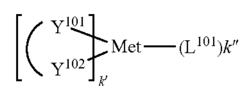

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

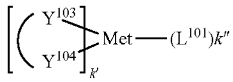

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

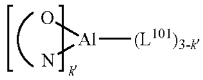 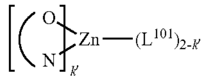

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of organic compounds used as host are selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

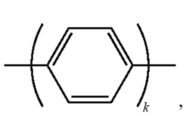, 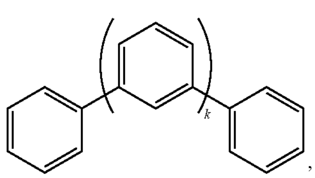,

-continued

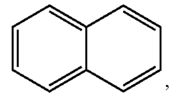, 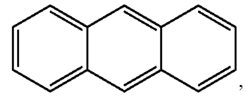,

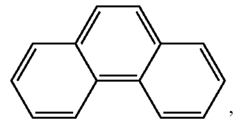, 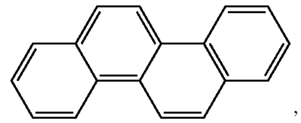,

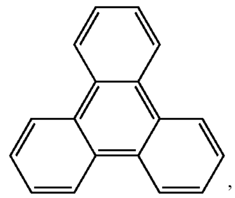, 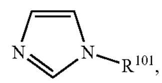, 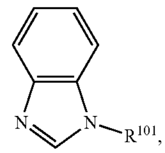

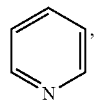, 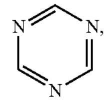, 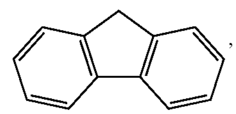,

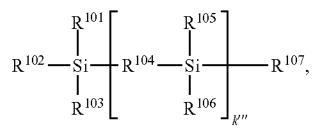

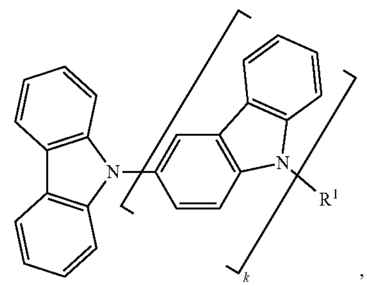,

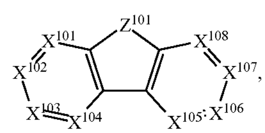

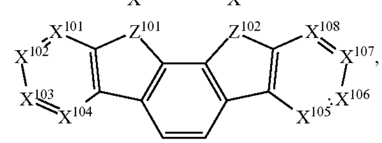

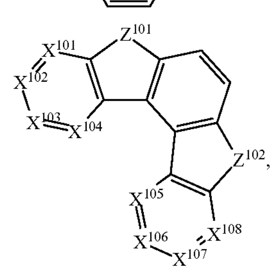

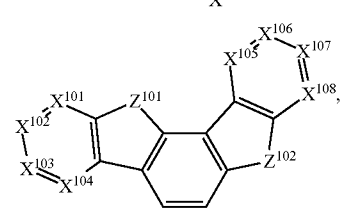

-continued

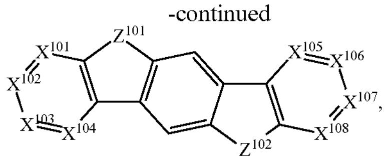

and

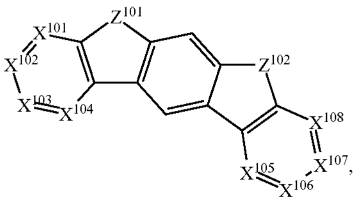

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N.

$Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, the compound used in the HBL contains the same molecule or the same functional groups used as the host described above.

In another aspect, the compound used in the HBL contains at least one of the following groups in the molecule:

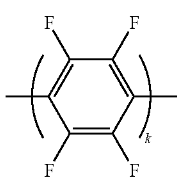

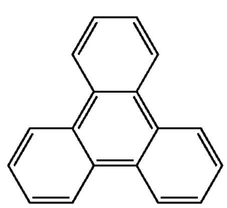

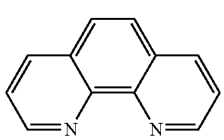

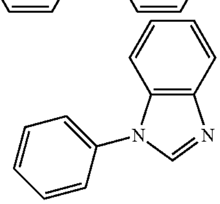

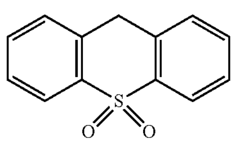

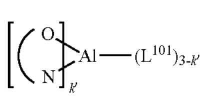

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, the compound used in ETL contains at least one of the following groups in the molecule:

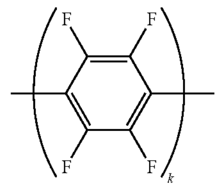

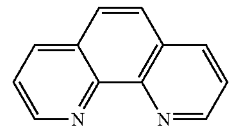

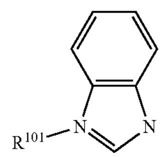

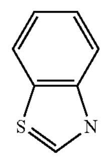

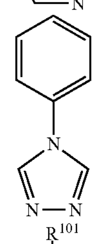

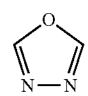

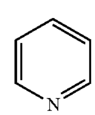

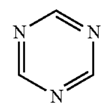

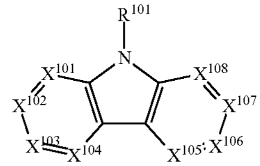

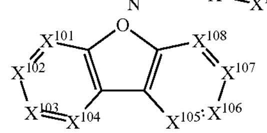

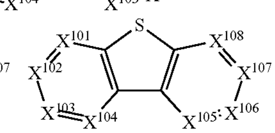

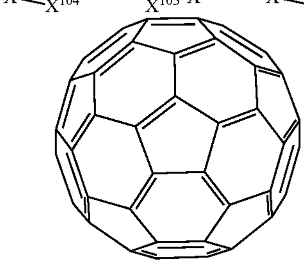

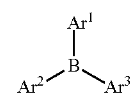

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but is not limited to, the following general formula:

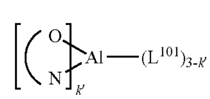

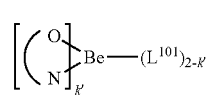

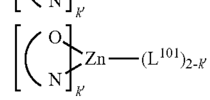

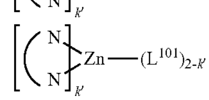

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table A below. Table A lists non-limiting classes of materials, non-limiting examples of compounds for each class, and references that disclose the materials.

TABLE A

| MATERIAL | EXAMPLES OF MATERIAL | PUBLICATIONS |
|---|---|---|
| | Hole injection materials | |
| Phthalocyanine and porphyrin compounds | 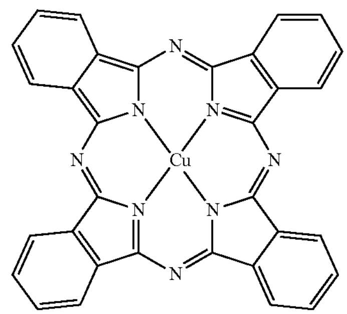 | Appl. Phys. Lett. 69, 2160 (1996) |
| Starburst triarylamines | 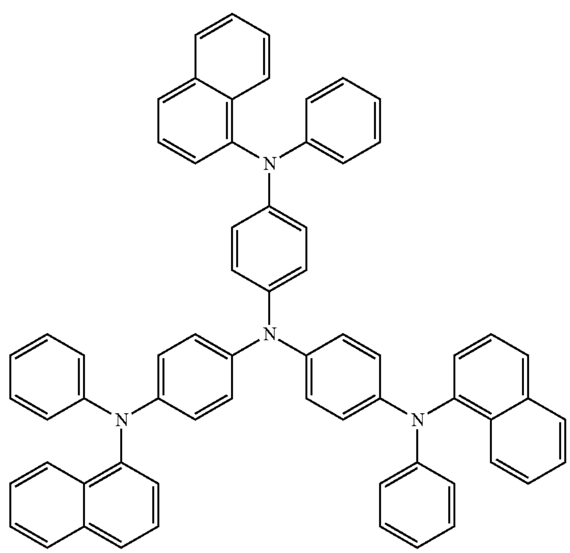 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polythiophene) | 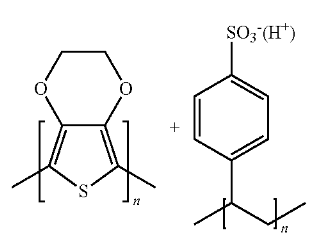 | Synth. Met. 87, 171 (1997) WO2007002683 |
| Phosphonic acid and silane SAMs | 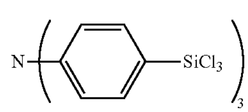 | US20030162053 |

TABLE A-continued
| MATERIAL | EXAMPLES OF MATERIAL | PUBLICATIONS |
| --- | --- | --- |
| Triarylamine or polythiophene polymers with conductivity dopants | 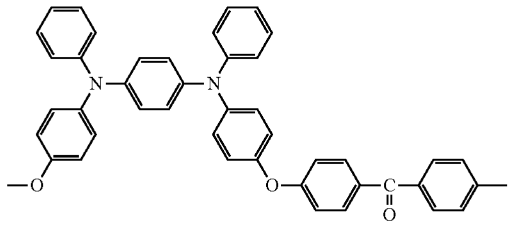 and 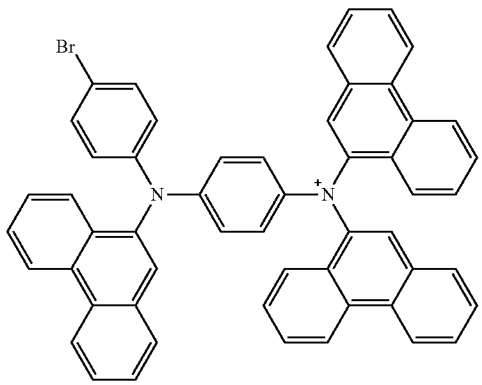 [SMILES: Brc1ccc(N(c2ccc([NH+](c3cc4ccccc4c4ccccc34)c3cc4ccccc4c4ccccc34)cc2)c2cc3ccccc3c3ccccc23)cc1] 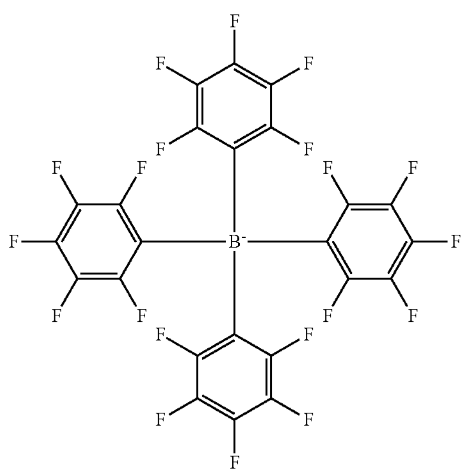 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | EP1725079A1 |
| Organic compounds with conductive inorganic compounds, such as molybdenum and tungsten oxides | 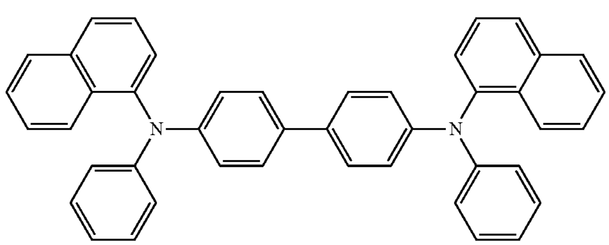 + $MoO_x$ | US20050123751<br>SID Symposium Digest, 37, 923 (2006)<br>WO2009018009 |

TABLE A-continued
| MATERIAL | EXAMPLES OF MATERIAL | PUBLICATIONS |
|---|---|---|
| n-type semiconducting organic complexes | 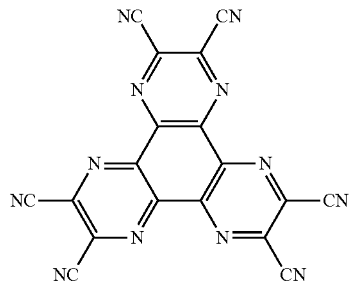 [SMILES: N#Cc1nc2c3nc(C#N)c(C#N)nc3c3nc(C#N)c(C#N)nc3c2nc1C#N] | US20020158242 |
| Metal organometallic complexes | 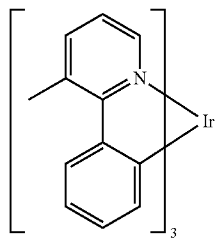 | US20060240279 |
| Cross-linkable compounds | 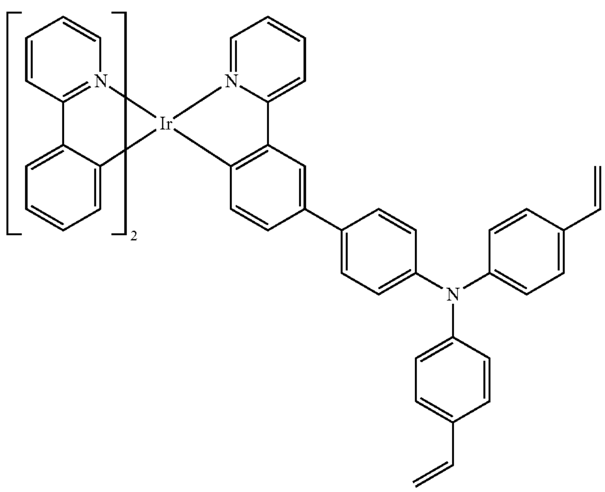 | US20080220265 |
| Polythiophene based polymers and copolymers | 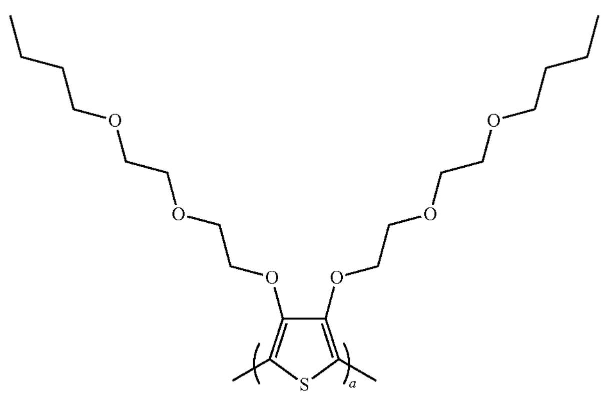 | WO 2011075644<br>EP2350216 |

TABLE A-continued
| MATERIAL | EXAMPLES OF MATERIAL | PUBLICATIONS |
|---|---|---|
| | Hole transporting materials | |
| Triarylamines (e.g., TPD, α-NPD) | 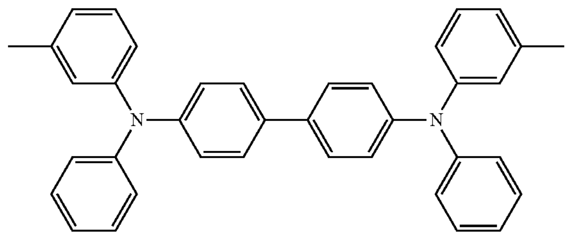 | Appl. Phys. Lett. 51, 913 (1987) |
| | 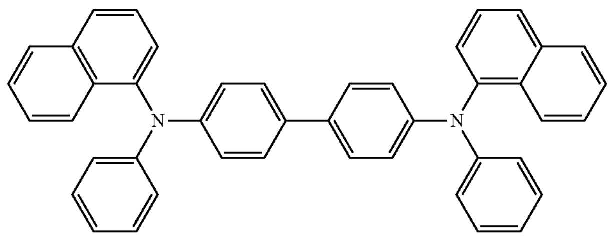 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 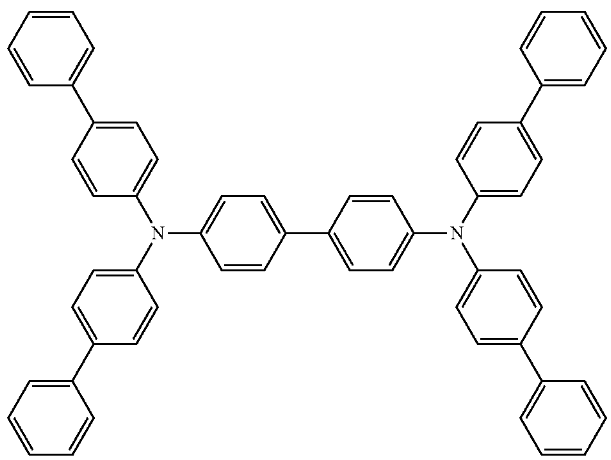 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 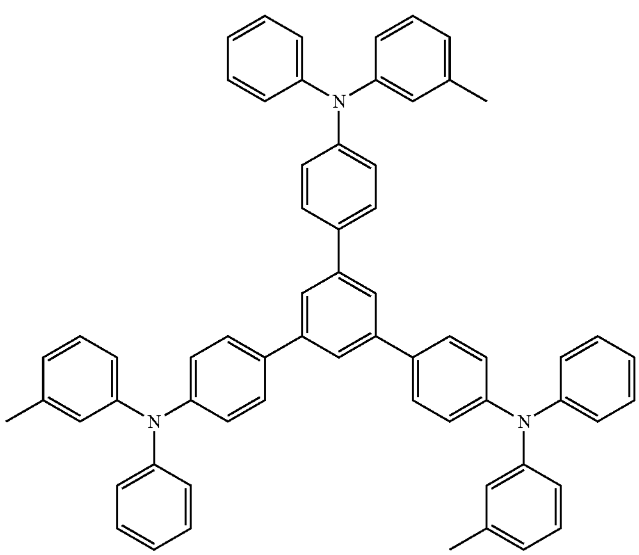 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE A-continued
| MATERIAL | EXAMPLES OF MATERIAL | PUBLICATIONS |
|---|---|---|
| | 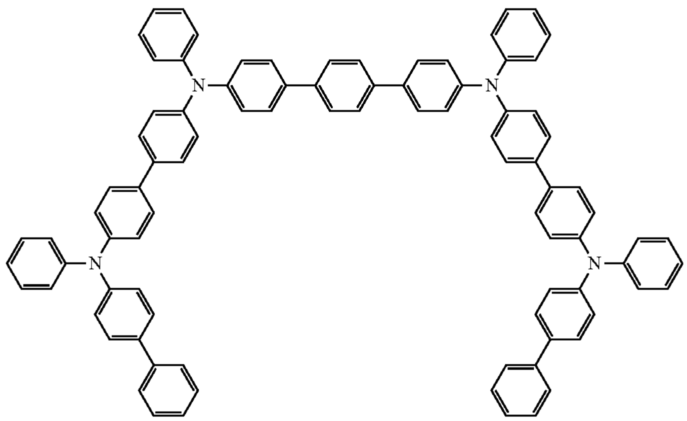 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 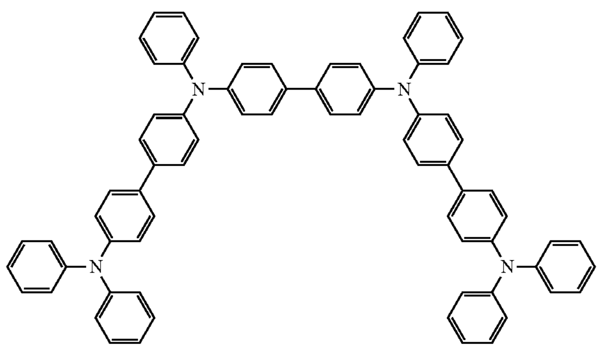 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triarylamine on spirofluorene core | 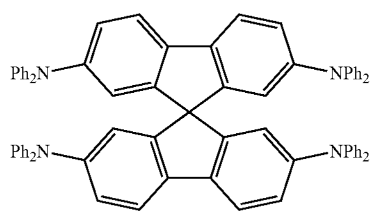 | Synth. Met. 91, 209 (1997) |
| Arylamine carbazole compounds | 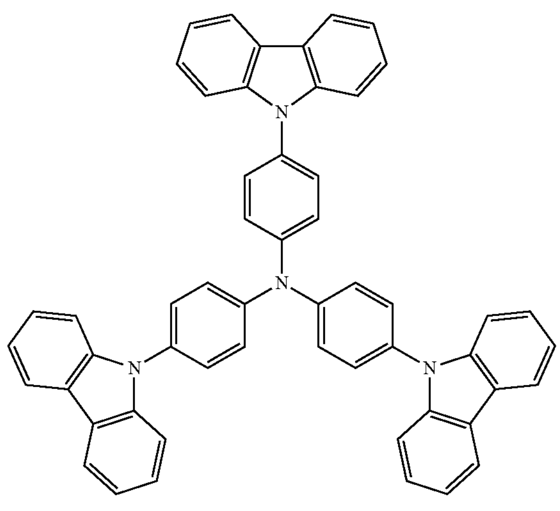 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |

TABLE A-continued
| MATERIAL | EXAMPLES OF MATERIAL | PUBLICATIONS |
|---|---|---|
| Triarylamine with (di)benzothiophene/(di)benzo furan | 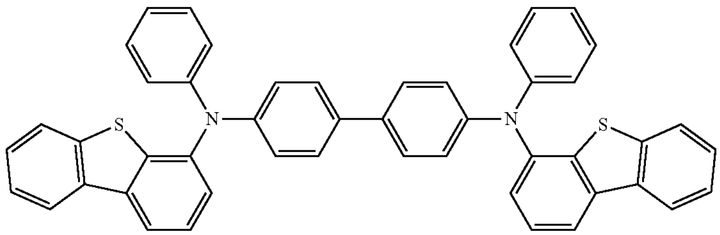 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 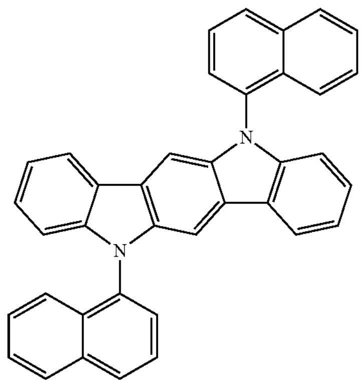 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 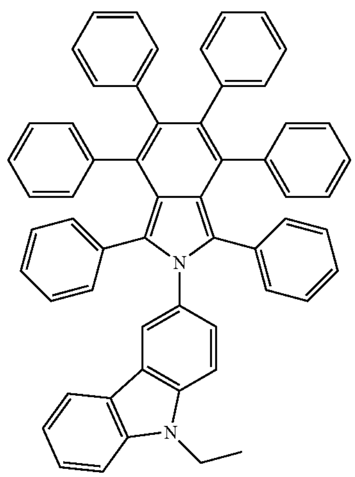 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 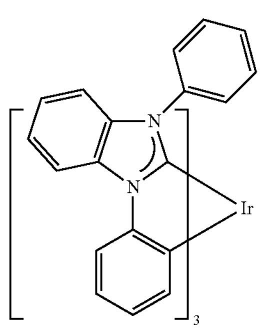 | US20080018221 |

TABLE A-continued
| MATERIAL | EXAMPLES OF MATERIAL | PUBLICATIONS |
|---|---|---|
| | Phosphorescent OLED host materials<br>Red hosts | |
| Arylcarbazoles | 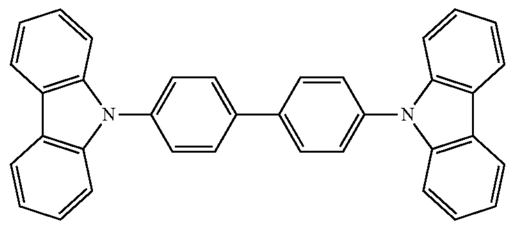 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., $Alq_3$, BAlq) | 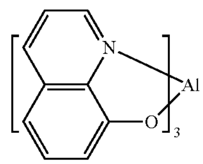 | Nature 395, 151 (1998) |
| | 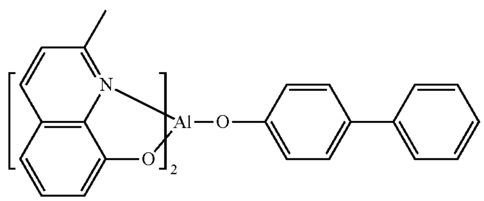 | US20060202194 |
| | 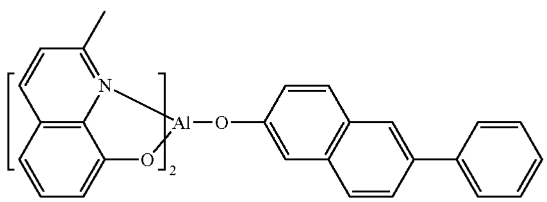 | WO2005014551 |
| | 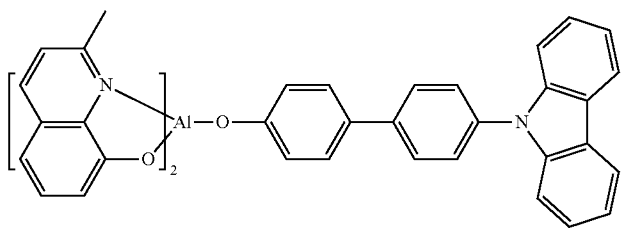 | WO2006072002 |
| Metal phenoxybenzothiazole compounds | 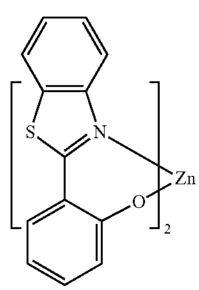 | Appl. Phys. Lett. 90, 123509 (2007) |
| Conjugated oligomers and polymers (e .g ., polyfluorene) | 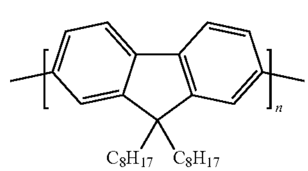 | Org. Electron. 1, 15 (2000) |

TABLE A-continued
| MATERIAL | EXAMPLES OF MATERIAL | PUBLICATIONS |
|---|---|---|
| Aromatic fused rings | 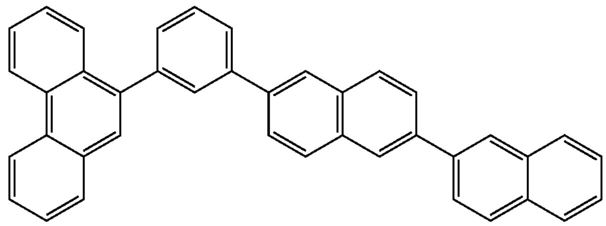 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 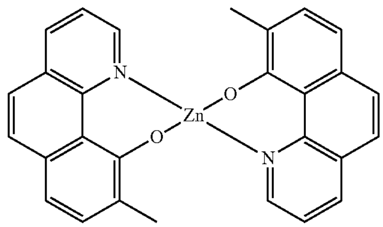 | WO2010056066 |
| Chrysene based compounds | 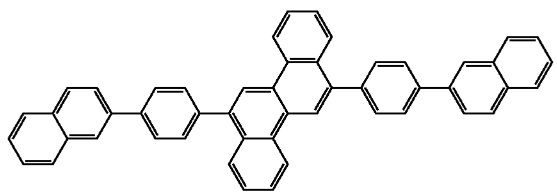 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| | Green hosts | |
| Arylcarbazoles | 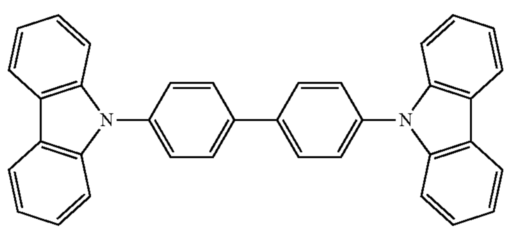 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 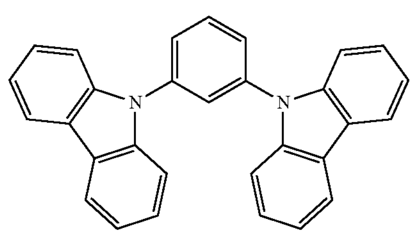 [SMILES: c1cc(-n2c3ccccc3c3ccccc32)cc(-n2c3ccccc3c3ccccc32)c1] | US20030175553 |
| | 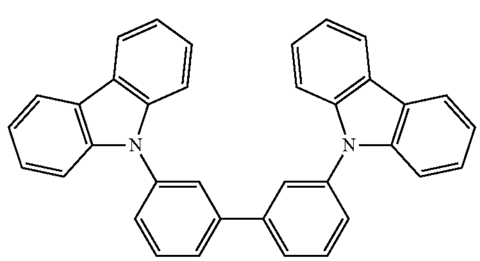 [SMILES: c1cc(-c2cccc(-n3c4ccccc4c4ccccc43)c2)cc(-n2c3ccccc3c3ccccc32)c1] | WO2001039234 |

TABLE A-continued
| MATERIAL | EXAMPLES OF MATERIAL | PUBLICATIONS |
| --- | --- | --- |
| Aryltriphenylene compounds | 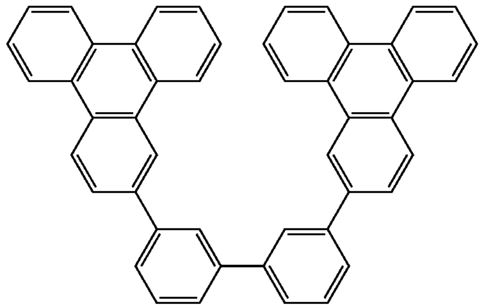 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 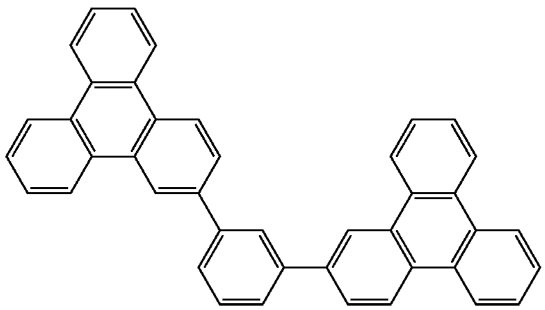 [SMILES: c1cc(-c2ccc3c4ccccc4c4ccccc4c3c2)cc(-c2ccc3c4ccccc4c4ccccc4c3c2)c1] | US20060280965 |
| | 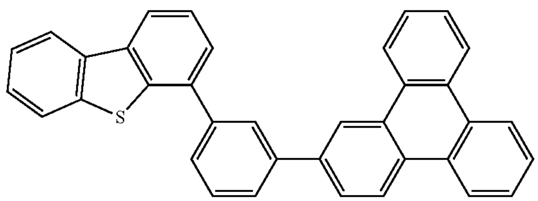 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 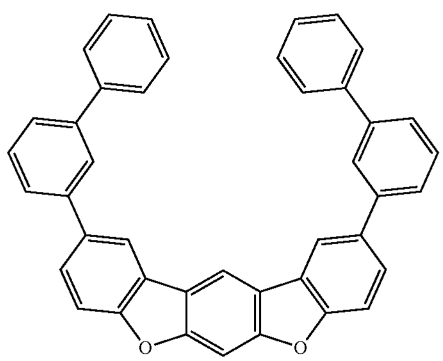 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 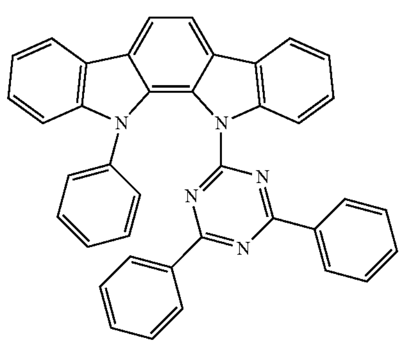 [SMILES: c1ccc(-c2nc(-c3ccccc3)nc(-n3c4ccccc4c4ccc5c6ccccc6n(-c6ccccc6)c5c43)n2)cc1] | WO2008056746 |

TABLE A-continued
| MATERIAL | EXAMPLES OF MATERIAL | PUBLICATIONS |
| --- | --- | --- |
| | 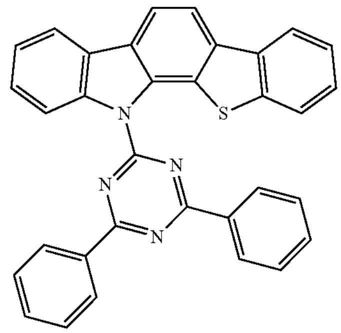 [SMILES: c1ccc(-c2nc(-c3ccccc3)nc(-n3c4ccccc4c4ccc5c6ccccc6sc5c43)n2)cc1] | WO2010107244 |
| Aza-carbazole/DBT/DBF | 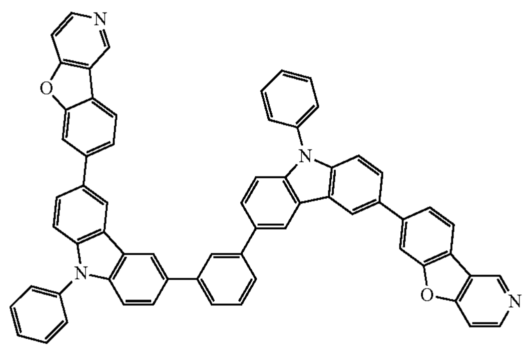 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 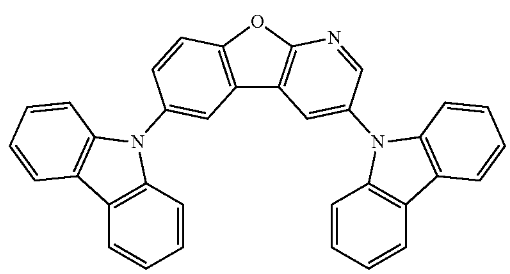 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 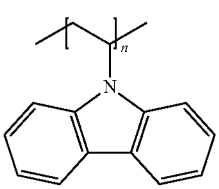 | Appl. Phys. Lett. 77, 2280 (2000) |
| Spirofluorene compounds | 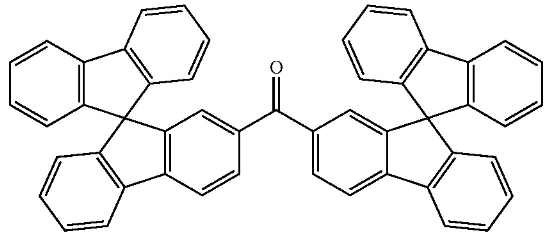 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE A-continued
| MATERIAL | EXAMPLES OF MATERIAL | PUBLICATIONS |
| --- | --- | --- |
| Metal phenoxybenzooxazole compounds | 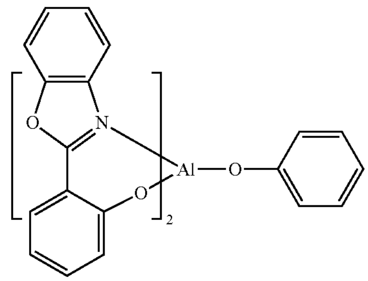 | WO2005089025 |
| | 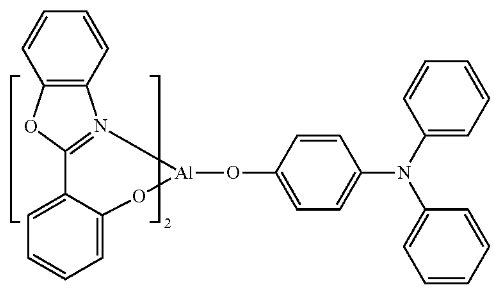 | WO2006132173 |
| | 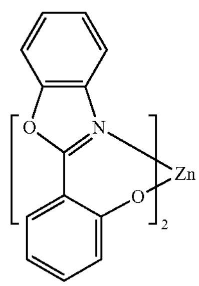 | JP200511610 |
| Spirofluorene-carbazole compounds | 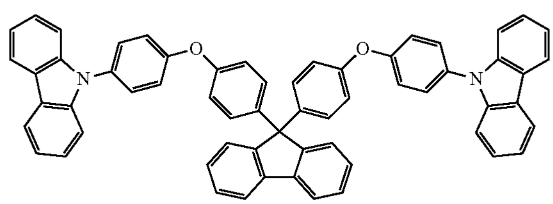 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 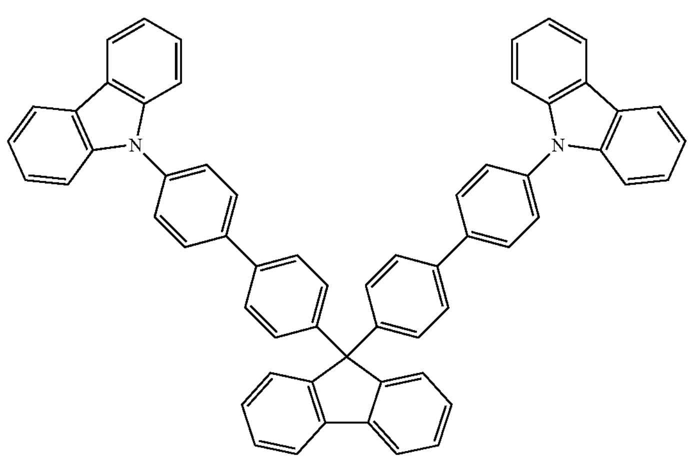 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |

TABLE A-continued
| MATERIAL | EXAMPLES OF MATERIAL | PUBLICATIONS |
|---|---|---|
| Indolocarbazoles | 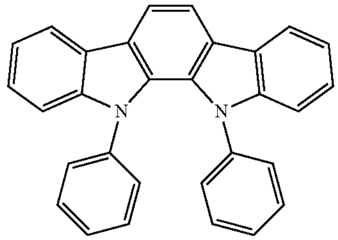 [SMILES: c1ccc(-n2c3ccccc3c3ccc4c5ccccc5n(-c5ccccc5)c4c32)cc1] | WO2007063796 |
| | 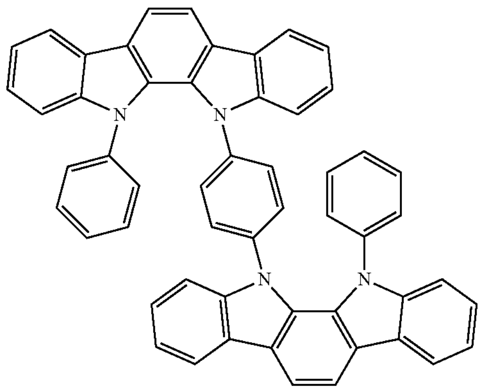 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 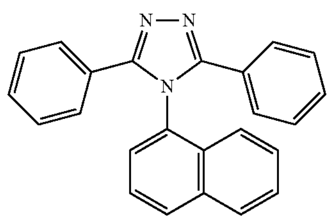 [SMILES: c1ccc(-c2nnc(-c3ccccc3)n2-c2cccc3ccccc23)cc1] | J. Appl. Phys. 90, 5048 (2001) |
| | 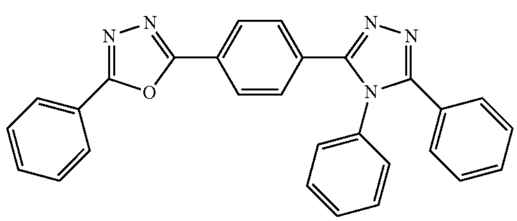 [SMILES: c1ccc(-c2nnc(-c3ccc(-c4nnc(-c5ccccc5)n4-c4ccccc4)cc3)o2)cc1] | WO2004107822 |
| Tetraphenylene complexes | 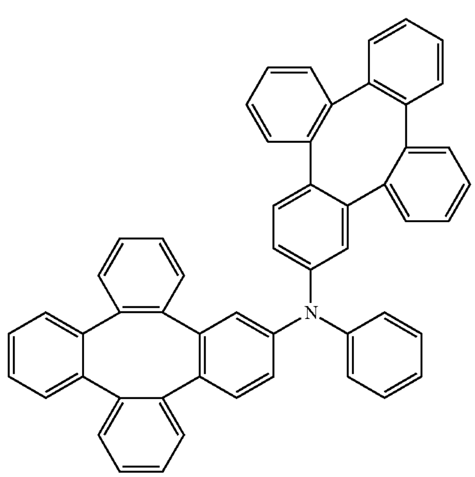 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |

TABLE A-continued
| MATERIAL | EXAMPLES OF MATERIAL | PUBLICATIONS |
| --- | --- | --- |
| Metal phenoxypyridine compounds | 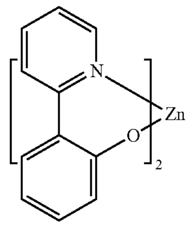 | WO2005030900 |
| Metal coordination complexes (e.g., Zn, Al with N^N ligands) | 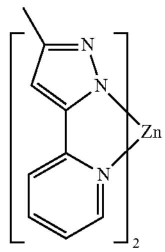 | US20040137268, US20040137267 |
| | Blue hosts | |
| Arylcarbazoles | 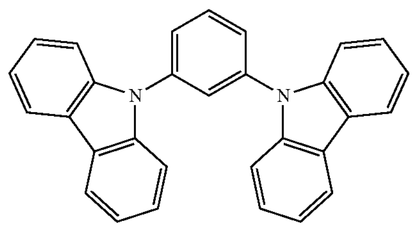 [SMILES: c1cc(-n2c3ccccc3c3ccccc32)cc(-n2c3ccccc3c3ccccc32)c1] | Appl. Phys. Lett, 82, 2422 (2003) |
| | 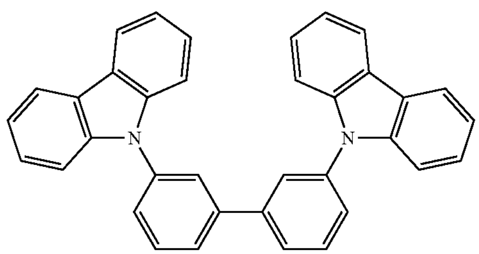 [SMILES: c1cc(-c2cccc(-n3c4ccccc4c4ccccc43)c2)cc(-n2c3ccccc3c3ccccc32)c1] | US20070190359 |
| Dibenzothiophene/ Dibenzofuran- carbazole compounds | 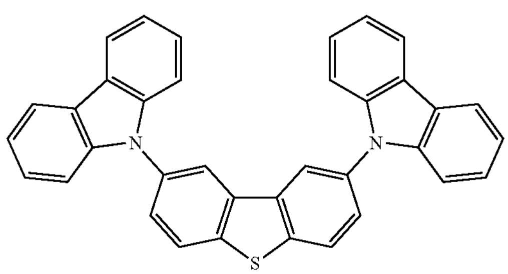 [SMILES: c1ccc2c(c1)c1ccccc1n2-c1ccc2sc3ccc(-n4c5ccccc5c5ccccc54)cc3c2c1] | WO2006114966, US20090167162 |
| | 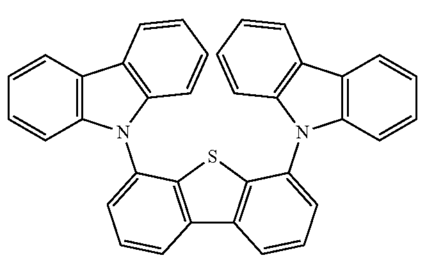 [SMILES: c1cc(-n2c3ccccc3c3ccccc32)c2sc3c(-n4c5ccccc5c5ccccc54)cccc3c2c1] | US20090167162 |

TABLE A-continued
| MATERIAL | EXAMPLES OF MATERIAL | PUBLICATIONS |
|---|---|---|
| | 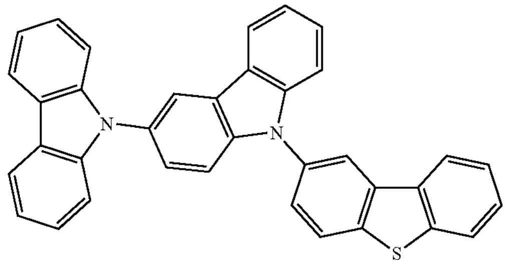 [SMILES: c1ccc2c(c1)sc1ccc(-n3c4ccccc4c4cc(-n5c6ccccc6c6ccccc65)ccc43)cc12] | WO2009086028 |
| | 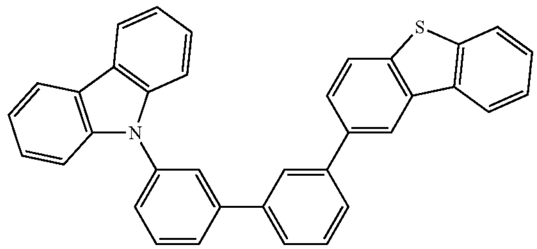 [SMILES: c1cc(-c2cccc(-n3c4ccccc4c4ccccc43)c2)cc(-c2ccc3sc4ccccc4c3c2)c1] | US20090030202, US20090017330 |
| | 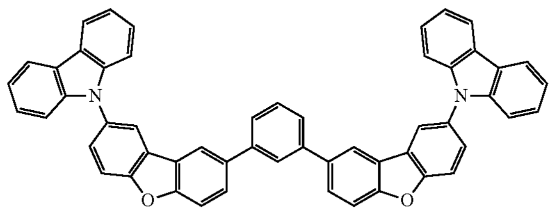 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 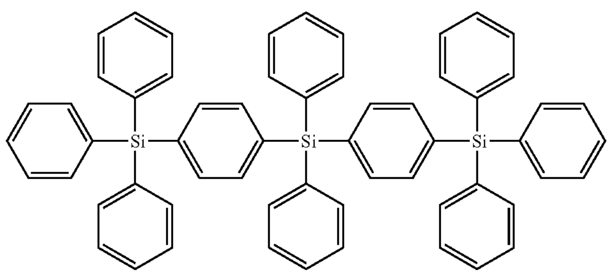 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 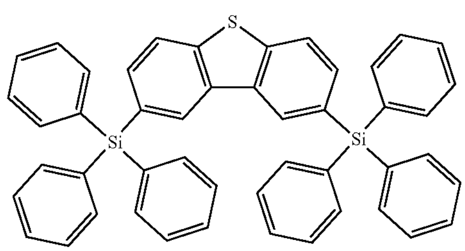 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |
| Silicon/Germanium aryl compounds | 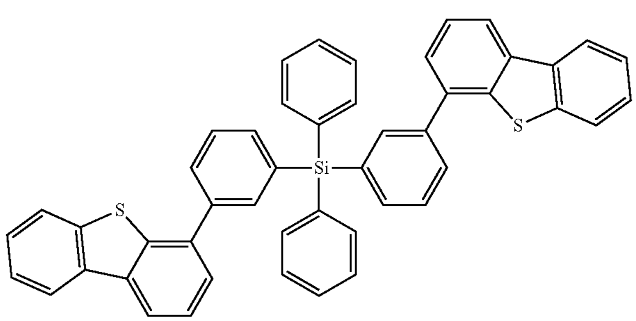 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |

TABLE A-continued
| MATERIAL | EXAMPLES OF MATERIAL | PUBLICATIONS |
|---|---|---|
| Aryl benzoyl ester | 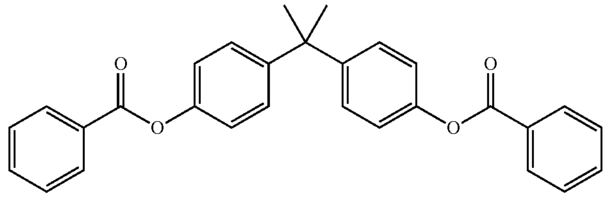 [SMILES: CC(C)(c1ccc(OC(=O)c2ccccc2)cc1)c1ccc(OC(=O)c2ccccc2)cc1] | WO2006100298 |
| Carbazole linked by non-conjugated groups | 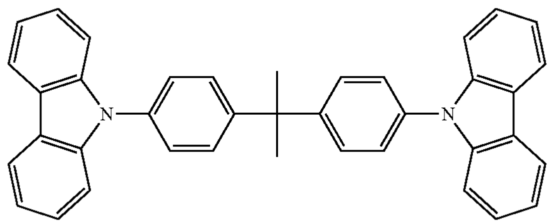 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 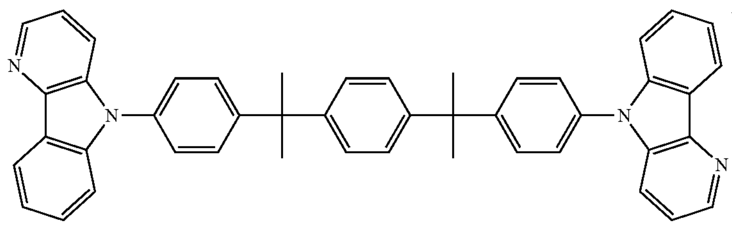 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| High triplet metal organometallic complex | 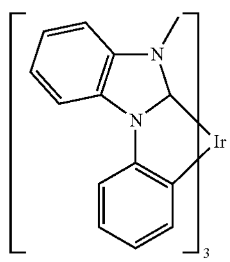 | U.S. Pat. No. 7,154,114 |
| | Phosphorescent dopants<br>Red dopants | |
| Heavy metal porphyrins (e.g., PtOEP) | 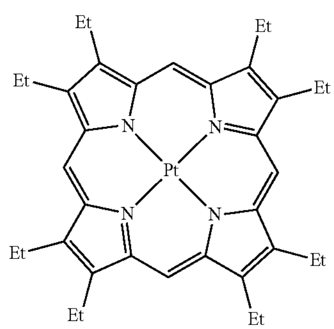 | Nature 395, 151 (1998) |
| Iridium(III) organometallic complexes | 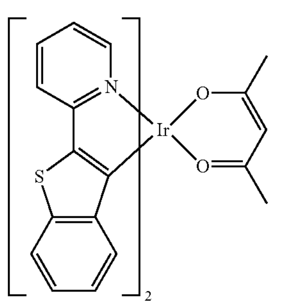 | Appl. Phys. Lett. 78, 1622 (2001) |

TABLE A-continued
| MATERIAL | EXAMPLES OF MATERIAL | PUBLICATIONS |
| --- | --- | --- |
| | 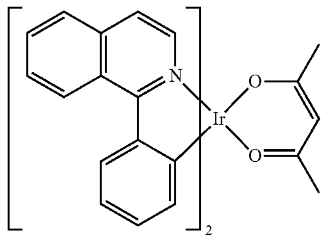 | US20030072964 |
| | 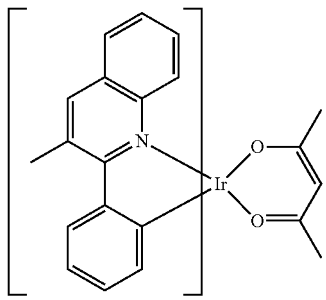 | US20030072964 |
| | 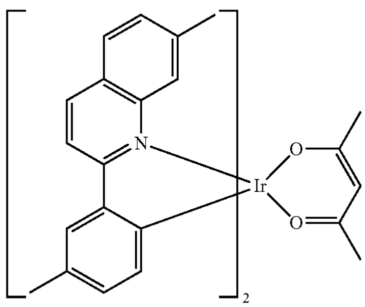 | US20060202194 |
| | 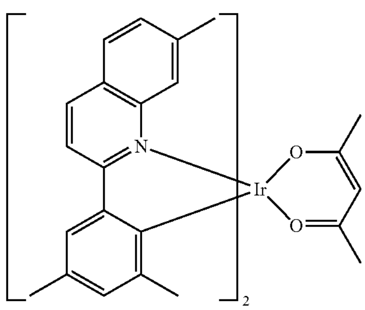 | US20060202194 |
| | 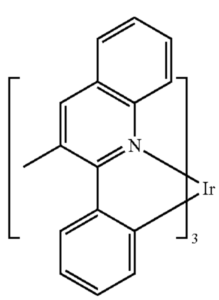 | US20070087321 |

TABLE A-continued
| MATERIAL | EXAMPLES OF MATERIAL | PUBLICATIONS |
| --- | --- | --- |
| | 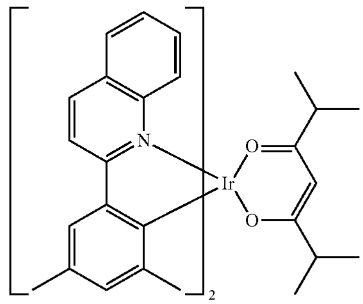 | US20080261076<br>US20100090591 |
| | 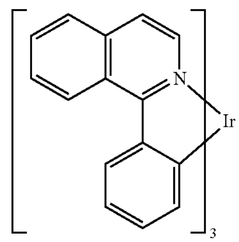 | US20070087321 |
| | 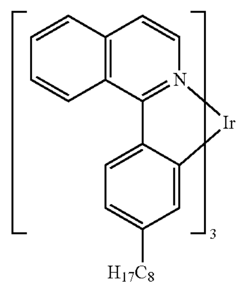 | Adv. Mater. 19, 739 (2007) |
| | 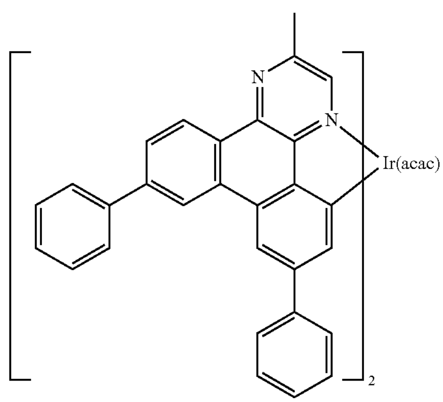 | WO2009100991 |
| | 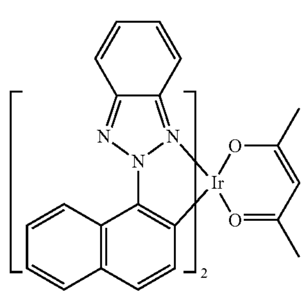 | WO2008101842 |

TABLE A-continued
| MATERIAL | EXAMPLES OF MATERIAL | PUBLICATIONS |
|---|---|---|
| | 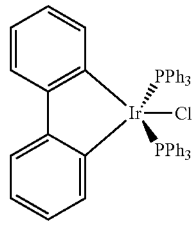 | U.S. Pat. No. 7,232,618 |
| Platinum(II) organometallic complexes | 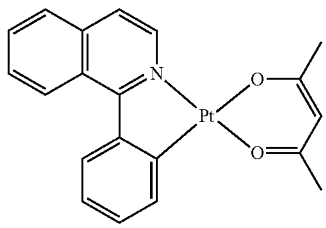 | WO2003040257 |
| | 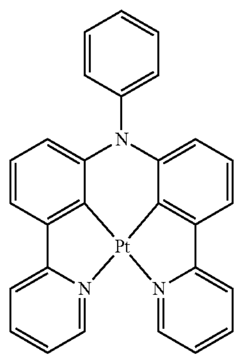 | US20070103060 |
| Osmium(III) complexes | 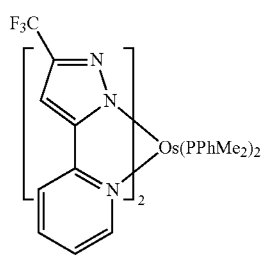 | Chem. Mater. 17, 3532 (2005) |
| Ruthenium(II) complexes | 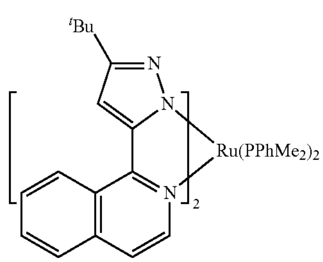 | Adv. Mater. 17, 1059 (2005) |
| Rhenium (I), (II), and (III) complexes | 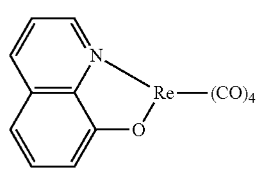 | US20050244673 |

TABLE A-continued
| MATERIAL | EXAMPLES OF MATERIAL | PUBLICATIONS |
|---|---|---|
| | Green dopants | |
| Iridium(III) organometallic complexes | 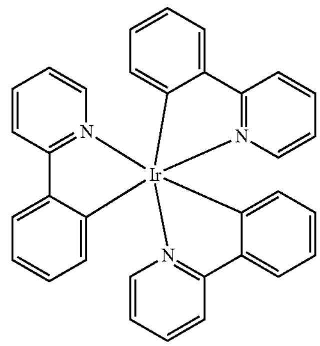 and its derivatives | Inorg. Chem. 40, 1704 (2001) |
| | 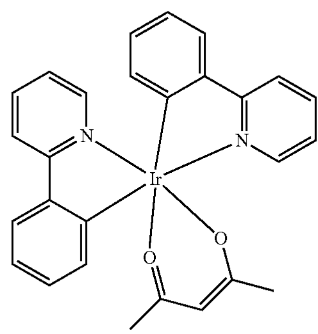 | US20020034656 |
| | 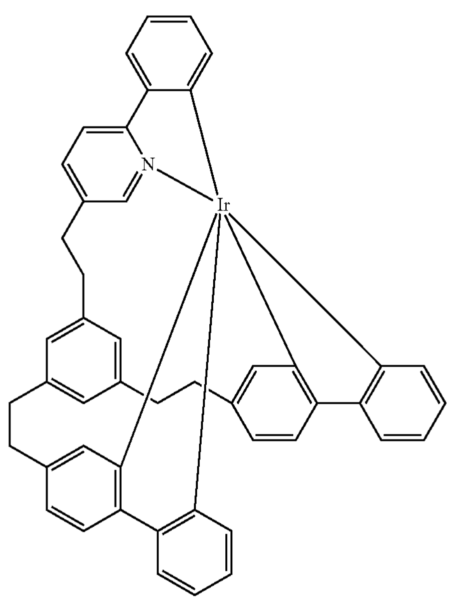 | U.S. Pat. No. 7,332,232 |

TABLE A-continued
| MATERIAL | EXAMPLES OF MATERIAL | PUBLICATIONS |
| --- | --- | --- |
| | 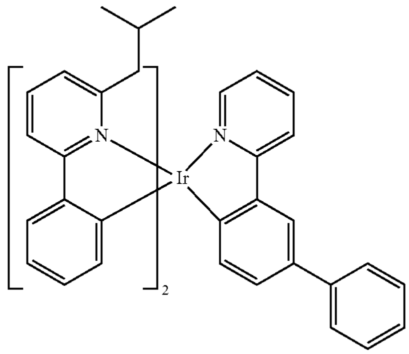 | US20090108737 |
| | 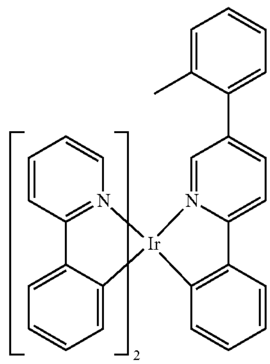 | WO2010028151 |
| | 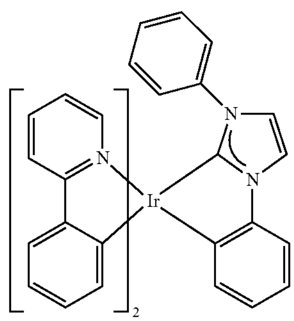 | EP1841834B |
| | 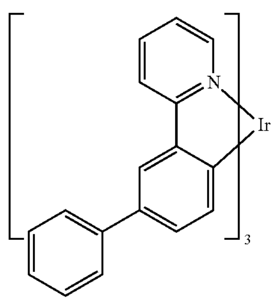 | US20060127696 |
| | 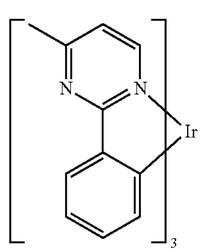 | US20090039776 |

TABLE A-continued
| MATERIAL | EXAMPLES OF MATERIAL | PUBLICATIONS |
| --- | --- | --- |
| | 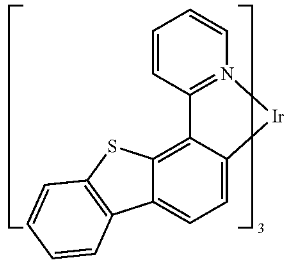 | U.S. Pat. No. 6,921,915 |
| | 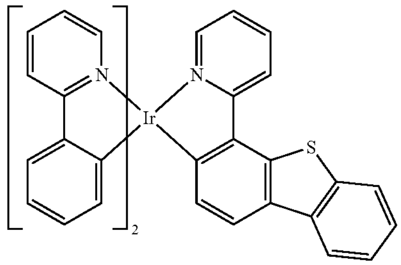 | US20100244004 |
| | 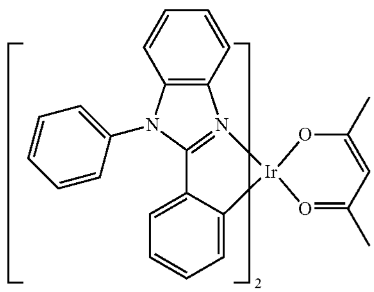 | U.S. Pat. No. 6,687,266 |
| | 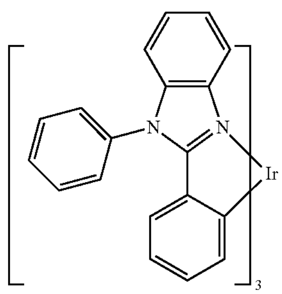 | Chem. Mater. 16, 2480 (2004) |
| | 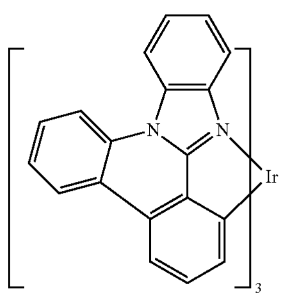 | US20070190359 |

TABLE A-continued
| MATERIAL | EXAMPLES OF MATERIAL | PUBLICATIONS |
| --- | --- | --- |
| | 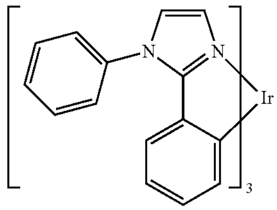 | US 20060008670 JP2007123392 |
| | 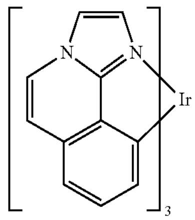 | WO2010086089, WO2011044988 |
| | 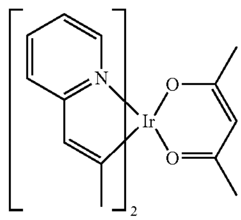 | Adv. Mater. 16, 2003 (2004) |
| | 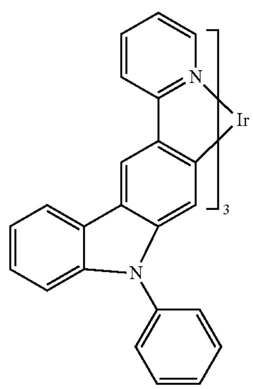 | Angew. Chem. Int. Ed. 2006, 45, 7800 |
| | 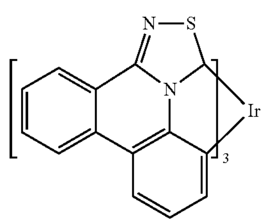 | WO2009050290 |
| | 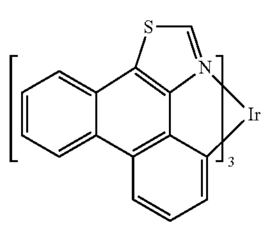 | US20090165846 |

TABLE A-continued
| MATERIAL | EXAMPLES OF MATERIAL | PUBLICATIONS |
|---|---|---|
| | 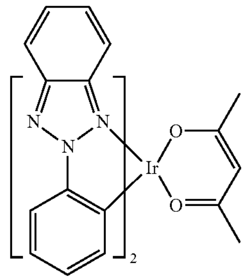 | US20080015355 |
| | 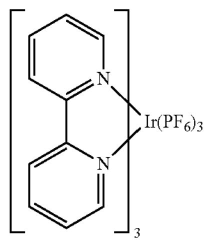 | US20010015432 |
| | 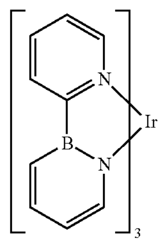 | US20100295032 |
| Monomer for polymeric metal organometallic compounds | 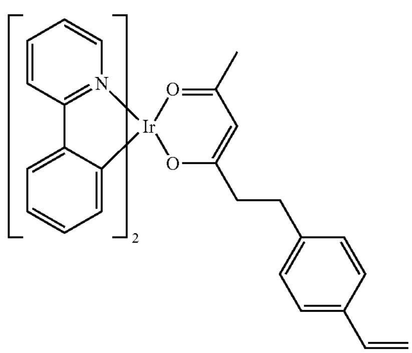 | U.S. Pat. No. 7,250,226, U.S. Pat. No. 7,396,598 |
| Pt(II) organometallic complexes, including polydentated ligands | 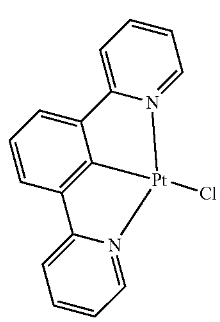 | Appl. Phys. Lett. 86, 153505 (2005) |

TABLE A-continued
| MATERIAL | EXAMPLES OF MATERIAL | PUBLICATIONS |
|---|---|---|
| | 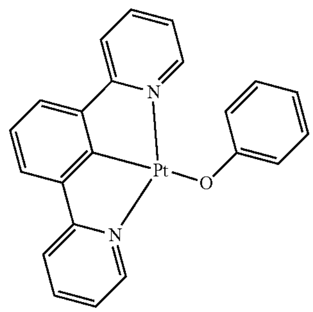 | Appl. Phys. Lett. 86, 153505 (2005) |
| | 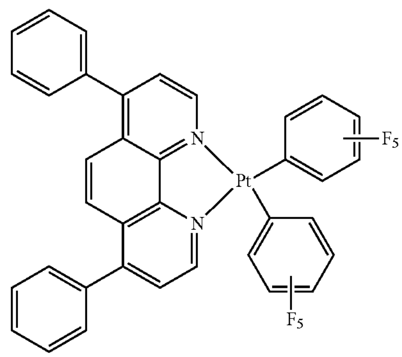 | Chem. Lett. 34, 592 (2005) |
| | 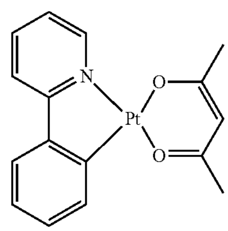 | WO2002015645 |
| | 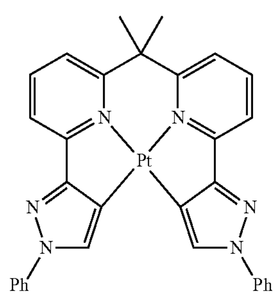 | US20060263635 |
| | 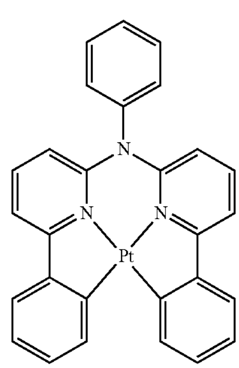 | US20060182992 US20070103060 |

TABLE A-continued
| MATERIAL | EXAMPLES OF MATERIAL | PUBLICATIONS |
| --- | --- | --- |
| Cu complexes | 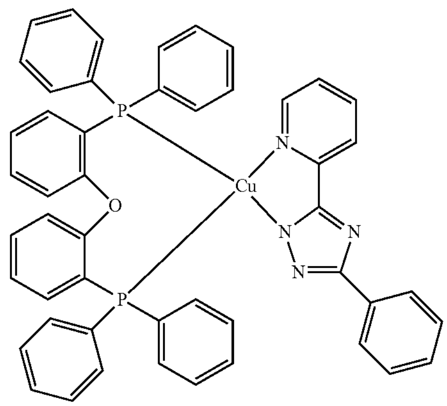 | WO2009000673 |
| | 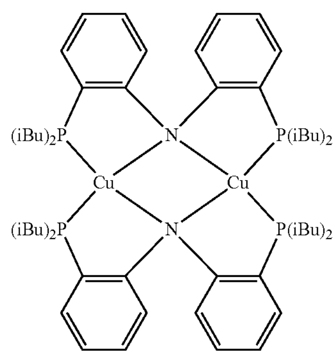 | US20070111026 |
| Gold complexes | 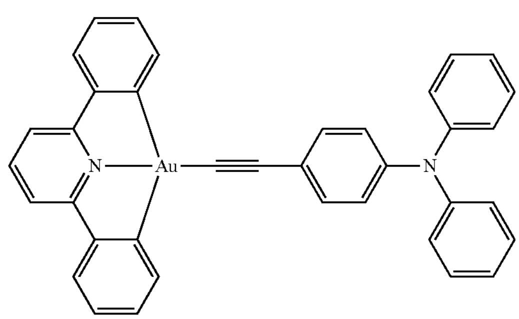 | Chem. Commun. 2906 (2005) |
| Rhenium(III) complexes | 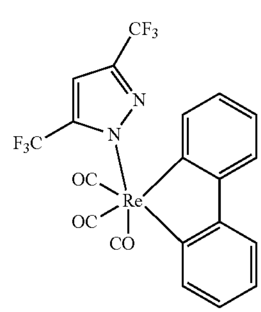 | Inorg. Chem. 42, 1248 (2003) |

TABLE A-continued
| MATERIAL | EXAMPLES OF MATERIAL | PUBLICATIONS |
|---|---|---|
| Osmium(II) complexes | 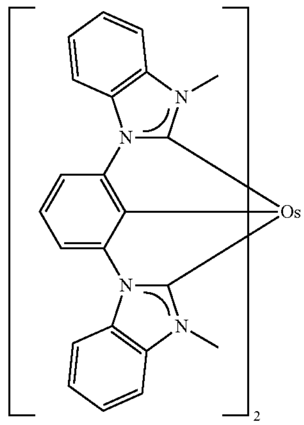 | U.S. Pat. No. 7,279,704 |
| Deuterated organometallic complexes | 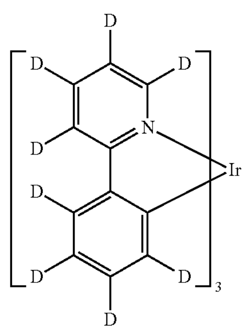 | US20030138657 |
| Organometallic complexes with two or more metal centers | 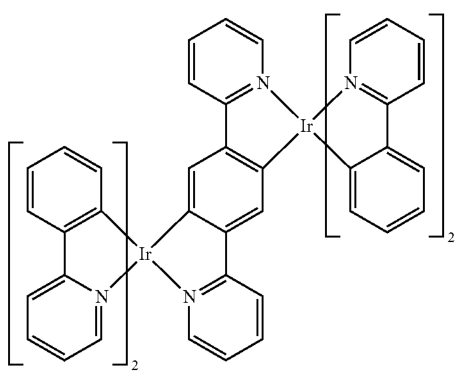 | US20030152802 |
| | 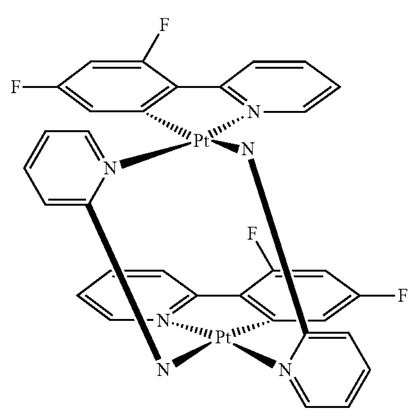 | U.S. Pat. No. 7,090,928 |

TABLE A-continued
| MATERIAL | EXAMPLES OF MATERIAL | PUBLICATIONS |
|---|---|---|
| | Blue dopants | |
| Iridium(III) organometallic complexes | 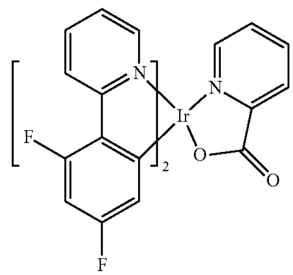 | WO2002002714 |
| | 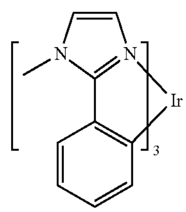 | WO2006009024 |
| | 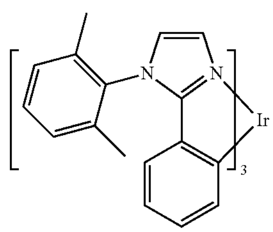 | US20060251923<br>US20110057559<br>US20110204333 |
| | 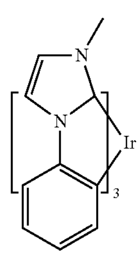 | U.S. Pat. No. 7,393,599,<br>WO2006056418,<br>US20050260441,<br>WO2005019373 |
| | 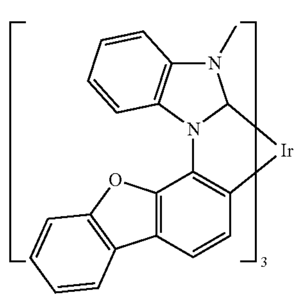 | U.S. Pat. No. 7,534,505 |

TABLE A-continued
| MATERIAL | EXAMPLES OF MATERIAL | PUBLICATIONS |
|---|---|---|
| | 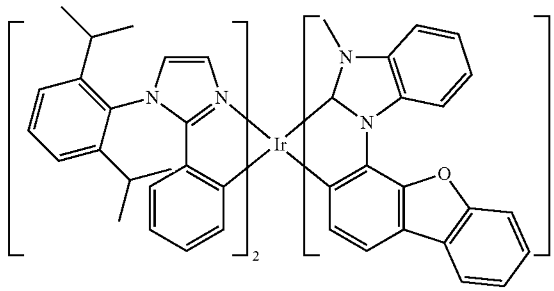 | WO2011051404 |
| | 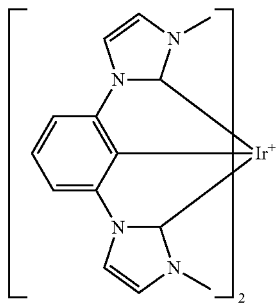 | U.S. Pat. No. 7,445,855 |
| | 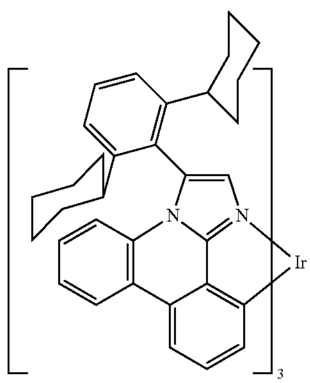 | US20070190359, US20080297033 US20100148663 |
| | 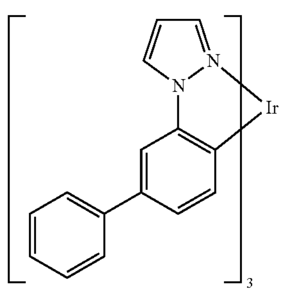 | U.S. Pat. No. 7,338,722 |
| | 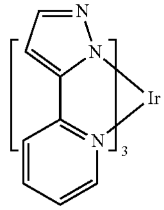 | US20020134984 |

TABLE A-continued
| MATERIAL | EXAMPLES OF MATERIAL | PUBLICATIONS |
|---|---|---|
| | 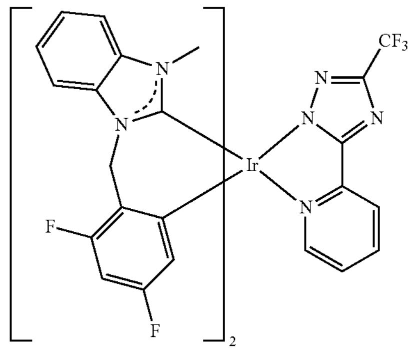 | Angew. Chem. Int. Ed. 47, 4542 (2008) |
| | 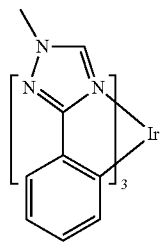 | Chem. Mater. 18, 5119 (2006) |
| | 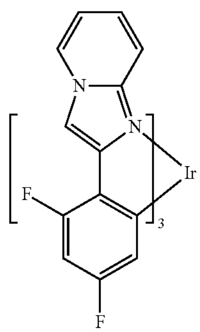 | Inorg. Chem. 46, 4308 (2007) |
| | 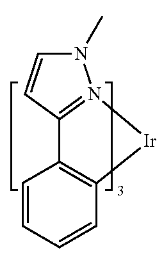 | WO2005123873 |
| | 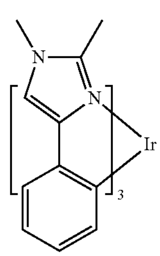 | WO2005123873 |

TABLE A-continued
| MATERIAL | EXAMPLES OF MATERIAL | PUBLICATIONS |
| --- | --- | --- |
| | 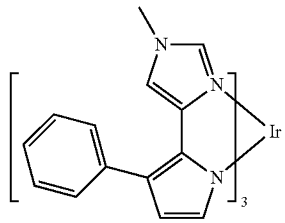 | WO2007004380 |
| | 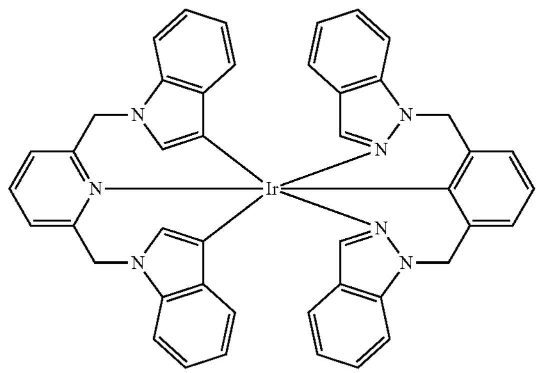 | WO2006082742 |
| Osmium(II) complexes | 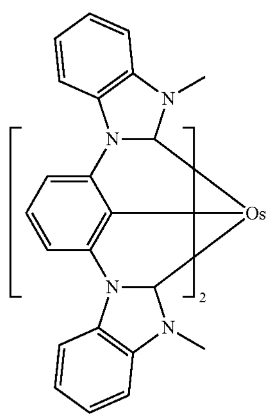 | U.S. Pat. No. 7,279,704 |
| | 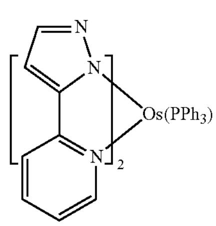 | Organometallics 23, 3745 (2004) |
| Gold complexes | 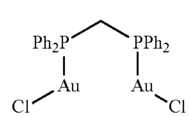 | Appl. Phys. Lett.74, 1361 (1999) |
| Platinum(II) complexes | 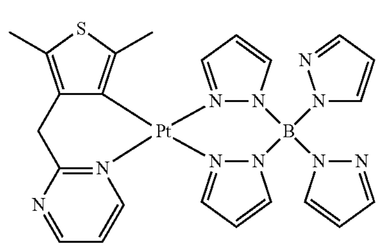 | WO2006098120, WO2006103874 |

TABLE A-continued

| MATERIAL | EXAMPLES OF MATERIAL | PUBLICATIONS |
|---|---|---|
| Pt tetradentate complexes with at least one metal-carbene bond | 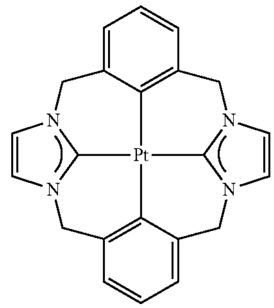 | U.S. Pat. No. 7,655,323 |
| | Exciton/hole blocking layer materials | |
| Bathocuprine compounds (e.g., BCP, BPhen) | 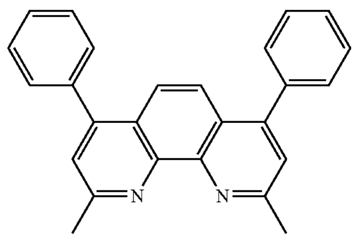 [SMILES: Cc1cc(-c2ccccc2)c2ccc3c(-c4ccccc4)cc(C)nc3c2n1] | Appl. Phys. Lett. 75, 4 (1999) |
| | 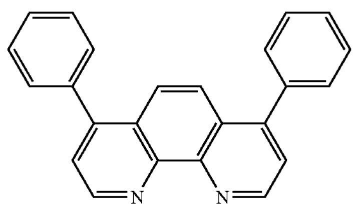 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 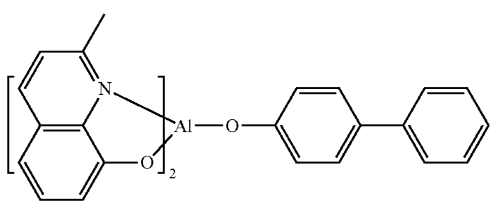 | Appl. Phys. Lett. 81, 162 (2002) |
| 5-member ring electron deficient heterocycles such as triazole, oxadiazole, imidazole, benzoimidazole | 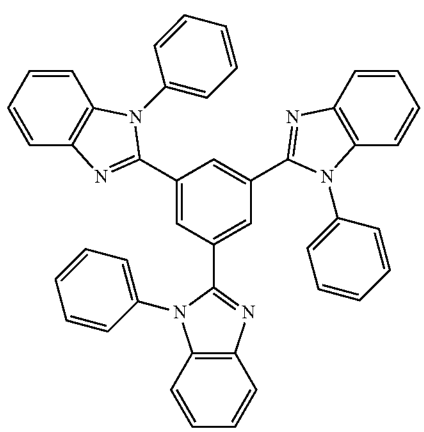 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE A-continued
| MATERIAL | EXAMPLES OF MATERIAL | PUBLICATIONS |
|---|---|---|
| Triphenylene compounds | 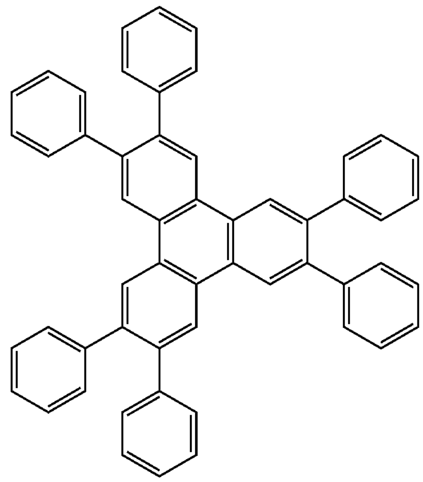 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 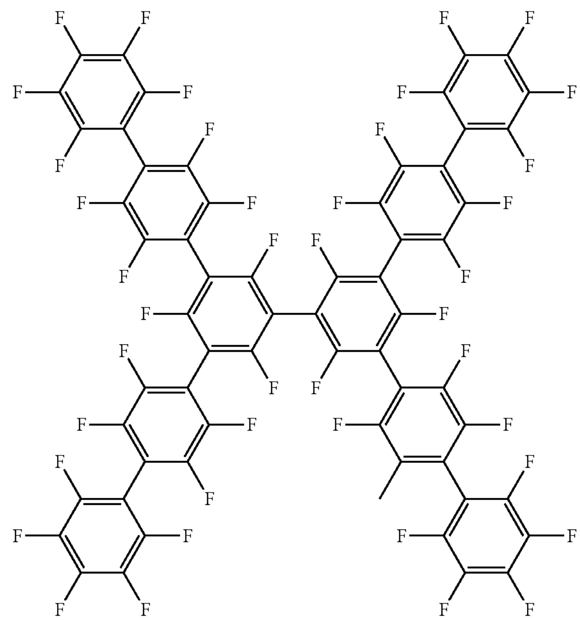 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 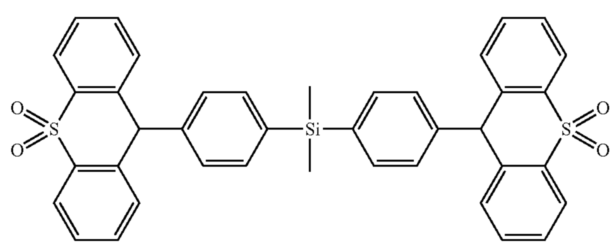 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 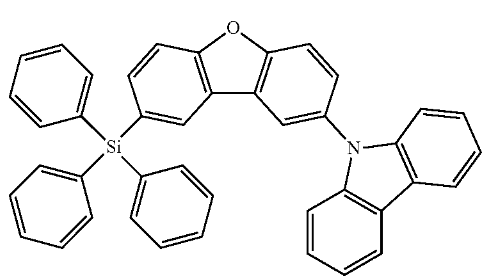 [SMILES: c1ccc([Si](c2ccccc2)(c2ccccc2)c2ccc3oc4ccc(-n5c6ccccc6c6ccccc65)cc4c3c2)cc1] | WO2010079051 |

TABLE A-continued
| MATERIAL | EXAMPLES OF MATERIAL | PUBLICATIONS |
| --- | --- | --- |
| Aza-carbazoles | 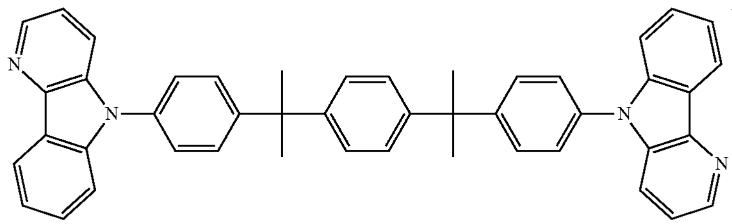 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| | Electron transporting materials | |
| Anthracene-benzoimidazole compounds | 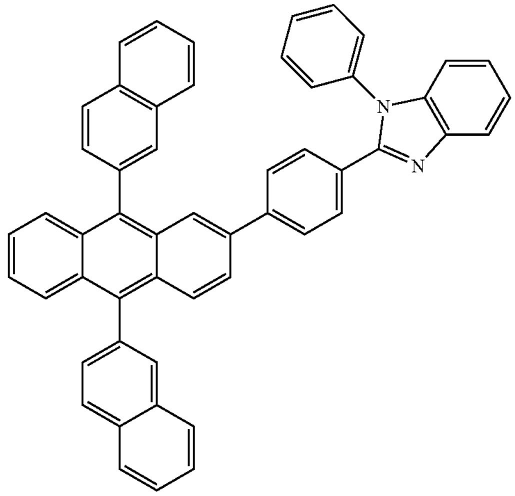 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 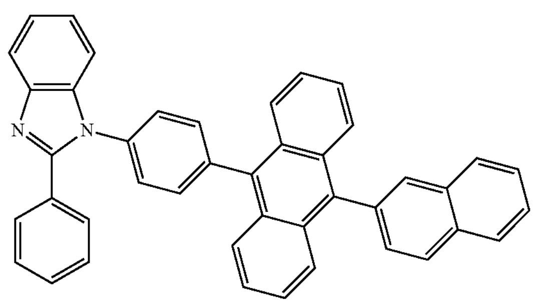 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 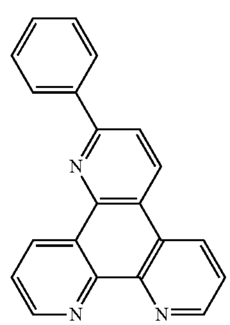 [SMILES: c1ccc(-c2ccc3c4cccnc4c4ncccc4c3n2)cc1] | US20090115316 |
| Anthracene-benzothiazole compounds | 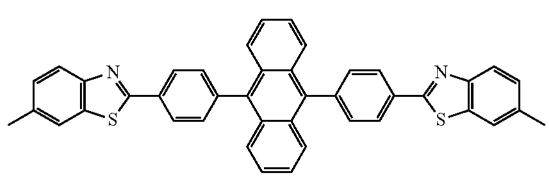 | Appl. Phys. Lett. 89, 063504 (2006) |

TABLE A-continued

| MATERIAL | EXAMPLES OF MATERIAL | PUBLICATIONS |
|---|---|---|
| Metal 8-hydroxyquinolates (e.g., $Alq_3$, $Zrq_4$) | 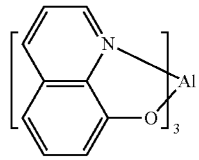 | Appl. Phys. Lett. 51, 913 (1987) U.S. Pat. No. 7,230,107 |
| Metal hydroxybenzoquinolates | 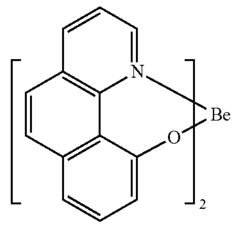 | Chem. Lett. 5, 905 (1993) |
| Bathocuprine compounds such as BCP, BPhen, etc | 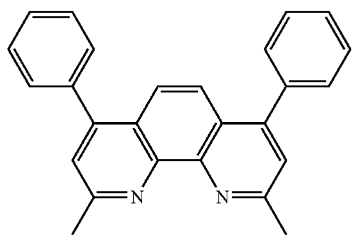 [SMILES: Cc1cc(-c2ccccc2)c2ccc3c(-c4ccccc4)cc(C)nc3c2n1] | Appl. Phys. Lett. 91, 263503 (2007) |
| | 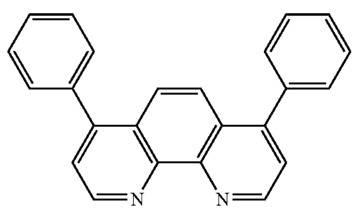 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g.,triazole, oxadiazole, imidazole, benzoimidazole) | 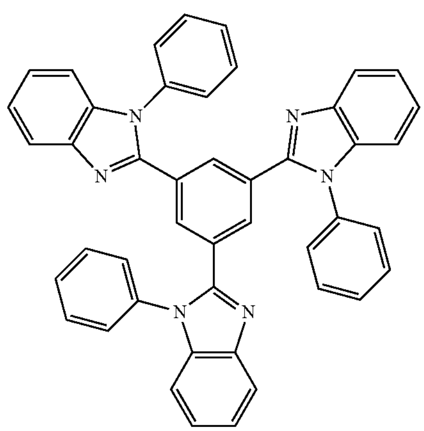 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 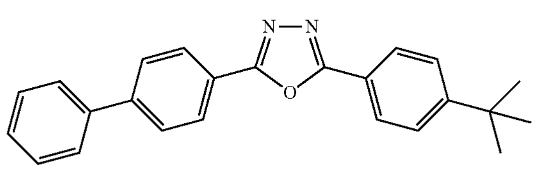 [SMILES: CC(C)(C)c1ccc(-c2nnc(-c3ccc(-c4ccccc4)cc3)o2)cc1] | Appl. Phys. Lett. 55, 1489 (1989) |

TABLE A-continued
| MATERIAL | EXAMPLES OF MATERIAL | PUBLICATIONS |
|---|---|---|
| | 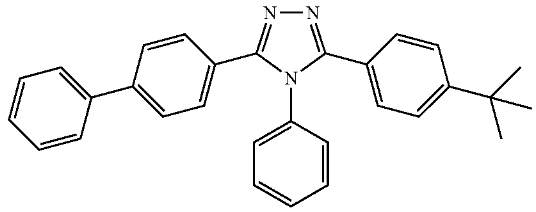 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 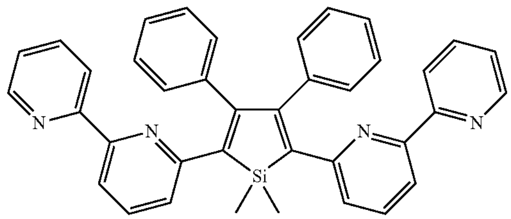 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 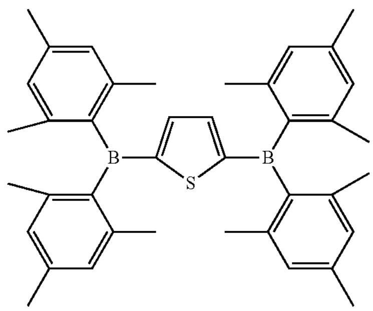 | J. Am. Chem. Soc. 120, 9714 (1998) |
| Fluorinated aromatic compounds | 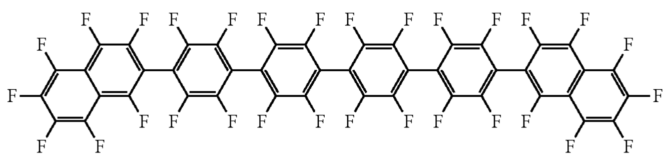 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 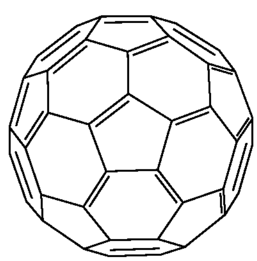 [SMILES: C1=CC2C3C4=c5c6c7c8c(ccc9c%10ccc%11c%12ccc%13c1c3c1c5c3c6c(c89)c%10c%11c3c%12c%131)C1C=CC2C4C71] | US20090101870 |
| Triazine complexes | 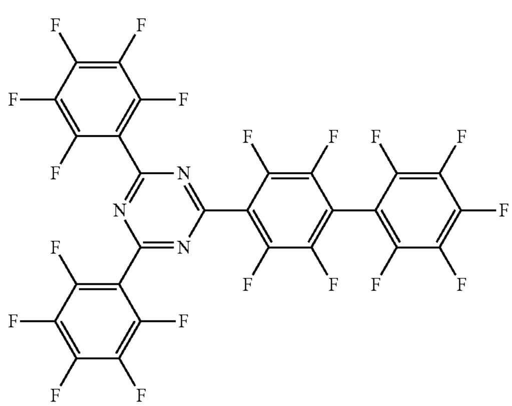 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

TABLE A-continued

| MATERIAL | EXAMPLES OF MATERIAL | PUBLICATIONS |
|---|---|---|
| Zn (N^N) complexes | 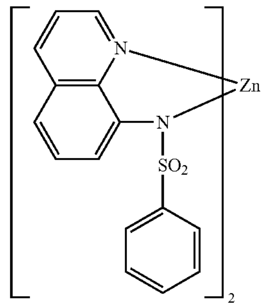 | U.S. Pat. No. 6,528,187 |

EXPERIMENTAL EXAMPLES

Example 1: Device Examples

All example devices were fabricated by high vacuum (<$10^{-7}$ Torr) thermal evaporation. The anode electrode is 800 Å of indium tin oxide (ITO). The cathode consisted of 10 Å of LiF followed by 1,000 Å of A1. All devices are encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially, from the ITO surface, 100 Å of LG101 as the hole injection layer (HIL), 450 Å of Compound D as the hole transporting layer (HTL), 400 Å of Compound 1 doped in Compound B as host with 10 or 15 weight percent of the iridium phosphorescent compound as the emissive layer (EML), 50 Å of Compound C as a blocking layer (BL), 450 Å of Alq (tris-8-hydroxyquinoline aluminum) as the ETL. The comparative Example with Compound A was fabricated similarly to the Device Examples. The device results and data are summarized in Tables 1 and 2. As used herein, Alq, Compound A, B, C and D have the following structures:

Compound 1

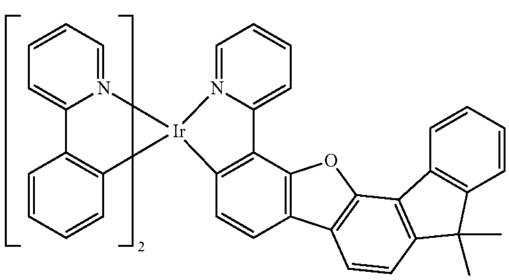

Compound A

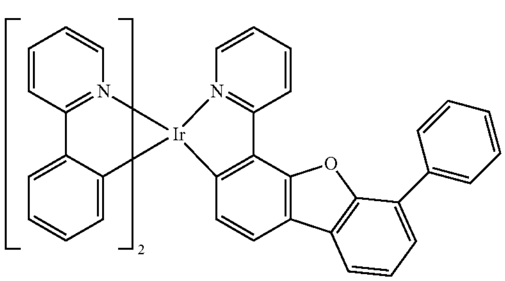

-continued

Compound B

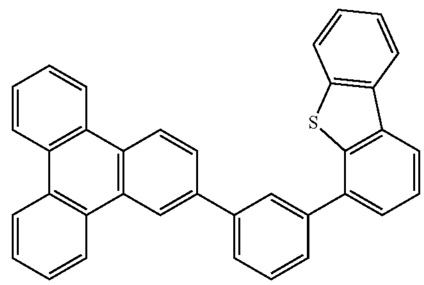

Compound C

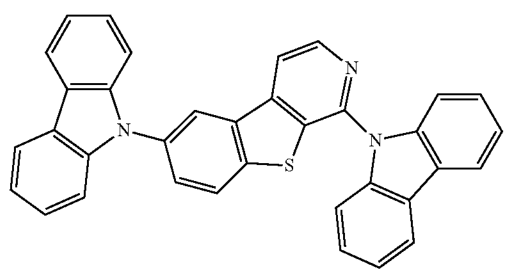

Compound D

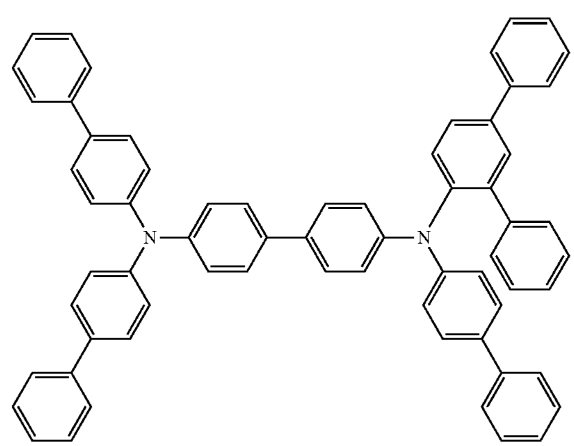

-continued

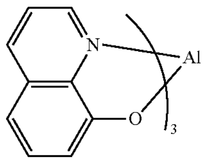

Alq

TABLE 1

Device Structures of Inventive Compound and Comparative Compound

| Example | HIL | HTL | EML (400 Å, doping %) | | BL | ETL |
|---|---|---|---|---|---|---|
| Comparative Example 1 | LG101 100 Å | Compound D 450 Å | Compound B as host | Compound A 10% | Compound C 50 Å | Alq 450 Å |
| Comparative Example 2 | LG101 100 Å | Compound D 450 Å | Compound B as host | Compound A 15% | Compound C 50 Å | Alq 450 Å |
| Inventive Example 1 | LG101 100 Å | Compound D 450 Å | Compound B as host | Compound 1 10% | Compound C 50 Å | Alq 450 Å |
| Inventive Example 2 | LG101 100 Å | Compound D 450 Å | Compound B as host | Compound 1 15% | Compound C 50 Å | Alq 450 Å |

TABLE 2

VTE Device Results

| | x | y | λmax (nm) | FWHM (nm) | $LT_{95\%}$ (h) At 40 mA/cm2 |
|---|---|---|---|---|---|
| Comparative example 1 | 0.335 | 0.633 | 528 | 58 | 18 |
| Comparative example 2 | 0.340 | 0.630 | 530 | 59 | 9 |
| Inventive example 1 | 0.344 | 0.626 | 530 | 58 | 32 |
| Inventive example 2 | 0.347 | 0.626 | 530 | 58 | 24 |

Table 2 is the summary of EL of comparative and inventive devices at 1000 nits and life test at 40 mA/cm$^2$. The $LT_{95}$% of Comparative example Compound A at dopant concentration 10% and 15% are 18 and 9 hours vs 32 and 24 hours for inventive example Compound 1, respectively. The device lifetime results demonstrated that a fused ring and rigidification of molecules can result in better device performance in term of lifetime, which is a desired property for OLED devices.

Example 2: Synthesis of Compound 1

Synthesis of methyl 2-(dibenzo[b,d]furan-4-yl)benzoate

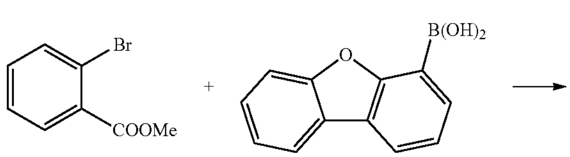

-continued

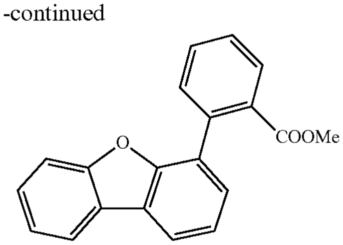

To a 500 mL round bottom flask, methyl-2-bromobenzoate (15 g, 69.8 mmol), dibenzo[b,d]furan-4-ylboronic acid (16.27 g, 77 mmol), $Pd(PPh_3)_4$ (0.806 g, 0.698 mmol), $K_2CO_3$ (19.28 g 140 mmol) and 250 mL THF were added and nitrogen was bubbled through the reaction mixture for 30 mins. The reaction mixture was heated up to reflux and stirred at reflux overnight. The reaction mixture was cooled down and purified using a silica gel column with DCM 50% in heptane as elutant and about 8 grams (38% yield) of pure product was obtained.

Synthesis of 2-(2-dibenzo[b,d]furan-4-yl)phenylpropan-2-ol

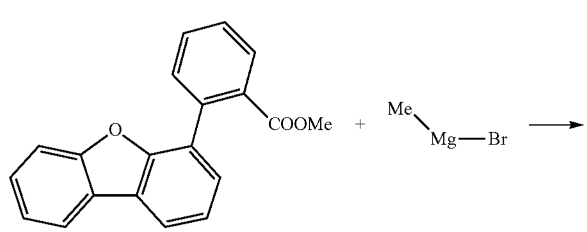

-continued

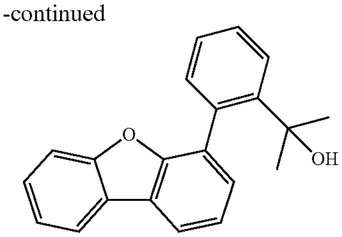

Methyl 2-(dibenzo[b,d]furan-4-yl)benzoate (7.7 g, 25.5 mmol) was dissolved in 150 mL anhydrous THF and cooled down to 0° C. To the solution, 25.5 mL of a 3 M methyl magnesium bromide diether solution was added slowly and the reaction mixture was stirred overnight. The reaction mixture was quenched with $NH_4Cl$ aqueous solution and extracted with DCM and dried over $Na_2SO_4$. 8 gram product was obtained after evaporation of DCM. The product, which was confirmed by GC, was used for the next step without further purification.

Synthesis of 7,7-dimethyl-7H-fluoreno[4,3-b]benzofuran

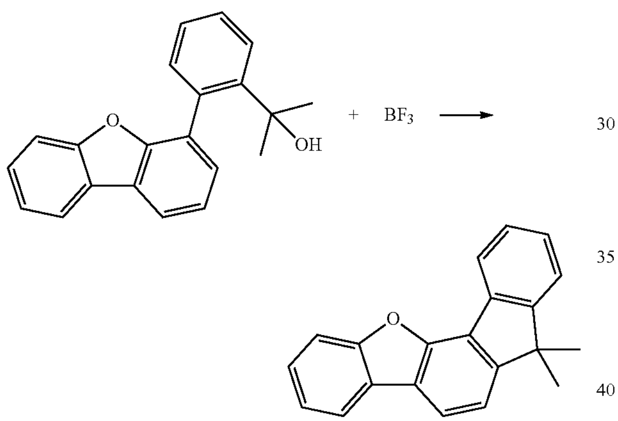

2-(2-dibenzo[b,d]furan-4-yl)phenylpropan-2-ol (8.0 g, 26.5 mmol) was dissolved in 150 mL DCM and cooled down to 0° C. To the solution, 10 mL of a $BF_3$ (46.5%) ether complex solution was added slowly, then the reaction mixture was stirred overnight. Saturated $NaHCO_3$ aqueous solution was slowly added while stirring until the formation of bubbles stopped. The reaction mixture was purified using a silica column with 15% DCM in heptane as eluant. 4 g product was obtained after column. The product was confirmed by proton NMR and GC.

Synthesis of 2-(7,7-dimethyl-7H-fluoreno[4,3-b]benzofuran-1-yl)-4,4,5,5-tetramethyl-1,3,2-dioxaborolane

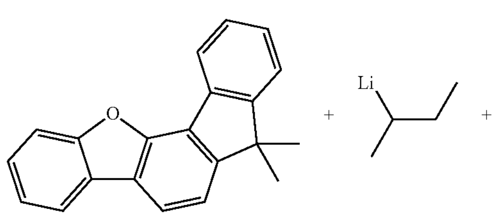

-continued

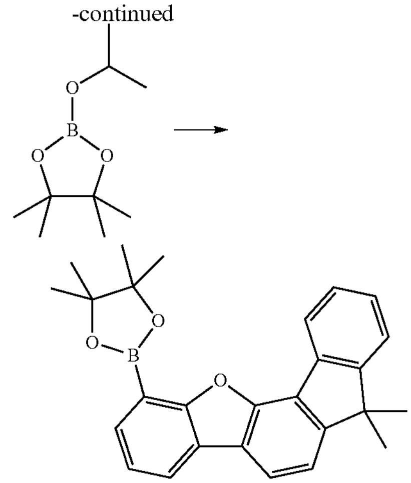

7,7-dimethyl-7H-fluoreno[4,3-b]benzofuran (4.0 g, 14.07 mmol) was dissolved in anhydrous THF and cooled down to −78° C. 30 mL of 1.4 M Sec-BuLi in cyclohexane was added into the solution once, and the reaction mixture was stirred for two hours at −78° C. 11.5 mL 2-isopropoxy-4,4,5,5-tetramethyl-1,3,2-dioxaborolane was added and the reaction mixture was stirred overnight. The reaction mixture was quenched with $NH_4OH$ aqueous solution and purified using a silica gel column to yield 2.1 g (36.5% yield) product.

Synthesis of 2-(7,7-dimethyl-7H-fluoreno[4,3-b]benzofuran-1-yl)pyridine

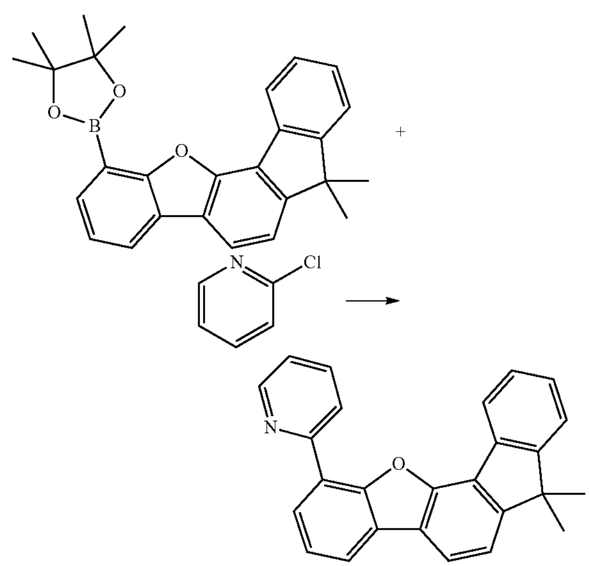

A round flask was charged with 2-(7,7-dimethyl-7H-fluoreno[4,3-b]benzofuran-1-yl)-4,4,5,5-tetramethyl-1,3,2-dioxaborolane (2.0 g, 4.87 mmol), 2-chloropyridine (0.664 g, 5.85 mmol), $Pd_2(dba)_3$ (0.09 g, 0.098 mmol), dicyclohexyl(2',6'-dimethoxy-[1,1'-biphenyl]-2-yl)phosphine (0.16 g, 0.39 mmol), $K_3PO_4$ (3.62 g, 17.06 mmol), 150 mL toluene and 15 mL water. Nitrogen was bubbled through the reaction mixture for 20 mins, and then the reaction mixture was heated up to reflux and stirred at reflux overnight. The product was purified using silica gel chromatograph, and was confirmed by GC. 1.3 g product (73.8% yield) was obtained.

Synthesis of Compound 1

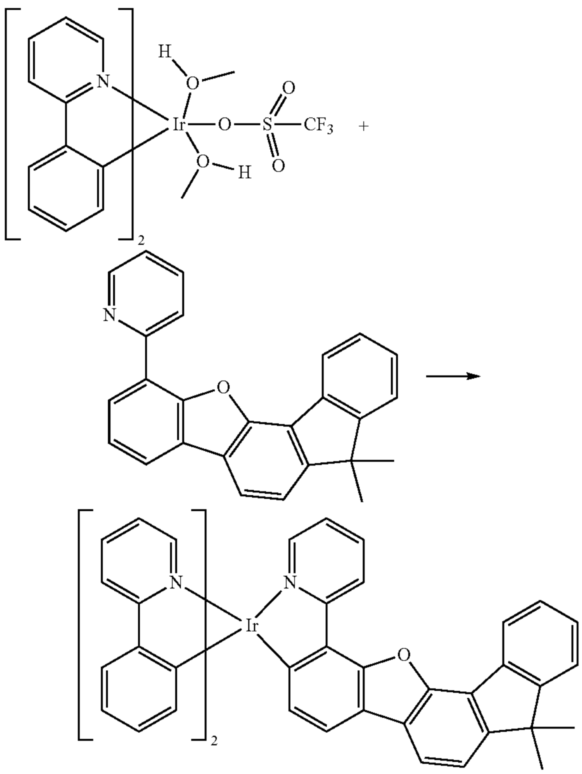

A round flask was charged with iridium complex precursor (1.6 g, 2.24 mmol), 2-(7,7-dimethyl-7H-fluoreno[4,3-b]benzofuran-1-yl)pyridine (1.3 g, 3.59 mmol), 30 mL methanol and 30 mL ethanol. The reaction mixture was heated up to reflux (oil bath; 85° C.) for and stirred at reflux for 7 days. The reaction mixture was purified using a silica gel column. 0.82 g (42.5% yield) pure product was isolated, which was confirmed by LC-MS and HPLC.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A compound comprising a ligand $L_A$ wherein the ligand $L_A$ is selected from the group consisting of:

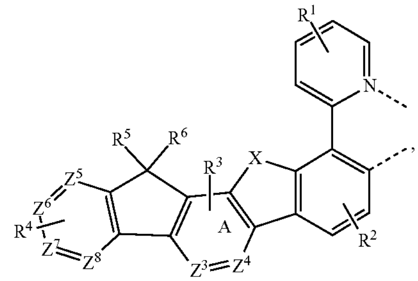

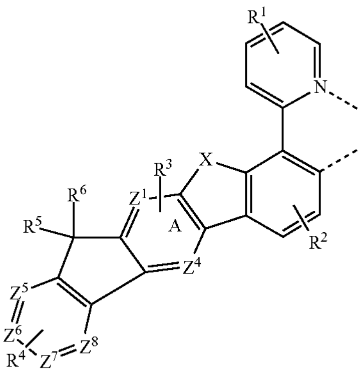

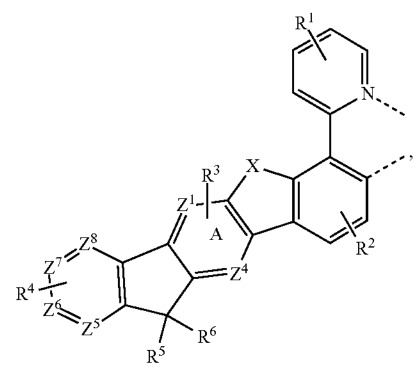

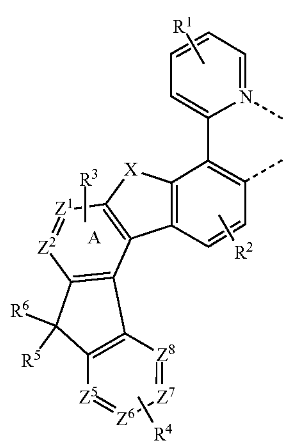
and

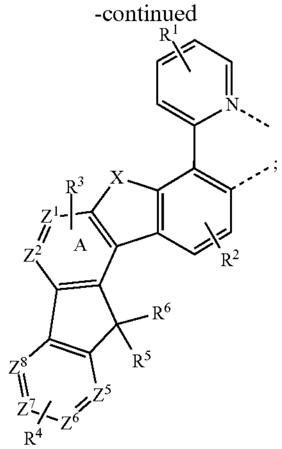

wherein each $Z^1$ to $Z^8$ is nitrogen or carbon;

wherein $R^1$ and $R^4$ each independently represent mono, di, tri, or tetra substitutions, or no substitution;

wherein $R^2$ and $R^3$ each independently represent mono, or di substitutions, or no substitution;

wherein X is O or S;

wherein $R^1$, $R^2$, $R^3$, $R^4$, $R^5$, and $R^6$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substituents are optionally joined to form a ring, which can be further substituted;

wherein the ligand $L_A$ is coordinated to a metal M; and wherein the ligand $L_A$ is optionally linked with other ligands to comprise a tridentate, tetradentate, pentadentate or hexadentate ligand.

2. The compound of claim 1, wherein M is selected from the group consisting of Ir, Rh, Re, Ru, Os, Pt, Au, and Cu.

3. The compound of claim 1, wherein each of $Z^1$ to $Z^4$ is carbon.

4. The compound of claim 1, wherein each of $Z^5$ to $Z^8$ is carbon.

5. The compound of claim 1, wherein each of $Z^1$ to $Z^8$ is carbon.

6. The compound of claim 1, wherein at least one of $Z^5$ to $Z^8$ is nitrogen.

7. The compound of claim 1, wherein X is O.

8. The compound of claim 1, wherein $R^5$ and $R^6$ are joined to form a ring.

9. The compound of claim 1, wherein the ligand $L_A$ is selected from the group consisting of:

$L_{A7}$

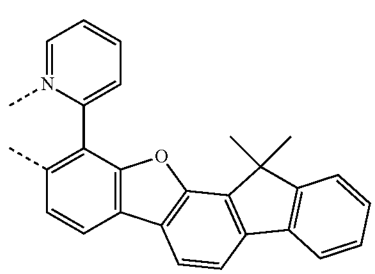

$L_{A8}$

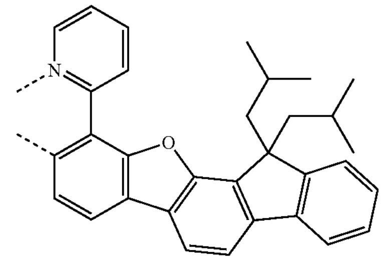

$L_{A9}$

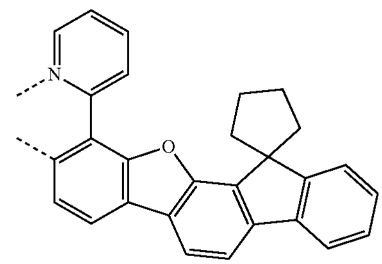

$L_{A10}$

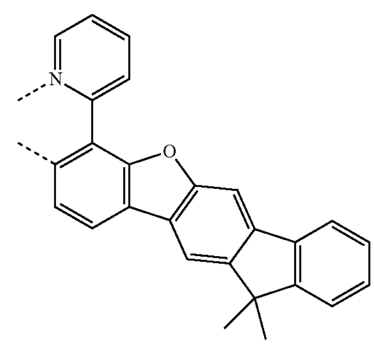

$L_{A11}$

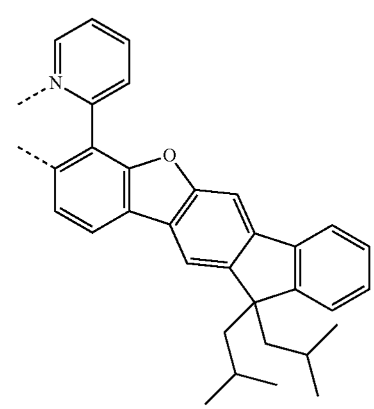

-continued
$L_{A12}$
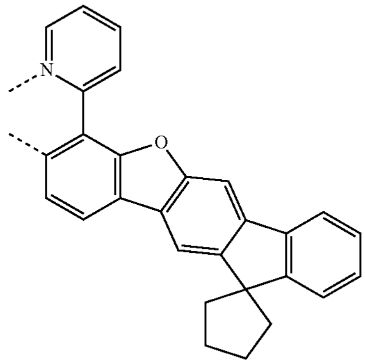
$L_{A13}$
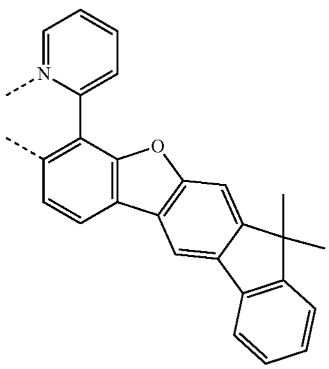
$L_{A14}$
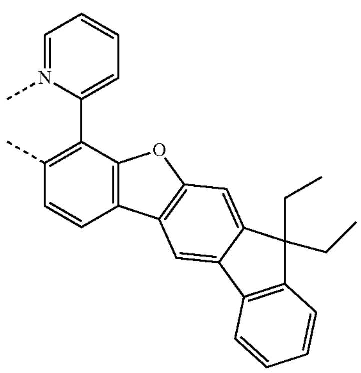
$L_{A15}$
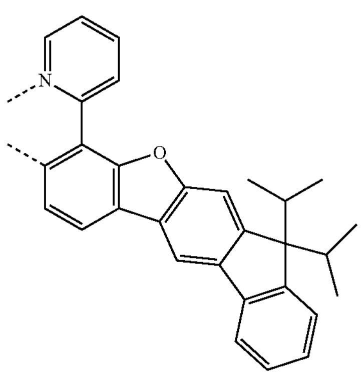
-continued
$L_{A16}$
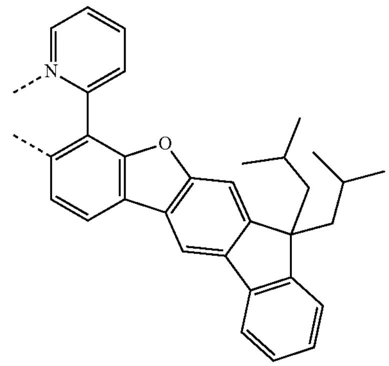
$L_{A17}$
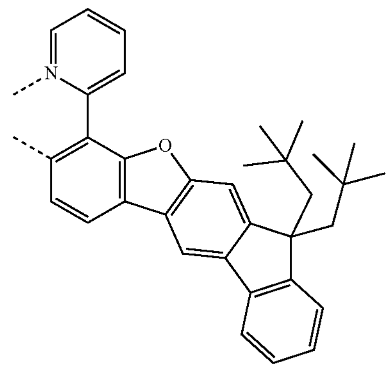
$L_{A18}$
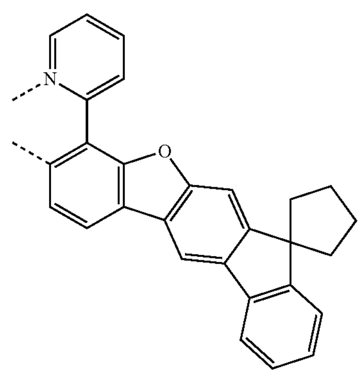
$L_{A19}$
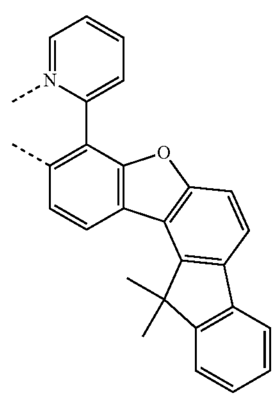

$L_{A20}$
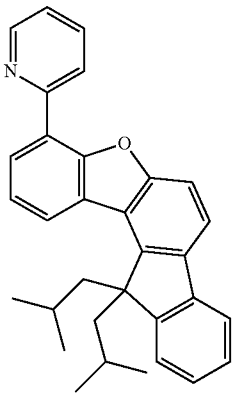
$L_{A21}$
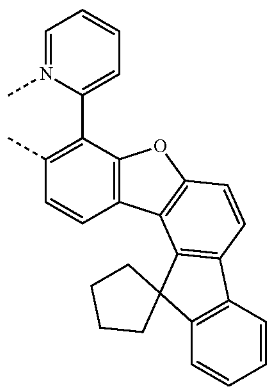
$L_{A22}$
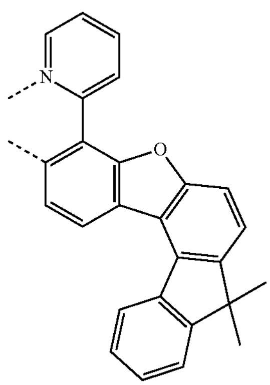
$L_{A23}$
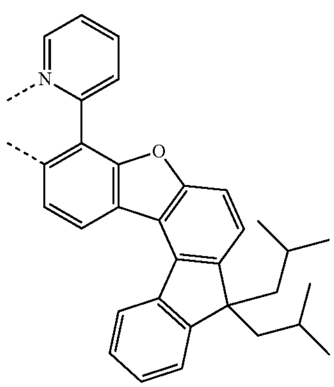
$L_{A24}$
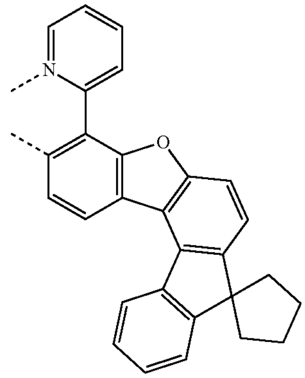
$L_{A31}$
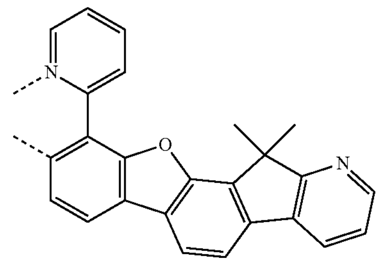
$L_{A32}$
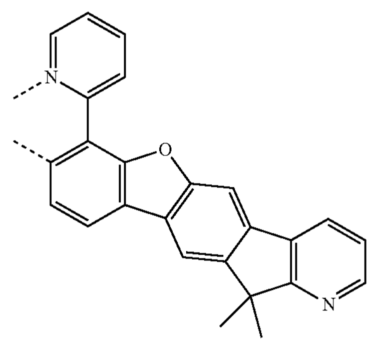
$L_{A33}$
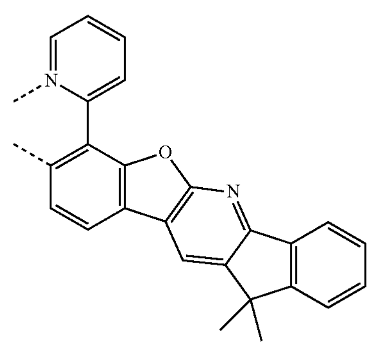

-continued
$L_{A34}$
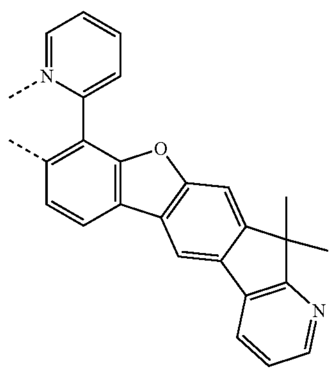
$L_{A35}$
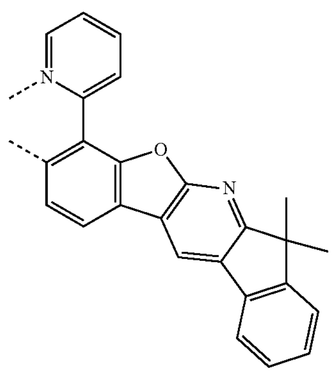
$L_{A36}$
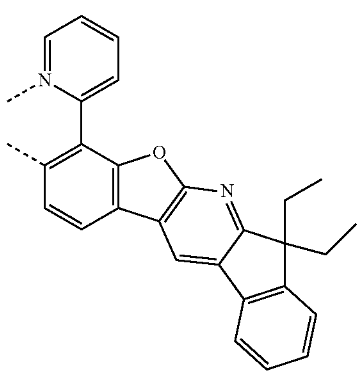
$L_{A37}$
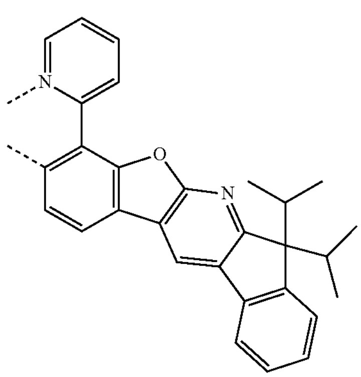
-continued
$L_{A38}$
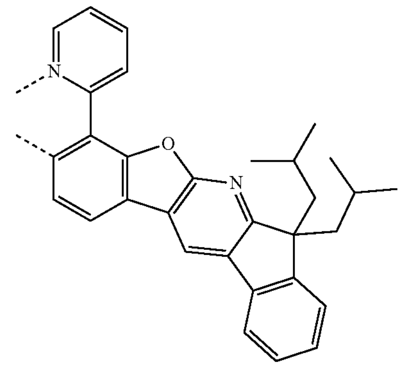
$L_{A39}$
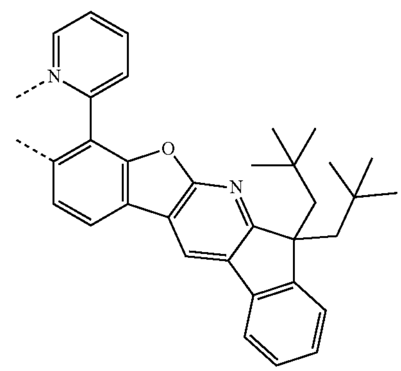
$L_{A40}$
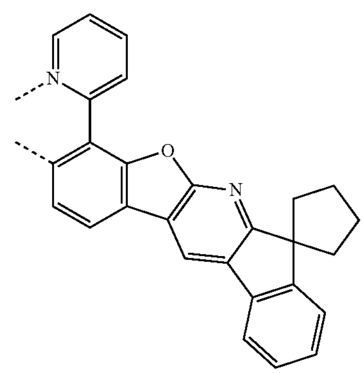
$L_{A41}$
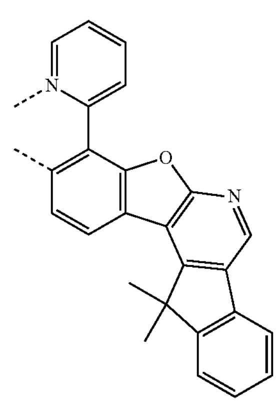

-continued
$L_{A48}$
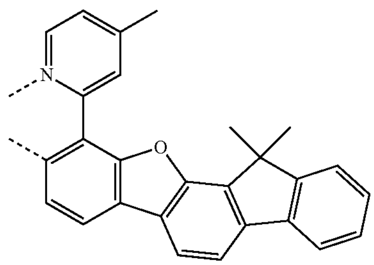
$L_{A49}$
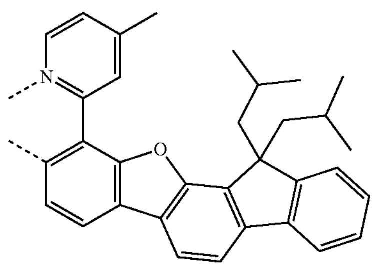
$L_{A50}$
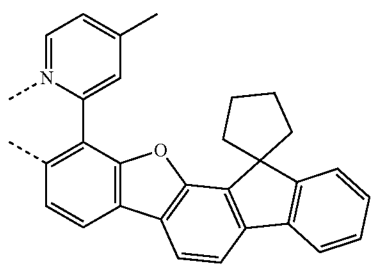
$L_{A51}$
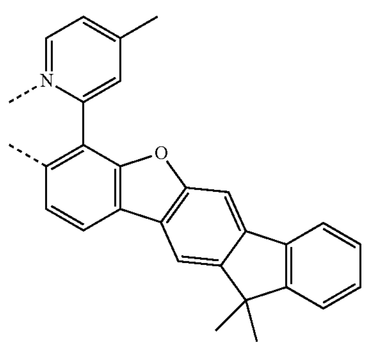
$L_{A52}$
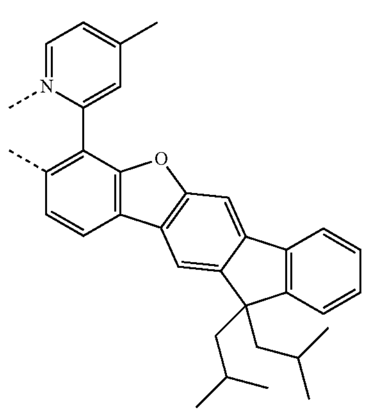
-continued
$L_{A53}$
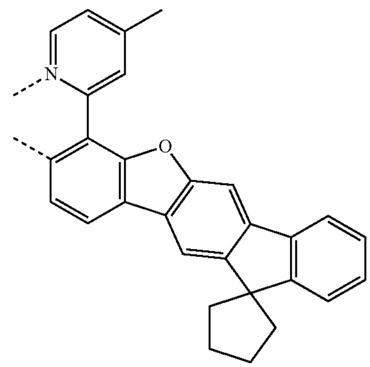
$L_{A54}$
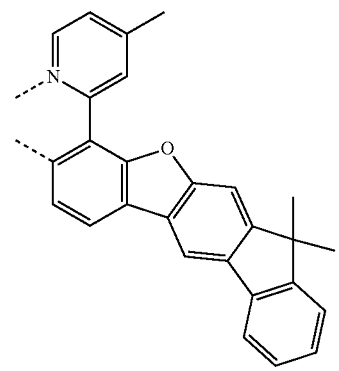
$L_{A55}$
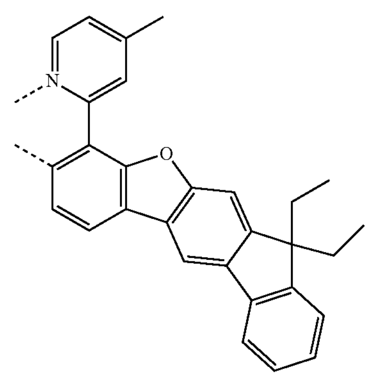
$L_{A56}$
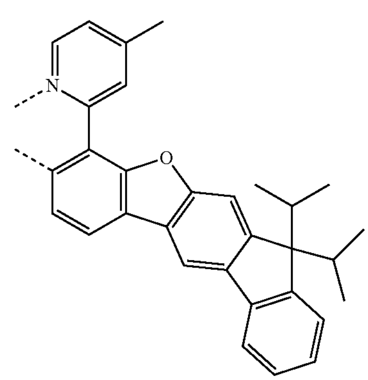

$L_{A57}$
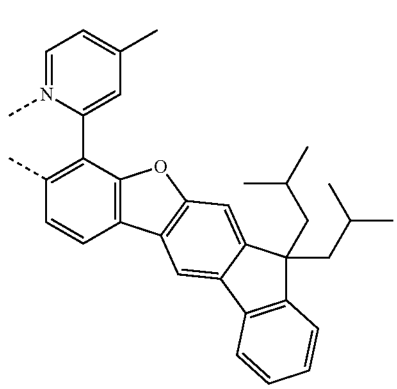
$L_{A58}$
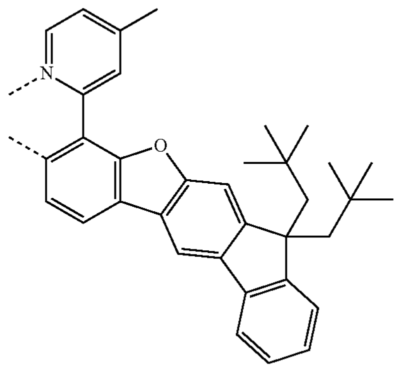
$L_{A59}$
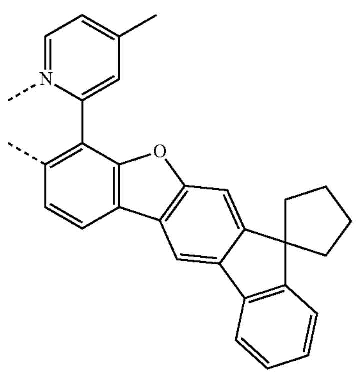
$L_{A60}$
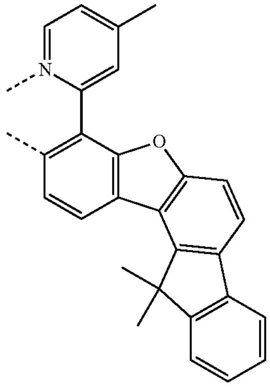
$L_{A61}$
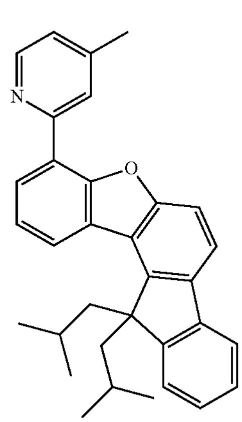
$L_{A62}$
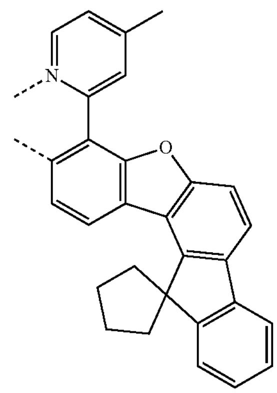
$L_{A63}$
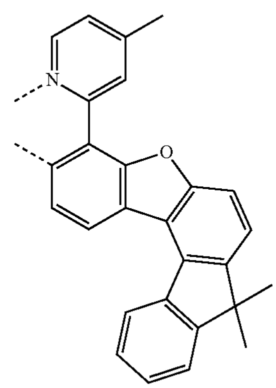
$L_{A64}$
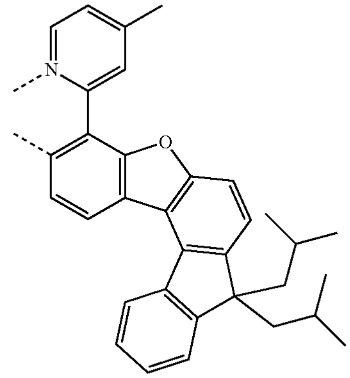

-continued
$L_{A65}$
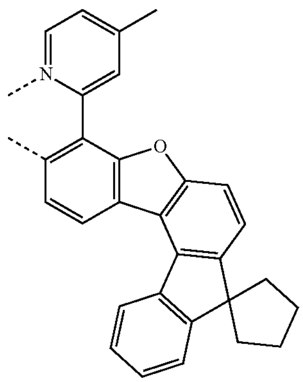
$L_{A72}$
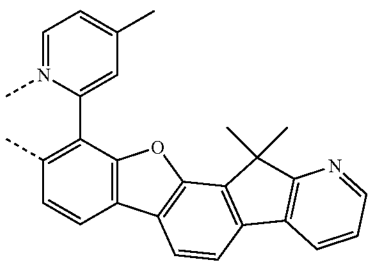
$L_{A73}$
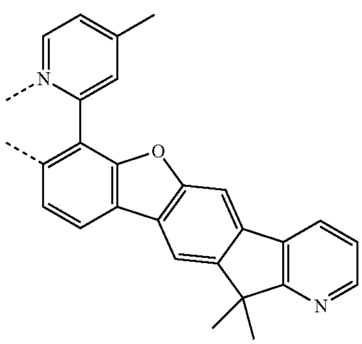
$L_{A74}$
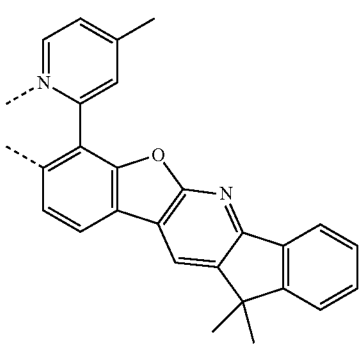
-continued
$L_{A75}$
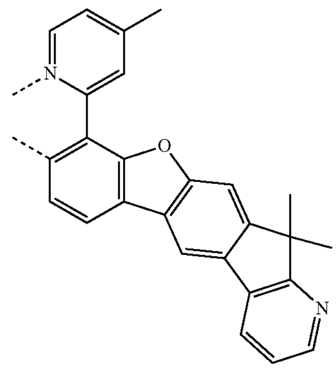
$L_{A76}$
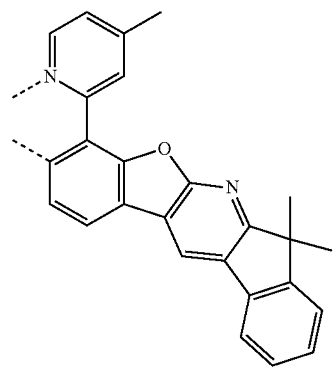
$L_{A77}$
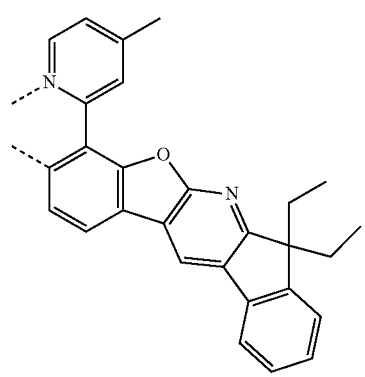
$L_{A78}$
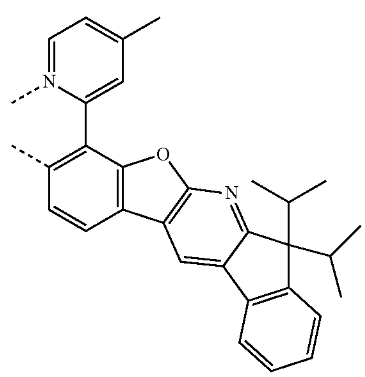

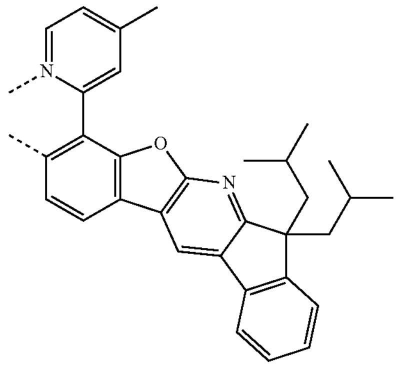
$L_{A79}$
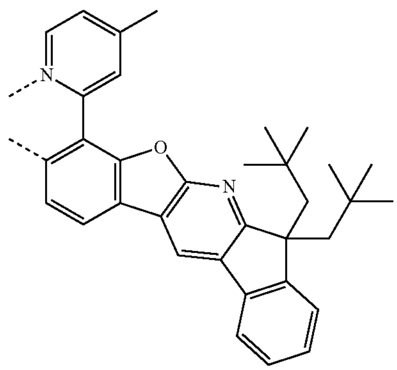
$L_{A80}$
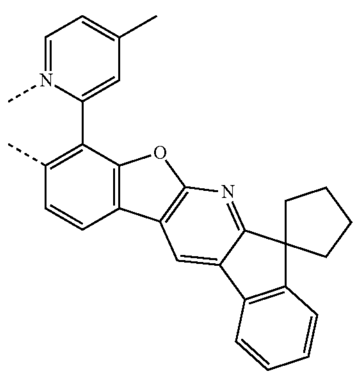
$L_{A81}$
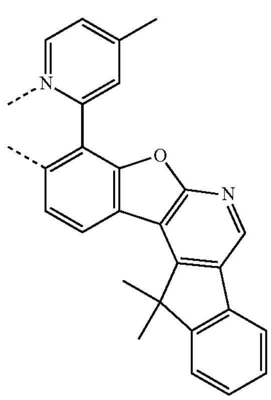
$L_{A82}$
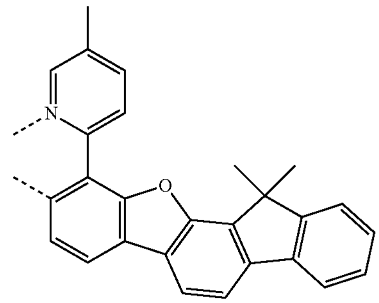
$L_{A89}$
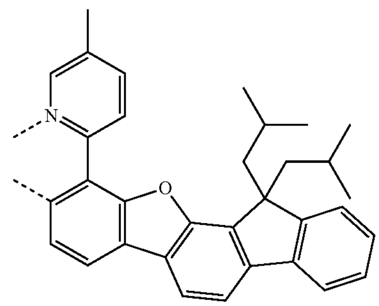
$L_{A90}$
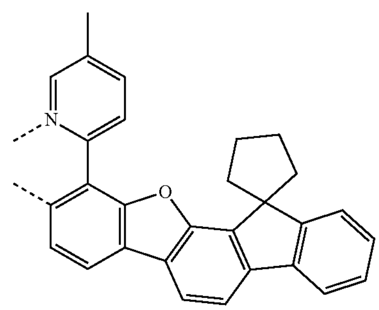
$L_{A91}$
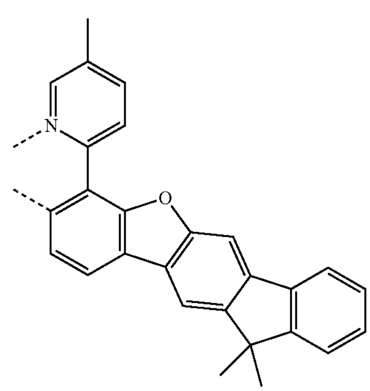
$L_{A92}$ $L_{A93}$
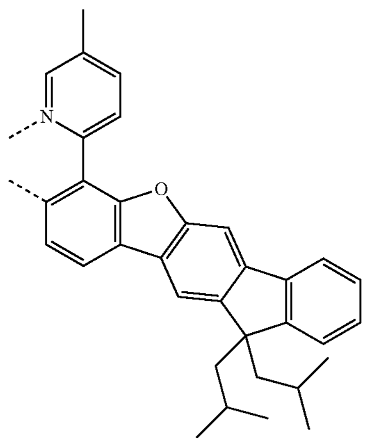
$L_{A94}$
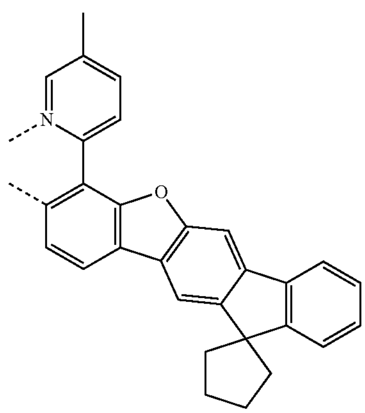
$L_{A95}$
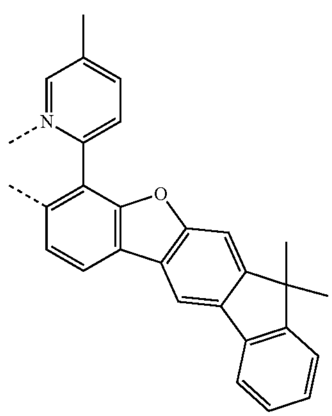
$L_{A96}$
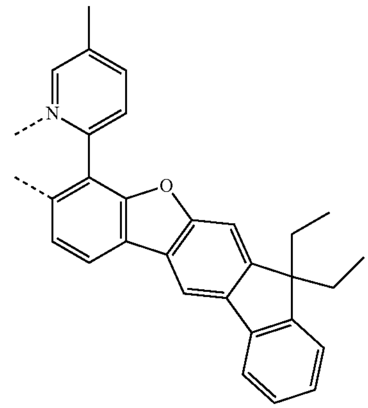
$L_{A97}$
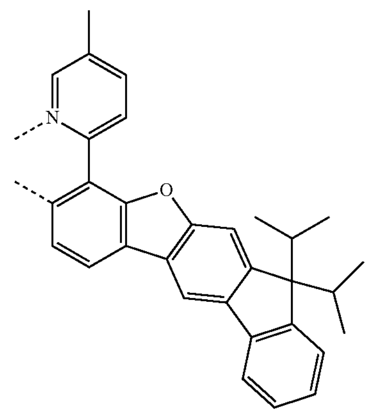
$L_{A98}$
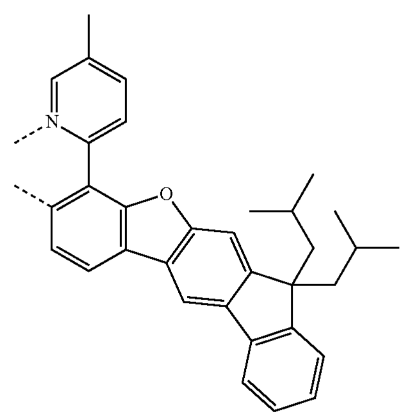
$L_{A99}$
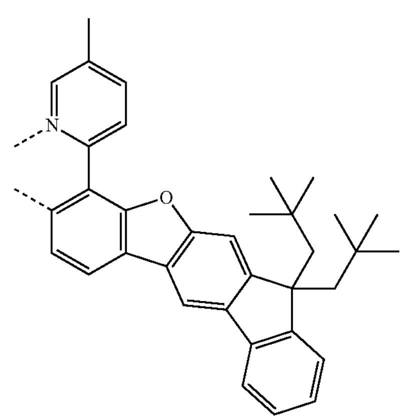

-continued
$L_{A100}$
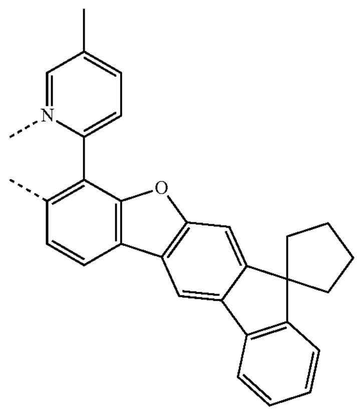
$L_{A101}$
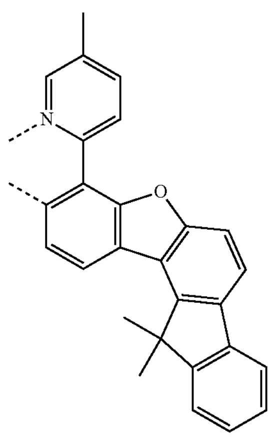
$L_{A102}$
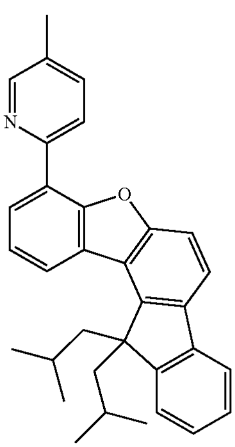
-continued
$L_{A103}$
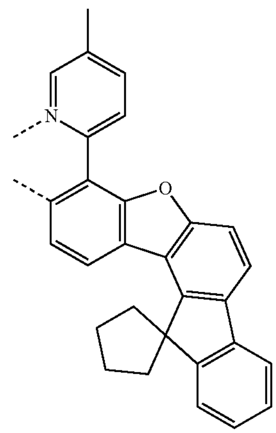
$L_{A104}$
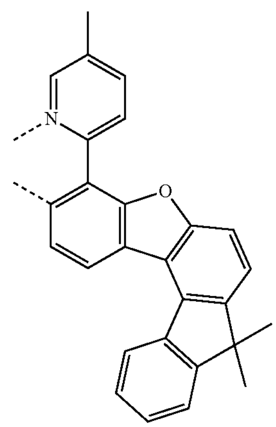
$L_{A105}$
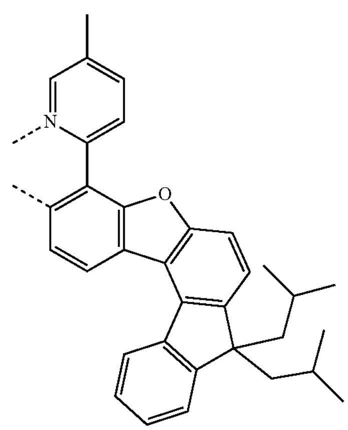

-continued
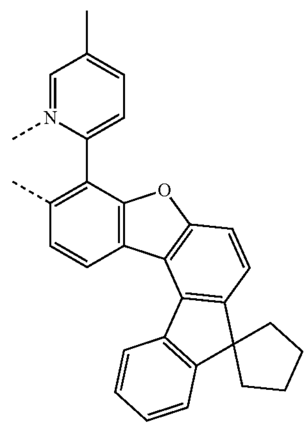
$L_{A106}$
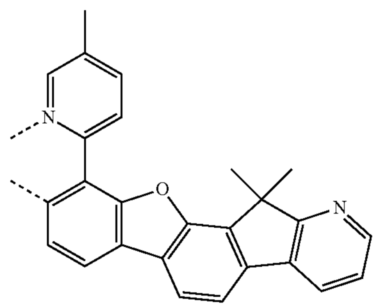
$L_{A113}$
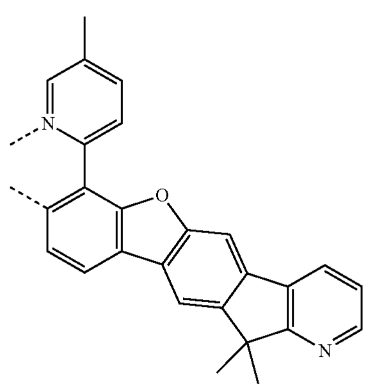
$L_{A114}$
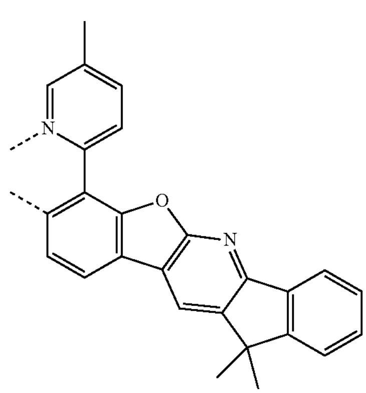
$L_{A115}$
-continued
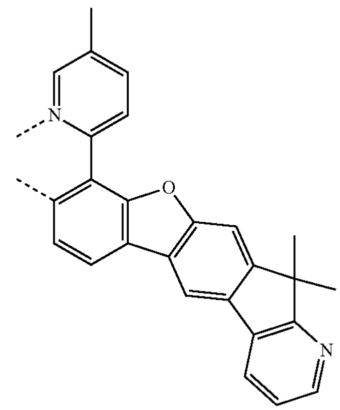
$L_{A116}$
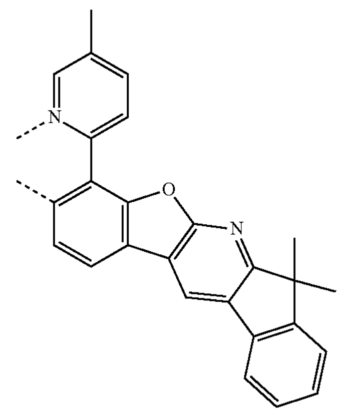
$L_{A117}$
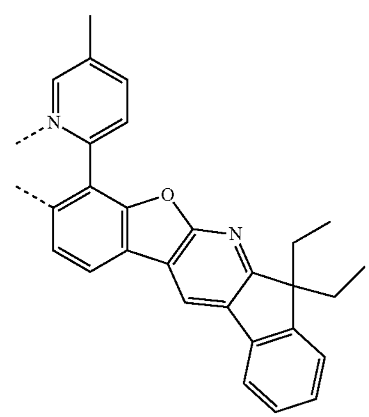
$L_{A118}$
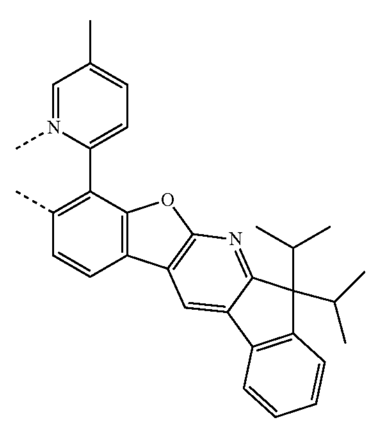
$L_{A119}$ -continued
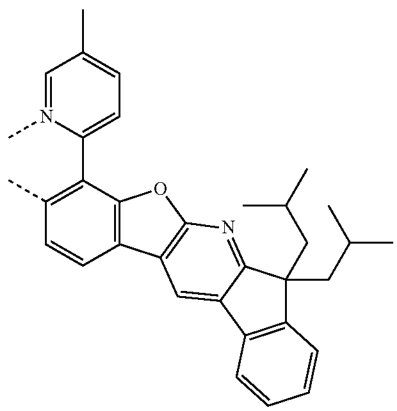
$L_{A120}$
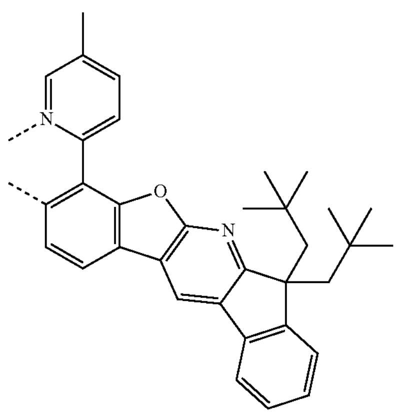
$L_{A121}$
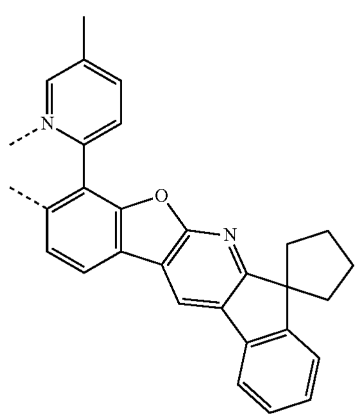
$L_{A122}$
-continued
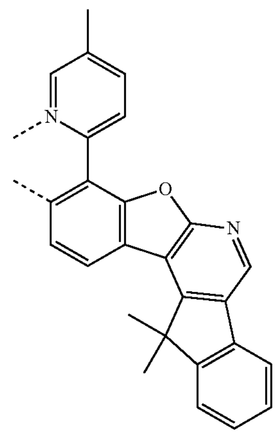
$L_{A123}$
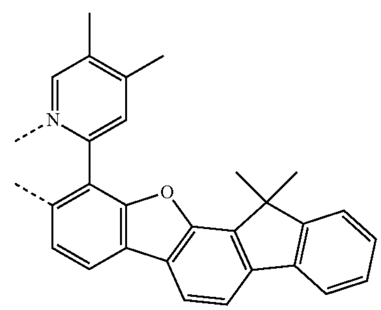
$L_{A130}$
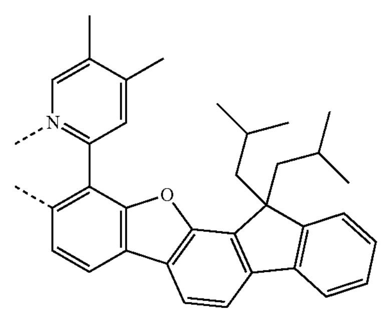
$L_{A131}$
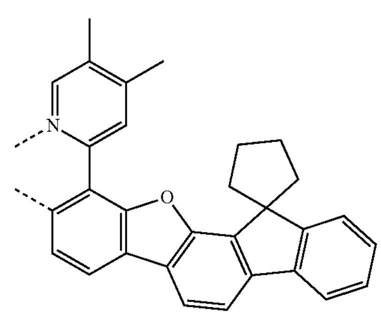
$L_{A132}$ $L_{A133}$
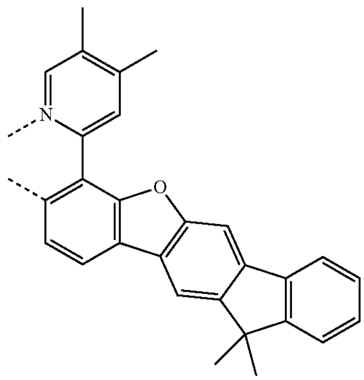
$L_{A134}$
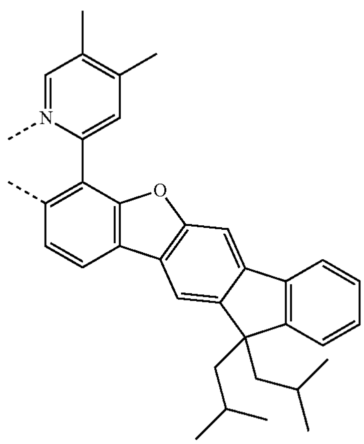
$L_{A135}$
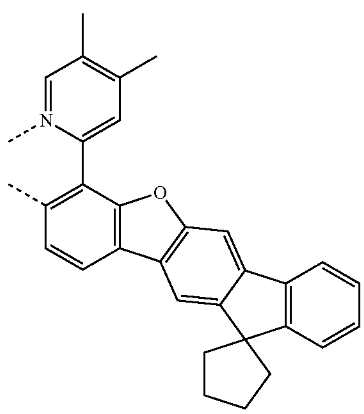
$L_{A136}$
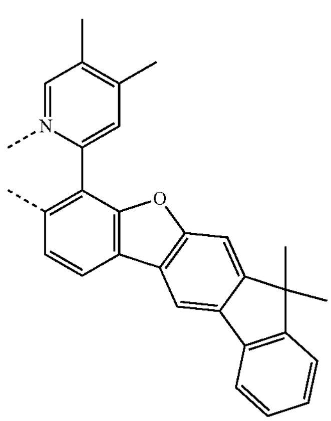
$L_{A137}$
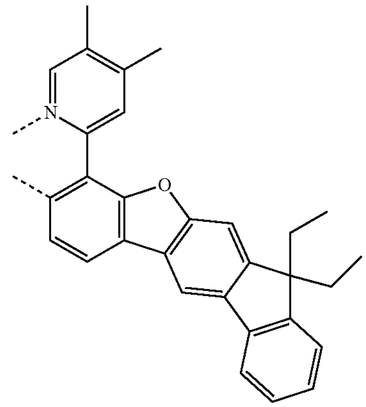
$L_{A138}$
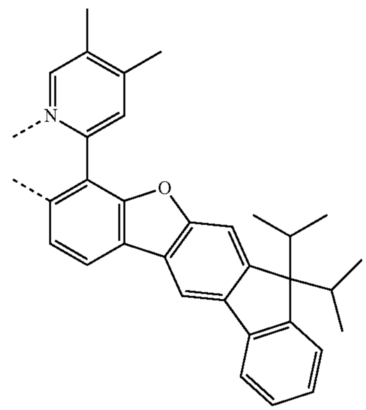
$L_{A139}$
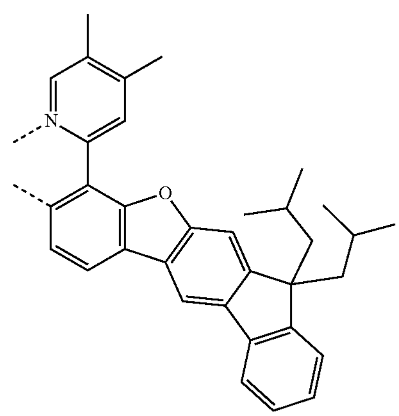
$L_{A140}$
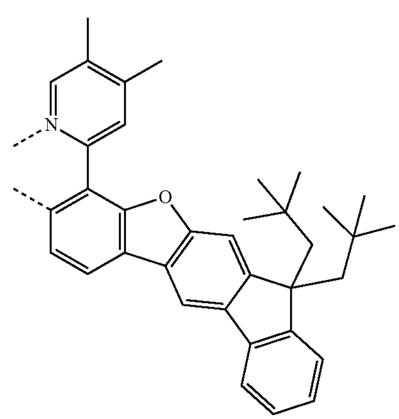

-continued
$L_{A141}$
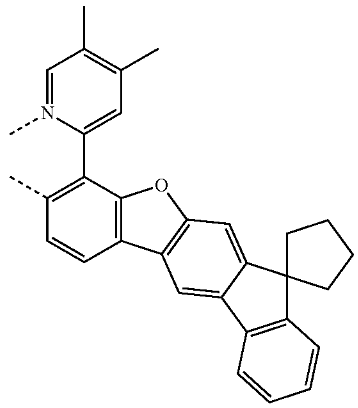
$L_{A142}$
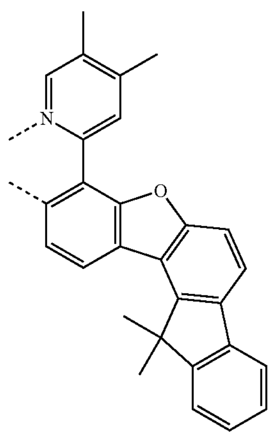
$L_{A143}$
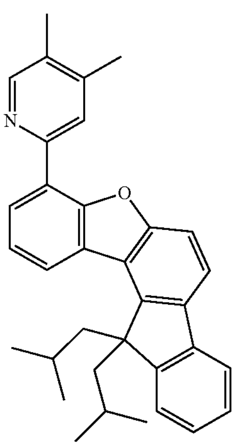
-continued
$L_{A144}$
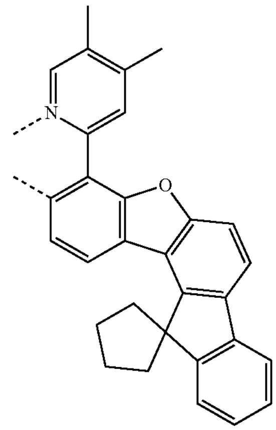
$L_{A145}$
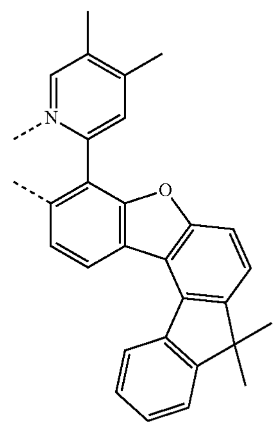
$L_{A146}$
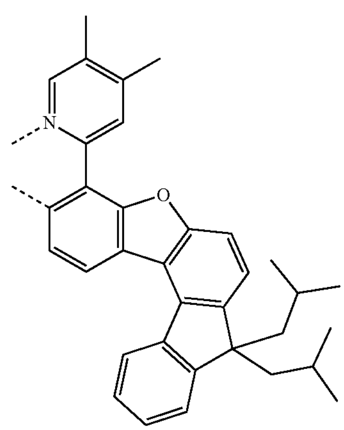

$L_{A147}$
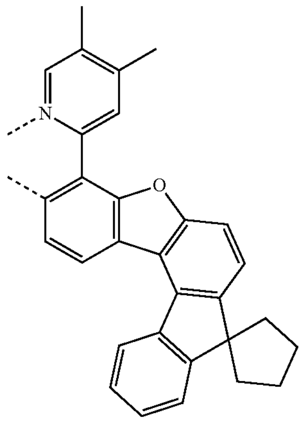
$L_{A154}$
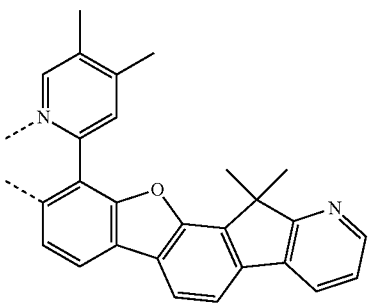
$L_{A155}$
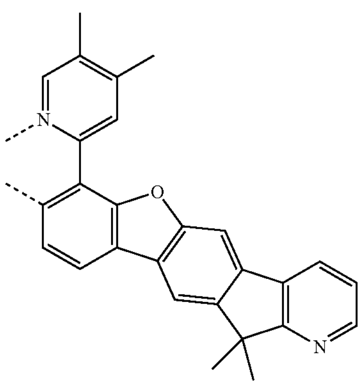
$L_{A156}$
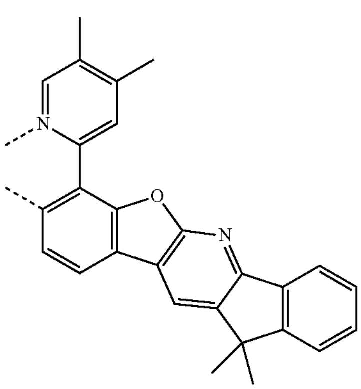
$L_{A157}$
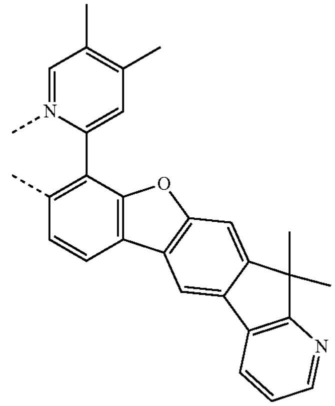
$L_{A158}$
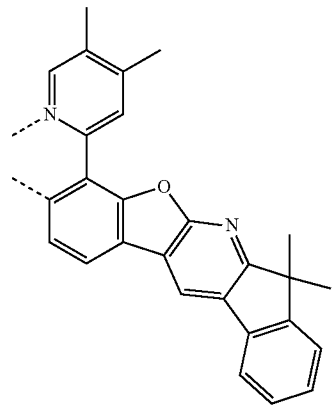
$L_{A159}$
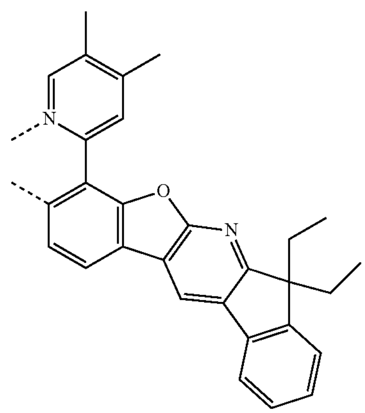
$L_{A160}$
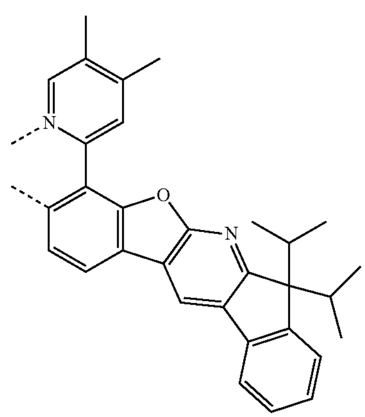

-continued
$L_{A161}$
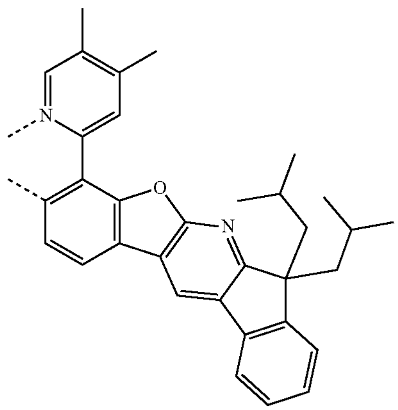
$L_{A162}$
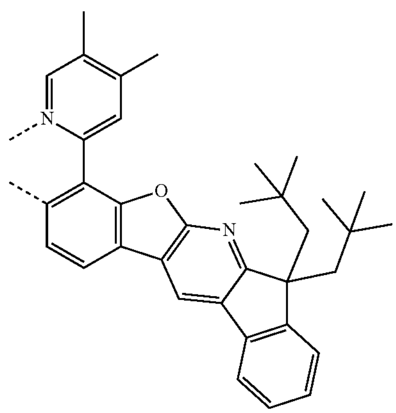
$L_{A163}$
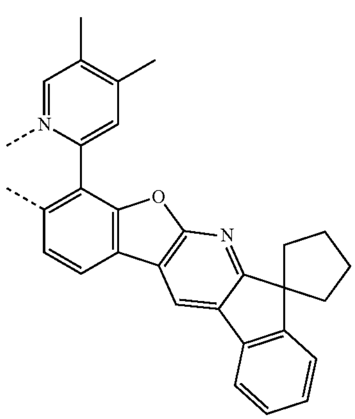
-continued
$L_{A164}$
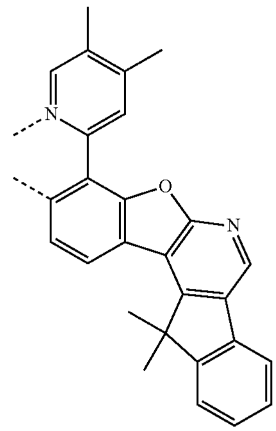
$L_{A171}$
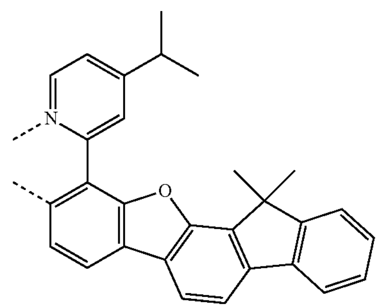
$L_{A172}$
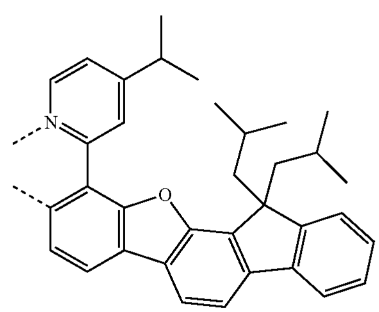
$L_{A173}$
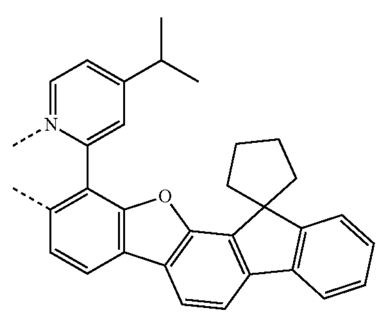

-continued
$L_{A174}$
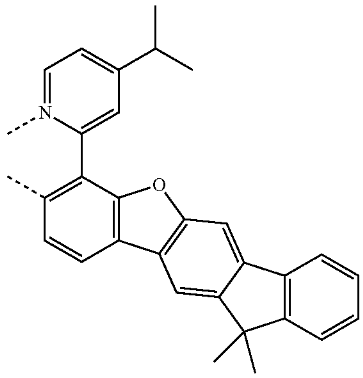
$L_{A175}$
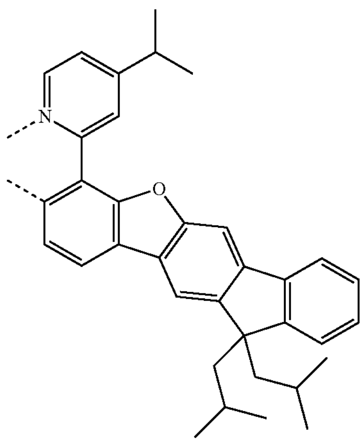
$L_{A176}$
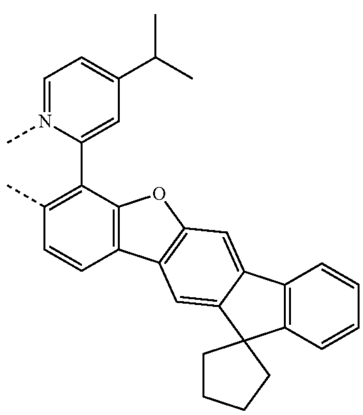
$L_{A177}$
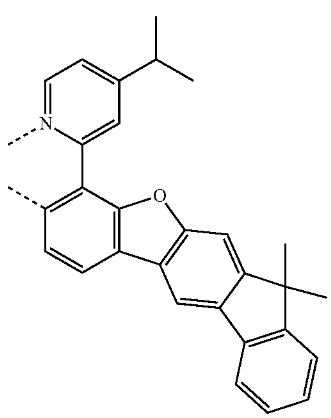
-continued
$L_{A178}$
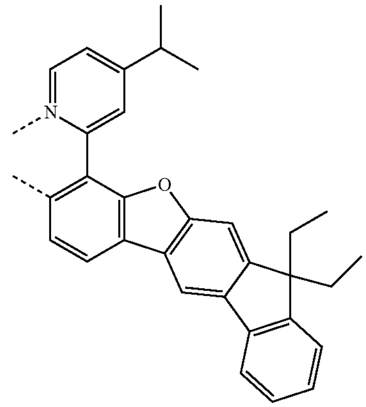
$L_{A179}$
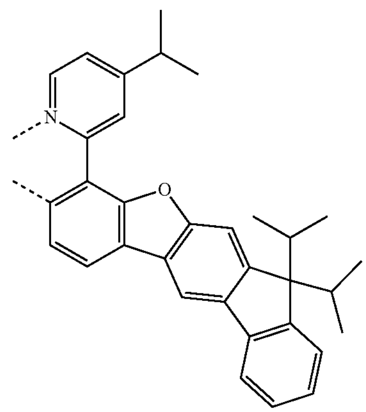
$L_{A180}$
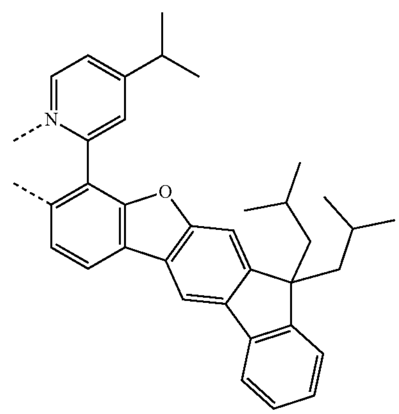
$L_{A181}$
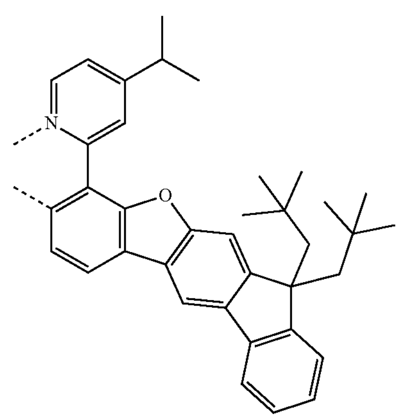

$L_{A182}$
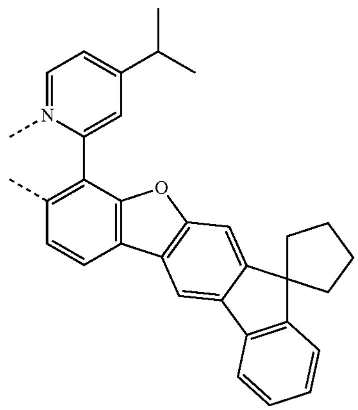
$L_{A183}$
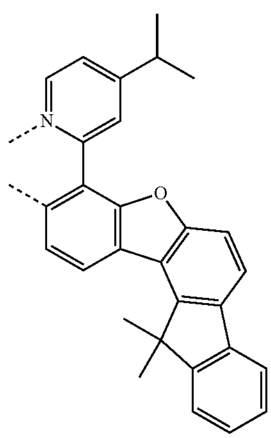
$L_{A184}$
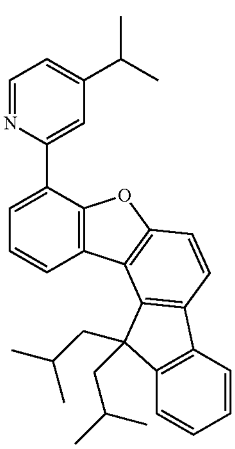
$L_{A185}$
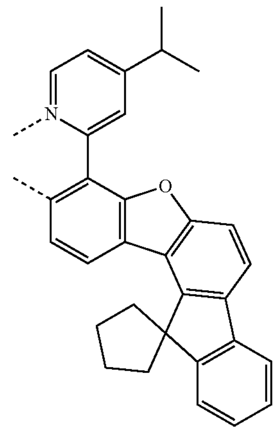
$L_{A186}$
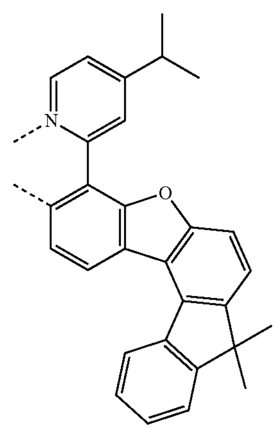
$L_{A187}$
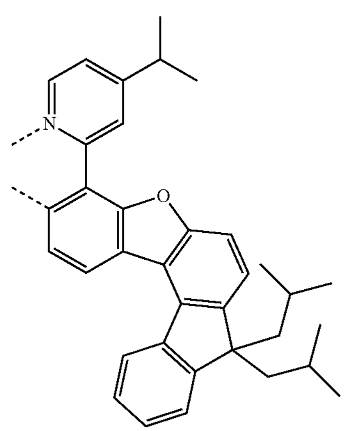

-continued
$L_{A188}$
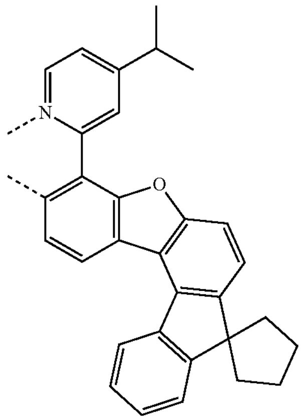
$L_{A194}$
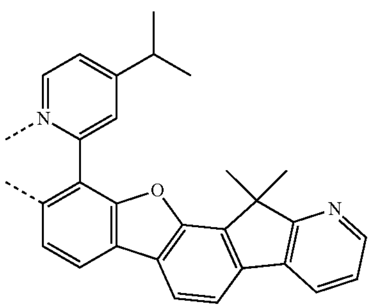
$L_{A195}$
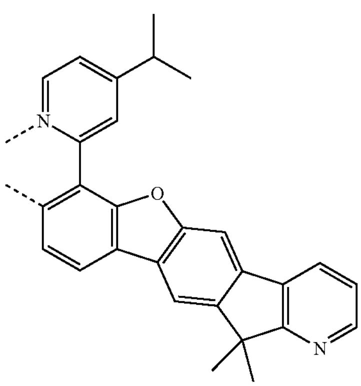
$L_{A196}$
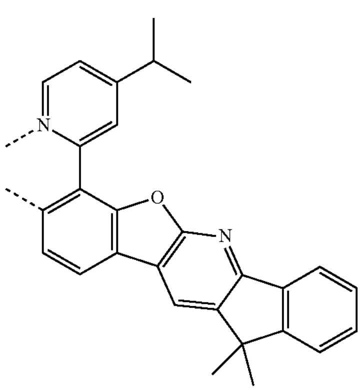
-continued
$L_{A197}$
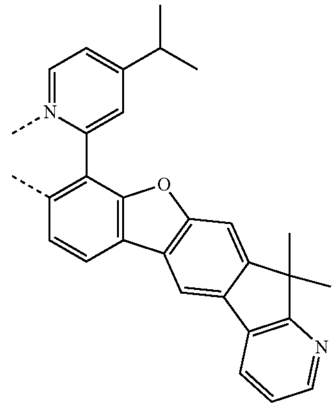
$L_{A198}$
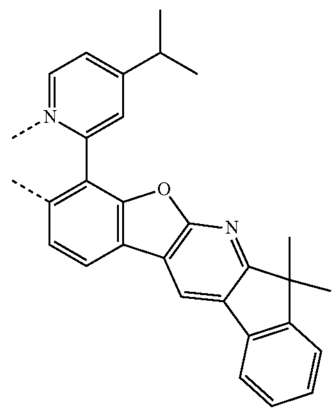
$L_{A199}$
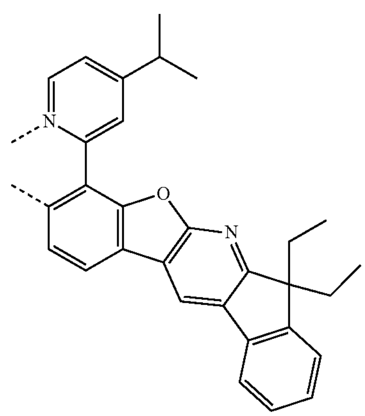
$L_{A200}$
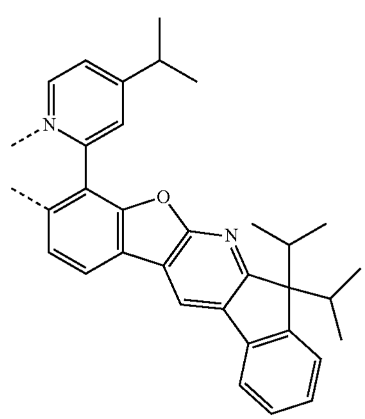

$L_{A201}$
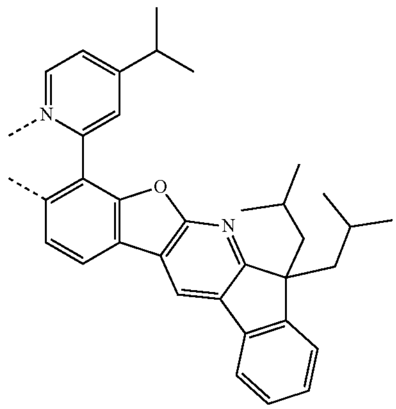
$L_{A202}$
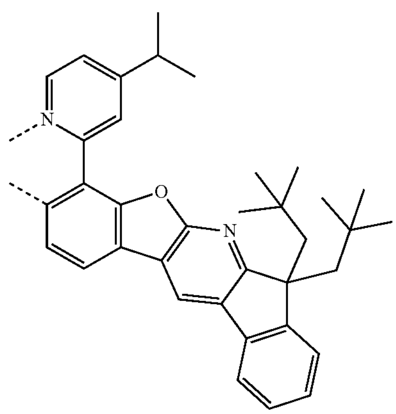
$L_{A203}$
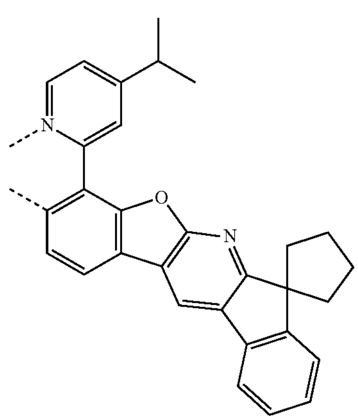
$L_{A204}$
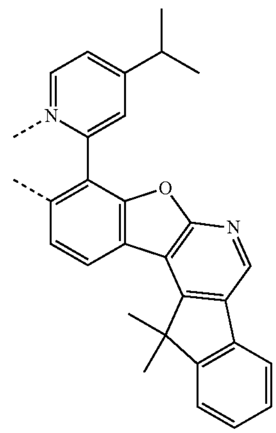
$L_{A211}$
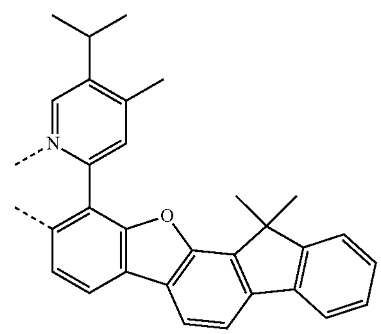
$L_{A212}$
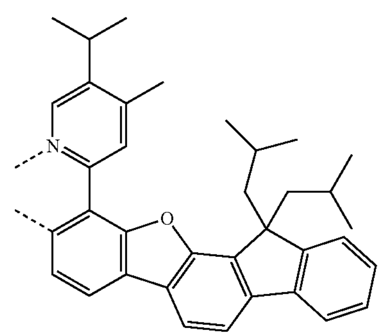
$L_{A213}$
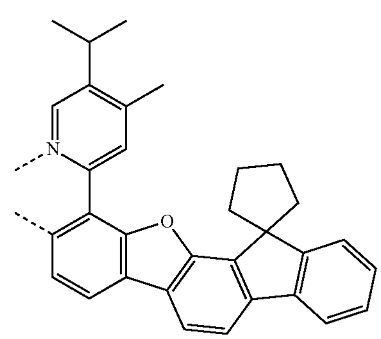

$L_{A214}$
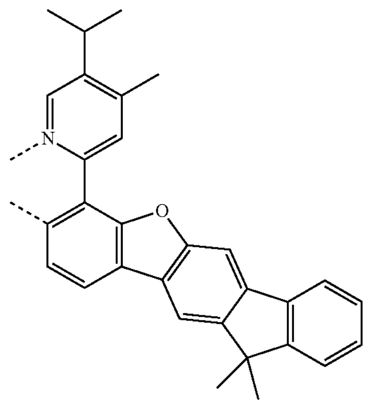
$L_{A215}$
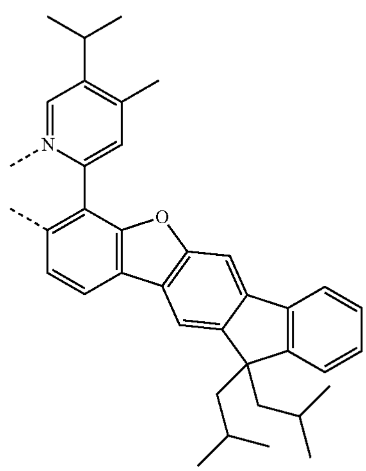
$L_{A216}$
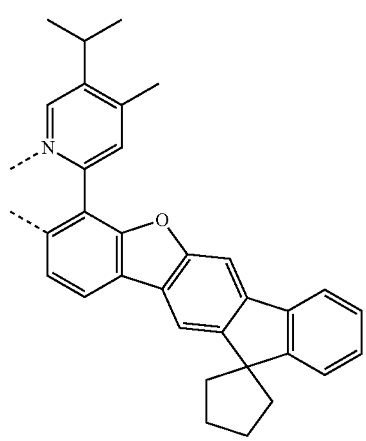
$L_{A217}$
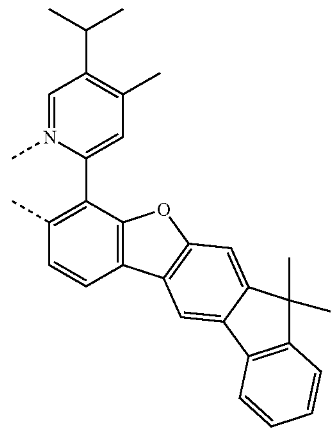
$L_{A218}$
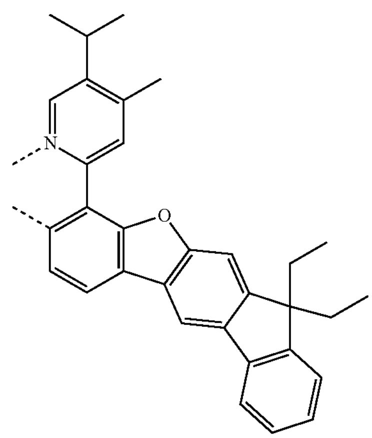
$L_{A219}$
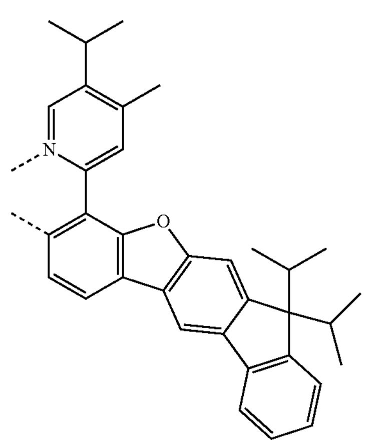

-continued
$L_{A220}$
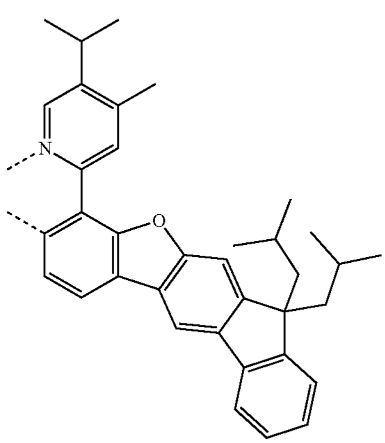
$L_{A221}$
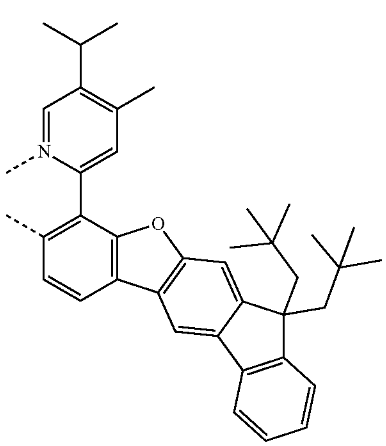
$L_{A222}$
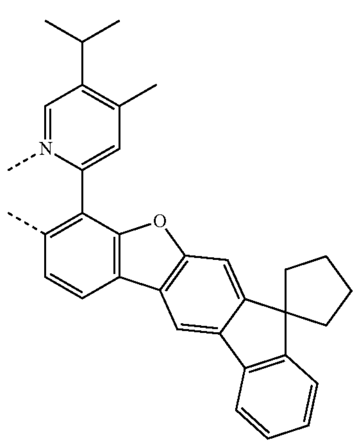
-continued
$L_{A223}$
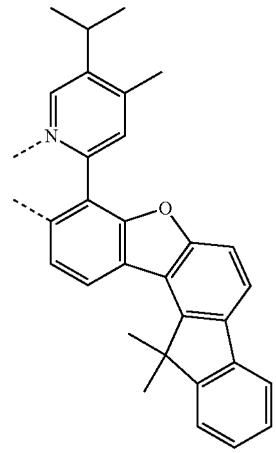
$L_{A224}$
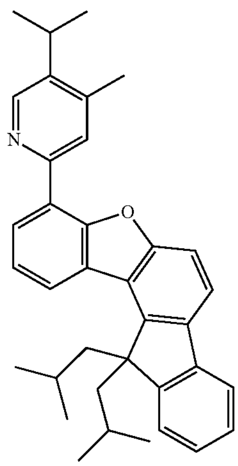
$L_{A225}$
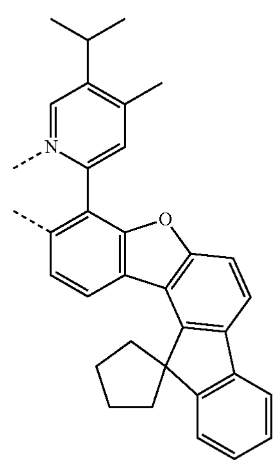

-continued
$L_{A226}$
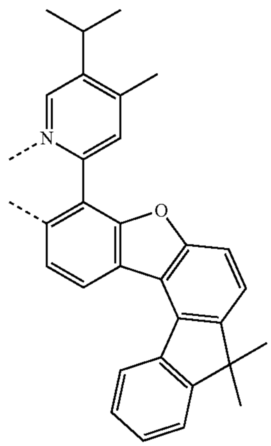
$L_{A227}$
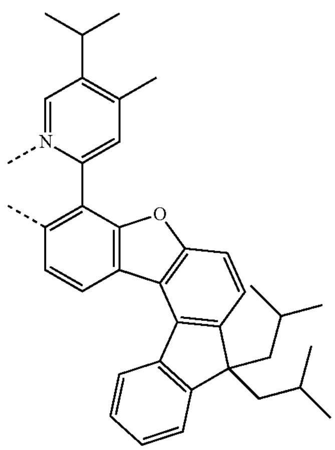
$L_{A228}$
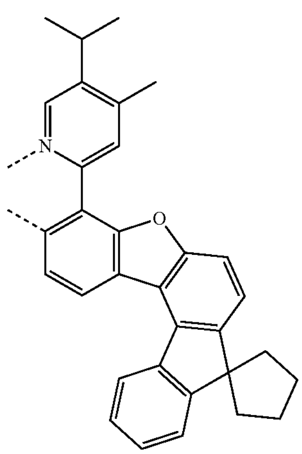
-continued
$L_{A235}$
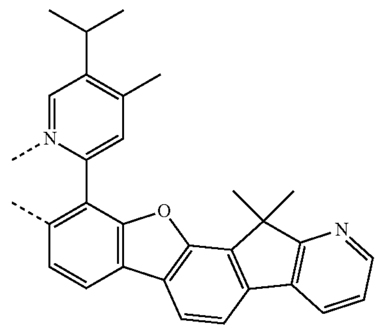
$L_{A236}$
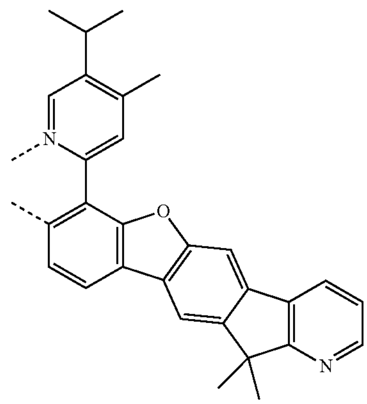
$L_{A237}$
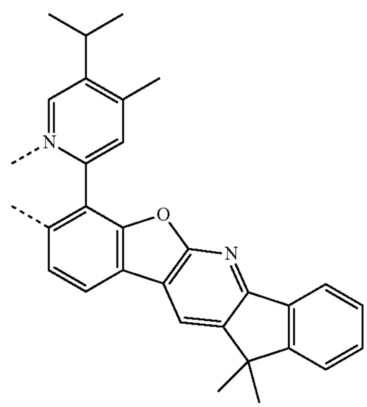
$L_{A238}$
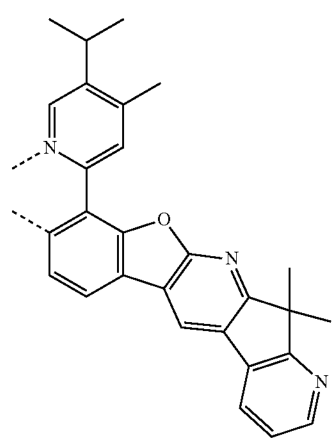

-continued
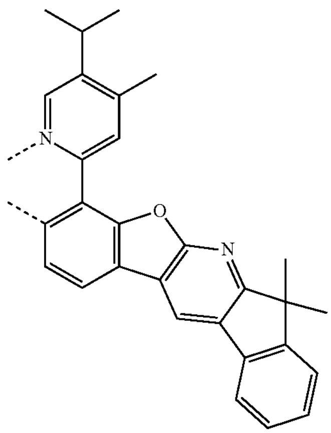
$L_{A239}$
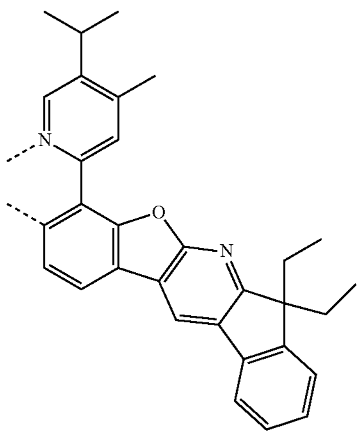
$L_{A240}$
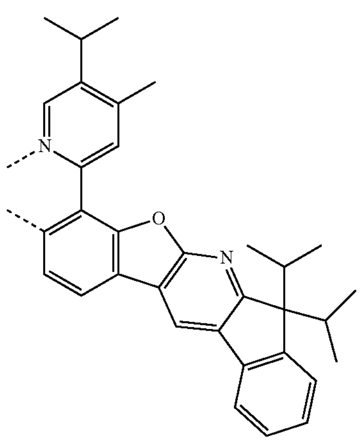
$L_{A241}$
-continued
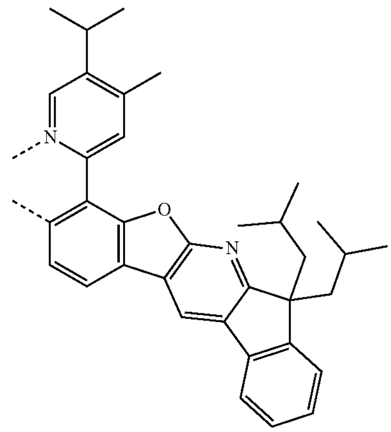
$L_{A242}$
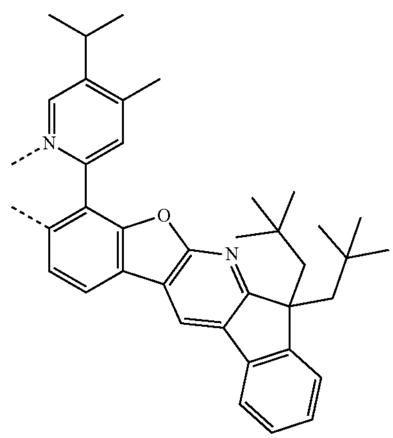
$L_{A243}$
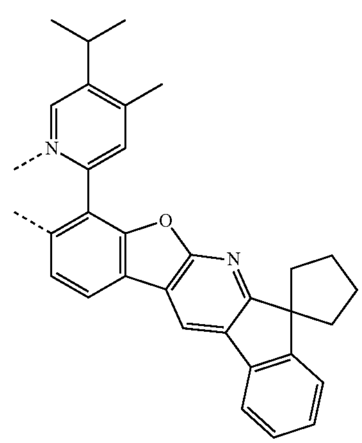
$L_{A244}$ -continued
$L_{A245}$
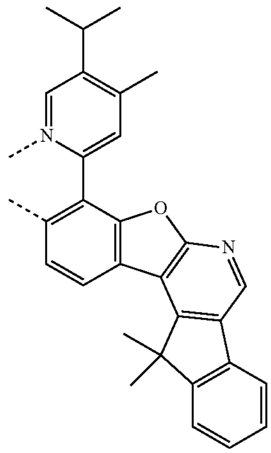
$L_{A252}$
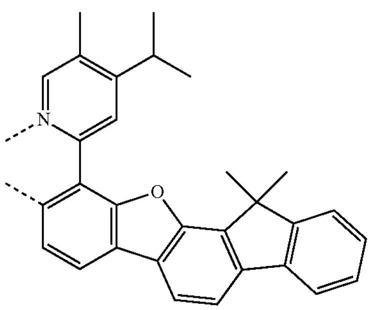
$L_{A253}$
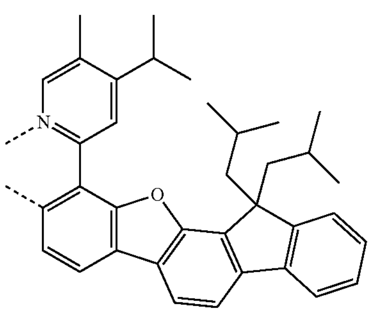
$L_{A254}$
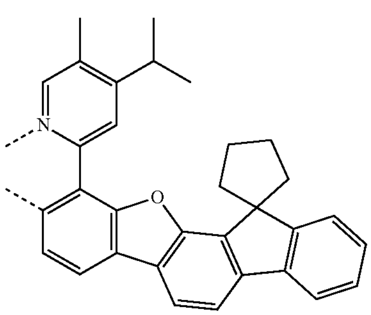
-continued
$L_{A255}$
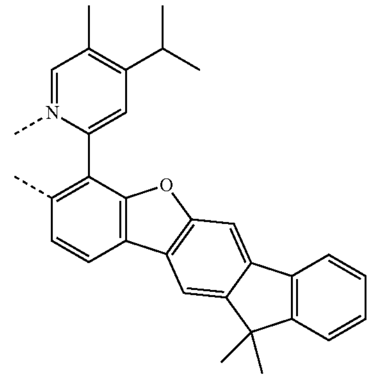
$L_{A256}$
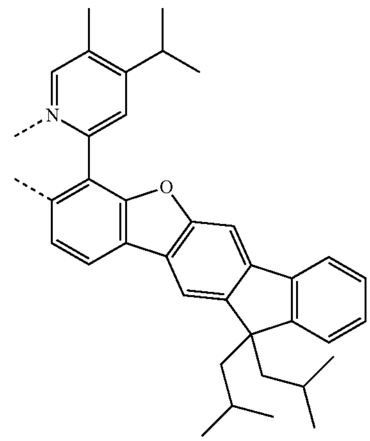
$L_{A257}$
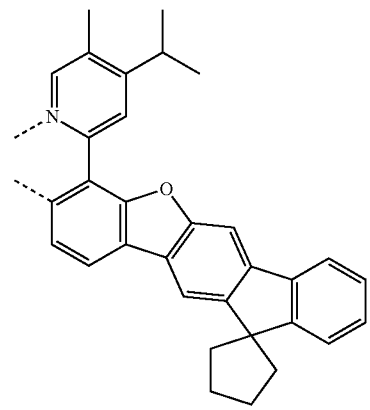
$L_{A258}$
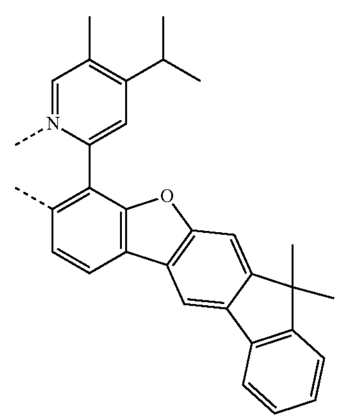

-continued
$L_{A259}$
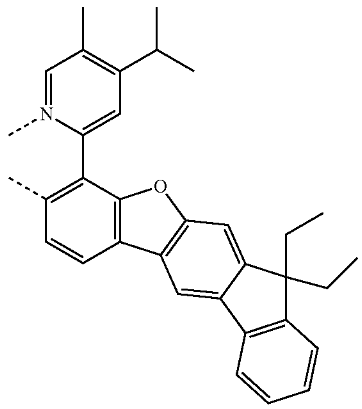
$L_{A260}$
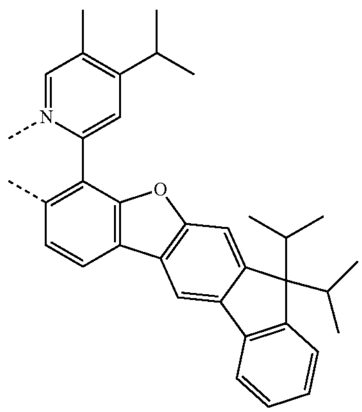
$L_{A261}$
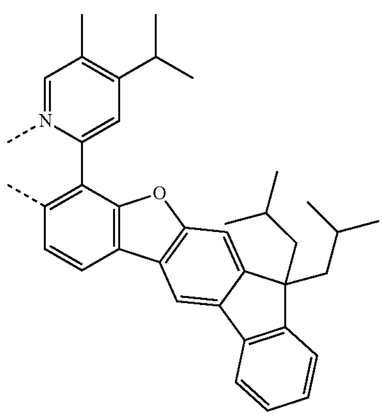
$L_{A262}$
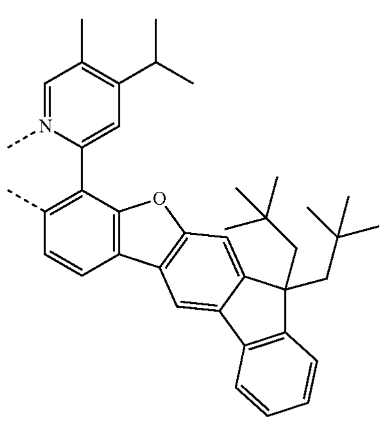
-continued
$L_{A263}$
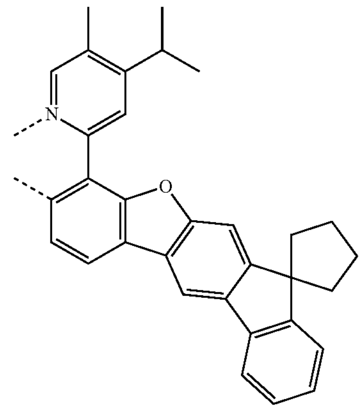
$L_{A264}$
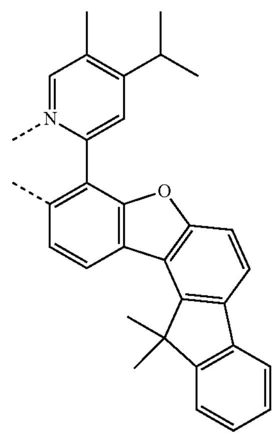
$L_{A265}$
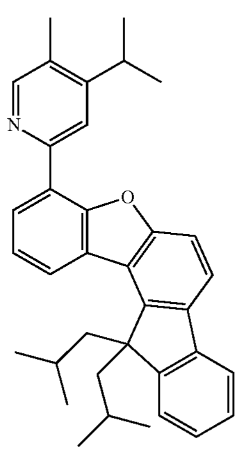

$L_{A266}$
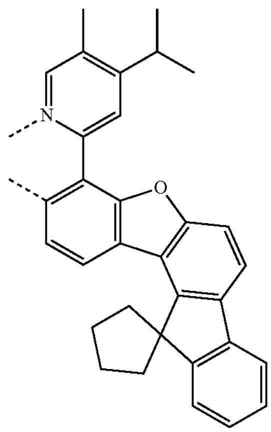
$L_{A267}$
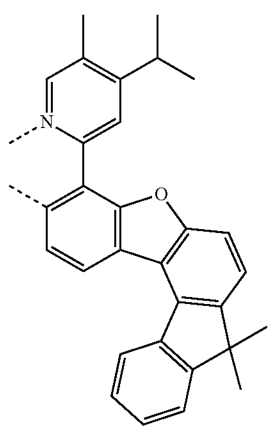
$L_{A268}$
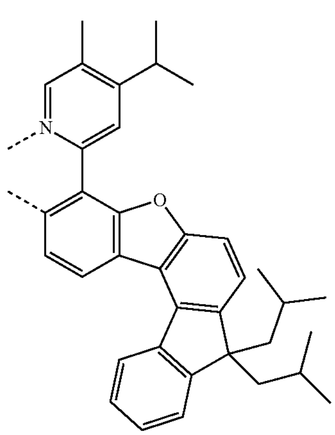
$L_{A269}$
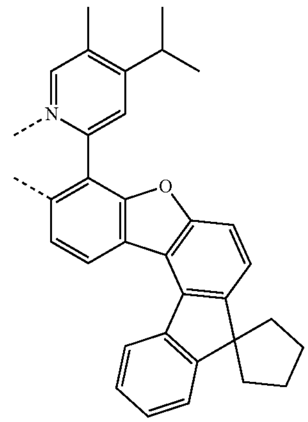
$L_{A276}$
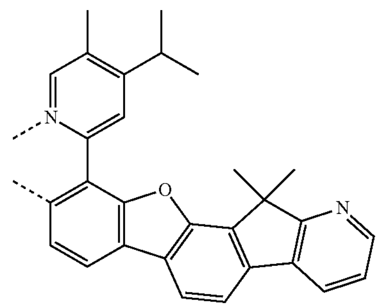
$L_{A277}$
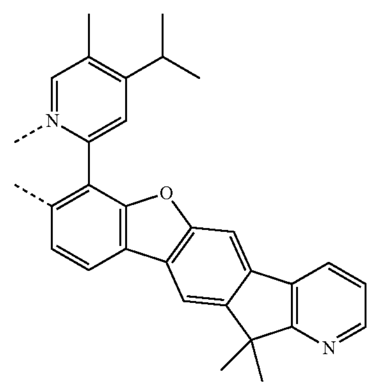
$L_{A278}$
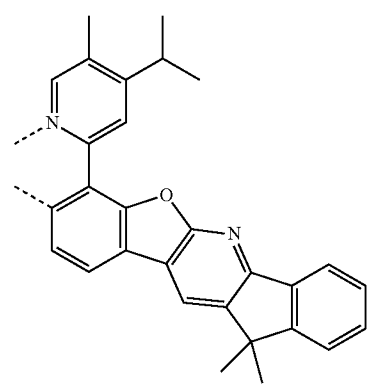

-continued
$L_{A279}$
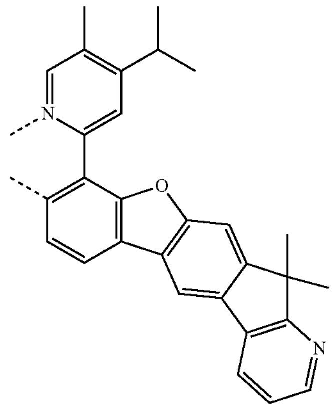
$L_{A280}$
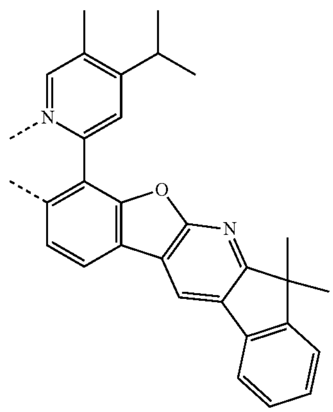
$L_{A281}$
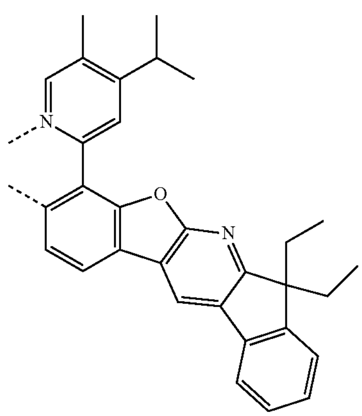
$L_{A282}$
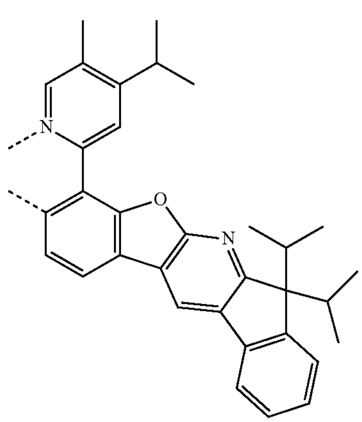
-continued
$L_{A283}$
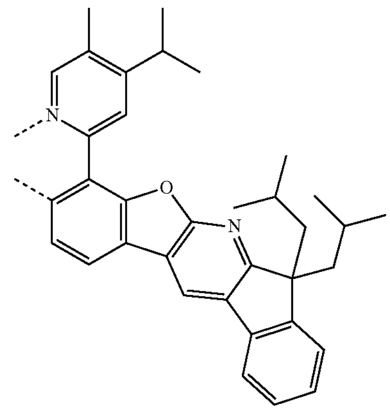
$L_{A284}$
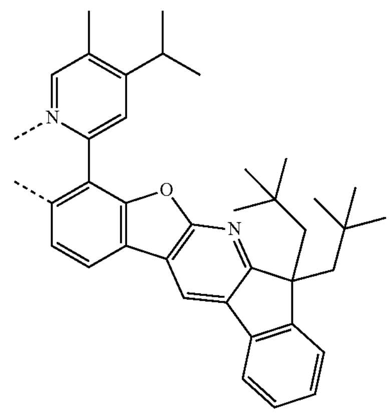
$L_{A285}$
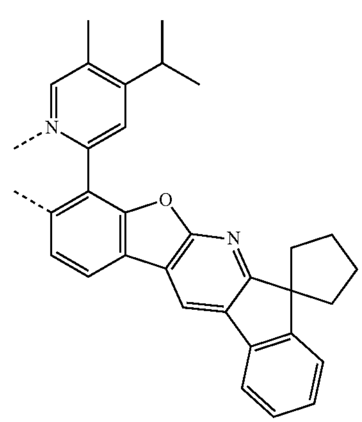

$L_{A286}$
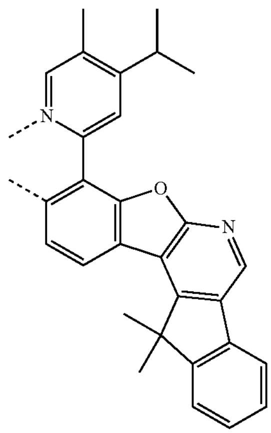
$L_{A291}$
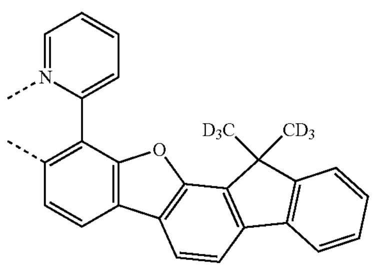
$L_{A292}$
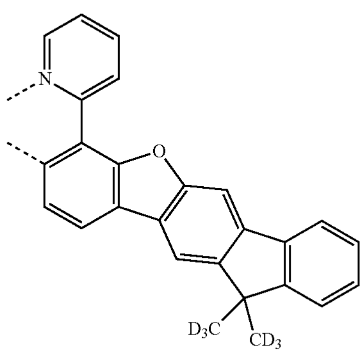
$L_{A293}$
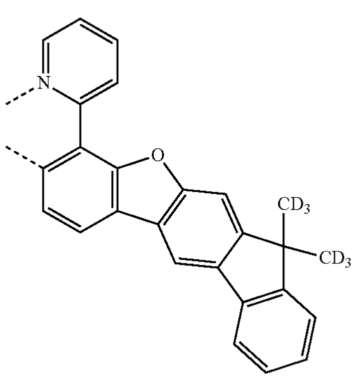
$L_{A294}$
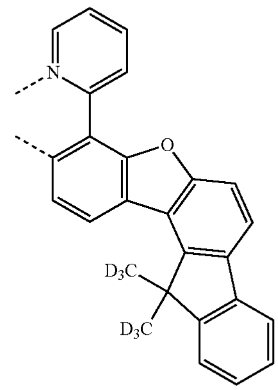
$L_{A295}$
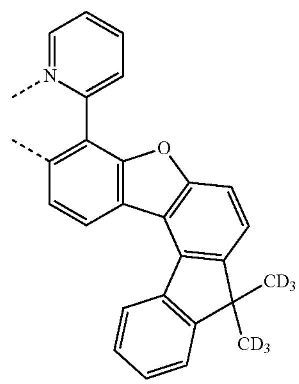
$L_{A302}$
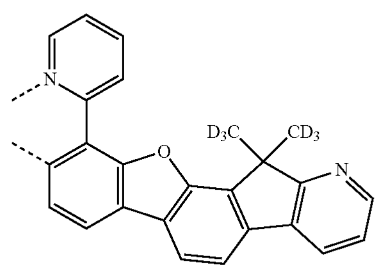
$L_{A303}$
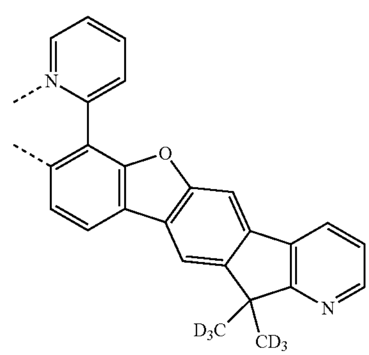

-continued
$L_{A304}$
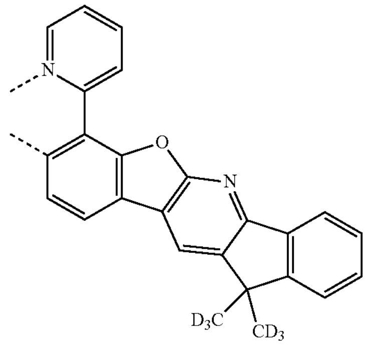
$L_{A305}$
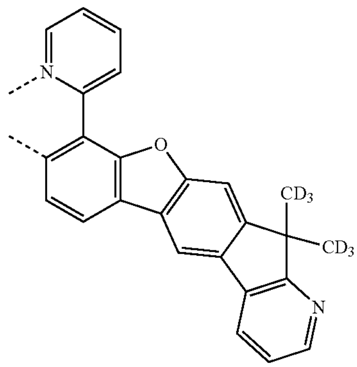
$L_{A306}$
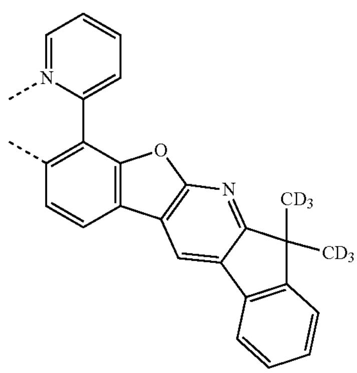
$L_{A307}$
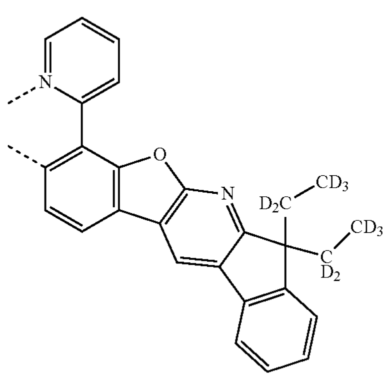
-continued
$L_{A308}$
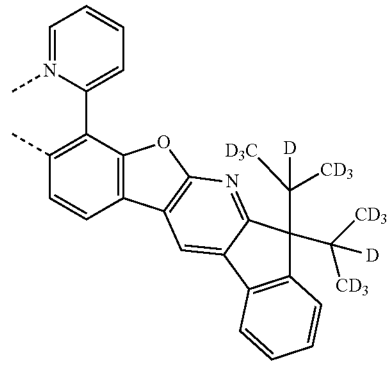
$L_{A309}$
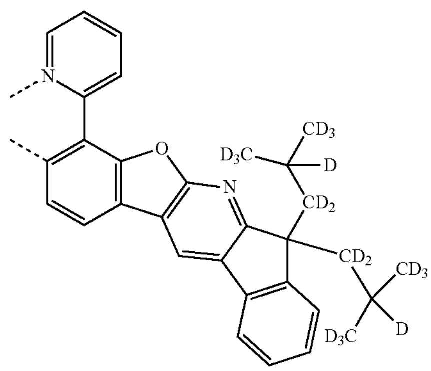
$L_{A310}$
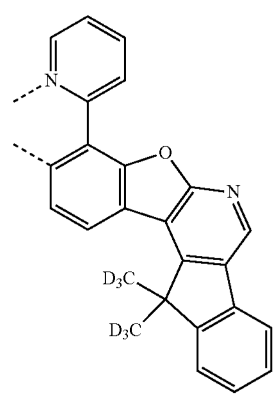
$L_{A315}$
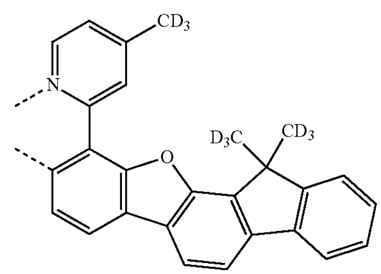

-continued
$L_{A316}$
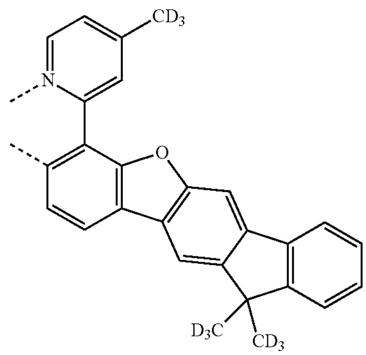
$L_{A317}$
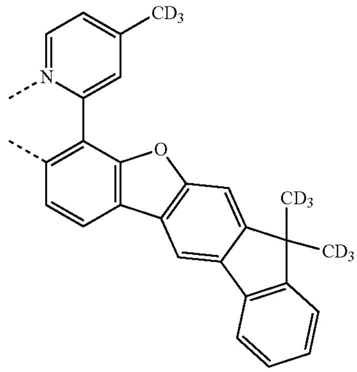
$L_{A318}$
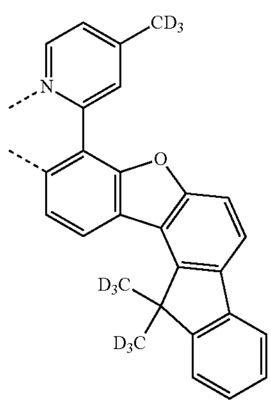
$L_{A319}$
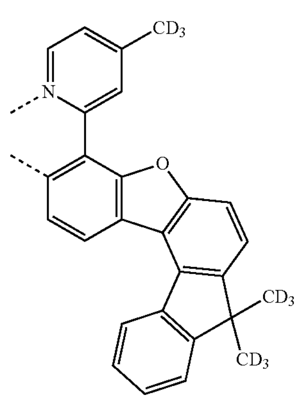
-continued
$L_{A326}$
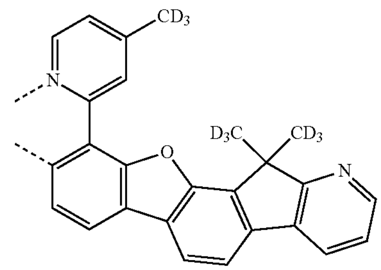
$L_{A327}$
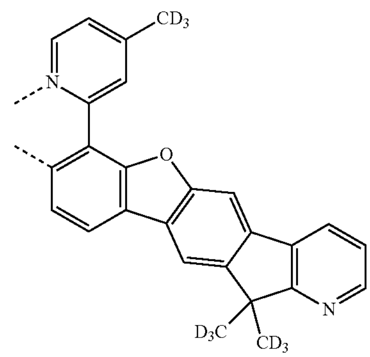
$L_{A328}$
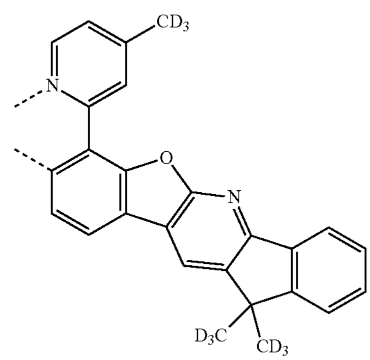
$L_{A329}$
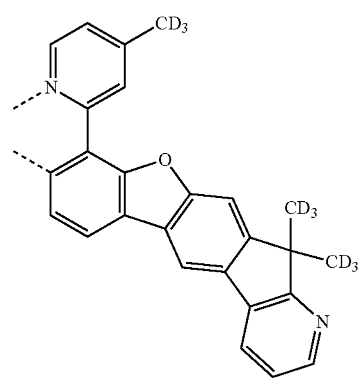

$L_{A330}$
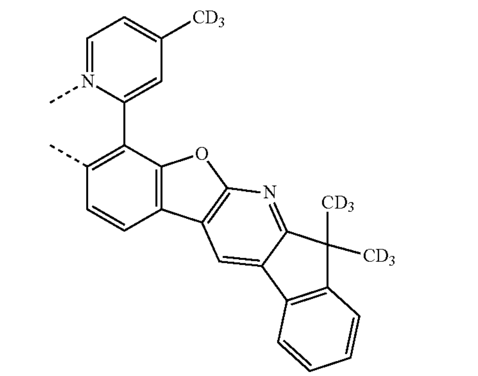
$L_{A331}$
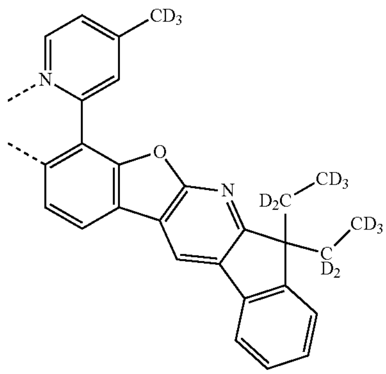
$L_{A332}$
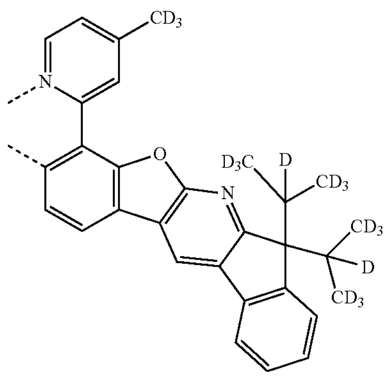
$L_{A333}$
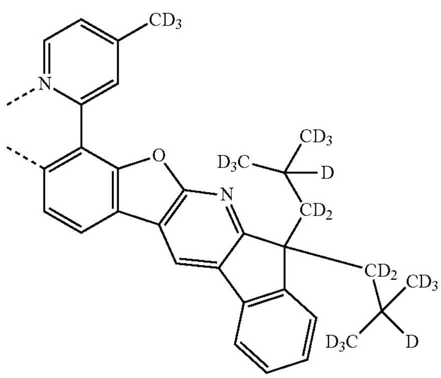
$L_{A334}$
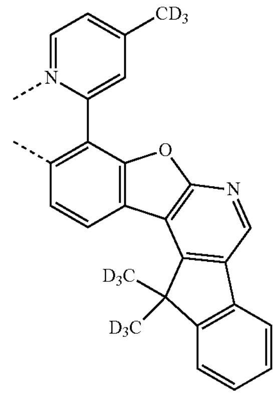
$L_{A339}$
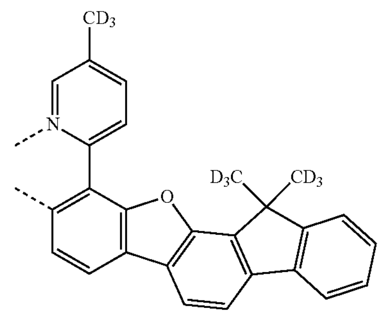
$L_{A340}$
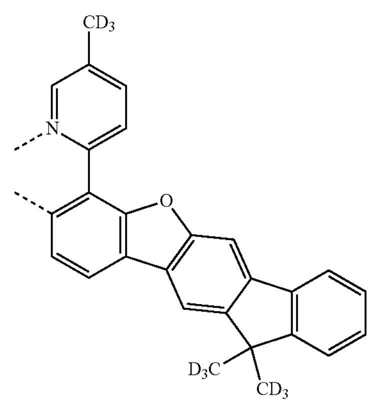
$L_{A341}$
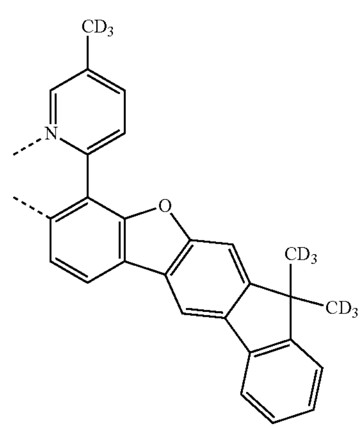

-continued
$L_{A342}$
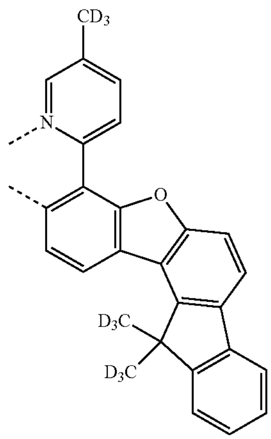
$L_{A343}$
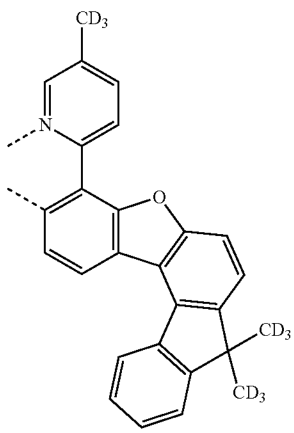
$L_{A350}$
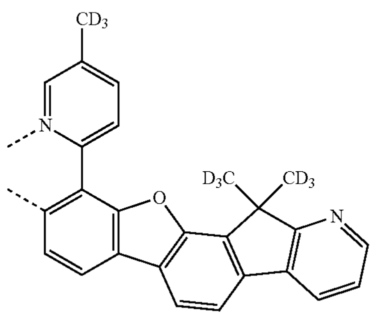
$L_{A351}$
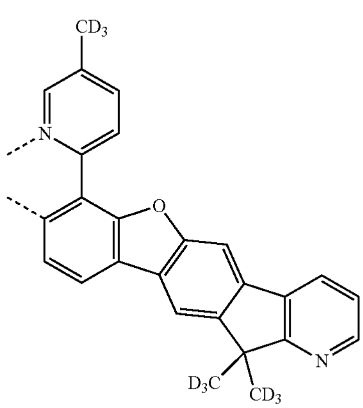
-continued
$L_{A352}$
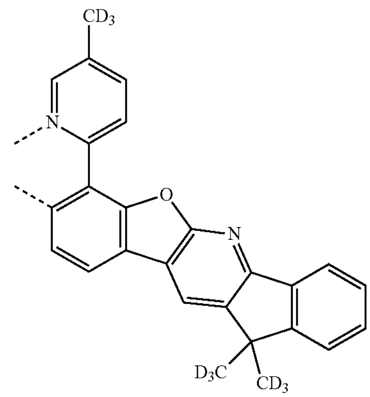
$L_{A353}$
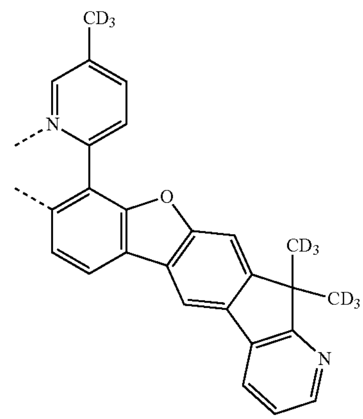
$L_{A354}$
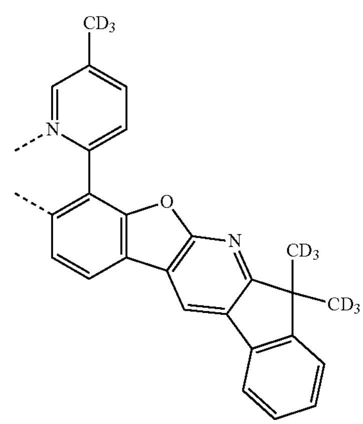
$L_{A355}$
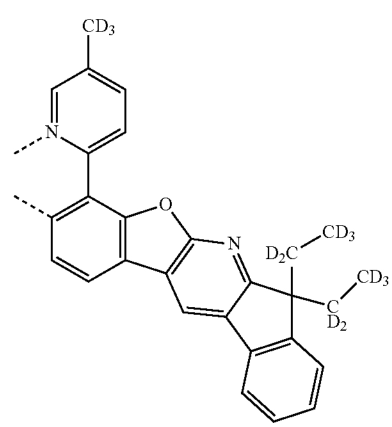

-continued
$L_{A356}$
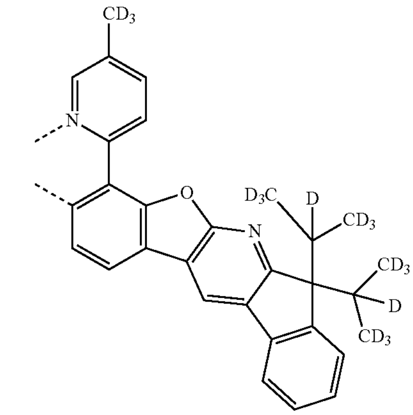
$L_{A357}$
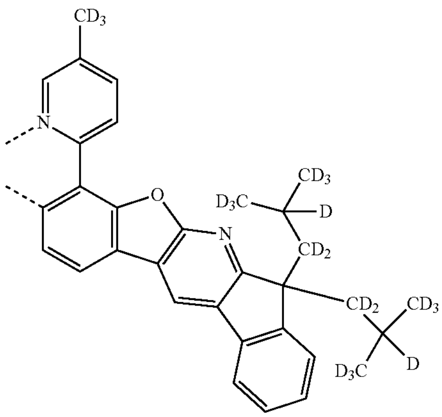
$L_{A358}$
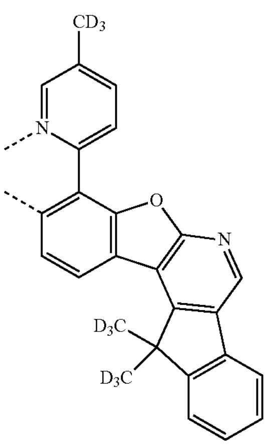
$L_{A359}$
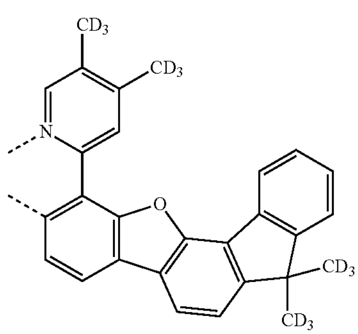
-continued
$L_{A363}$
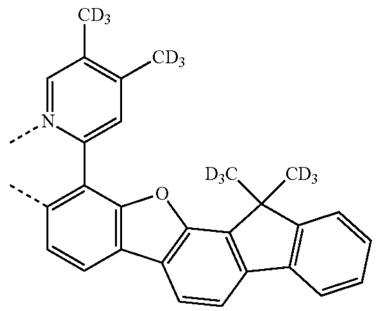
$L_{A364}$
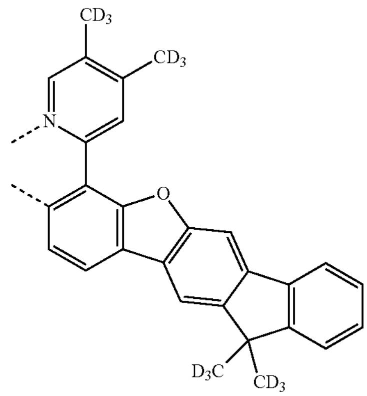
$L_{A365}$
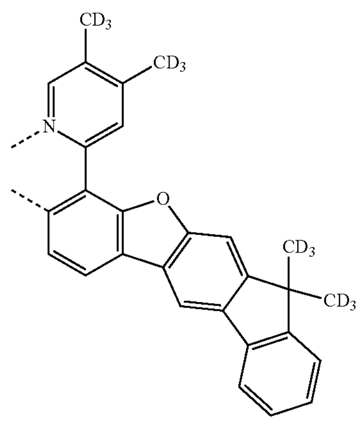
$L_{A366}$
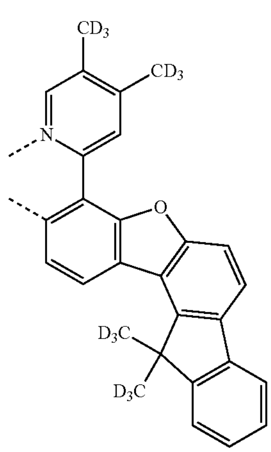

-continued
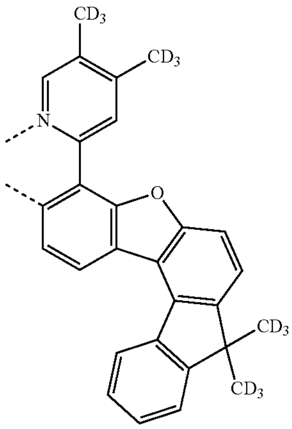
$L_{A367}$
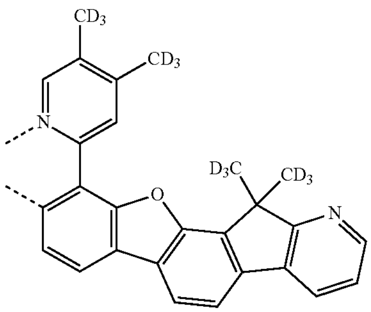
$L_{A374}$
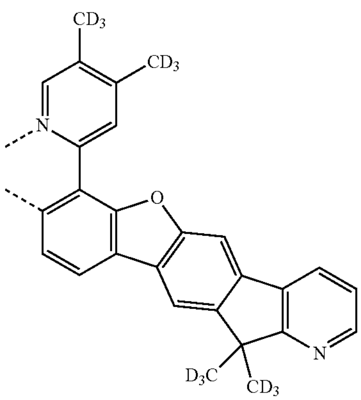
$L_{A375}$
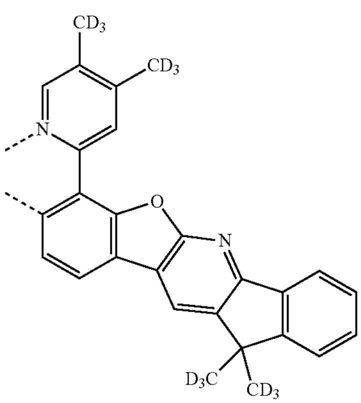
$L_{A376}$
-continued
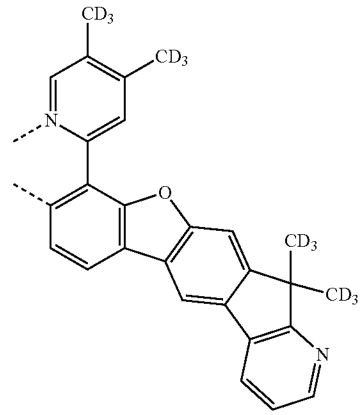
$L_{A377}$
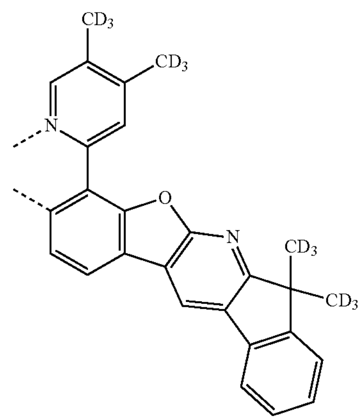
$L_{A378}$
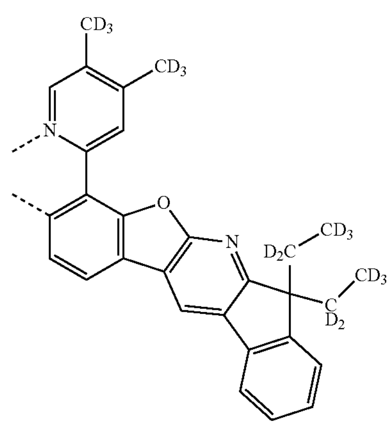
$L_{A379}$ -continued
L$_{A380}$
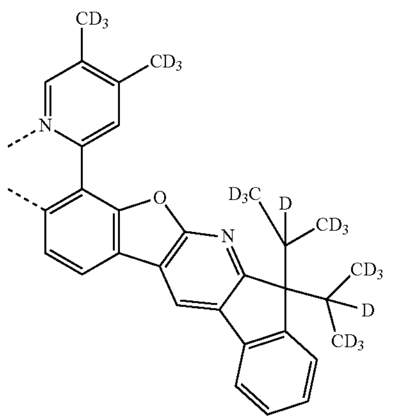
L$_{A381}$
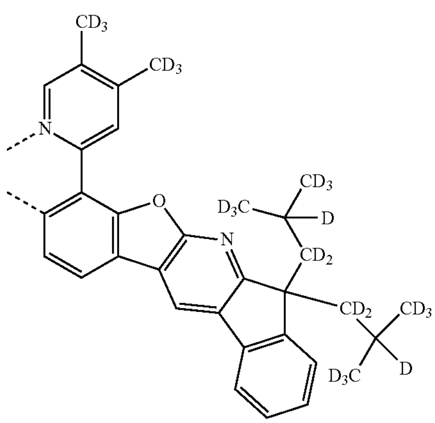
L$_{A382}$
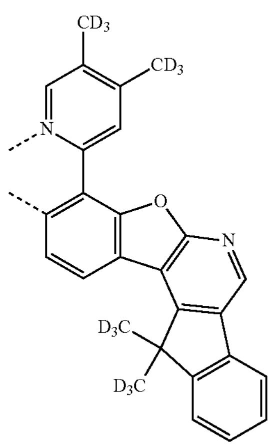
L$_{A387}$
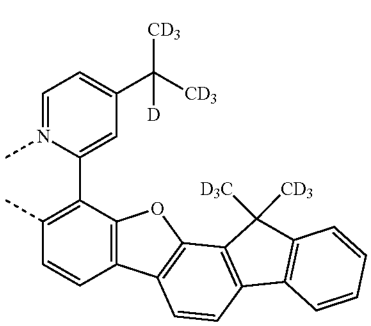
-continued
L$_{A388}$
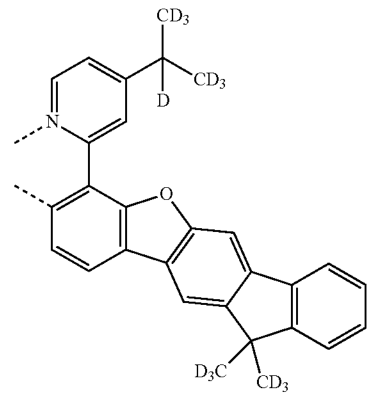
L$_{A389}$
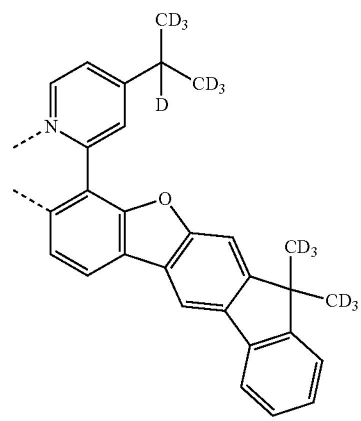
L$_{A390}$
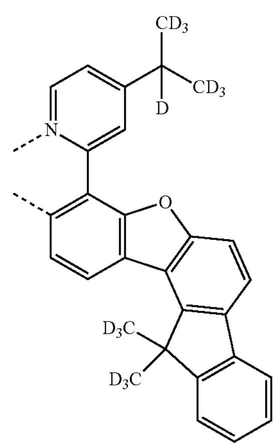

$L_{A391}$
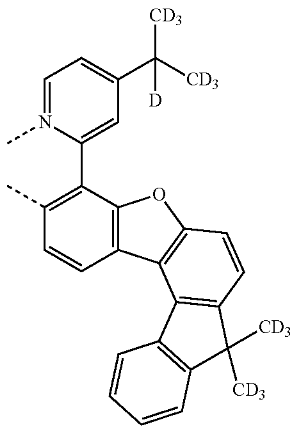
$L_{A398}$
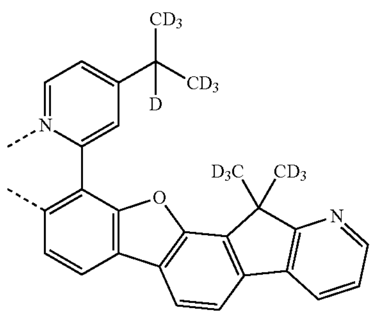
$L_{A399}$
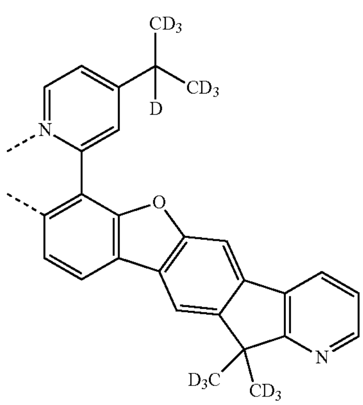
$L_{A400}$
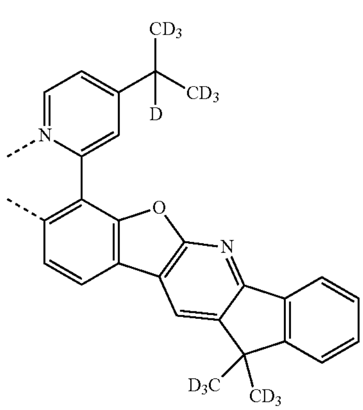
$L_{A401}$
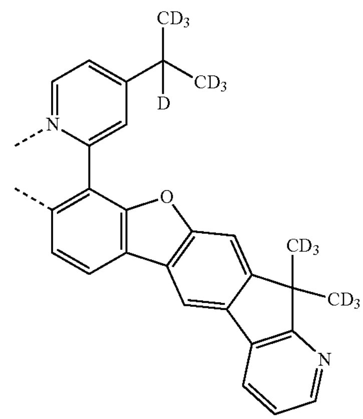
$L_{A402}$
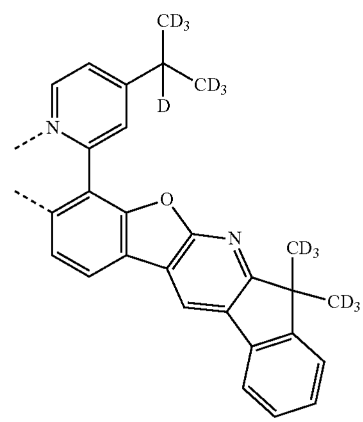
$L_{A403}$
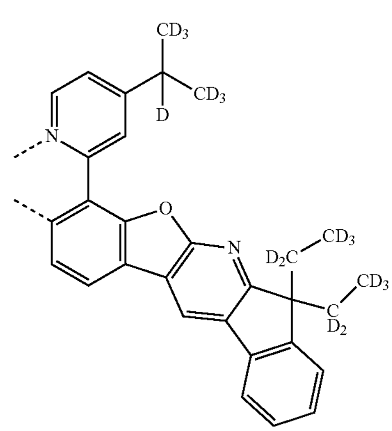

-continued
L$_{A404}$
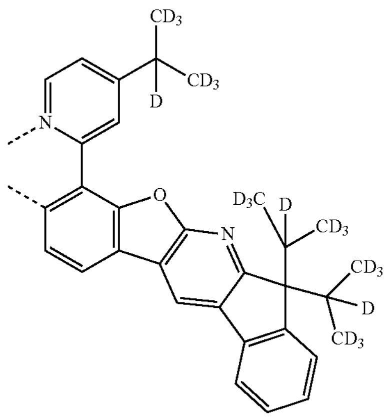
L$_{A405}$
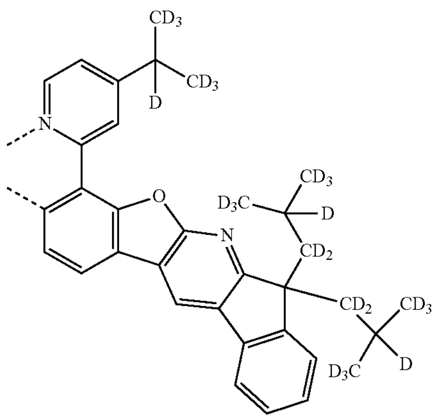
L$_{A406}$
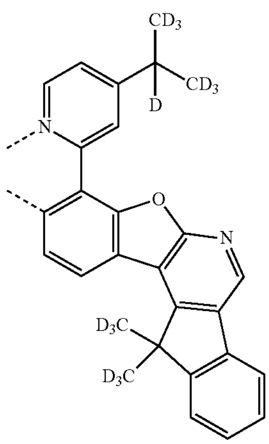
L$_{A411}$
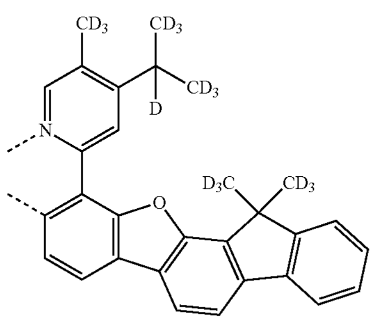
-continued
L$_{A412}$
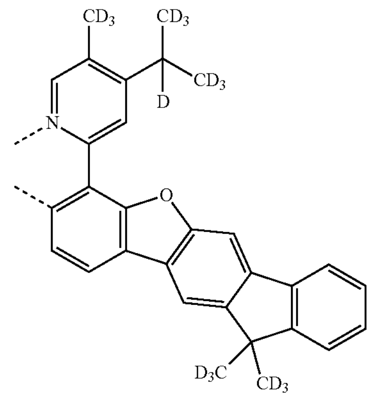
L$_{A413}$
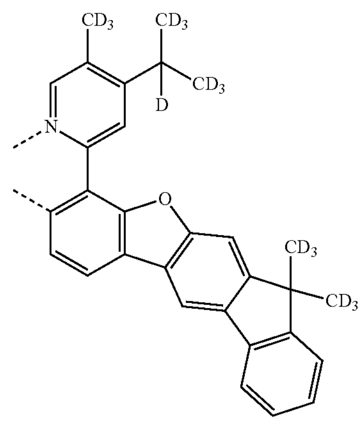
L$_{A414}$
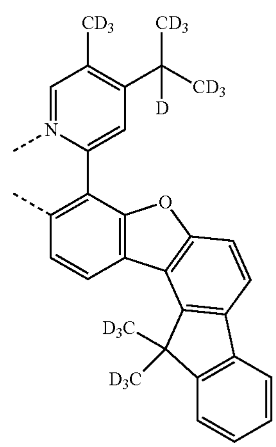

-continued
$L_{A415}$
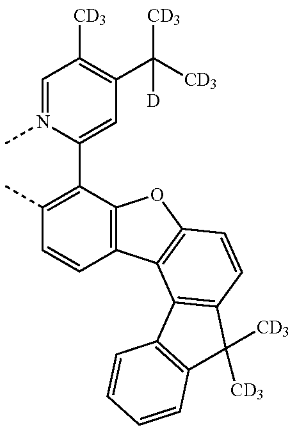
$L_{A422}$
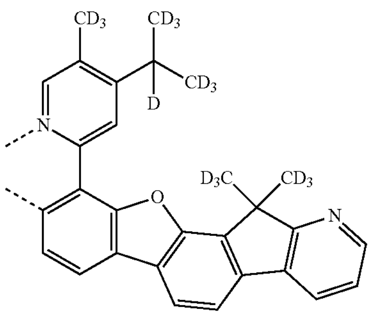
$L_{A423}$
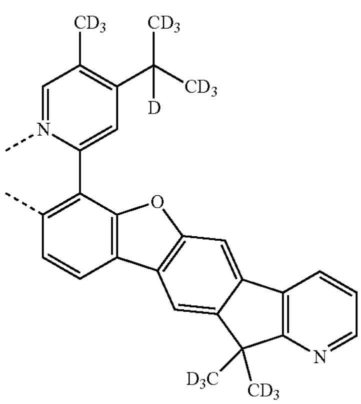
$L_{A424}$
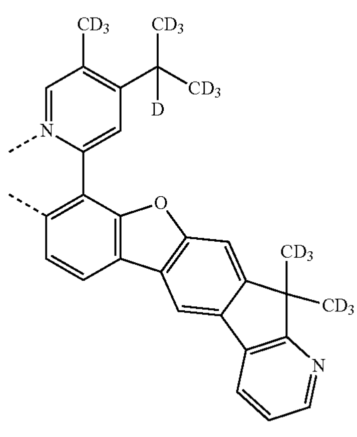
-continued
$L_{A425}$
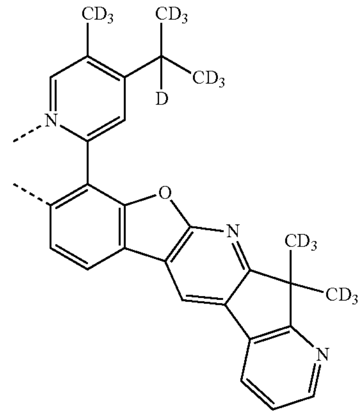
$L_{A426}$
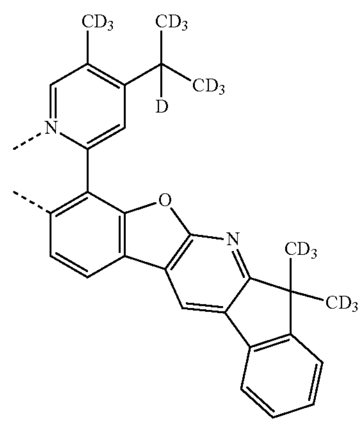
$L_{A427}$
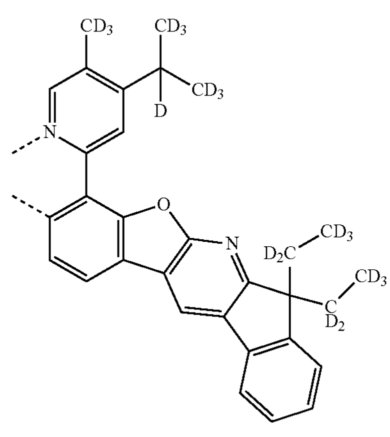

-continued
$L_{A428}$
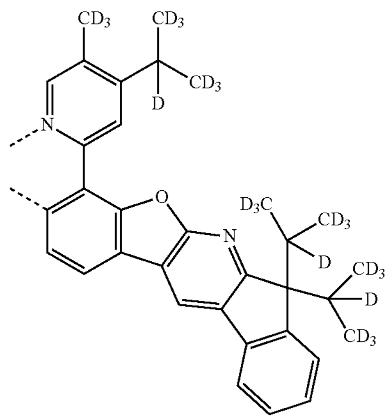
$L_{A429}$
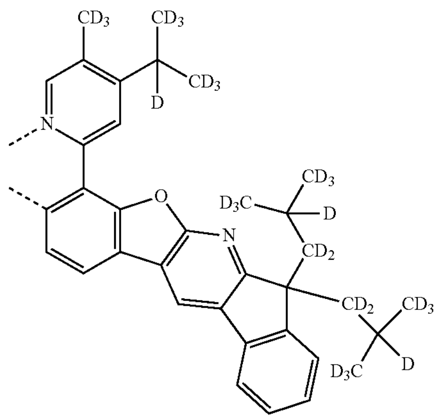
$L_{A430}$
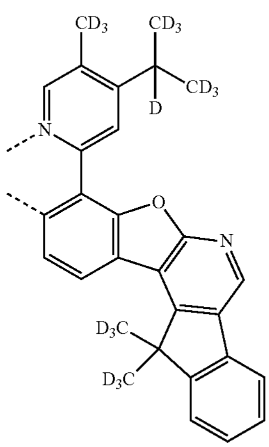
$L_{A435}$
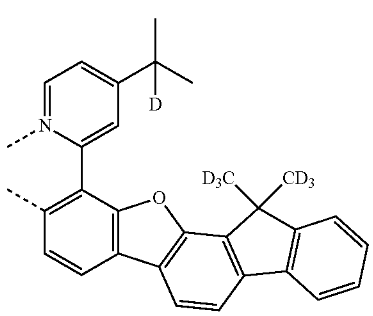
-continued
$L_{A436}$
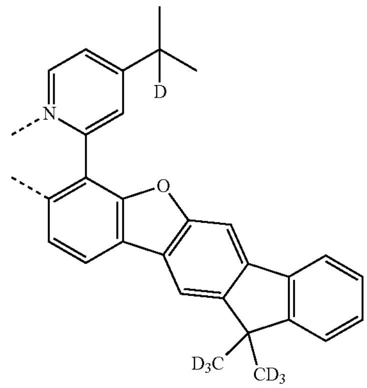
$L_{A437}$
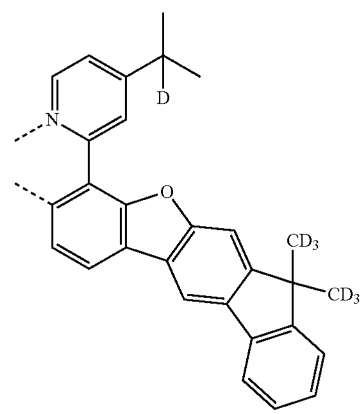
$L_{A438}$
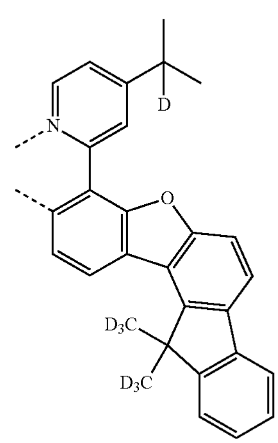

-continued
$L_{A439}$
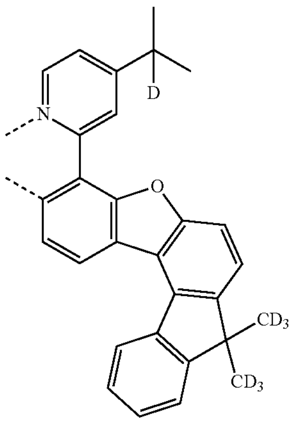
$L_{A447}$
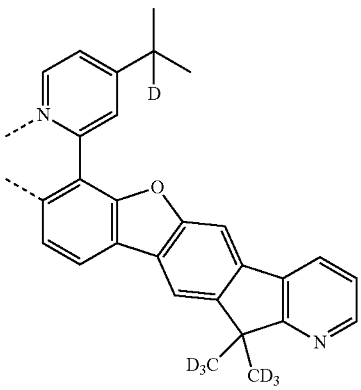
$L_{A448}$
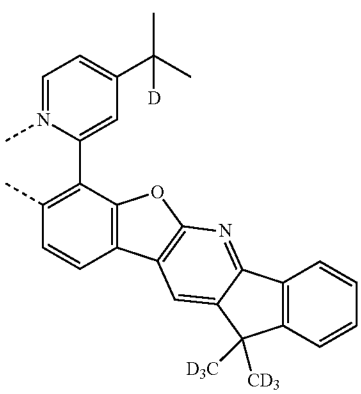
$L_{A449}$
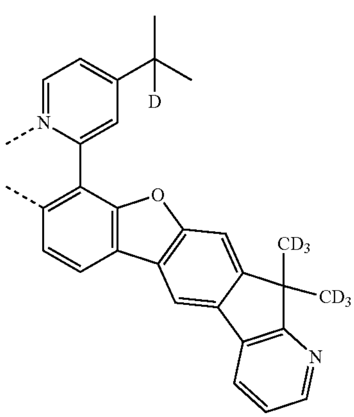
-continued
$L_{A450}$
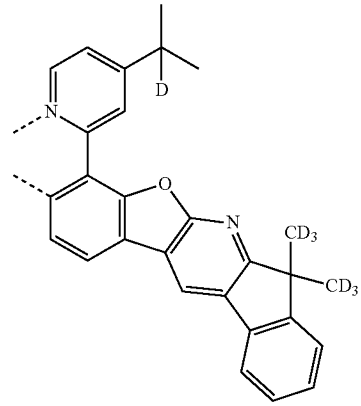
$L_{A451}$
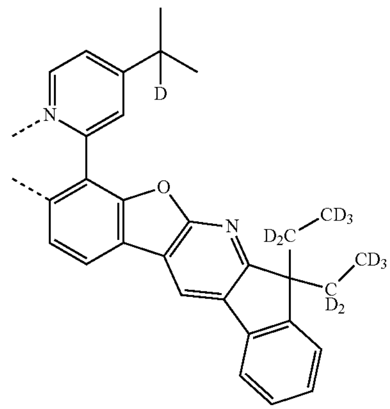
$L_{A452}$
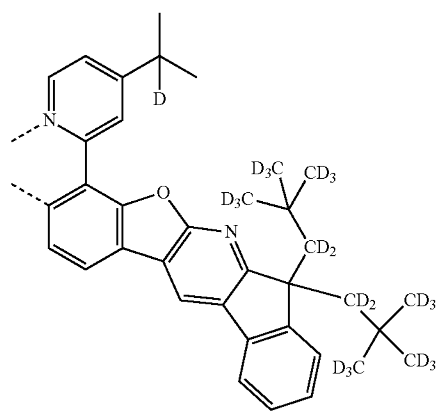
$L_{A453}$
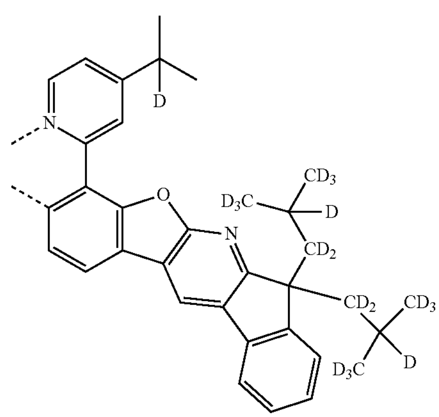

-continued
$L_{A454}$
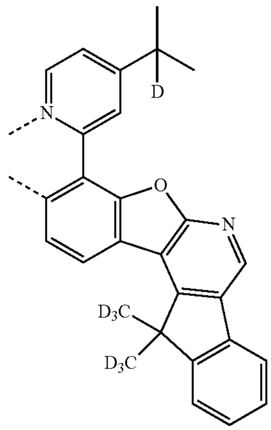
$L_{A459}$
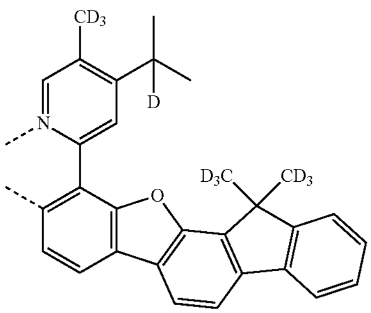
$L_{A460}$
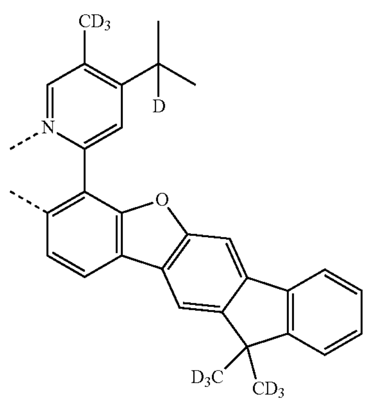
$L_{A461}$
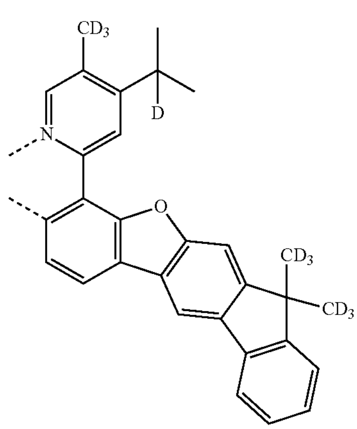
-continued
$L_{A462}$
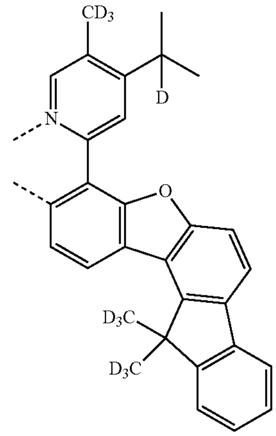
$L_{A463}$
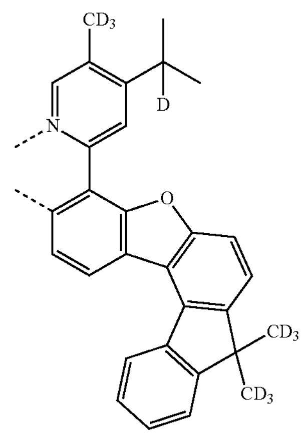
$L_{A470}$
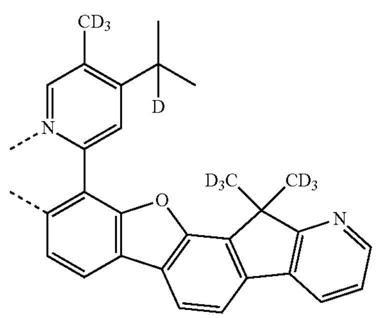
$L_{A471}$
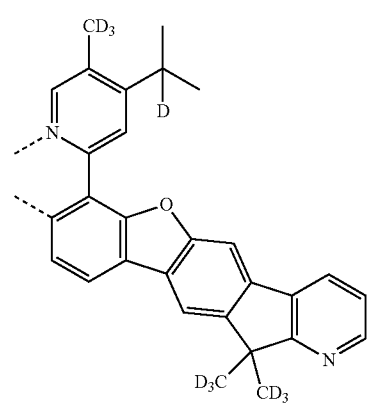

-continued
L_A472
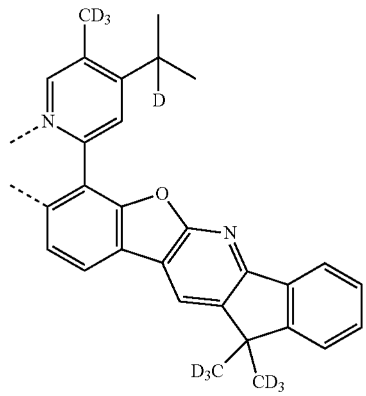
L_A473
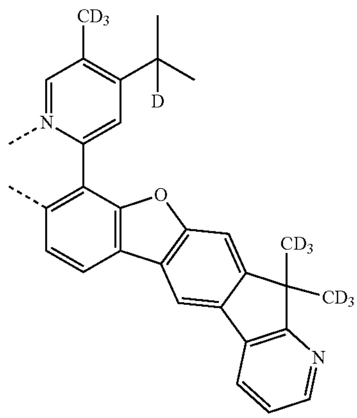
L_A474
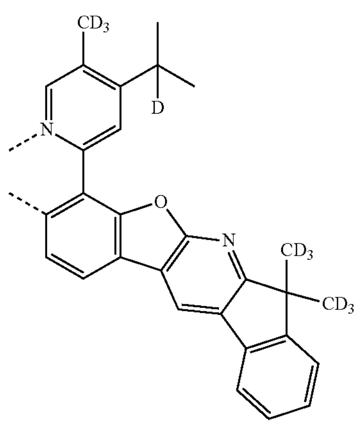
L_A475
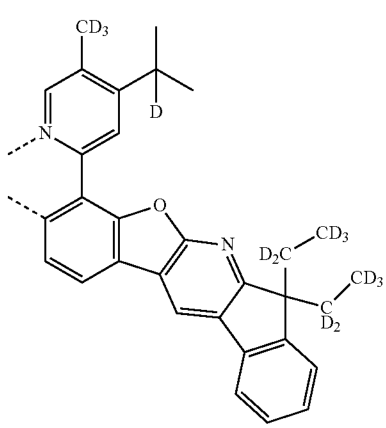
-continued
L_A476
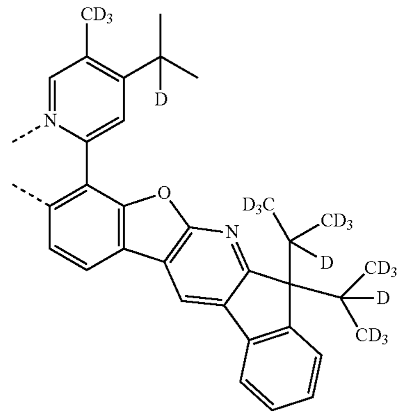
L_A477
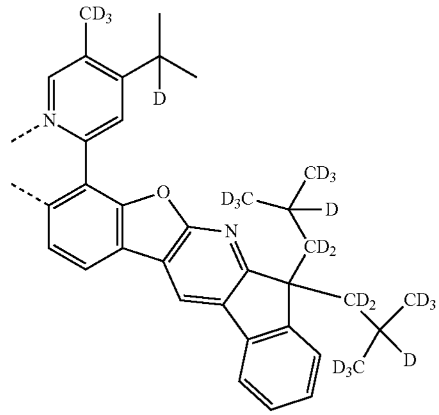
L_A478
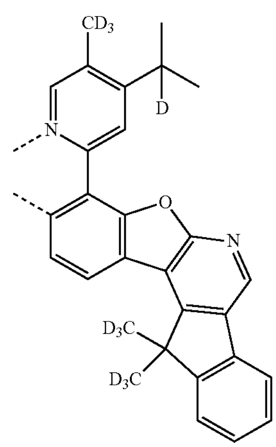
L_A483
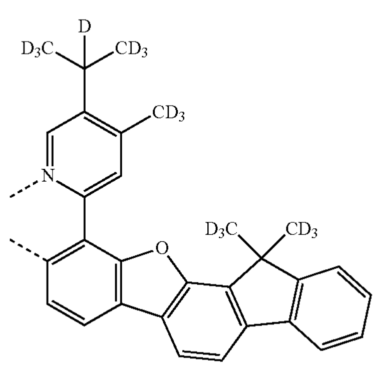

-continued
$L_{A484}$
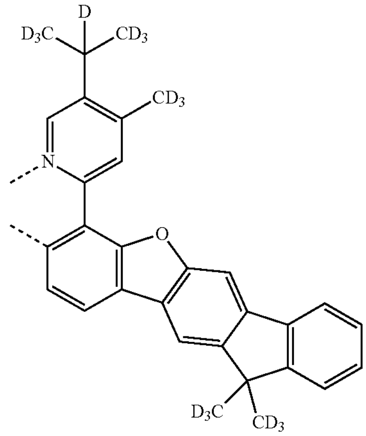
$L_{A485}$
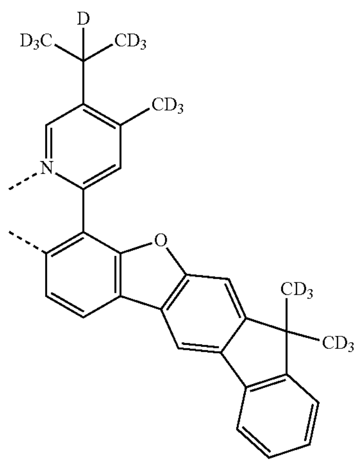
$L_{A486}$
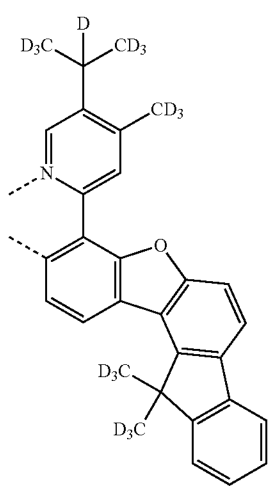
-continued
$L_{A487}$
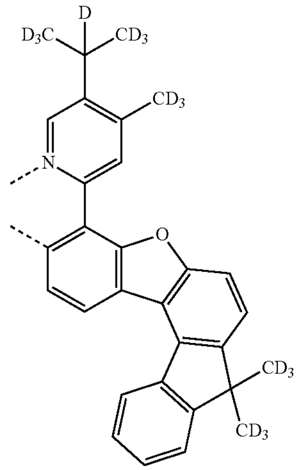
$L_{A494}$
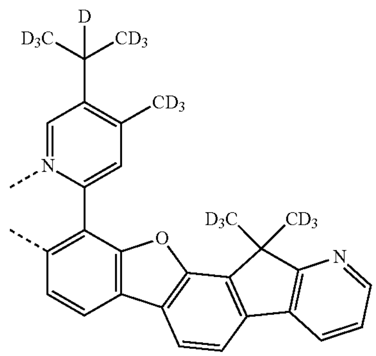
$L_{A495}$
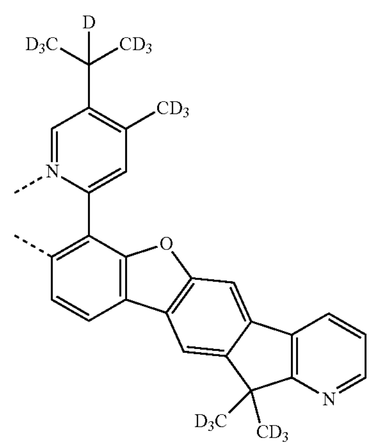

-continued
$L_{A496}$
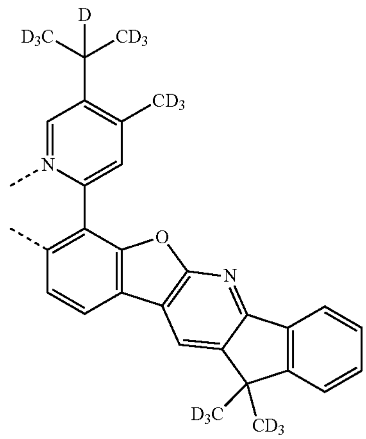
$L_{A497}$
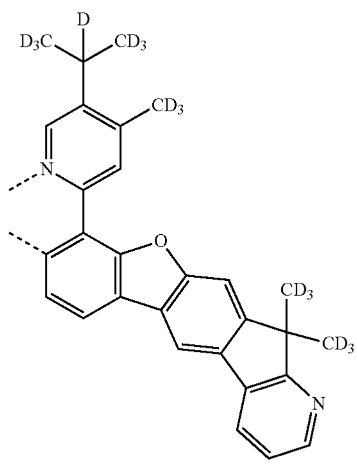
$L_{A498}$
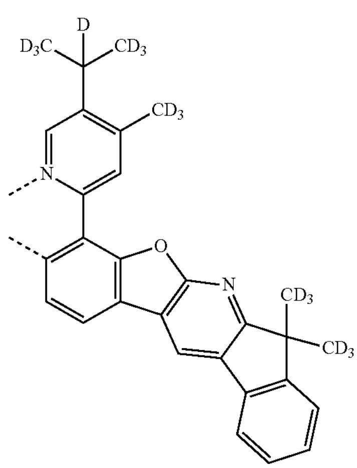
-continued
$L_{A499}$
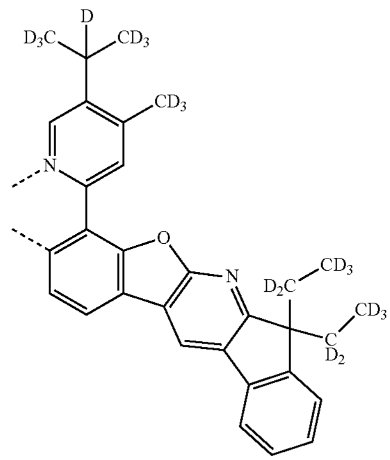
$L_{A500}$
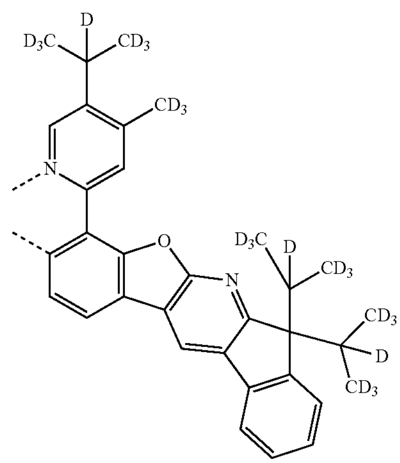
$L_{A501}$
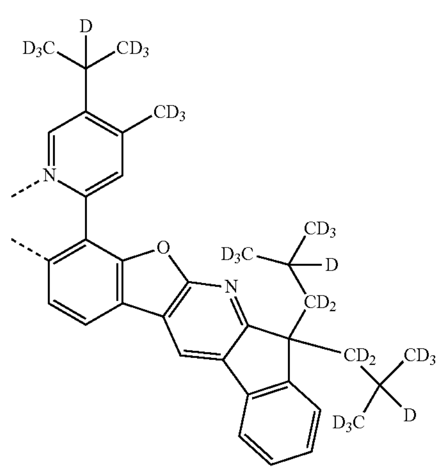

-continued $L_{A502}$

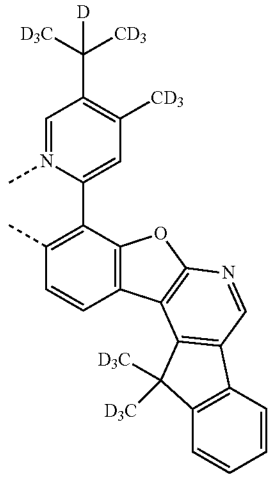

$L_{A503}$

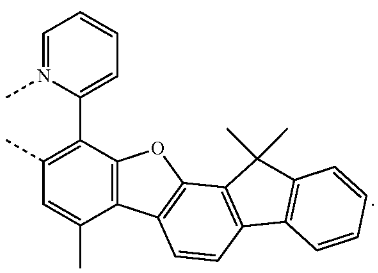

.

10. The compound of claim 1, wherein the compound has the formula $(L_A)Ir(L_B)_2$, wherein $L_B$ has the following formula:

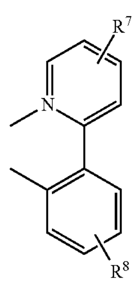

wherein $R^7$ and $R^8$ each independently represent mno, di, tri, or tetra substitutions, or no substitution;

wherein $R^7$ and $R^8$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two adjacent $R^7$ and $R^8$ are optionally joined to form a ring, which can be further substituted.

11. The compound of claim 10, wherein $L_B$ is selected from the group consisting of:

$L_{B1}$

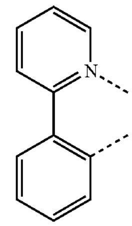

, $L_{B2}$

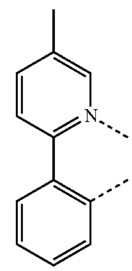

, $L_{B3}$

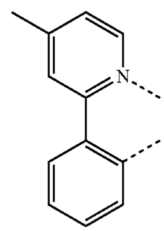

, $L_{B4}$

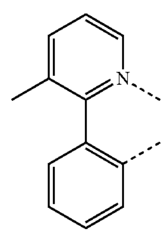

, $L_{B5}$

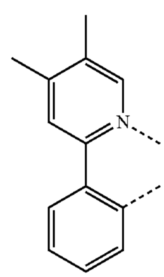

, $L_{B6}$

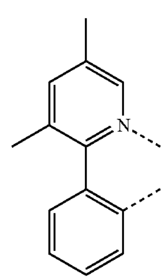

,

-continued
$L_{B7}$
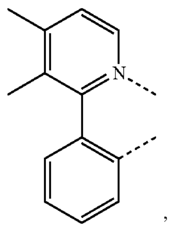
$L_{B8}$
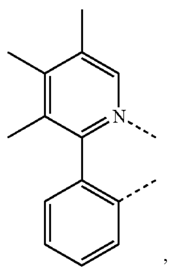
$L_{B9}$
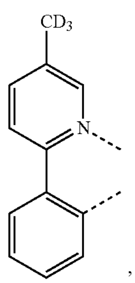
$L_{B10}$
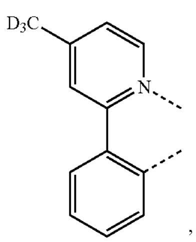
$L_{B11}$
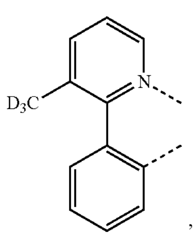
$L_{B12}$
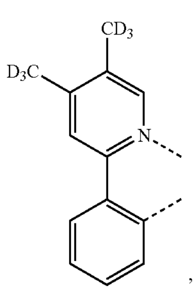
-continued
$L_{B13}$
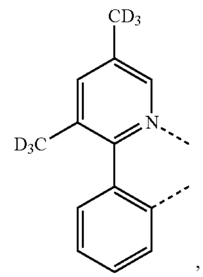
$L_{B14}$
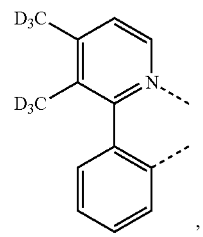
$L_{B15}$
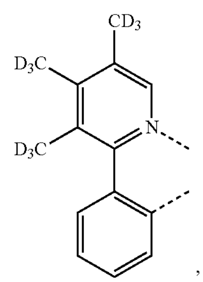
$L_{B16}$
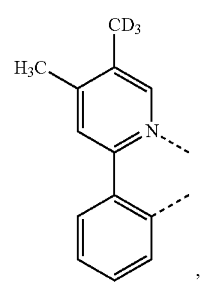
$L_{B17}$
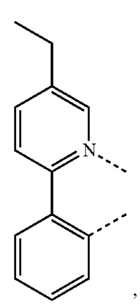

-continued
$L_{B18}$
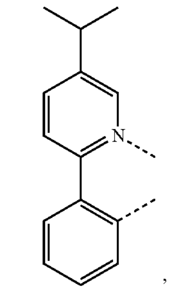
$L_{B19}$
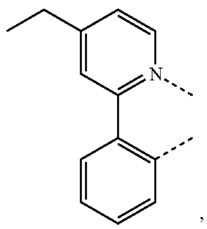
$L_{B20}$
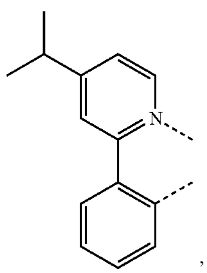
$L_{B21}$
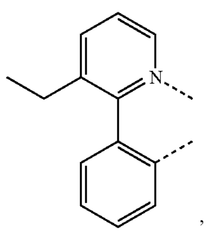
$L_{B22}$
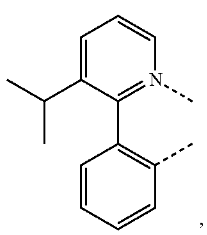
$L_{B23}$
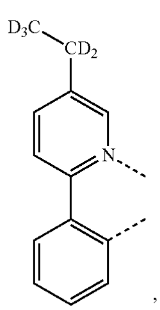
-continued
$L_{B24}$
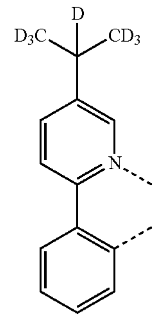
$L_{B25}$
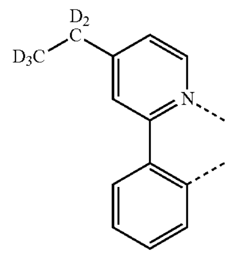
$L_{B26}$
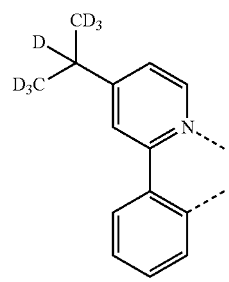
$L_{B27}$
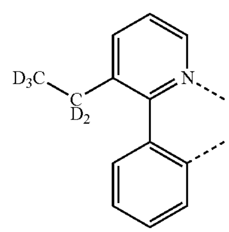
$L_{B28}$
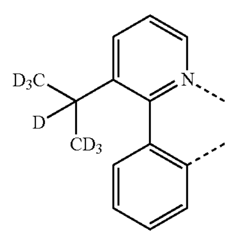
$L_{B29}$
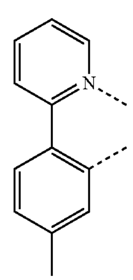

-continued
L$_{B30}$
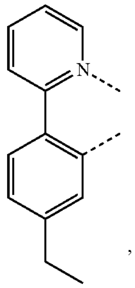
L$_{B31}$
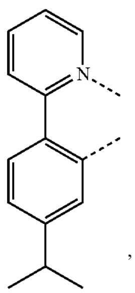
L$_{B32}$
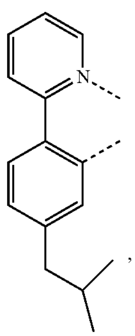
L$_{B33}$
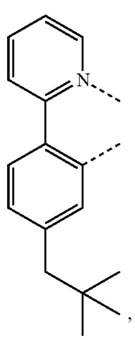
L$_{B34}$
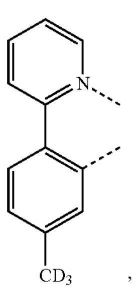
-continued
L$_{B35}$
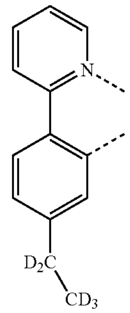
L$_{B36}$
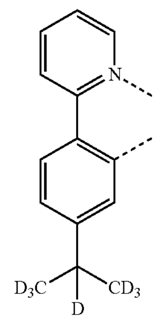
L$_{B37}$
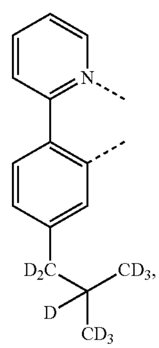
L$_{B38}$
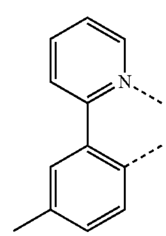
L$_{B39}$
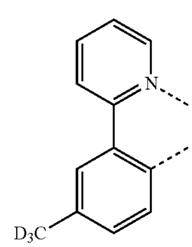

$L_{B40}$
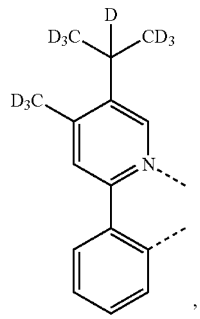
$L_{B41}$
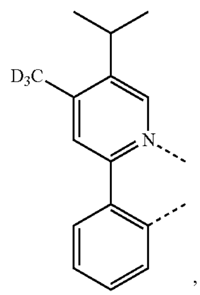
$L_{B42}$
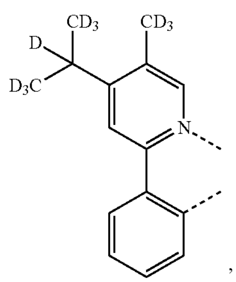
$L_{B43}$
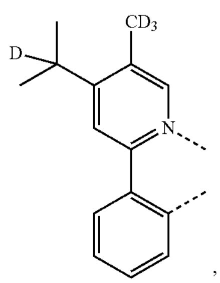
$L_{B44}$
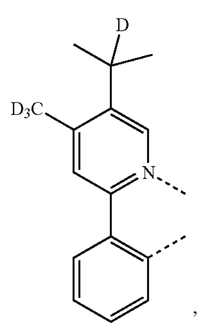
$L_{B45}$
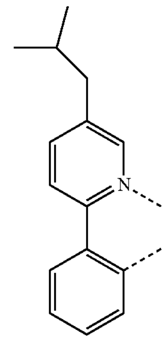
$L_{B46}$
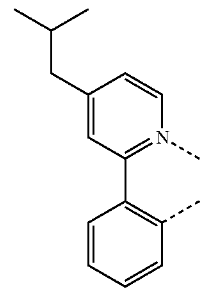
$L_{B47}$
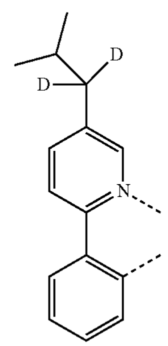
$L_{B48}$
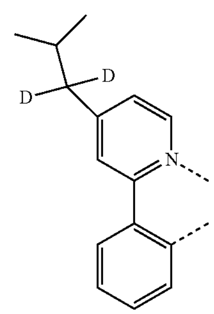
$L_{B49}$
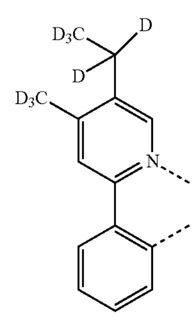

-continued
$L_{B50}$
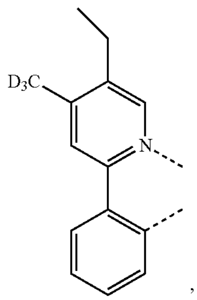
$L_{B51}$
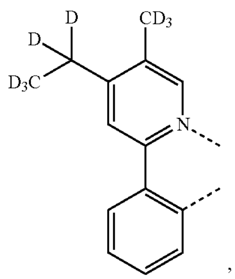
$L_{B52}$
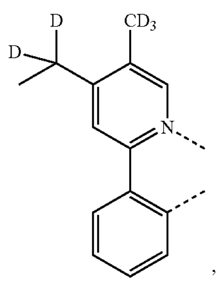
$L_{B53}$
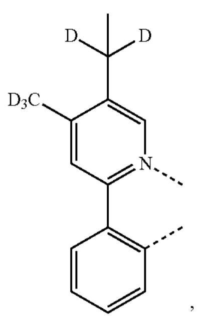
$L_{B54}$
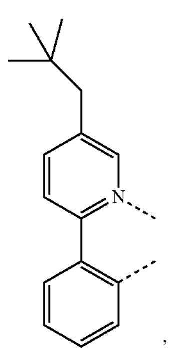
-continued
$L_{B55}$
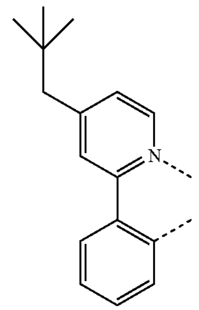
$L_{B56}$
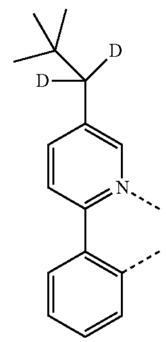
$L_{B57}$
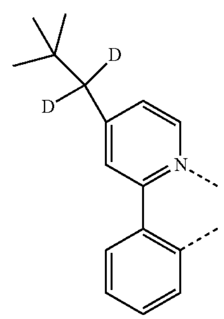
$L_{B58}$
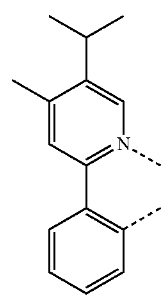
$L_{B59}$
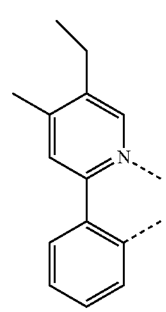

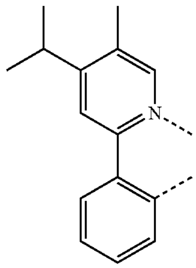
,
$L_{B60}$
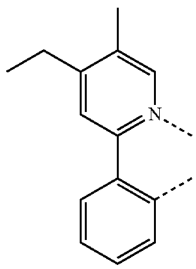
,
$L_{B61}$
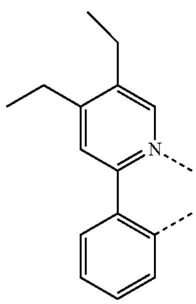
,
$L_{B62}$
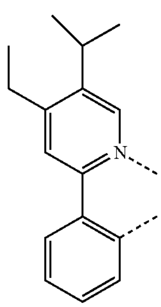
,
$L_{B63}$
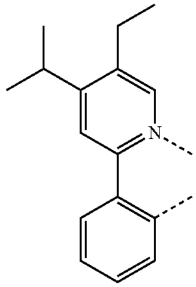
,
$L_{B64}$
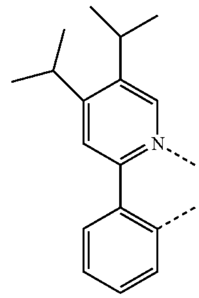
,
$L_{B65}$
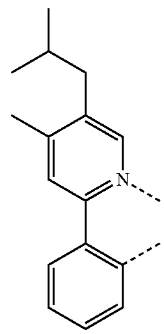
,
$L_{B66}$
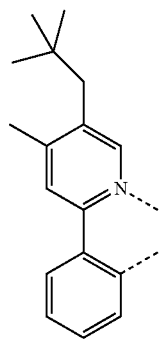
,
$L_{B67}$
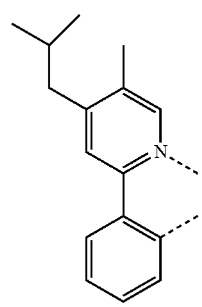
,
$L_{B68}$
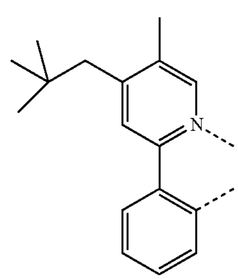
,
$L_{B69}$ $L_{B70}$
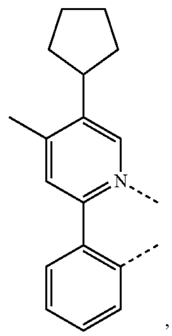
$L_{B71}$
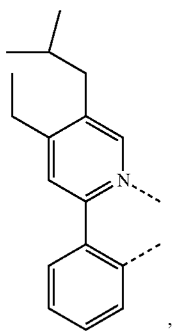
$L_{B72}$
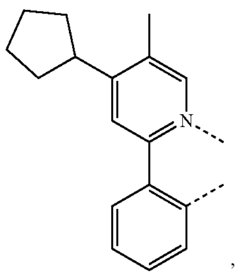
$L_{B73}$
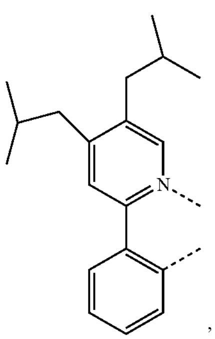
$L_{B74}$
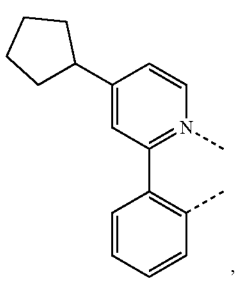
$L_{B75}$
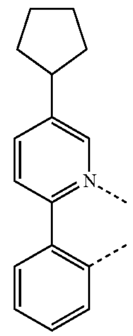
$L_{B76}$
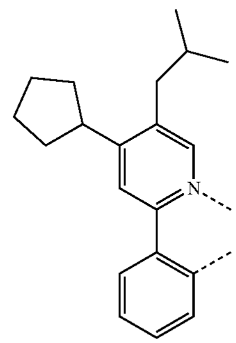
$L_{B77}$
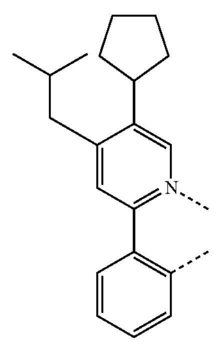
$L_{B78}$
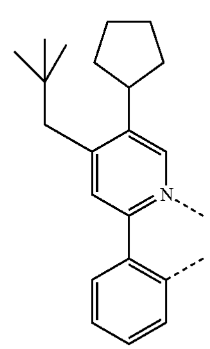

-continued
L$_{B79}$
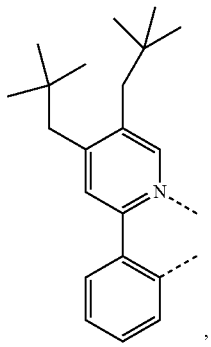
L$_{B80}$
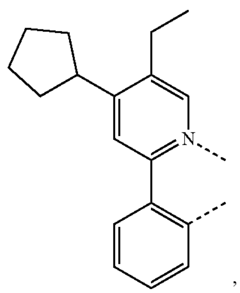
L$_{B81}$
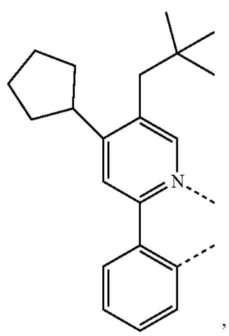
L$_{B82}$
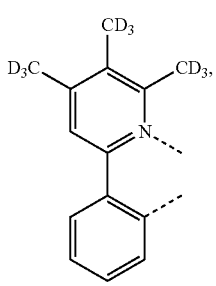
L$_{B83}$
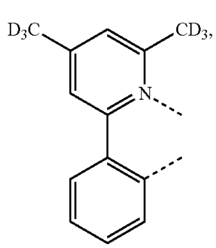
-continued
L$_{B84}$
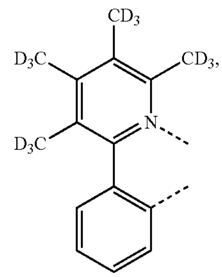
L$_{B85}$
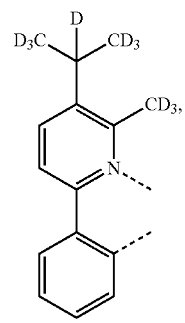
L$_{B86}$
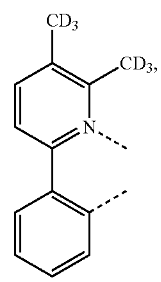
L$_{B87}$
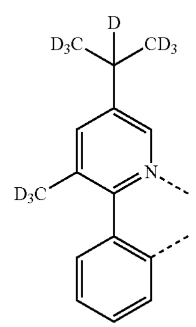
L$_{B88}$
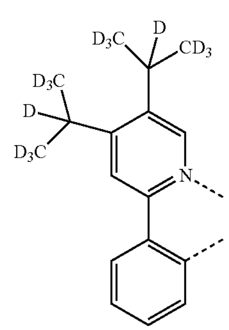

$L_{B89}$
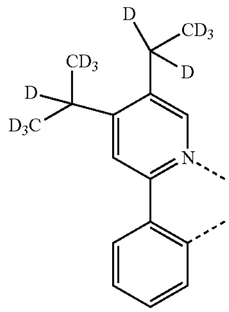
,
$L_{B90}$
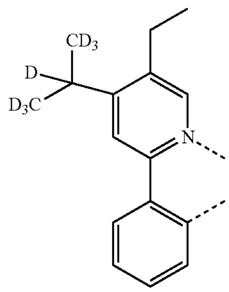
,
$L_{B91}$
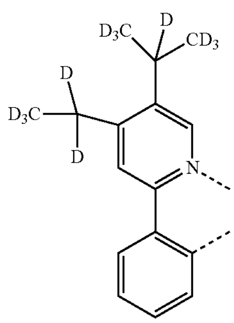
,
$L_{B92}$
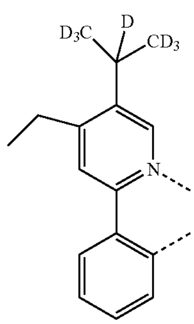
,
$L_{B93}$
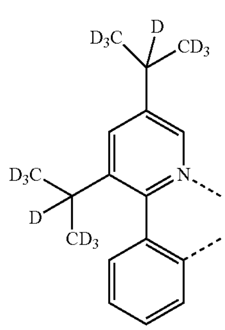
,
$L_{B94}$
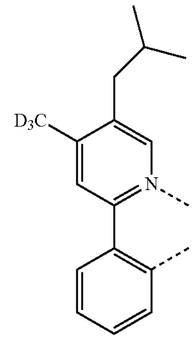
,
$L_{B95}$
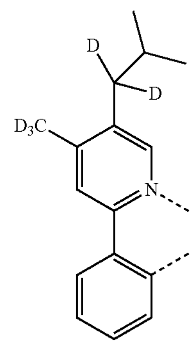
,
$L_{B96}$
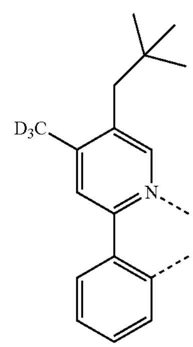
,
$L_{B97}$
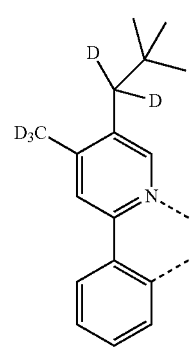
, -continued
$L_{B98}$
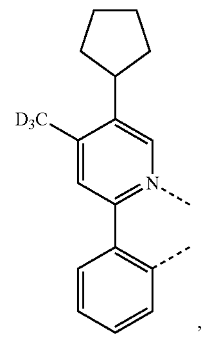
$L_{B99}$
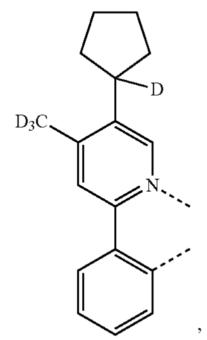
$L_{B100}$
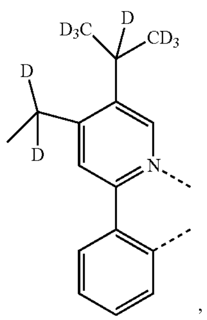
$L_{B101}$
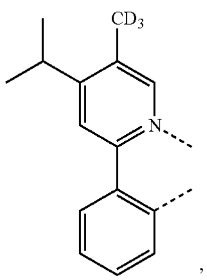
$L_{B102}$
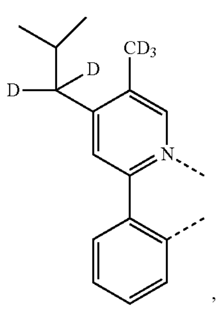
-continued
$L_{B103}$
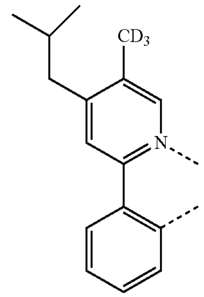
$L_{B104}$
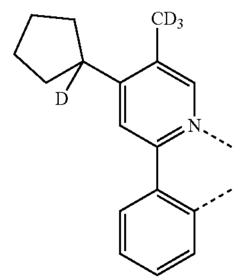
$L_{B105}$
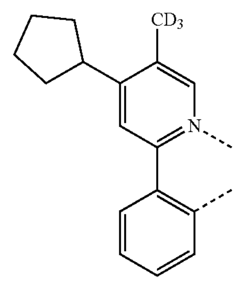
$L_{B106}$
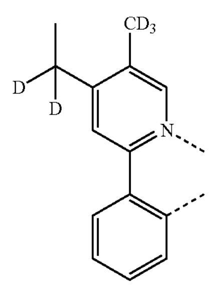
$L_{B107}$
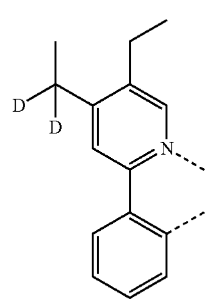

-continued
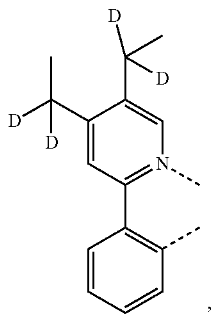
$L_{B108}$
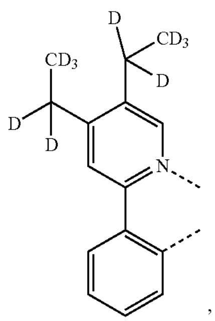
$L_{B109}$
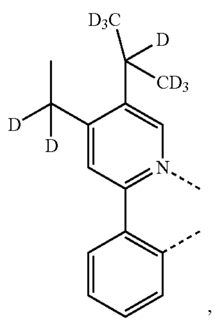
$L_{B110}$
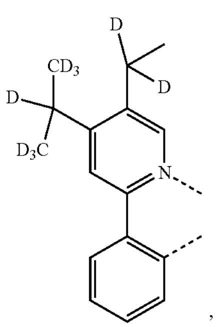
$L_{B111}$
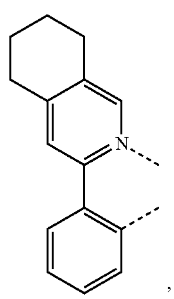
$L_{B112}$
-continued
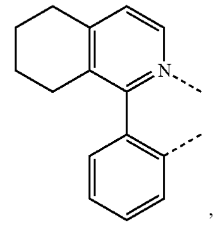
$L_{B113}$
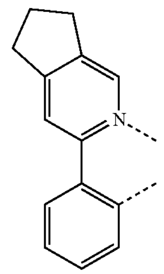
$L_{B114}$
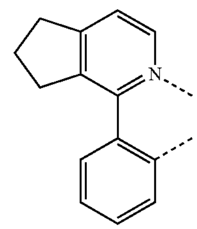
$L_{B115}$
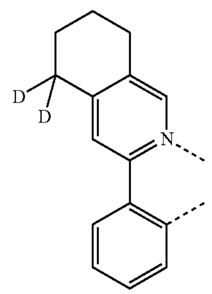
$L_{B116}$
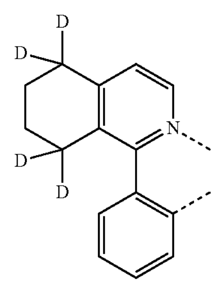
$L_{B117}$
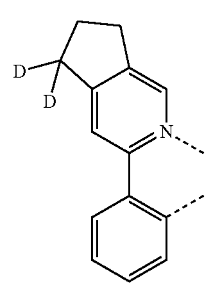
$L_{B118}$ -continued
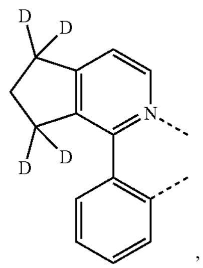
$L_{B119}$
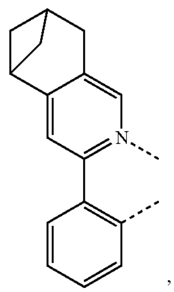
$L_{B120}$
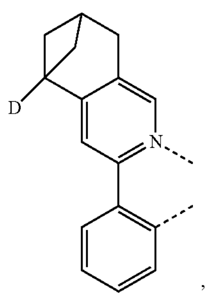
$L_{B121}$
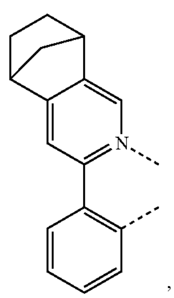
$L_{B122}$
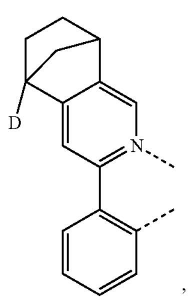
$L_{B123}$
-continued
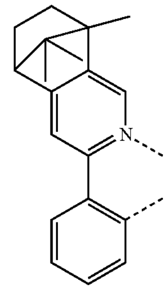
$L_{B124}$
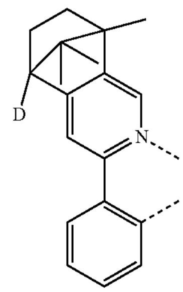
$L_{B125}$
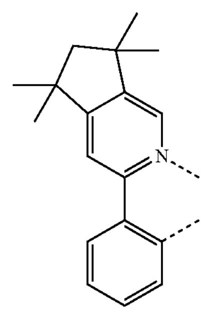
$L_{B126}$
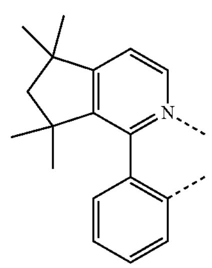
$L_{B127}$
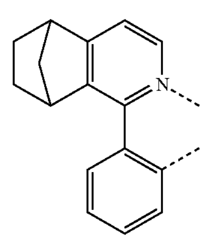
$L_{B128}$ -continued
$L_{B129}$
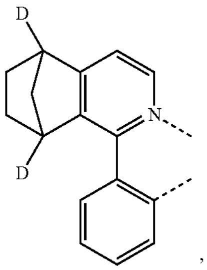
$L_{B130}$
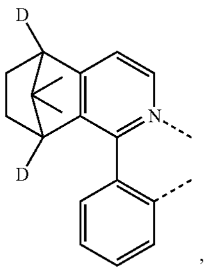
$L_{B131}$
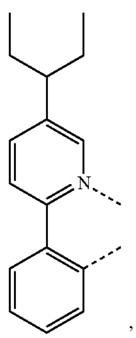
$L_{B132}$
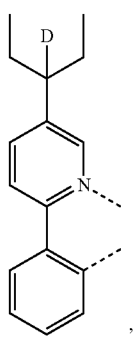
$L_{B133}$
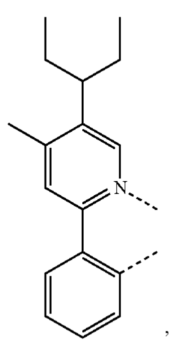
-continued
$L_{B134}$
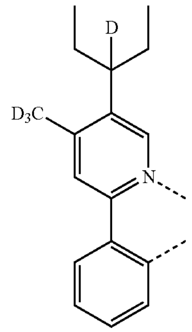
$L_{B135}$
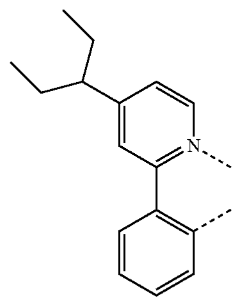
$L_{B136}$
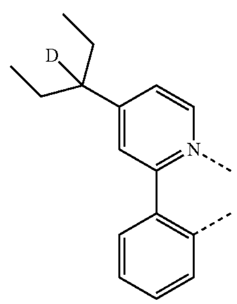
$L_{B137}$
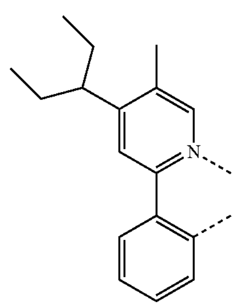
$L_{B138}$
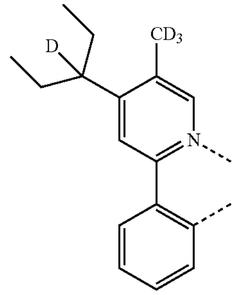

-continued
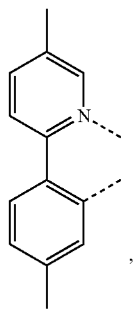
$L_{B139}$
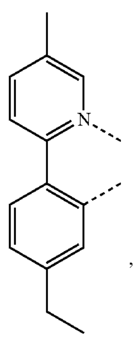
$L_{B140}$
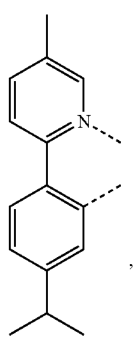
$L_{B141}$
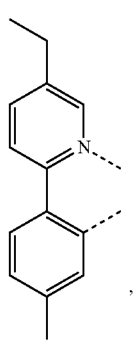
$L_{B142}$
-continued
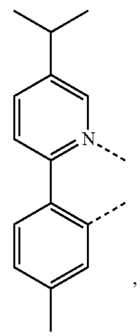
$L_{B143}$
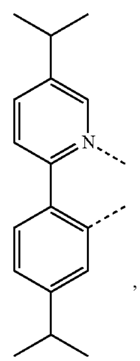
$L_{B144}$
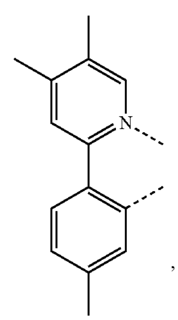
$L_{B145}$
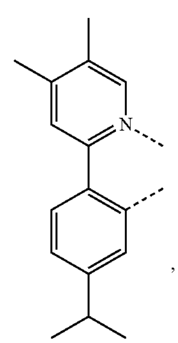
$L_{B146}$ -continued
$L_{B147}$
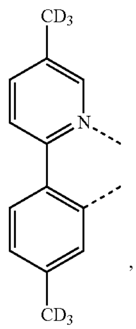
$L_{B148}$
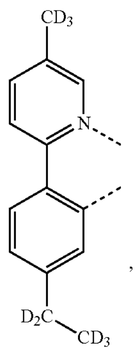
$L_{B149}$
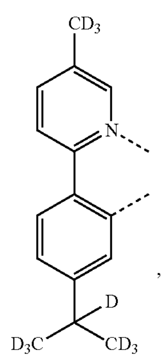
$L_{B150}$
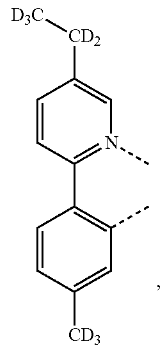
-continued
$L_{B151}$
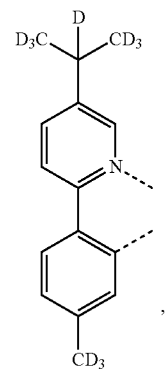
$L_{B152}$
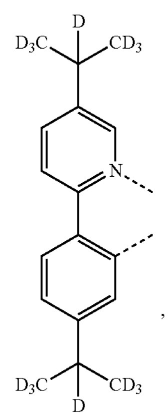
$L_{B153}$
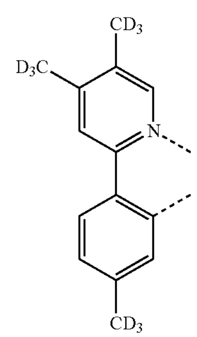
$L_{B154}$
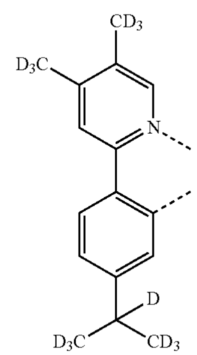

-continued
$L_{B155}$
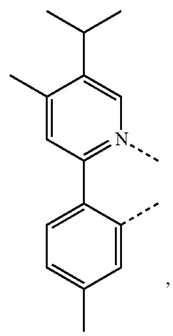
$L_{B156}$
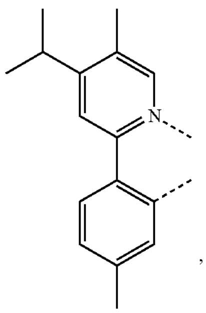
$L_{B157}$
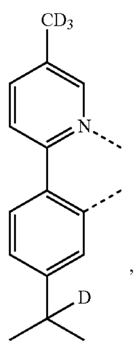
$L_{B158}$
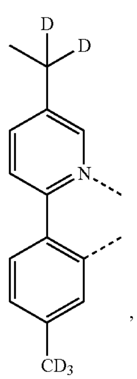
-continued
$L_{B159}$
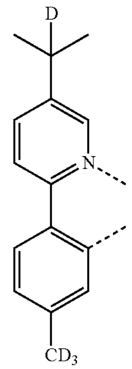
$L_{B160}$
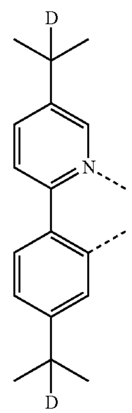
$L_{B161}$
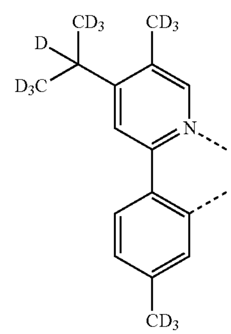
$L_{B162}$
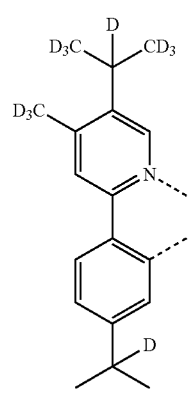

-continued
$L_{B163}$
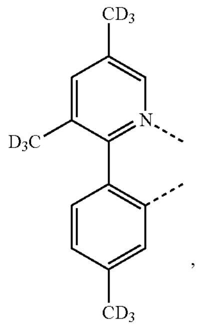
$L_{B164}$
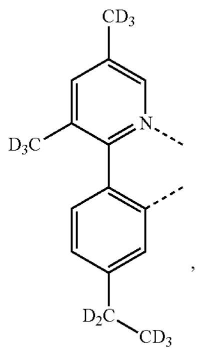
$L_{B165}$
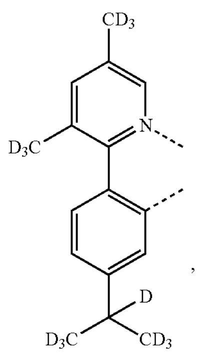
$L_{B166}$
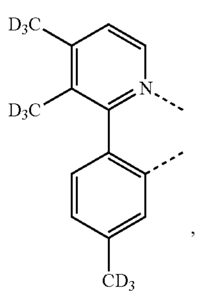
$L_{B167}$
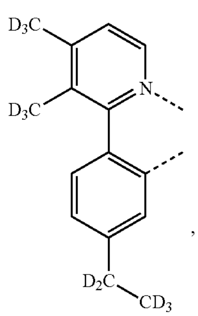
-continued
$L_{B168}$
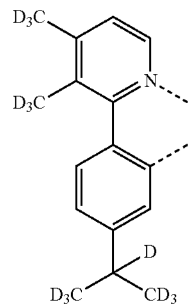
$L_{B169}$
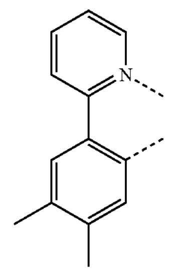
$L_{B170}$
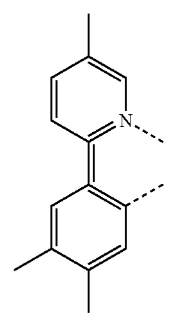
$L_{B171}$
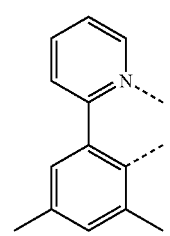
$L_{B172}$
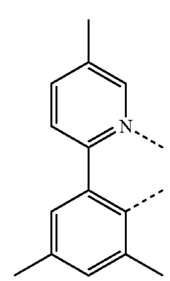

L$_{B173}$
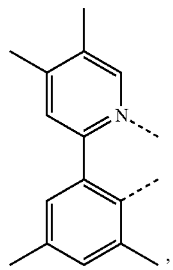
L$_{B174}$
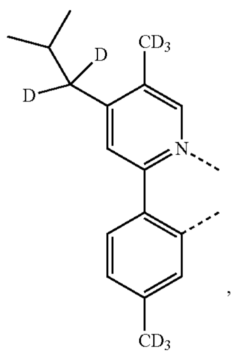
L$_{B175}$
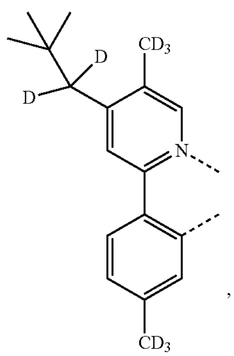
L$_{B176}$
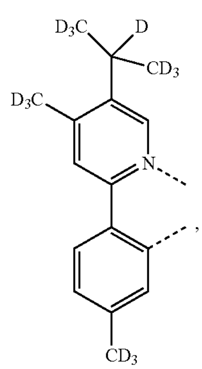
L$_{B177}$
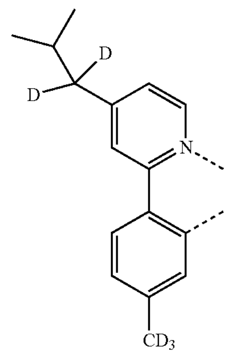
L$_{B178}$
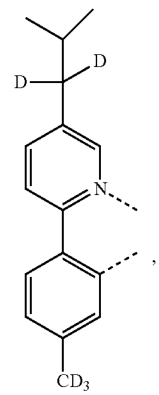
L$_{B179}$
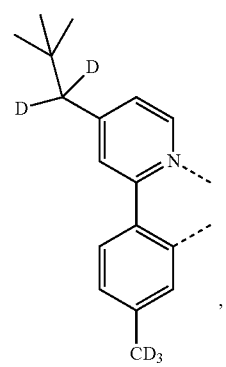
L$_{B180}$
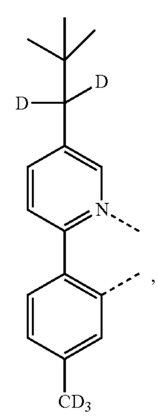

-continued
$L_{B181}$
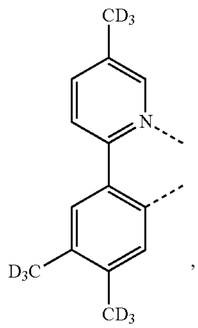
$L_{B182}$
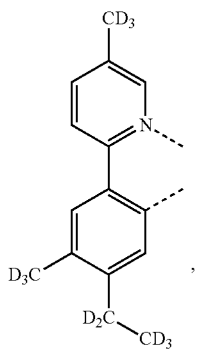
$L_{B183}$
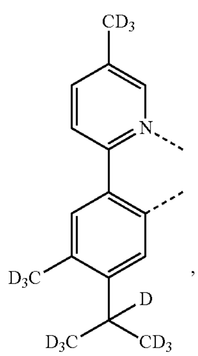
$L_{B184}$
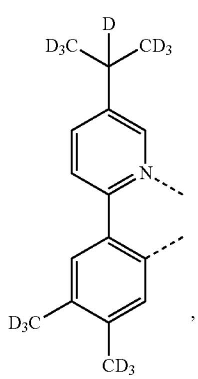
-continued
$L_{B185}$
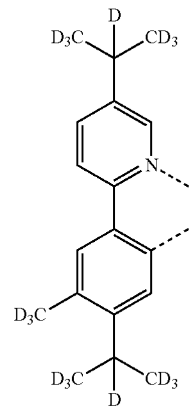
$L_{B186}$
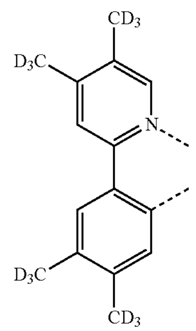
$L_{B187}$
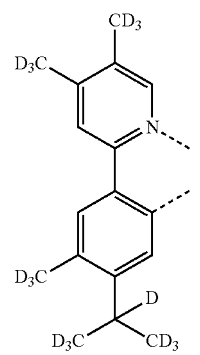
$L_{B188}$
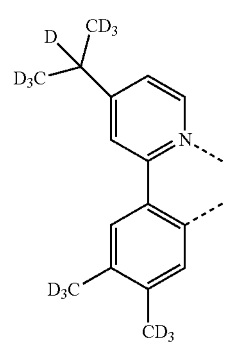

-continued
L$_{B189}$
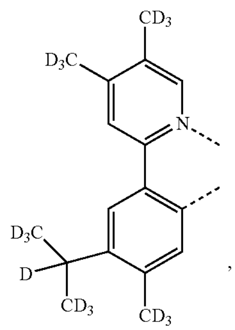
L$_{B190}$
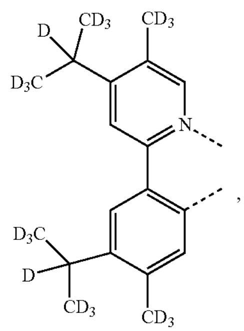
L$_{B191}$
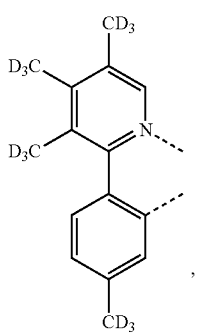
L$_{B192}$
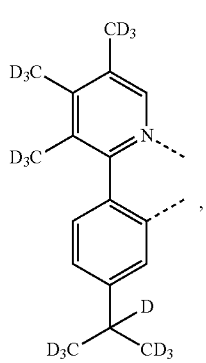
-continued
L$_{B193}$
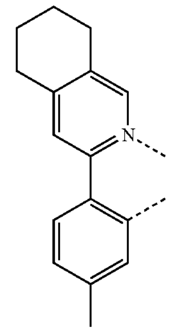
L$_{B194}$
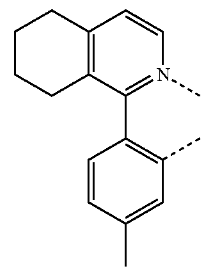
L$_{B195}$
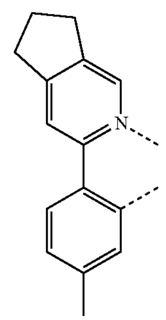
L$_{B196}$
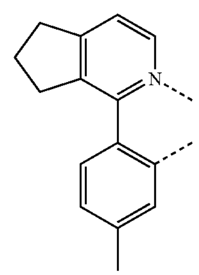
L$_{B197}$
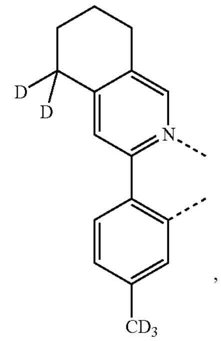

-continued
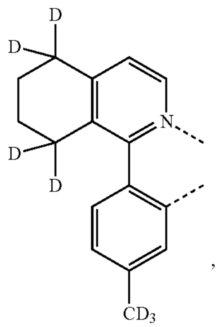
$L_{B198}$
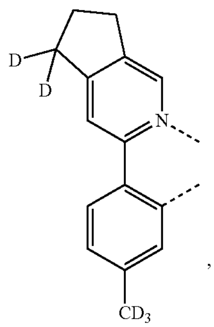
$L_{B199}$
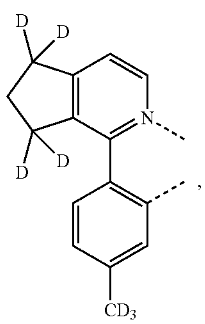
$L_{B200}$
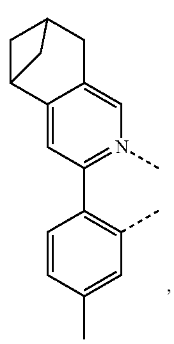
$L_{B201}$
-continued
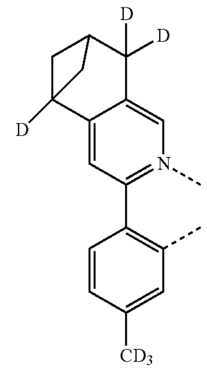
$L_{B202}$
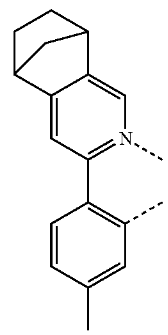
$L_{B203}$
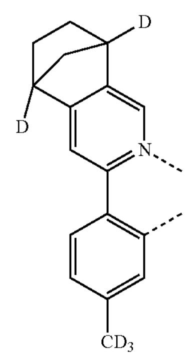
$L_{B204}$
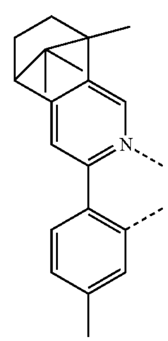
$L_{B205}$

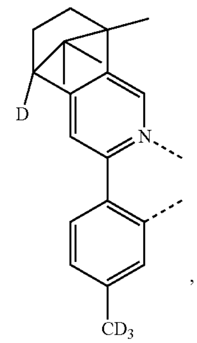
$L_{B206}$
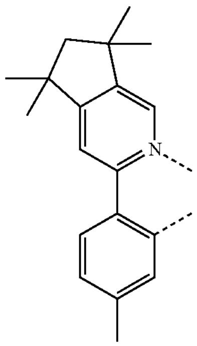
$L_{B207}$
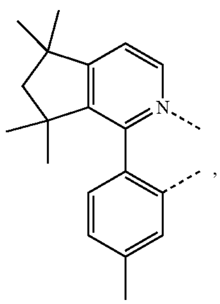
$L_{B208}$
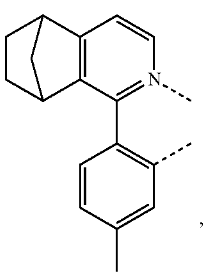
$L_{B209}$
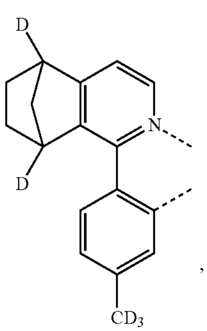
$L_{B210}$
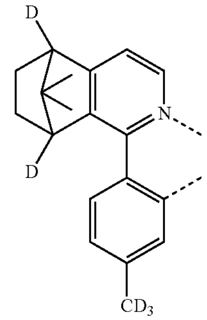
$L_{B211}$
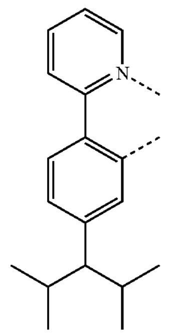
$L_{B212}$
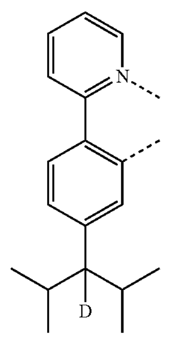
$L_{B213}$
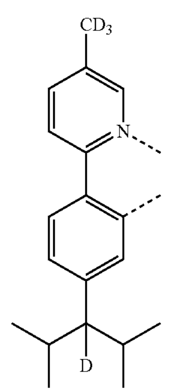
$L_{B214}$ $L_{B215}$
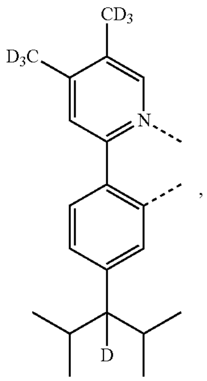
$L_{B216}$
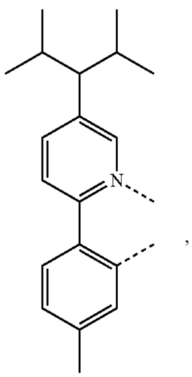
$L_{B217}$
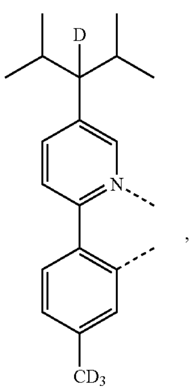
$L_{B218}$
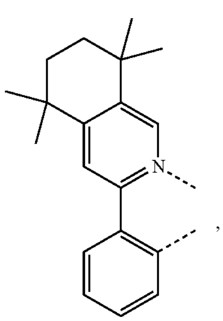
$L_{B219}$
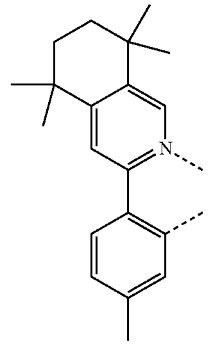
$L_{B220}$
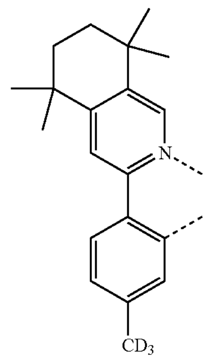
$L_{B221}$
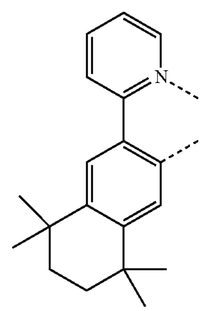
$L_{B222}$
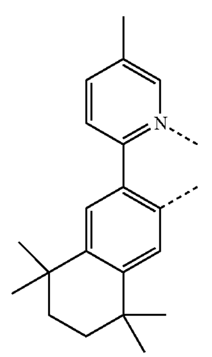

-continued
$L_{B223}$
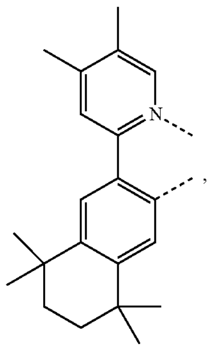
$L_{B224}$
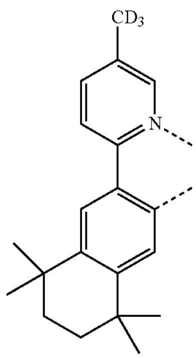
, and
$L_{B225}$
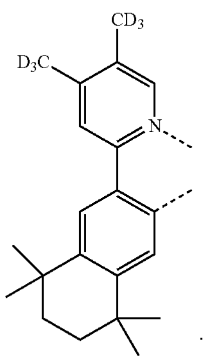
12. The compound of claim 9, wherein the compound is selected from the group consisting of Compound 1 through Compound 114,300;
where each Compound x has the formula $Ir(L_{Ai})(L_{Bj})_2$;
wherein x=508j+i−508, i is an integer from 1 to 508, and j is an integer from 1 to 225;
wherein $L_{Bj}$ has the following formula:
$L_{B1}$
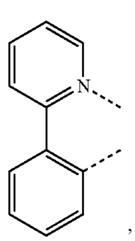
-continued
$L_{B2}$
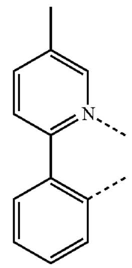
$L_{B3}$
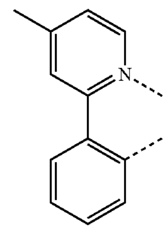
$L_{B4}$
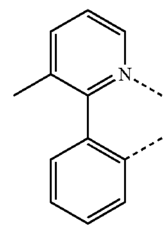
$L_{B5}$
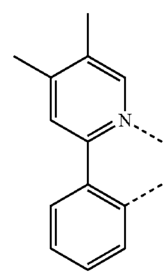
$L_{B6}$
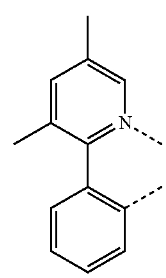
$L_{B7}$
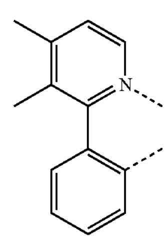

-continued
$L_{B8}$
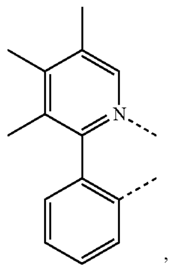
$L_{B9}$
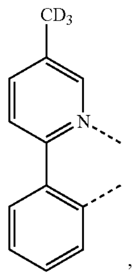
$L_{B10}$
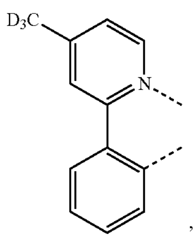
$L_{B11}$
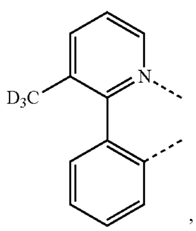
$L_{B12}$
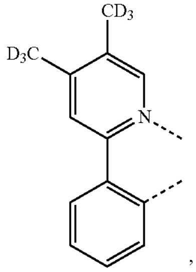
$L_{B13}$
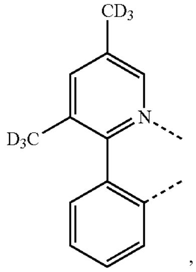
-continued
$L_{B14}$
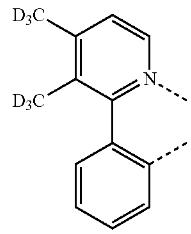
$L_{B15}$
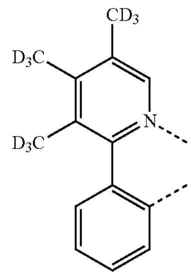
$L_{B16}$
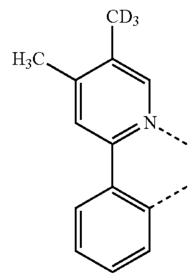
$L_{B17}$
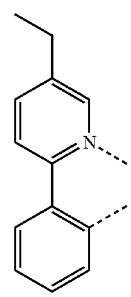
$L_{B18}$
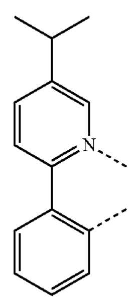
$L_{B19}$
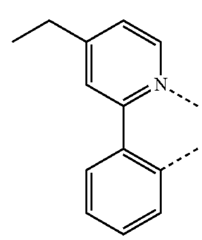

-continued
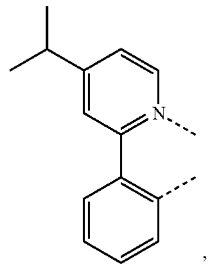
$L_{B20}$
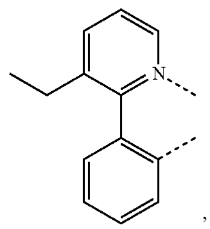
$L_{B21}$
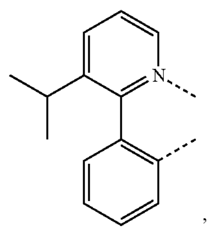
$L_{B22}$
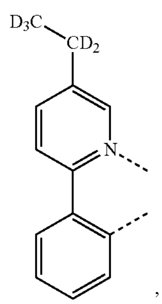
$L_{B23}$
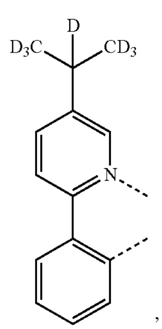
$L_{B24}$
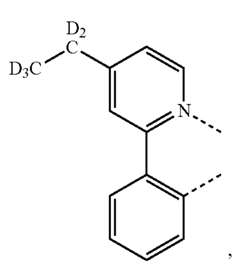
$L_{B25}$
-continued
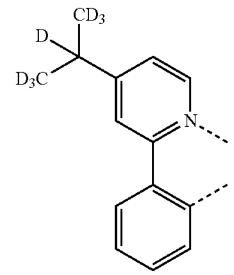
$L_{B26}$
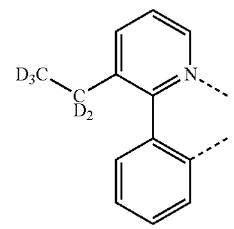
$L_{B27}$
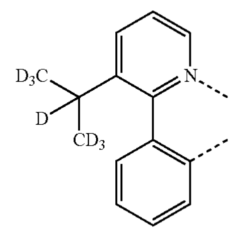
$L_{B28}$
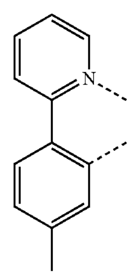
$L_{B29}$
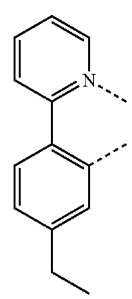
$L_{B30}$
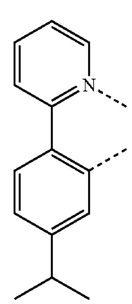
$L_{B31}$ -continued
$L_{B32}$
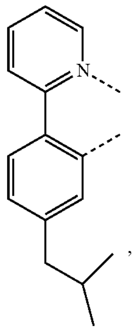
$L_{B33}$
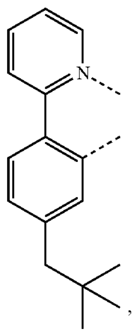
$L_{B34}$
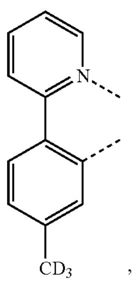
$L_{B35}$
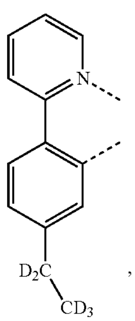
$L_{B36}$
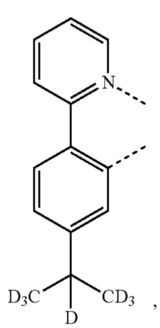
-continued
$L_{B37}$
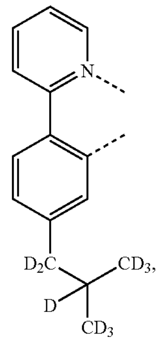
$L_{B38}$
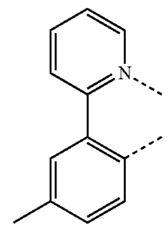
$L_{B39}$
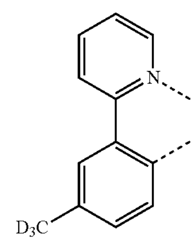
$L_{B40}$
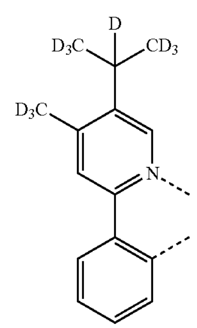
$L_{B41}$
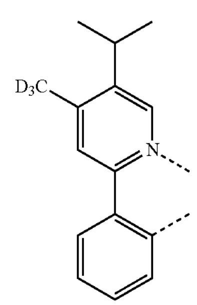

$L_{B42}$
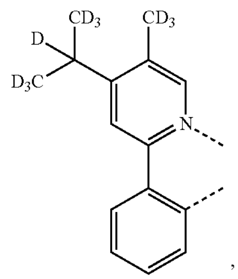
$L_{B43}$
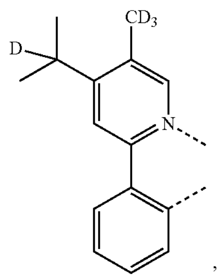
$L_{B44}$
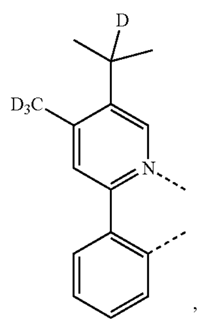
$L_{B45}$
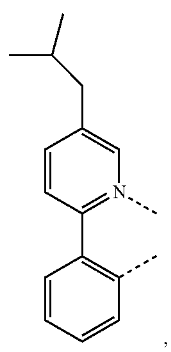
$L_{B46}$
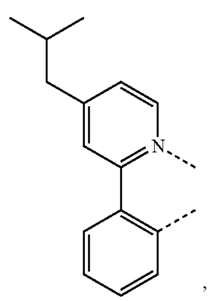
$L_{B47}$
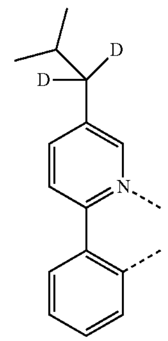
$L_{B48}$
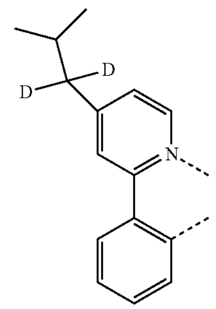
$L_{B49}$
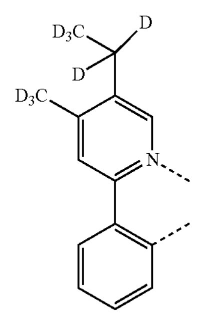
$L_{B50}$
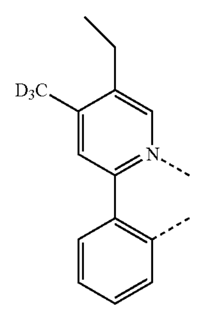
$L_{B51}$
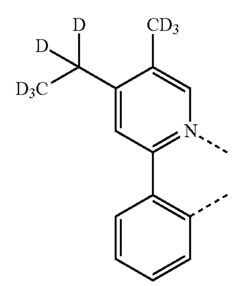

-continued
$L_{B52}$
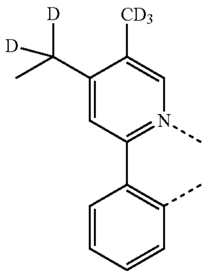
$L_{B53}$
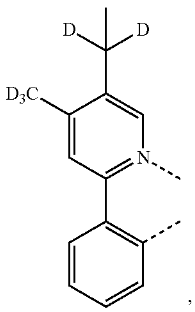
$L_{B54}$
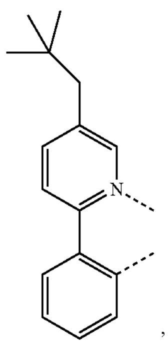
$L_{B55}$
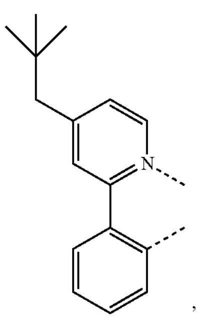
$L_{B56}$
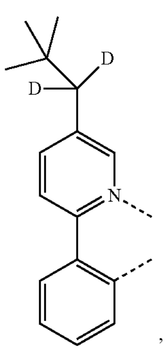
-continued
$L_{B57}$
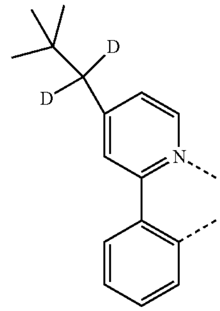
$L_{B58}$
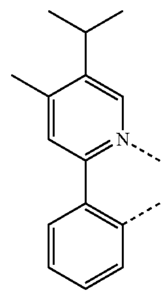
$L_{B59}$
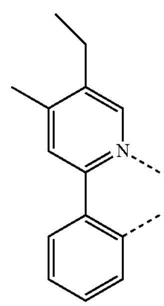
$L_{B60}$
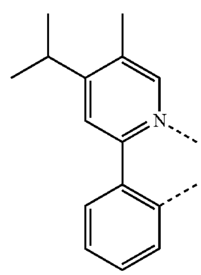
$L_{B61}$
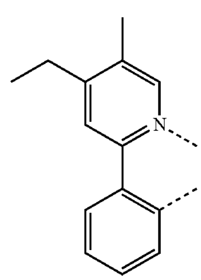

$L_{B62}$
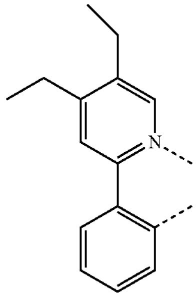
,
$L_{B63}$
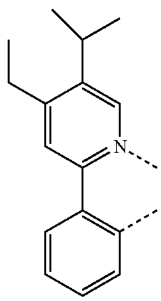
,
$L_{B64}$
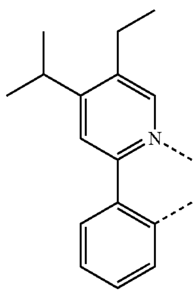
,
$L_{B65}$
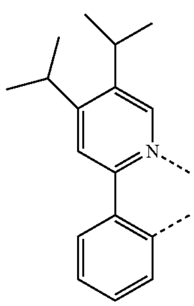
,
$L_{B66}$
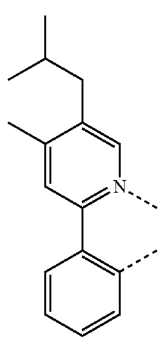
,
$L_{B67}$
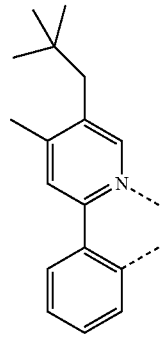
,
$L_{B68}$
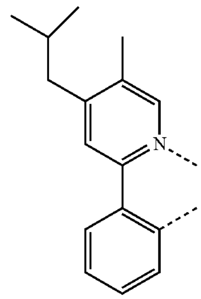
,
$L_{B69}$
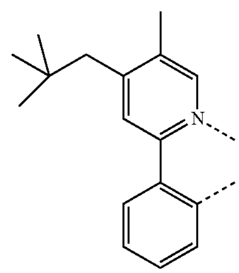
,
$L_{B70}$
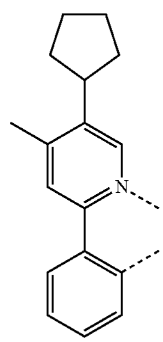
,
$L_{B71}$
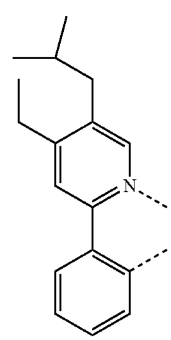
, -continued
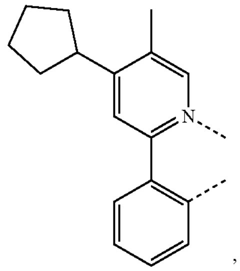
$L_{B72}$
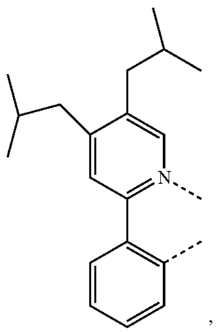
$L_{B73}$
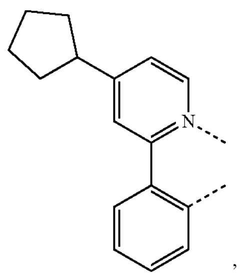
$L_{B74}$
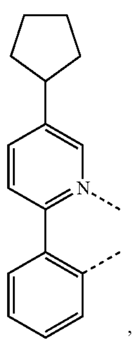
$L_{B75}$
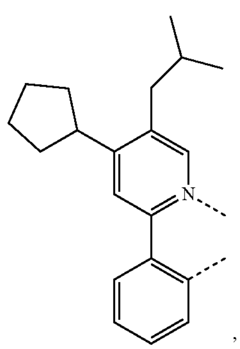
$L_{B76}$
-continued
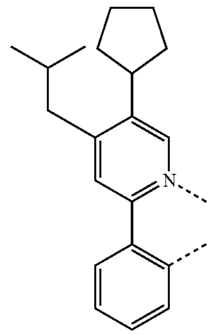
$L_{B77}$
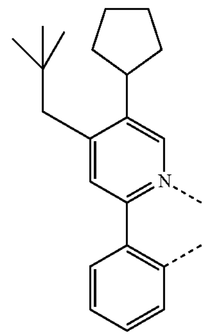
$L_{B78}$
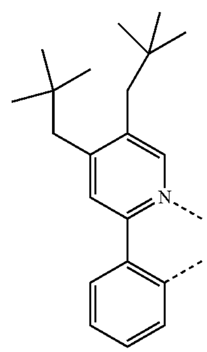
$L_{B79}$
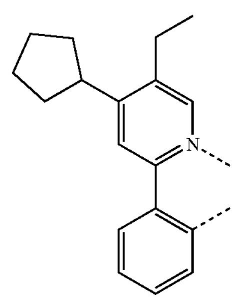
$L_{B80}$ -continued
$L_{B81}$
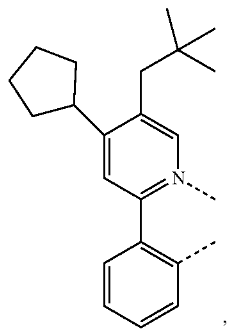
$L_{B82}$
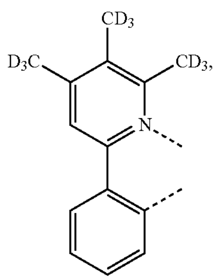
$L_{B83}$
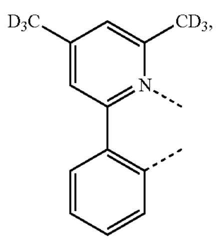
$L_{B84}$
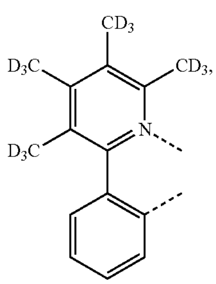
$L_{B85}$
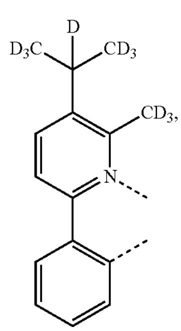
-continued
$L_{B86}$
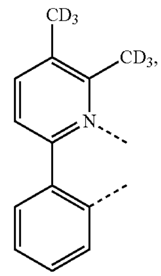
$L_{B87}$
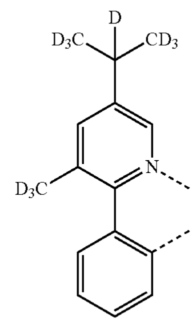
$L_{B88}$
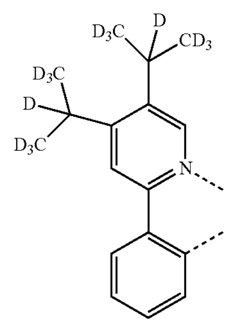
$L_{B89}$
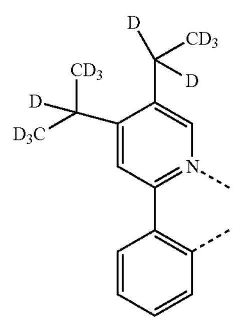
$L_{B90}$
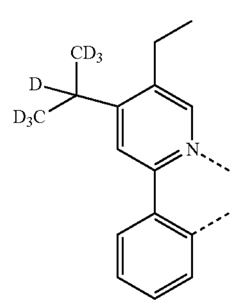

-continued
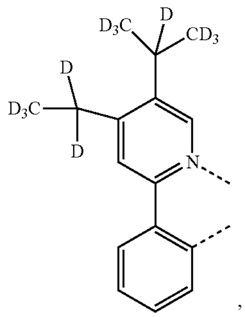
$L_{B91}$
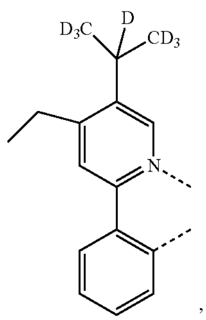
$L_{B92}$
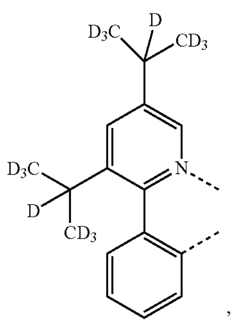
$L_{B93}$
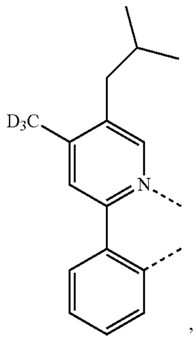
$L_{B94}$
-continued
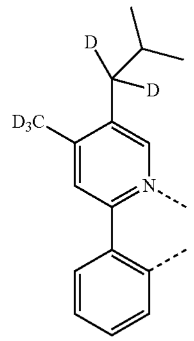
$L_{B95}$
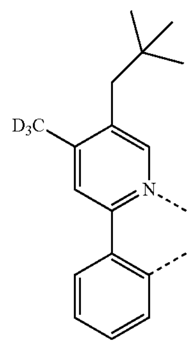
$L_{B96}$
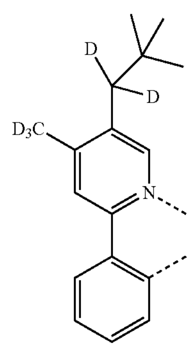
$L_{B97}$
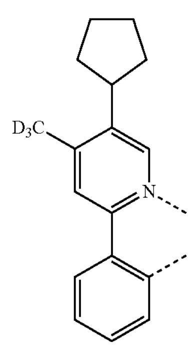
$L_{B98}$ -continued
$L_{B99}$
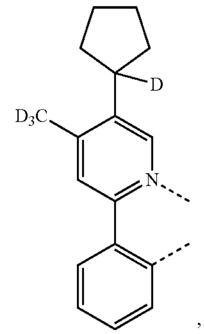
$L_{B100}$
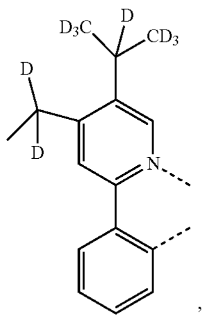
$L_{B101}$
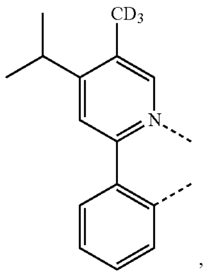
$L_{B102}$
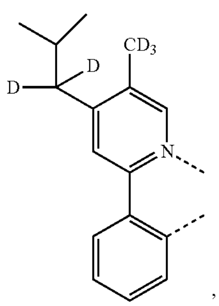
$L_{B103}$
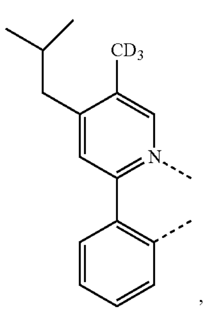
-continued
$L_{B104}$
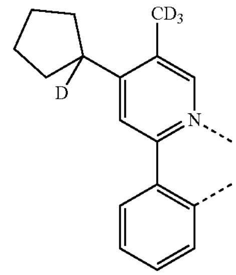
$L_{B105}$
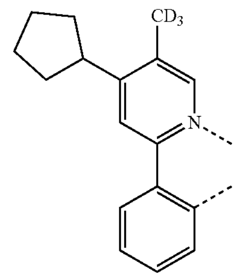
$L_{B106}$
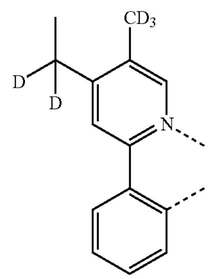
$L_{B107}$
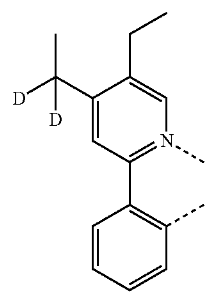
$L_{B108}$
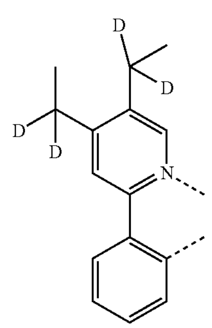

$L_{B109}$
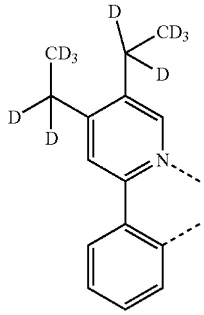
,
$L_{B110}$
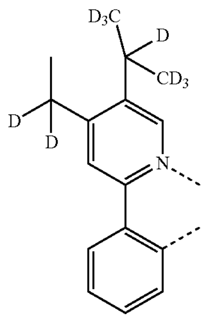
,
$L_{B111}$
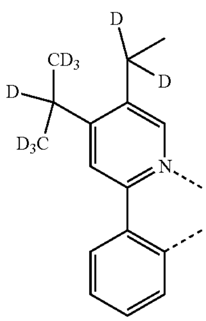
,
$L_{B112}$
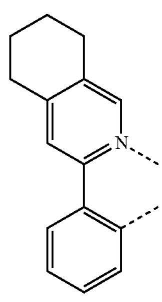
,
$L_{B113}$
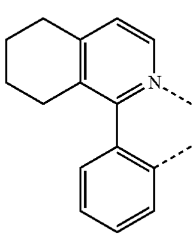
,
$L_{B114}$
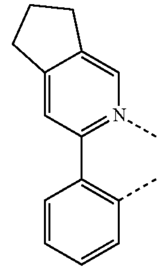
,
$L_{B115}$
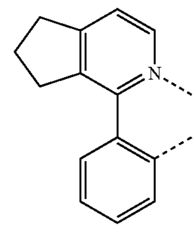
,
$L_{B116}$
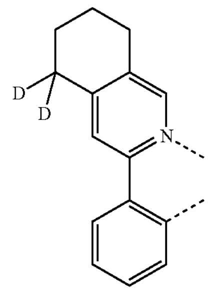
,
$L_{B117}$
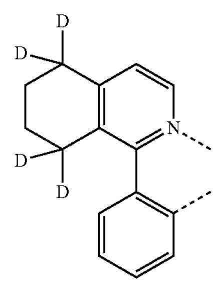
,
$L_{B118}$
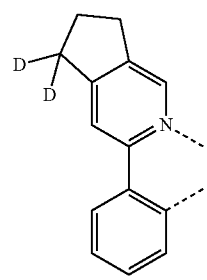
,
$L_{B119}$
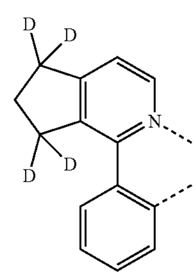
, -continued
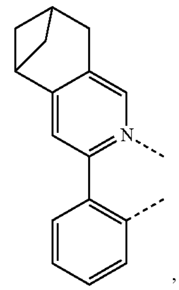
$L_{B120}$
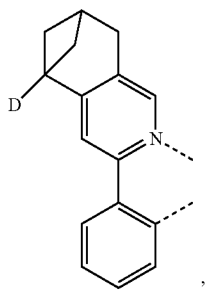
$L_{B121}$
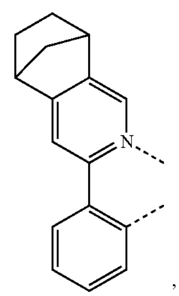
$L_{B122}$
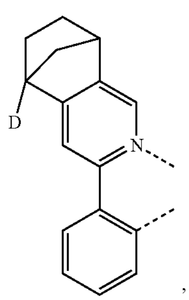
$L_{B123}$
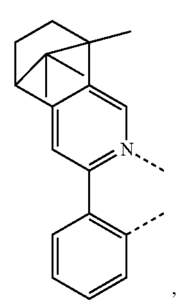
$L_{B124}$
-continued
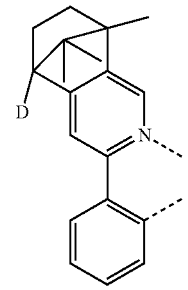
$L_{B125}$
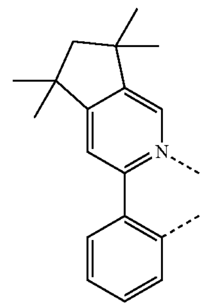
$L_{B126}$
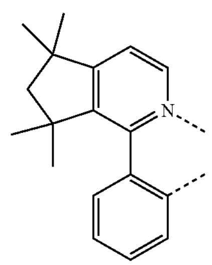
$L_{B127}$
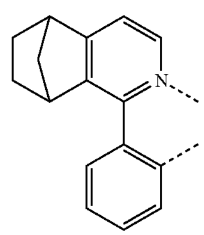
$L_{B128}$
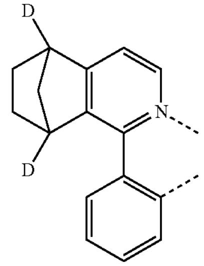
$L_{B129}$ $L_{B130}$
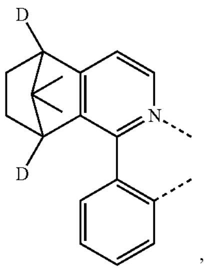
$L_{B131}$
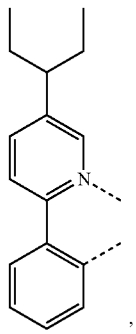
$L_{B132}$
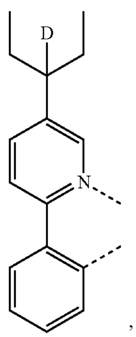
$L_{B133}$
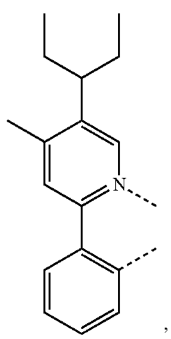
$L_{B134}$
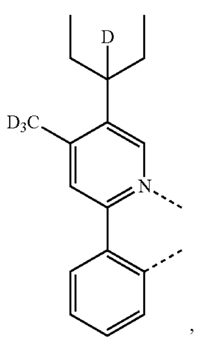
$L_{B135}$
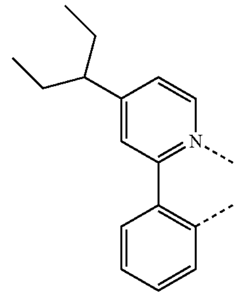
$L_{B136}$
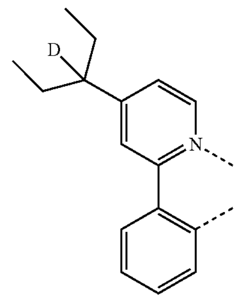
$L_{B137}$
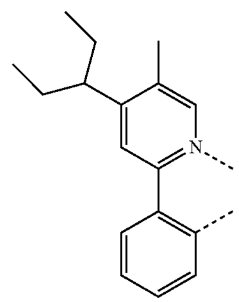
$L_{B138}$
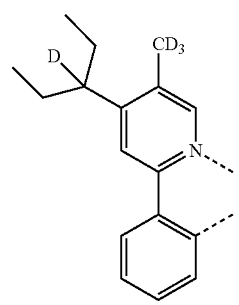
$L_{B139}$
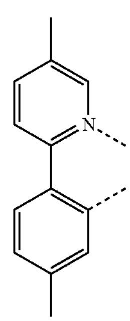

$L_{B140}$
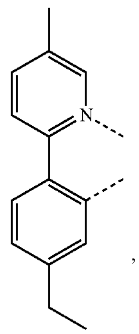
$L_{B141}$
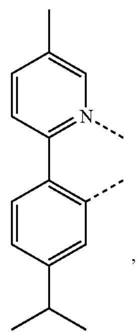
$L_{B142}$
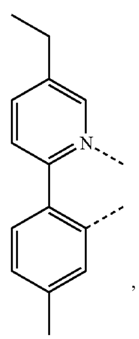
$L_{B143}$
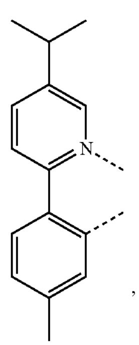
$L_{B144}$
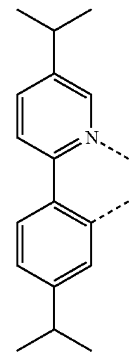
$L_{B145}$
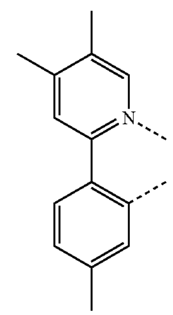
$L_{B146}$
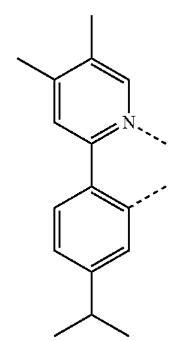
$L_{B147}$
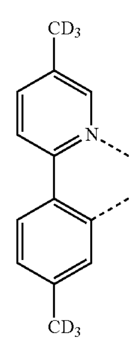

-continued
L$_{B148}$
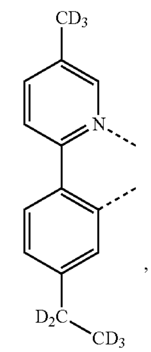
L$_{B149}$
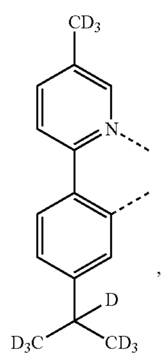
L$_{B150}$
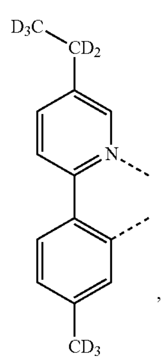
L$_{B151}$
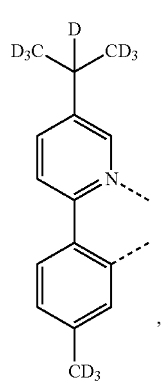
-continued
L$_{B152}$
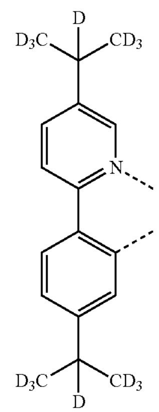
L$_{B153}$
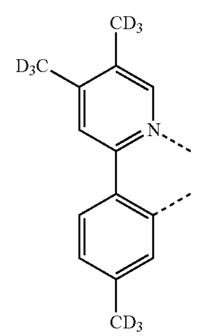
L$_{B154}$
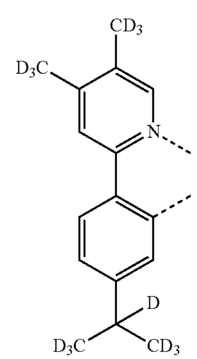
L$_{B155}$
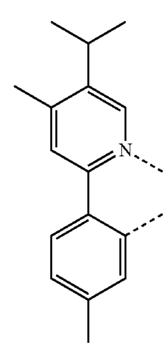

$L_{B156}$
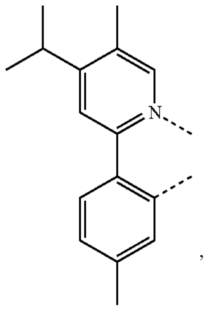
$L_{B157}$
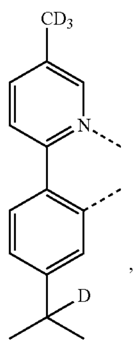
$L_{B158}$
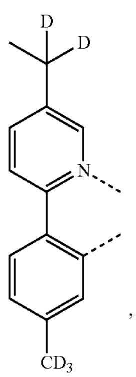
$L_{B159}$
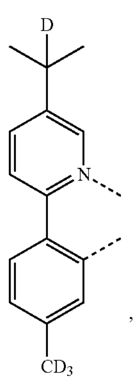
$L_{B160}$
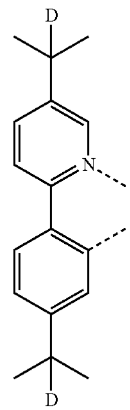
$L_{B161}$
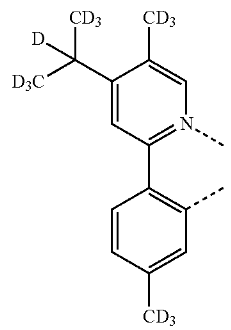
$L_{B162}$
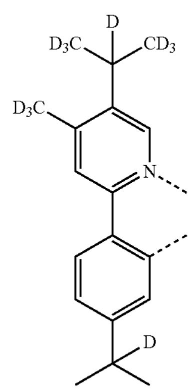
$L_{B163}$
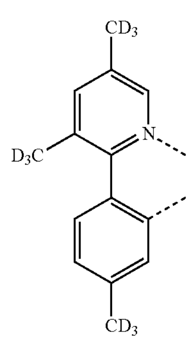

-continued
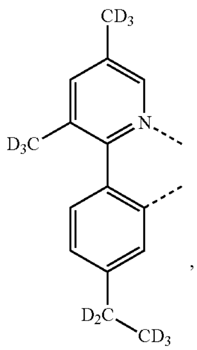
$L_{B164}$
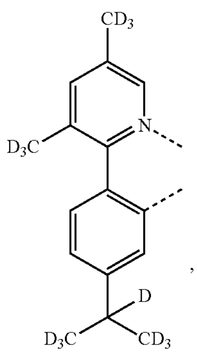
$L_{B165}$
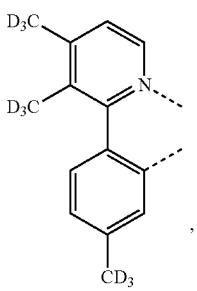
$L_{B166}$
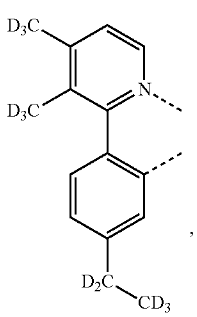
$L_{B167}$
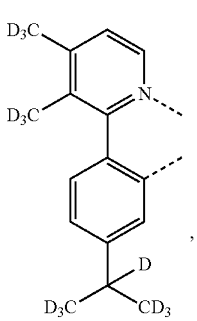
$L_{B168}$
-continued
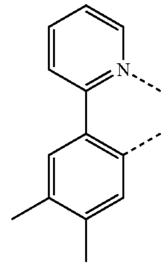
$L_{B169}$
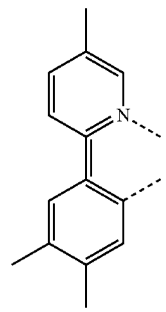
$L_{B170}$
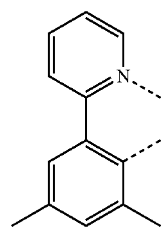
$L_{B171}$
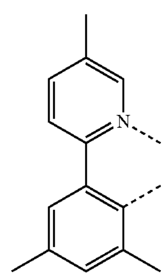
$L_{B172}$
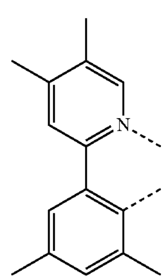
$L_{B173}$ -continued
$L_{B174}$
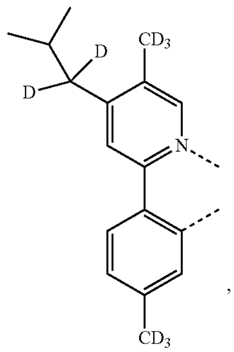
$L_{B175}$
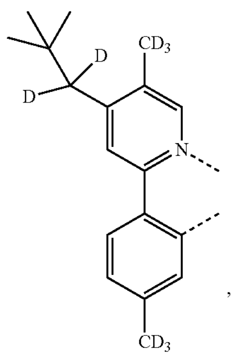
$L_{B176}$
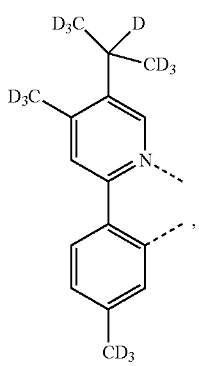
$L_{B177}$
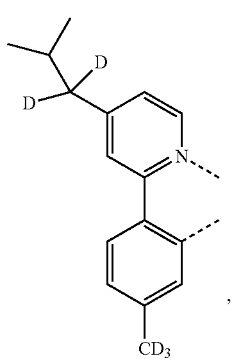
-continued
$L_{B178}$
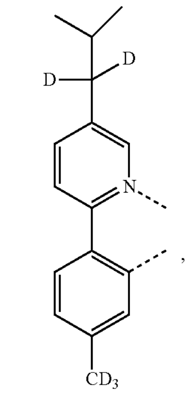
$L_{B179}$
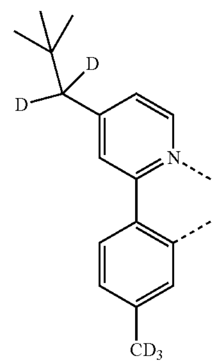
$L_{B180}$
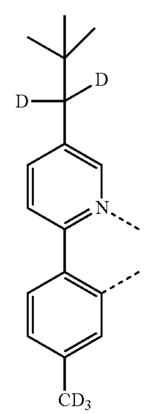
$L_{B181}$
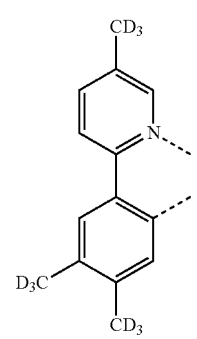

-continued
$L_{B182}$
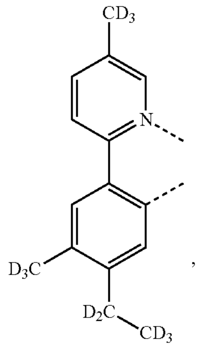
$L_{B183}$
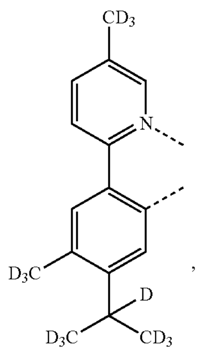
$L_{B184}$
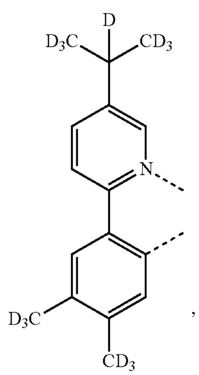
$L_{B185}$
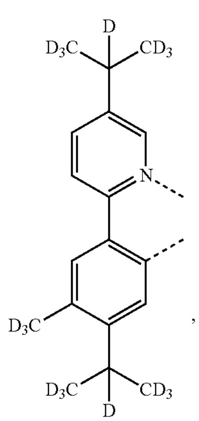
-continued
$L_{B186}$
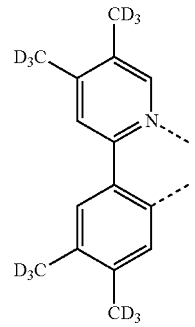
$L_{B187}$
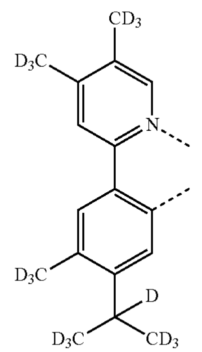
$L_{B188}$
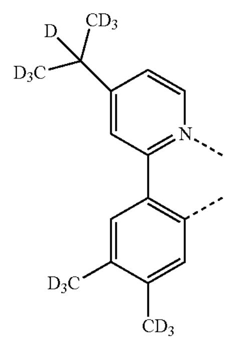
$L_{B189}$
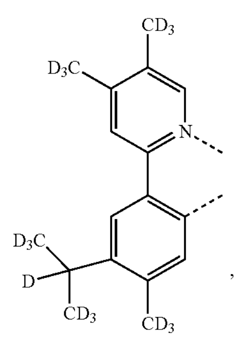

$L_{B190}$
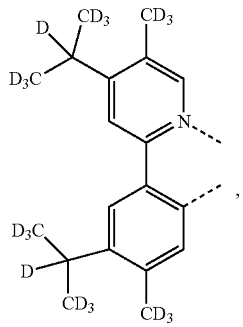
$L_{B191}$
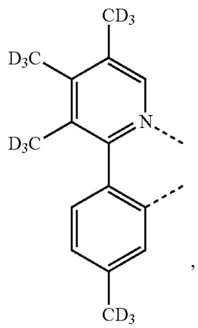
$L_{B192}$
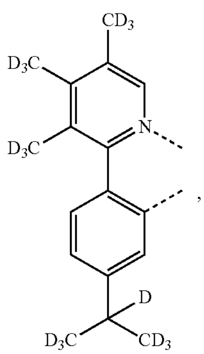
$L_{B193}$
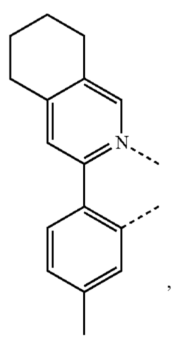
$L_{B194}$
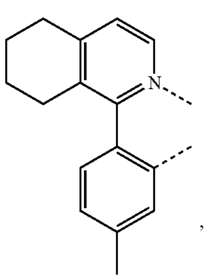
$L_{B195}$
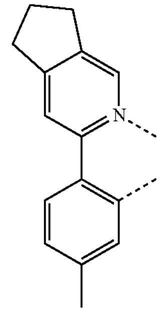
$L_{B196}$
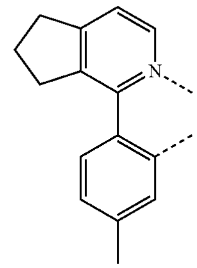
$L_{B197}$
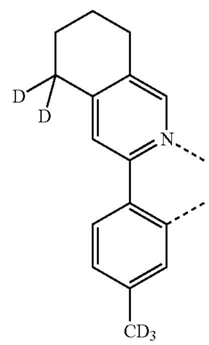
$L_{B198}$
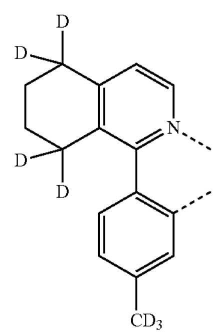
$L_{B199}$
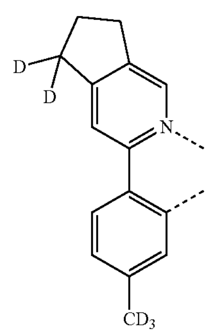

-continued
$L_{B200}$
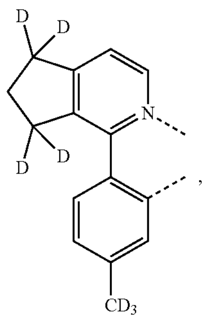
$L_{B201}$
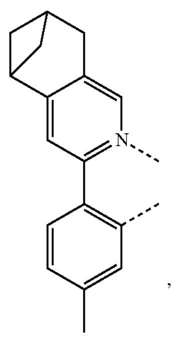
$L_{B202}$
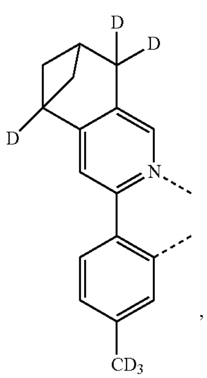
$L_{B203}$
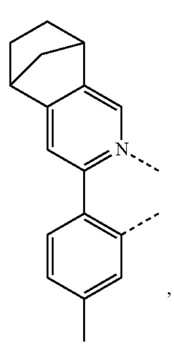
-continued
$L_{B204}$
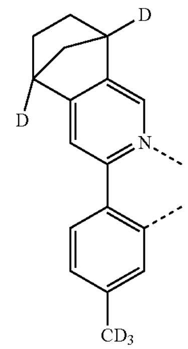
$L_{B205}$
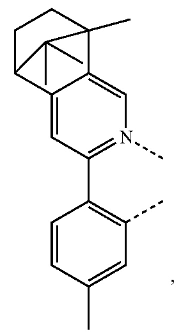
$L_{B206}$
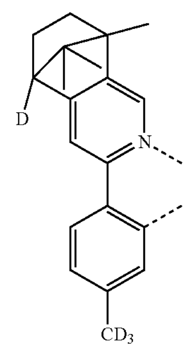
$L_{B207}$
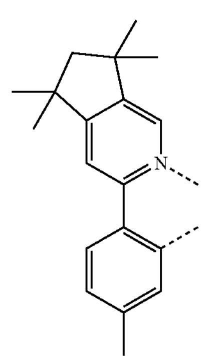

-continued
$L_{B208}$
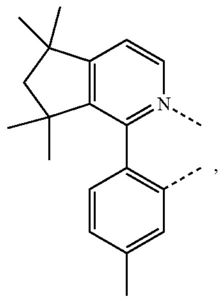
$L_{B209}$
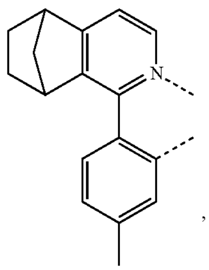
$L_{B210}$
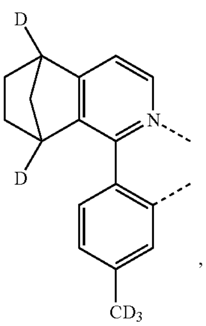
$L_{B211}$
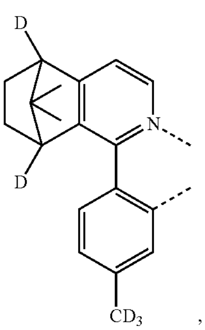
$L_{B212}$
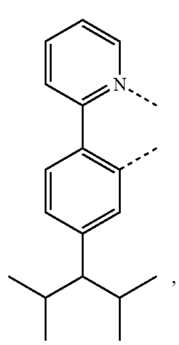
-continued
$L_{B213}$
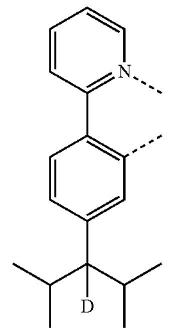
$L_{B214}$
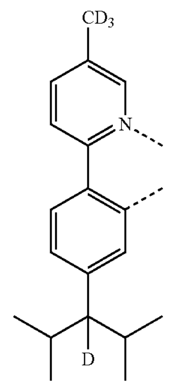
$L_{B215}$
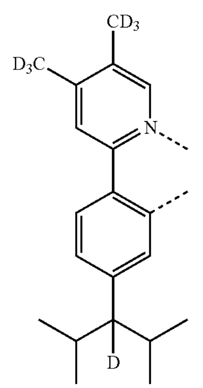
$L_{B216}$
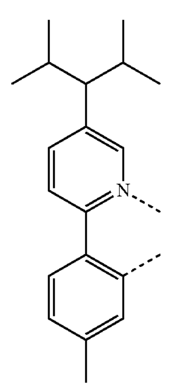

-continued
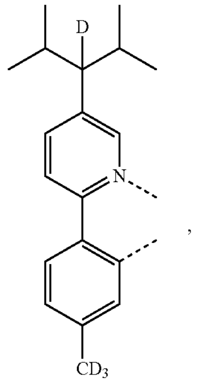
$L_{B217}$
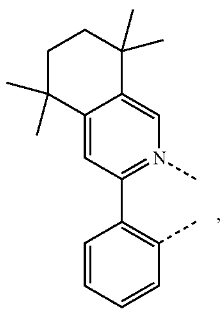
$L_{B218}$
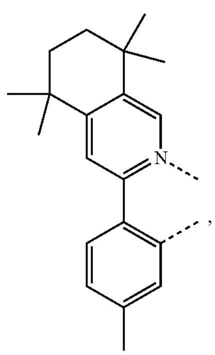
$L_{B219}$
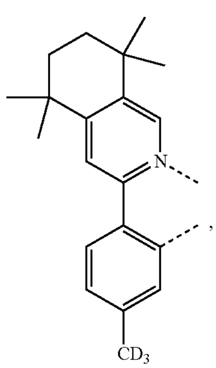
$L_{B220}$
-continued
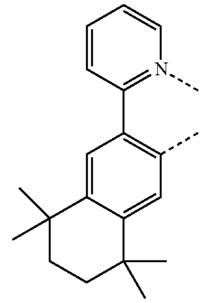
$L_{B221}$
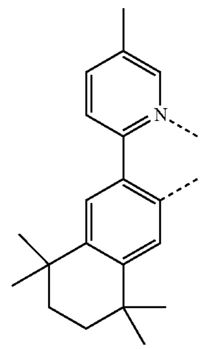
$L_{B222}$
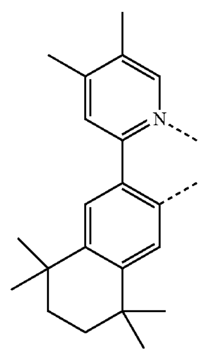
$L_{B223}$
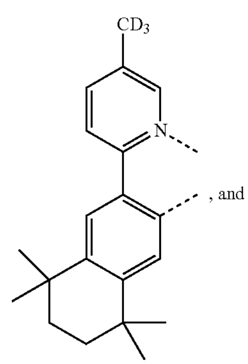
$L_{B224}$ -continued $L_{B225}$

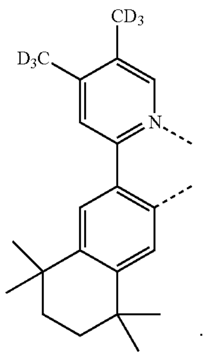

13. The compound of claim 1, wherein the ligand $L_A$ is selected from the group consisting of:

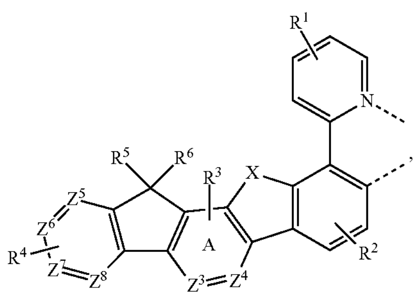

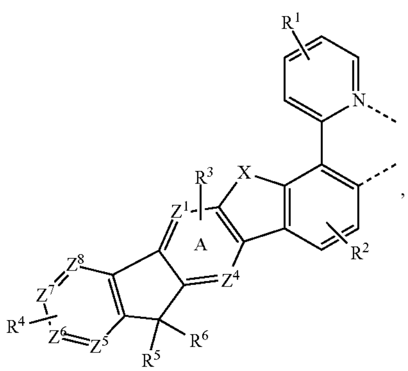

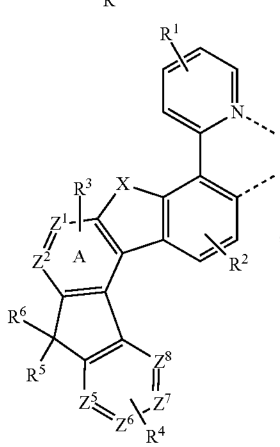

, and

-continued

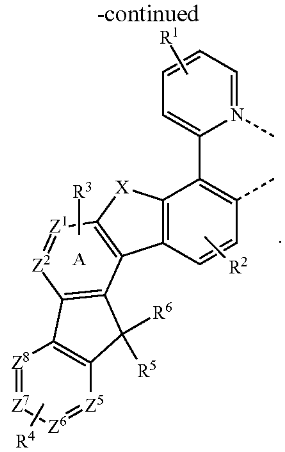

14. An organic light emitting device (OLED) comprising:

an anode;

a cathode; and an organic layer, disposed between the anode and the cathode, comprising a compound comprising a ligand $L_A$ wherein the ligand $L_A$ is selected from the group consisting of:

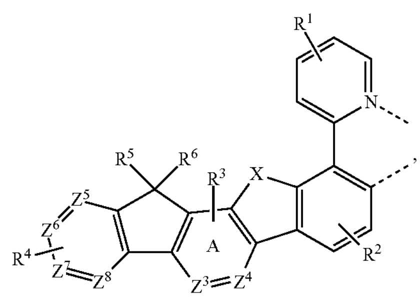

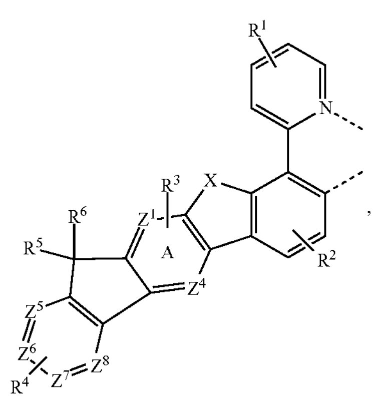

-continued

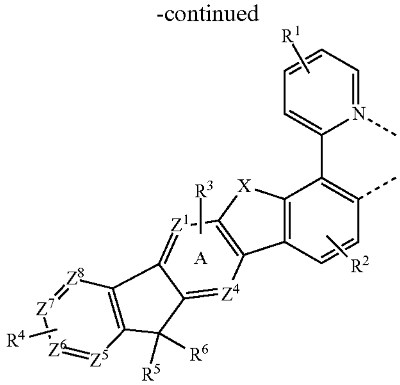

,

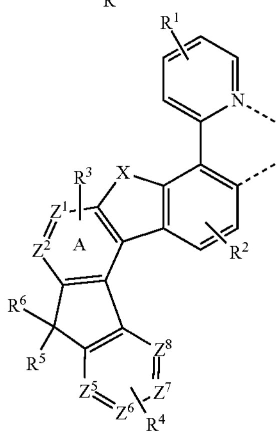

, and

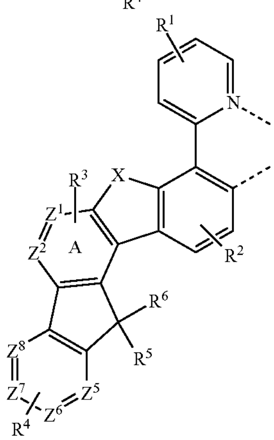

;

wherein each $Z^1$ to $Z^8$ is nitrogen or carbon;

wherein $R^1$ and $R^4$ each independently represent mono, di, tri, or tetra substitutions, or no substitution;

wherein $R^2$ and $R^3$ each independently represent mono, or di substitutions, or no substitution;

wherein X is O or S;

wherein $R^1$, $R^2$, $R^3$, $R^4$, $R^5$, and $R^6$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substituents are optionally joined to form a ring, which can be further substituted;

wherein the ligand $L_A$ is coordinated to a metal M; and wherein the ligand $L_A$ is optionally linked with other ligands to comprise a tridentate, tetradentate, pentadentate or hexadentate ligand.

15. The OLED of claim 14, wherein the OLED is incorporated into a device selected from the group consisting of a consumer product, an electronic component module, and a lighting panel.

16. The OLED of claim 14, wherein the organic layer is an emissive layer and the compound is an emissive dopant or a non-emissive dopant.

17. The OLED of claim 14, wherein the organic layer further comprises a host; wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, $C_nH_{2n}{-}Ar_1$, or the host has no substitution;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

18. The OLED of claim 14, wherein the organic layer further comprises a host, wherein the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

19. The OLED of claim 14, wherein the organic layer further comprises a host and the host is selected from the group consisting of:

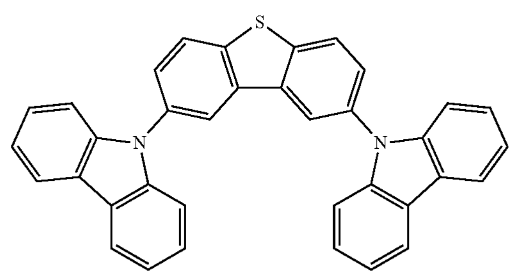

,

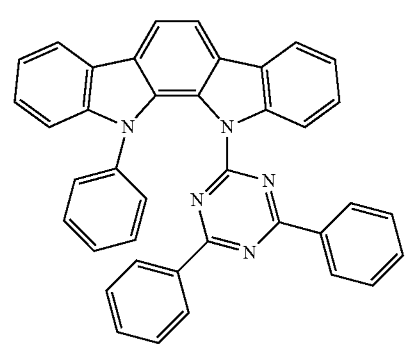

,

-continued
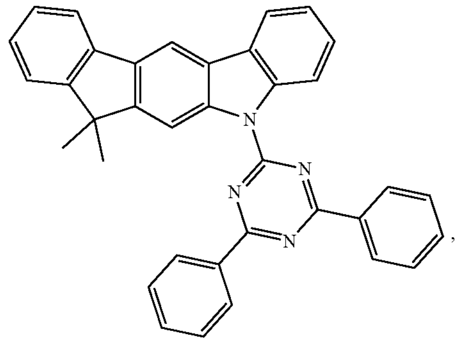
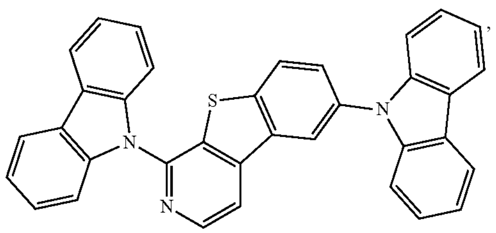
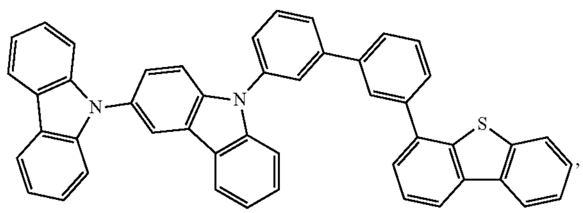
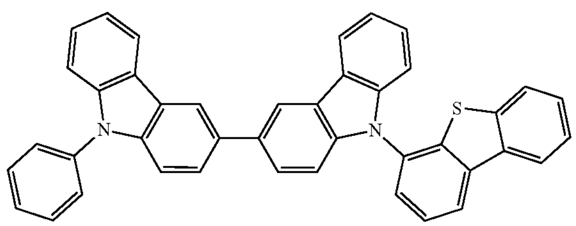
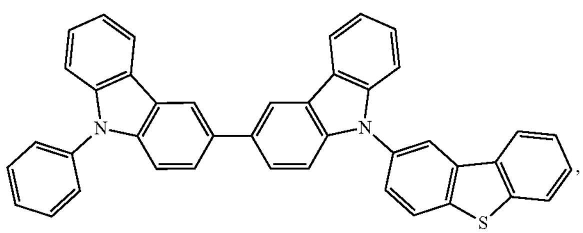
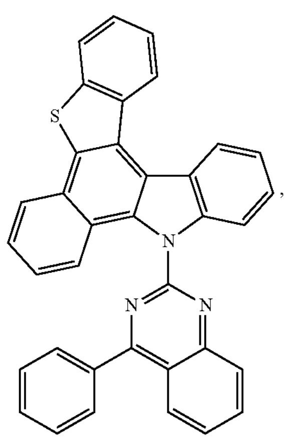
-continued
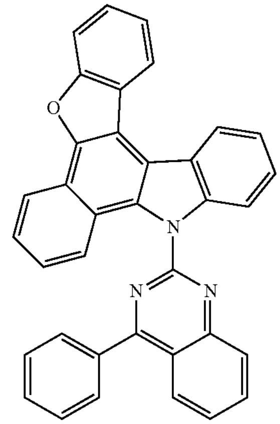
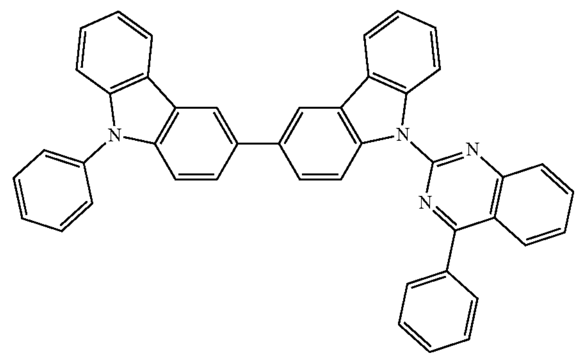
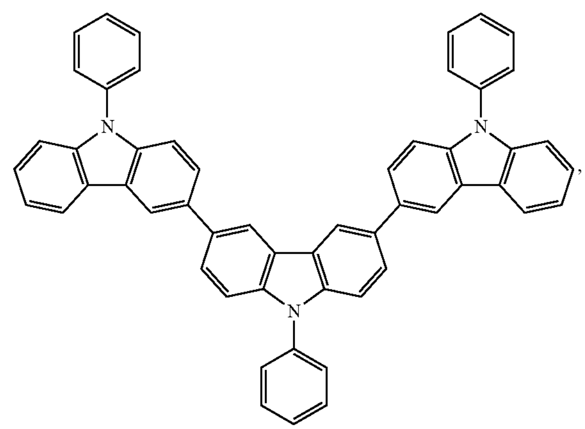
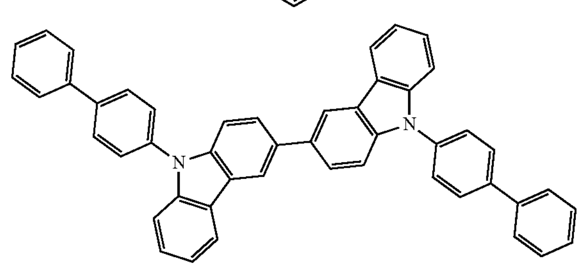
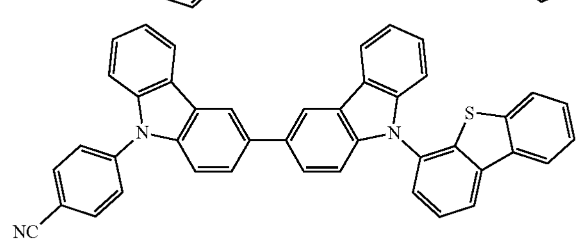

-continued
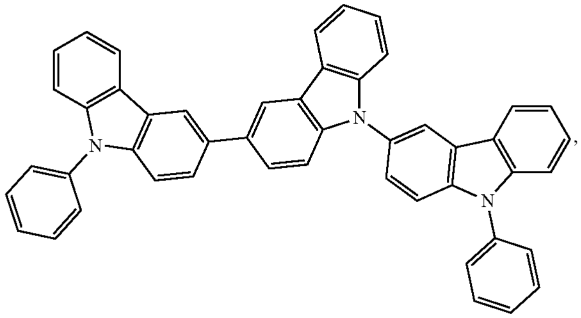
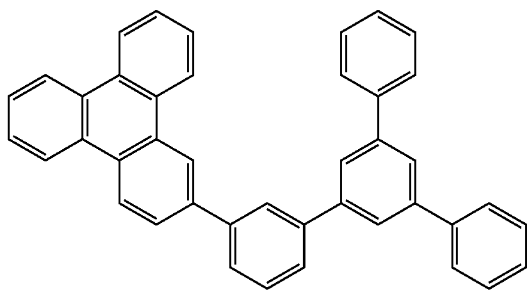
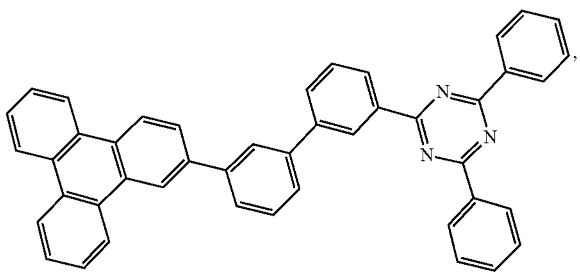
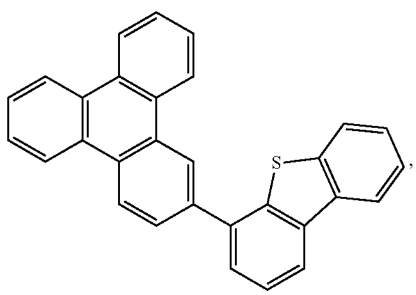
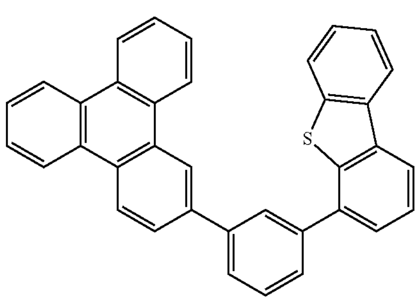
-continued
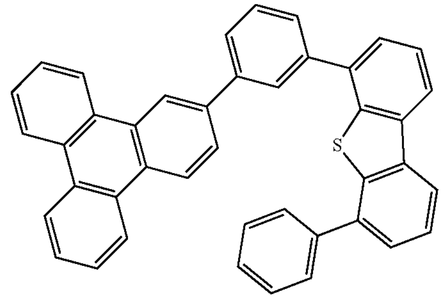
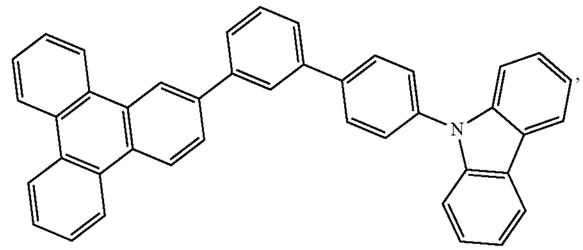
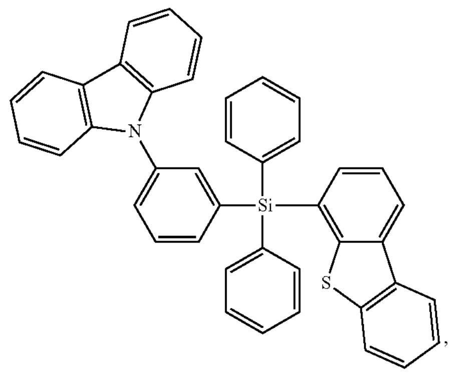
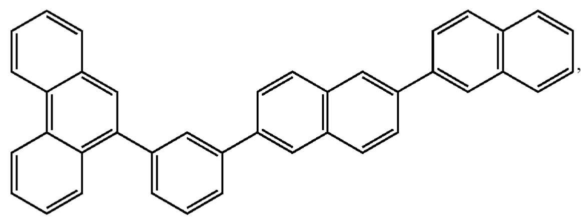
and combinations thereof.
20. A formulation comprising a compound comprising a ligand $L_A$ wherein the ligand $L_A$ is selected from the group consisting of:
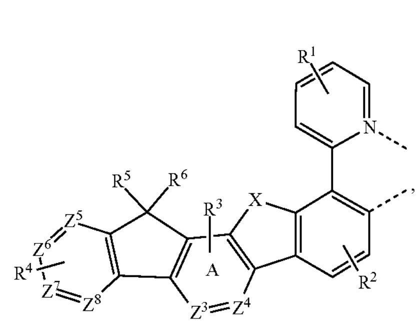

-continued

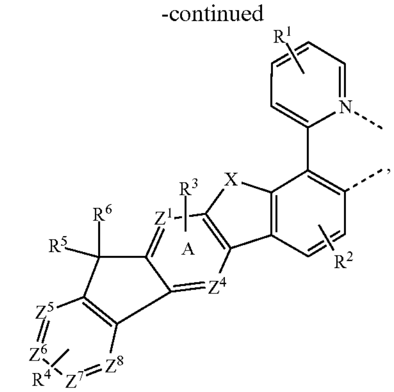

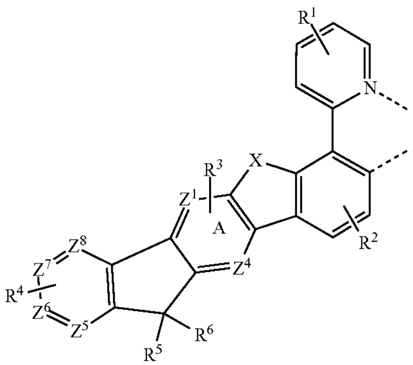

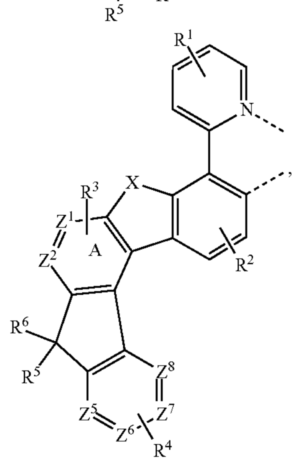

, and

-continued

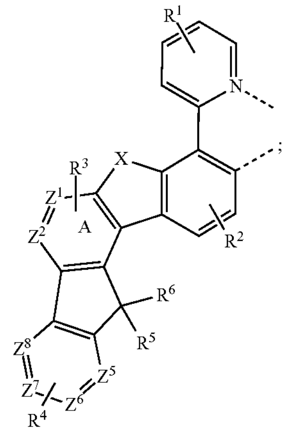

wherein each $Z^1$ to $Z^8$ is nitrogen or carbon;

wherein $R^1$ and $R^4$ each independently represent mono, di, tri, or tetra substitutions, or no substitution;

wherein $R^2$ and $R^3$ each independently represent mono, or di substitutions, or no substitution;

wherein X is O or S;

wherein $R^1$, $R^2$, $R^3$, $R^4$, $R^5$, and $R^6$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substituents are optionally joined to form a ring, which can be further substituted;

wherein the ligand $L_A$ is coordinated to a metal M; and wherein the ligand $L_A$ is optionally linked with other ligands to comprise a tridentate, tetradentate, pentadentate or hexadentate ligand.

* * * * *